(12) United States Patent
Jacques

(10) Patent No.: US 9,929,691 B2
(45) Date of Patent: Mar. 27, 2018

(54) PYRAMIDAL WALL SECTIONS

(71) Applicant: Jonathan Jacques, Peabody, MA (US)

(72) Inventor: Jonathan Jacques, Peabody, MA (US)

( * ) Notice: Subject to any disclaimer, the term of this patent is extended or adjusted under 35 U.S.C. 154(b) by 0 days.

(21) Appl. No.: 15/484,762

(22) Filed: Apr. 11, 2017

(65) Prior Publication Data
US 2017/0294872 A1    Oct. 12, 2017

Related U.S. Application Data

(60) Provisional application No. 62/321,287, filed on Apr. 12, 2016.

(51) Int. Cl.
| | |
|---|---|
| *H01L 21/00* | (2006.01) |
| *H02S 30/10* | (2014.01) |
| *B29C 70/44* | (2006.01) |
| *B33Y 80/00* | (2015.01) |
| *H02S 40/36* | (2014.01) |
| *B29K 307/04* | (2006.01) |
| *B29L 31/10* | (2006.01) |

(52) U.S. Cl.
CPC ............ *H02S 30/10* (2014.12); *B29C 70/443* (2013.01); *B33Y 80/00* (2014.12); *H02S 40/36* (2014.12); *B29K 2307/04* (2013.01); *B29L 2031/10* (2013.01)

(58) Field of Classification Search
CPC ......... B32B 7/045; B32B 17/00; H02S 30/10; H02S 30/20; H02S 40/10; H02S 40/36; B29C 70/443

USPC .............. 438/57, 66; 136/244, 251
See application file for complete search history.

(56) References Cited

U.S. PATENT DOCUMENTS

| 8,579,360 B2 | 11/2013 | Litchfield | |
|---|---|---|---|
| 2009/0230725 A1 | 9/2009 | Juieng | |
| 2015/0027514 A1* | 1/2015 | Furutani | ................. E04C 2/324 136/251 |

OTHER PUBLICATIONS

Inside-Out Pyramids Triple a Solar Cell's Efficiency (Jul. 9, 2013). https://www.melanietoniaevans.com/articles/narcissist-behaviours.htm.

(Continued)

*Primary Examiner* — Brook Kebede
(74) *Attorney, Agent, or Firm* — Preti Flaherty Beliveau Pachios LLP

(57) ABSTRACT

A method of producing a wall section is described. The method includes vacuum forming a carbon fiber sheet to a pyramidal mold core to create a first layer having a plurality of pyramidal shapes. A conductive frame is disposed on the carbon fiber sheet. A first set of solar panel post slots are trimmed from the first layer. Vents are cut in the carbon fiber sheet to expose frame connectors. The carbon fiber sheet is clamped to the conductive frame and wrapped around the conductive frame and over the first layer to create a second layer. A second set of solar panel post slots are trimmed from the second layer so as to overlap the first solar panel post slots. The second layer is trimmed to expose locking post slot areas. The method also includes affixing locking posts to the peaks of the plurality of pyramidal shapes.

9 Claims, 158 Drawing Sheets

(56) References Cited

OTHER PUBLICATIONS

Pyramid shape of polymer solar cells: a simple solution to triple efficiency (Jul. 2, 2013). http://iopscience.iop.org/article/10.1088/0022-3727/46/30/305101/meta;jsessionid=6A0D08125A163C313C7B72B0E8F46F16.ip-10-40-1-105.
With misinformation and factually incorrect statements swirling. Richard Wood is out to ease the turbulence (Aug. 1, 2012). http://trailer-bodybuilders.com/trailers/misinformation-and-factually-incorrect-statements-swirling-richard-wood-out-ease-turbulence.

* cited by examiner

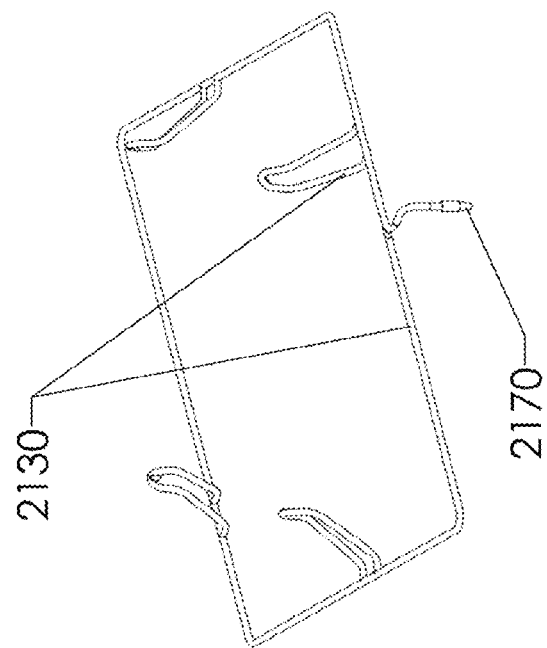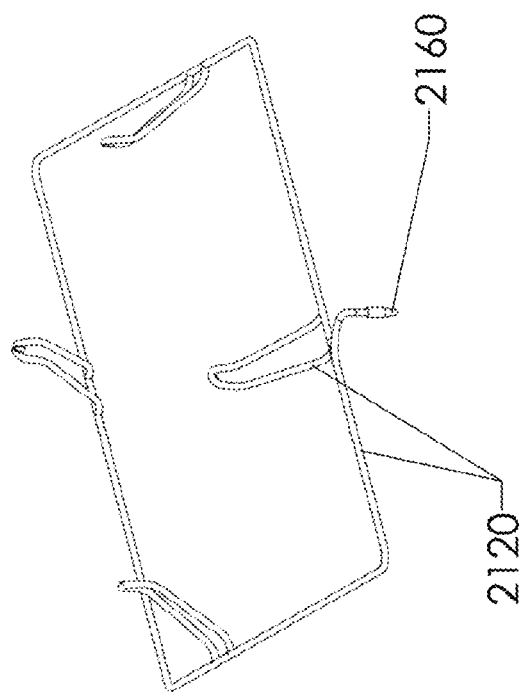
Figure 56B

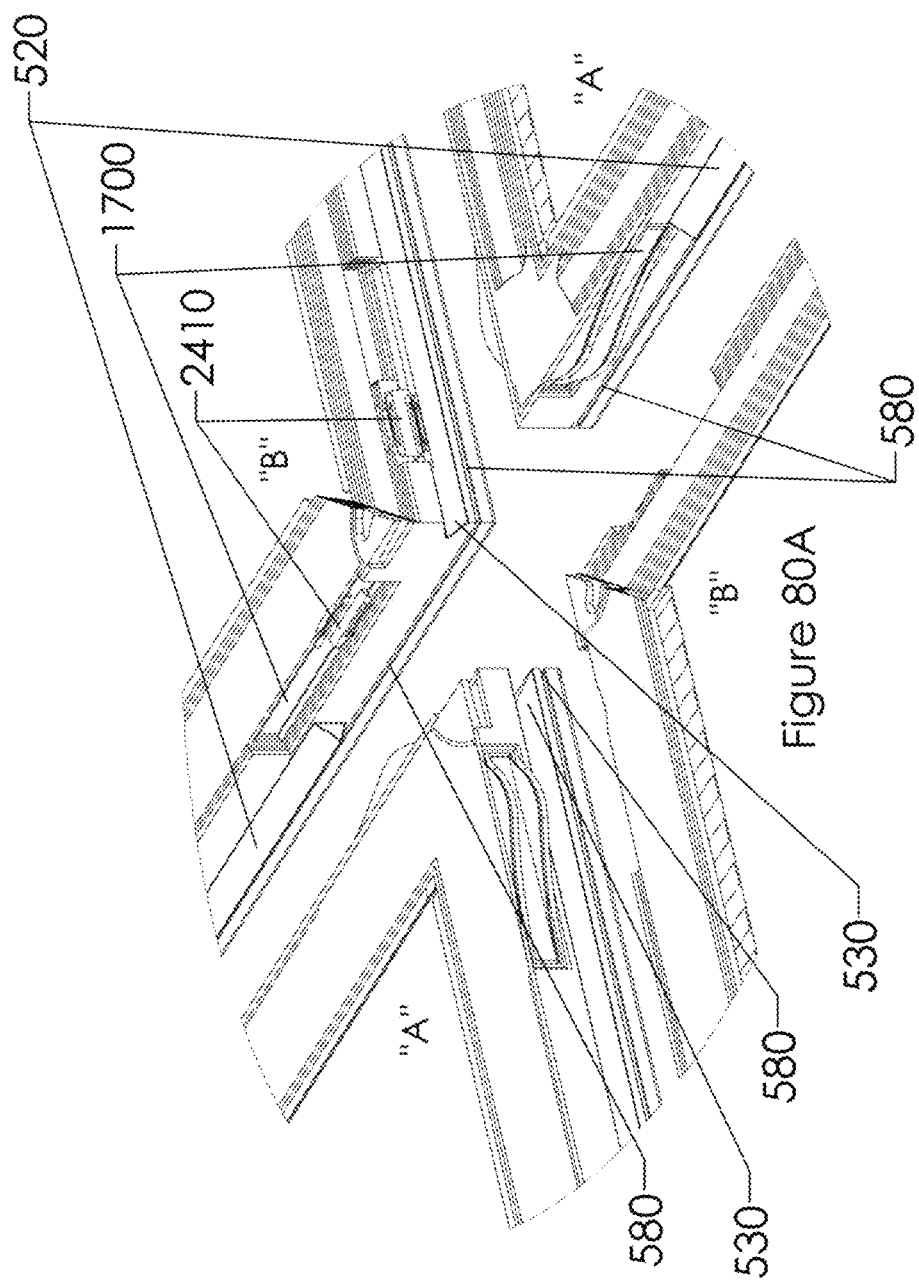

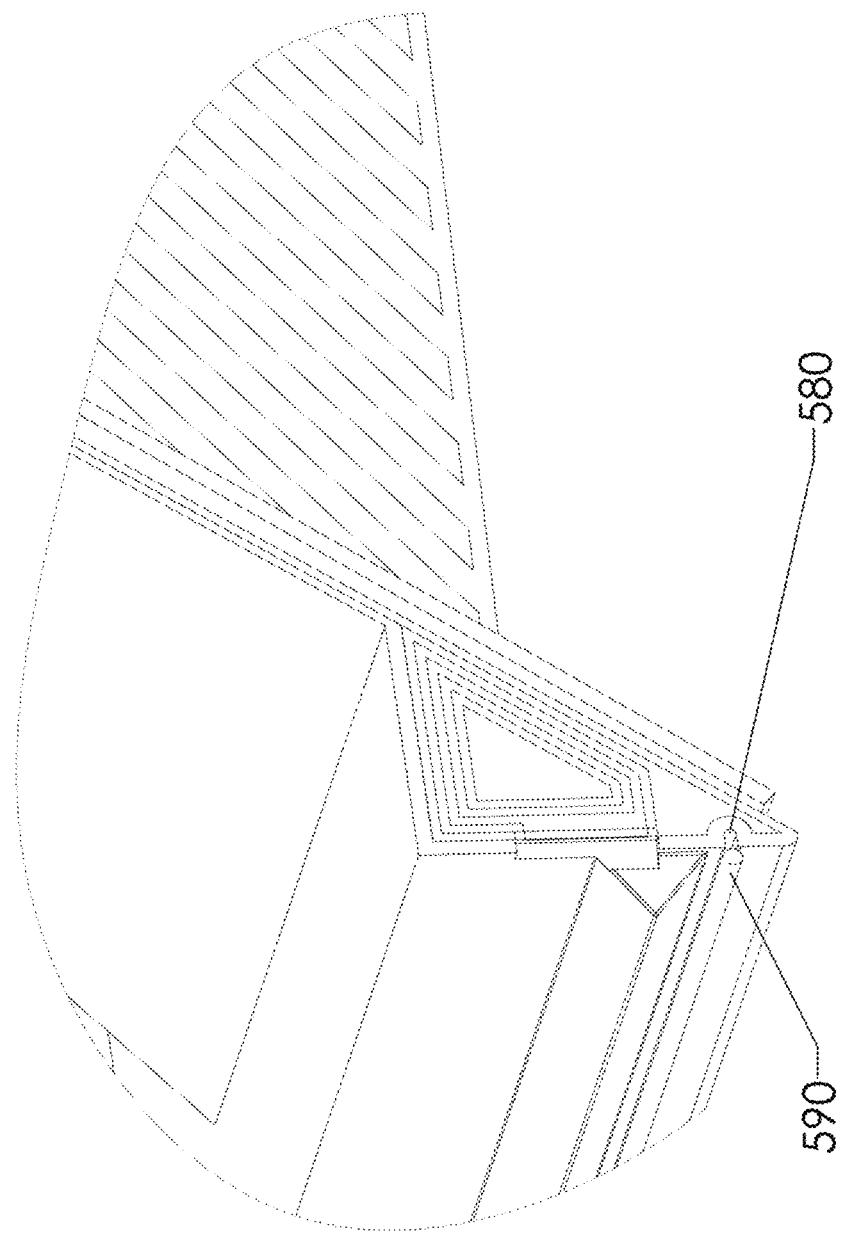

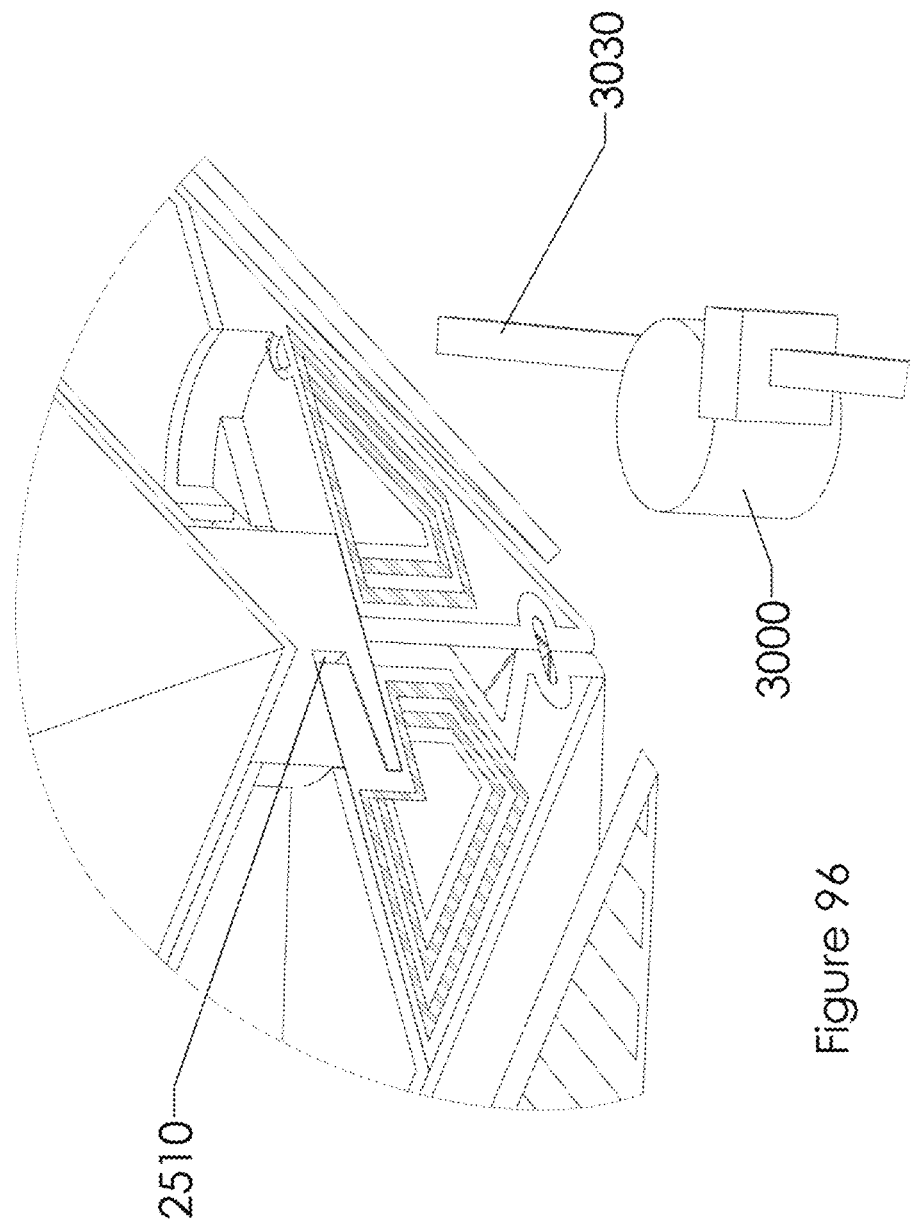

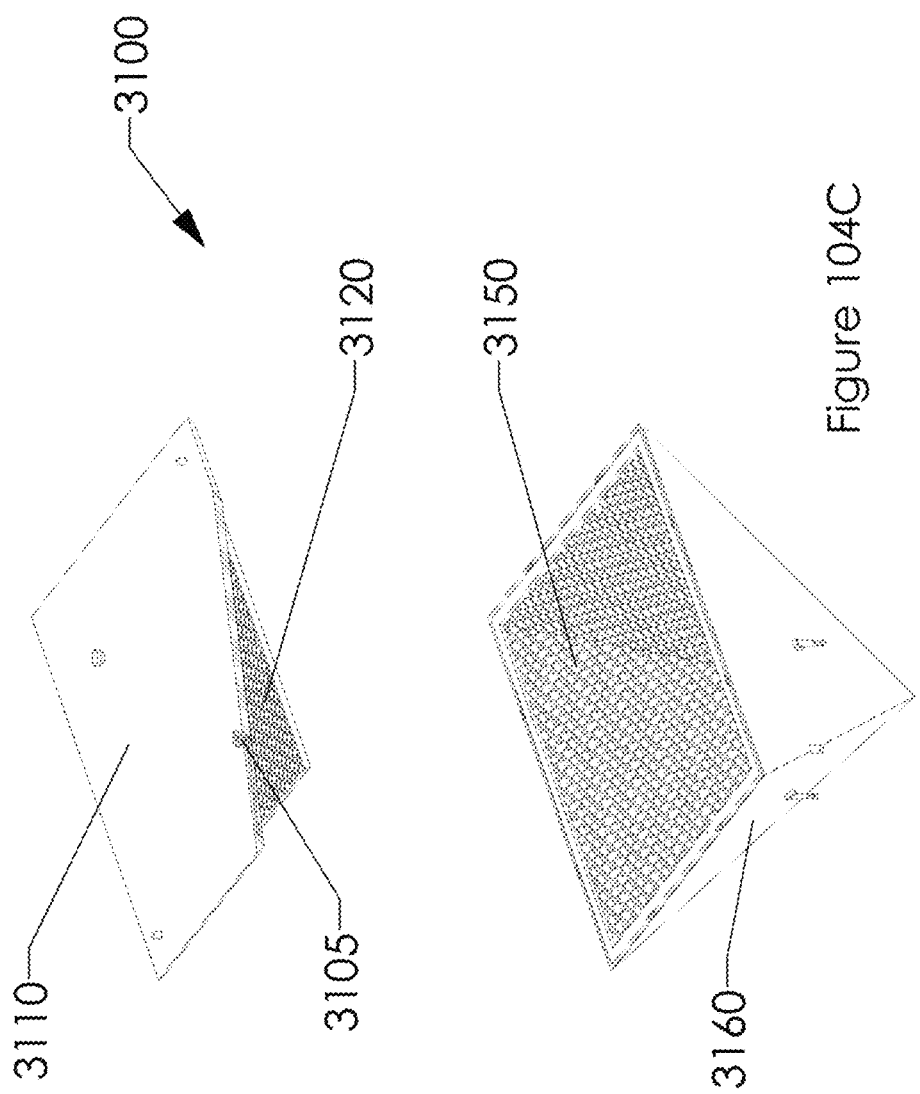

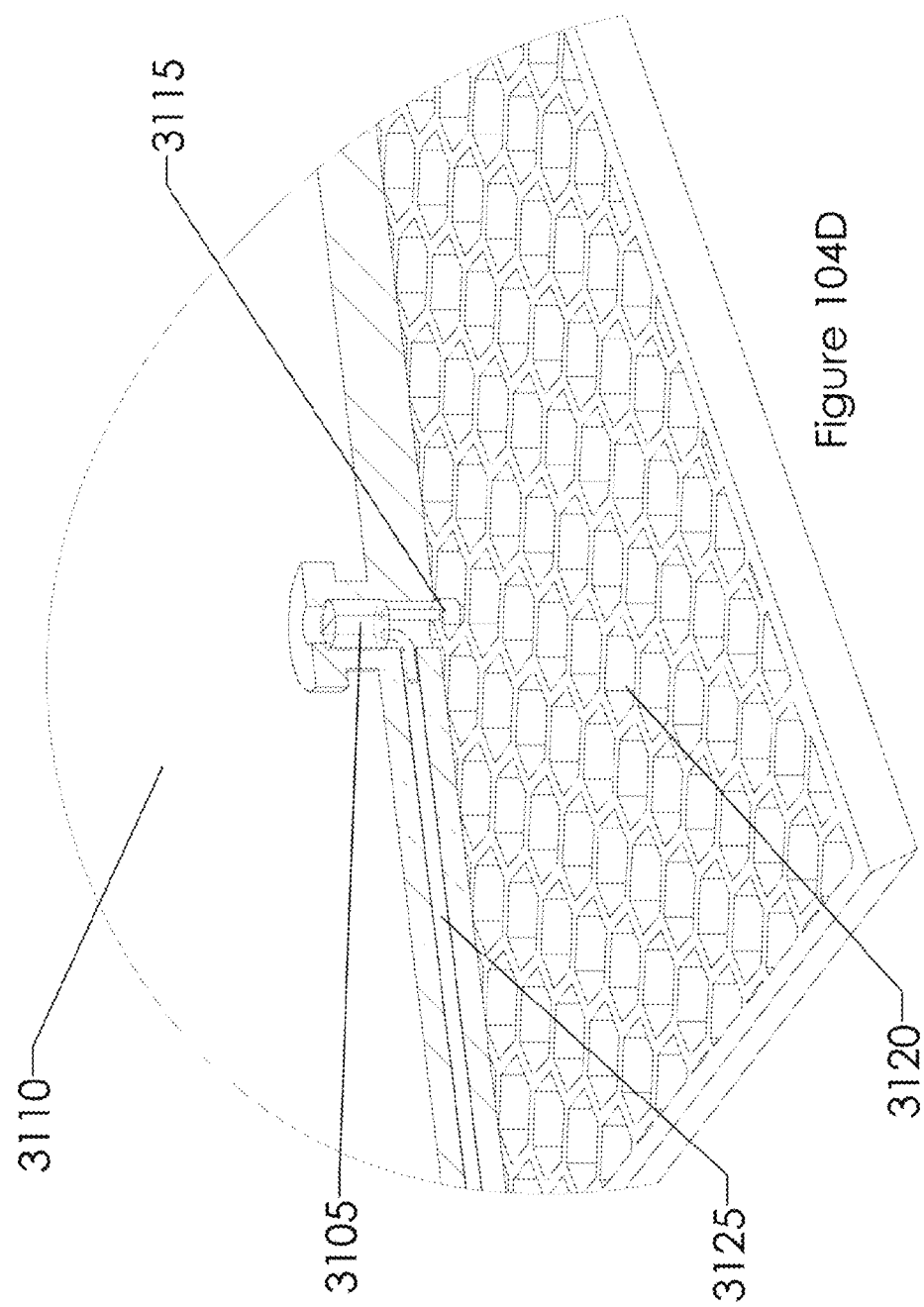

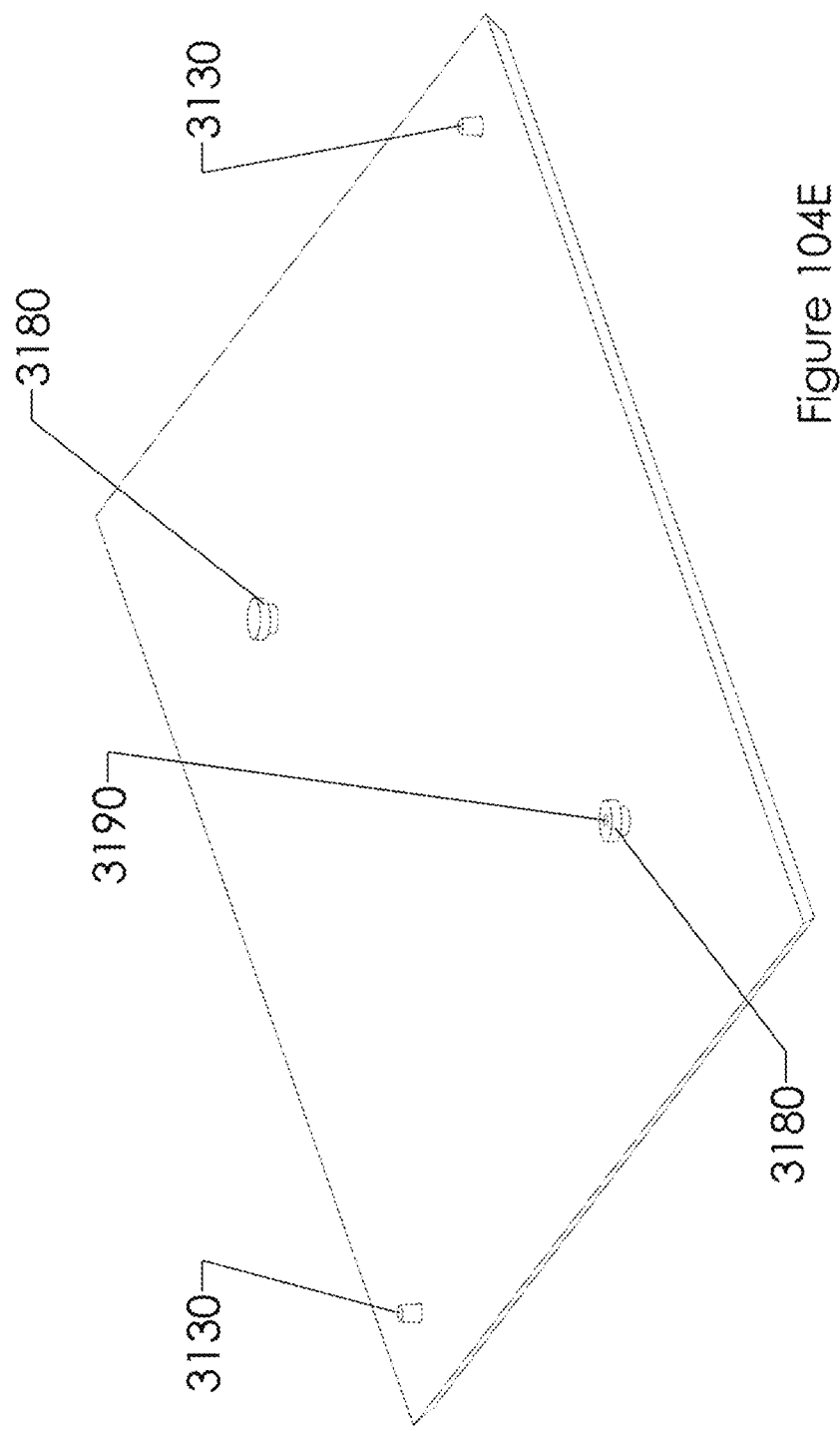

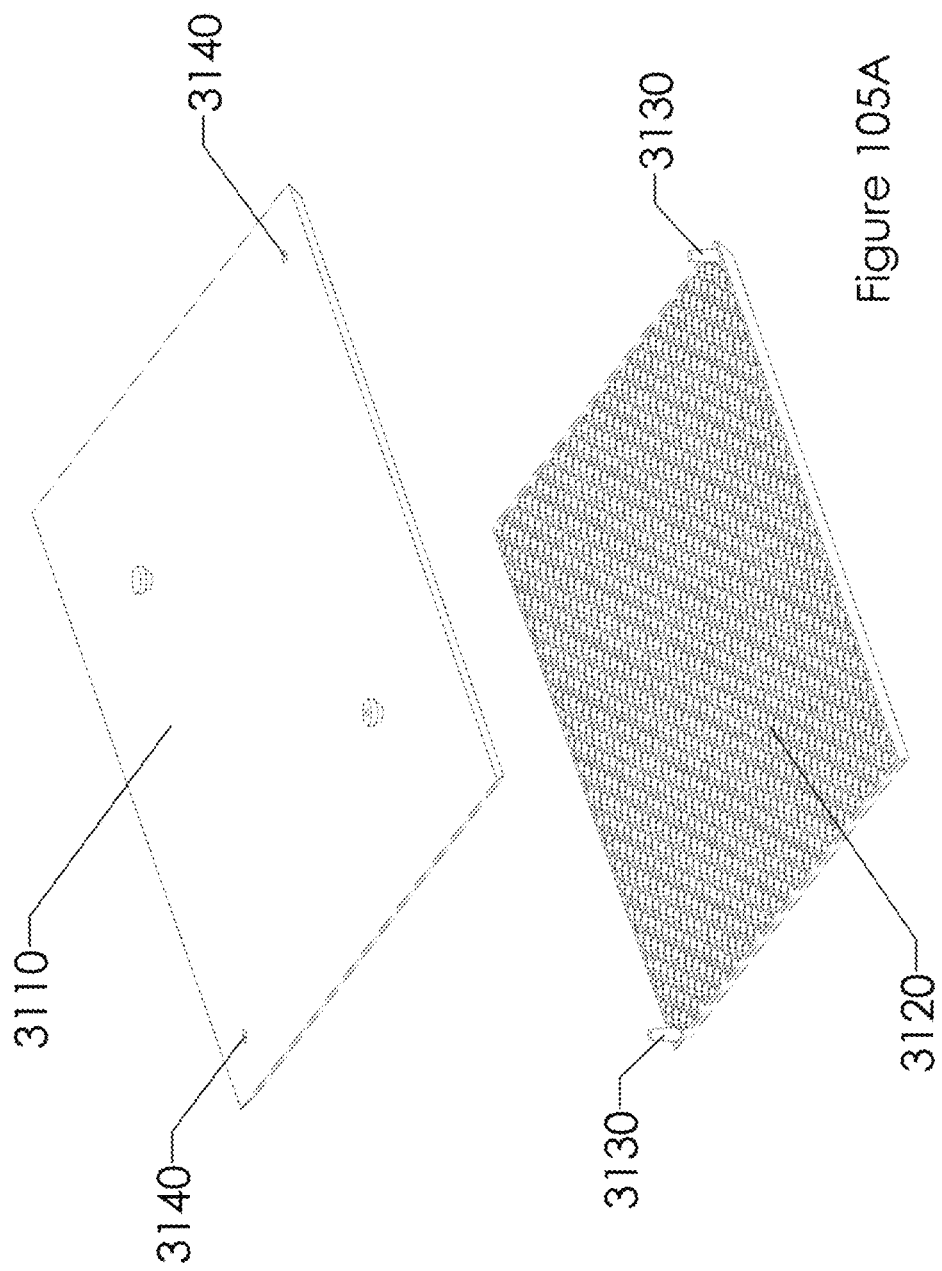

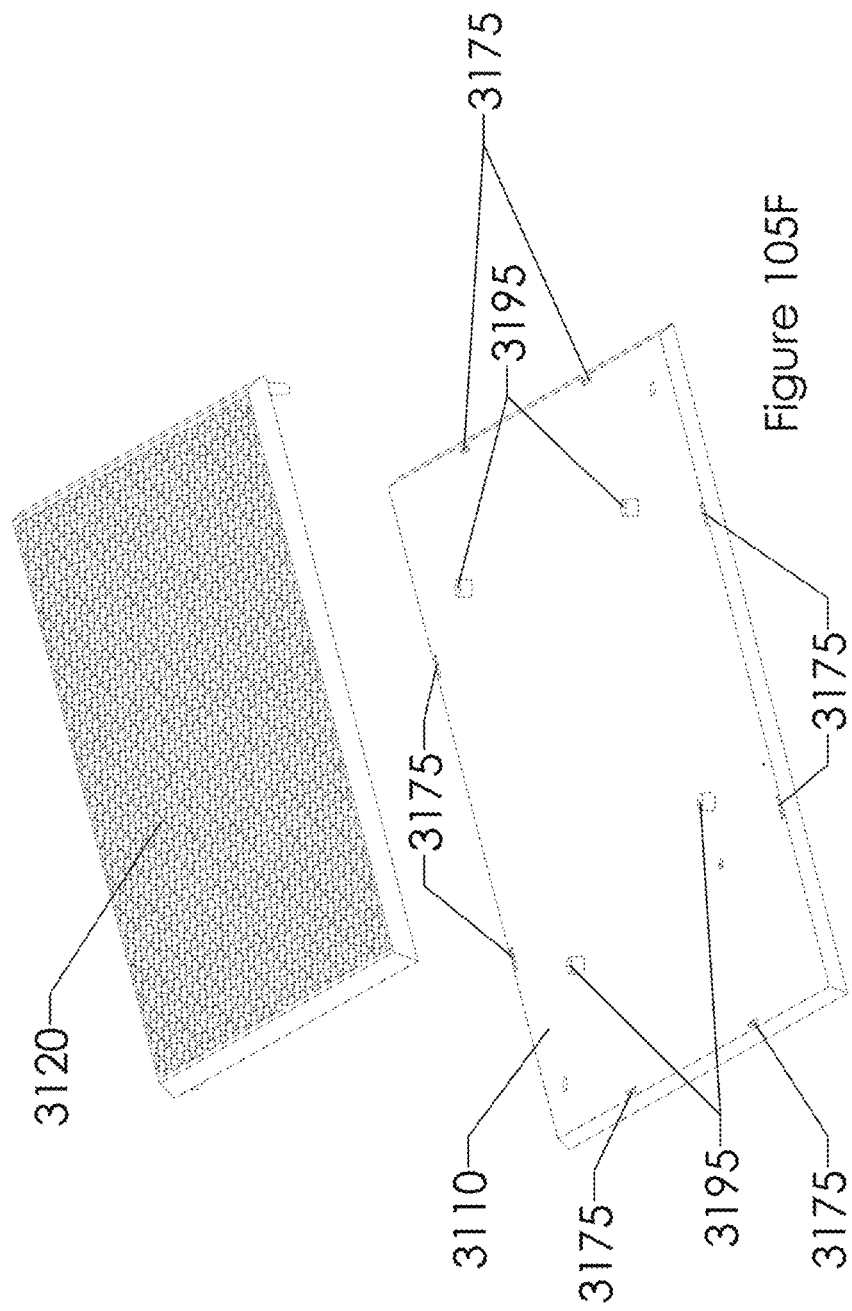

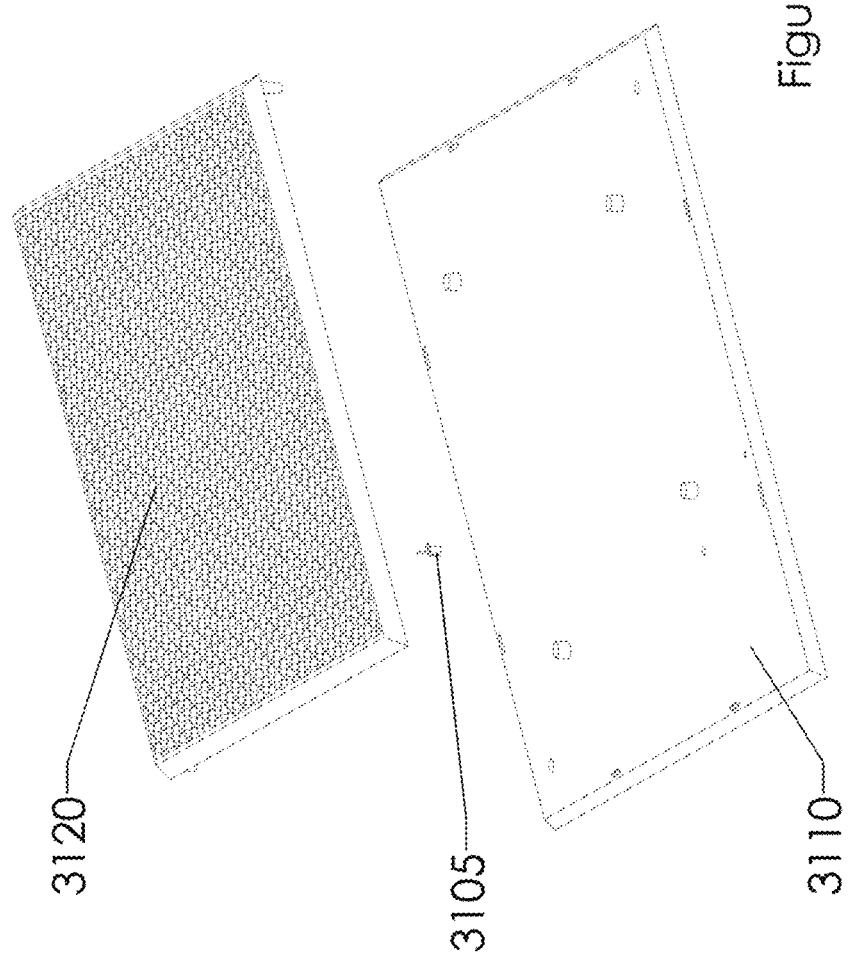

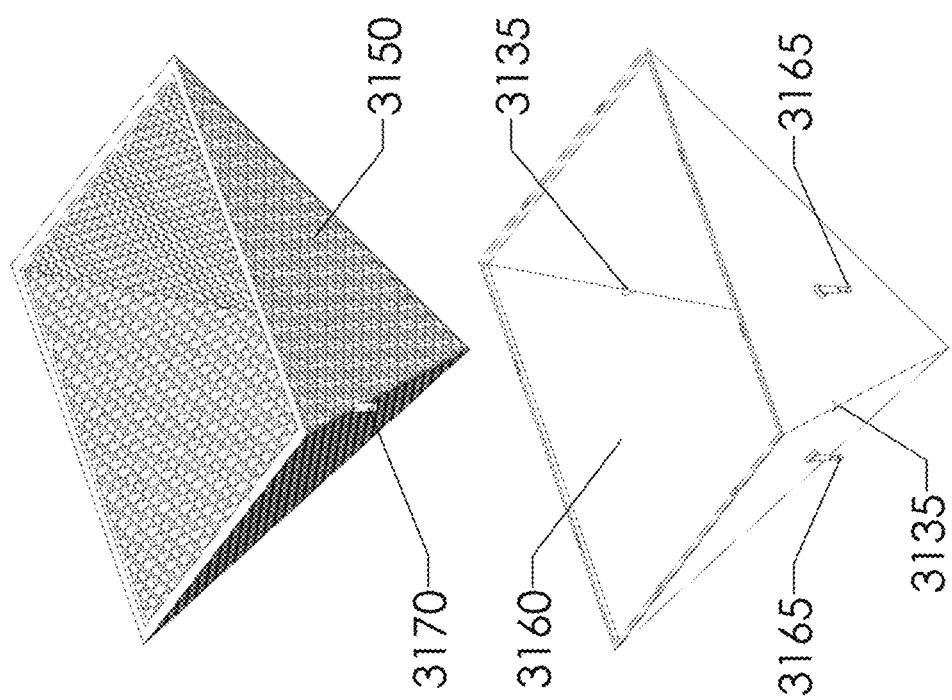

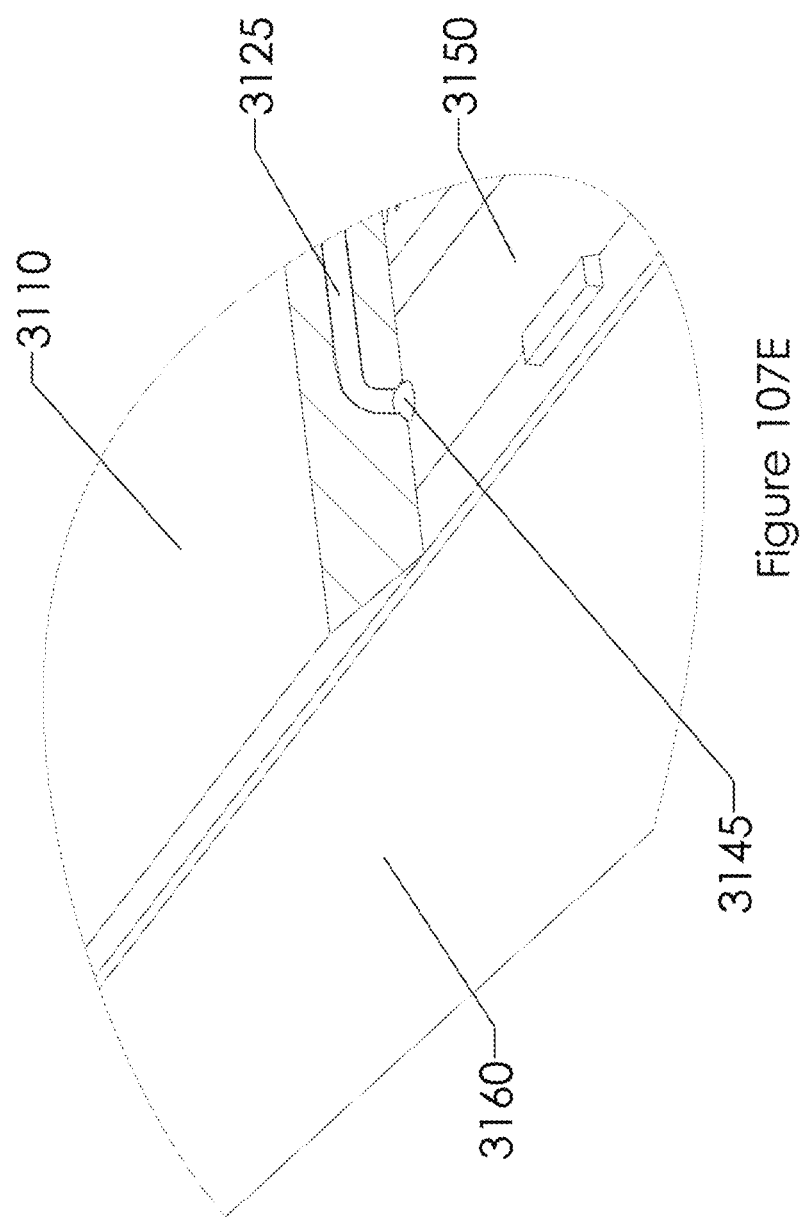

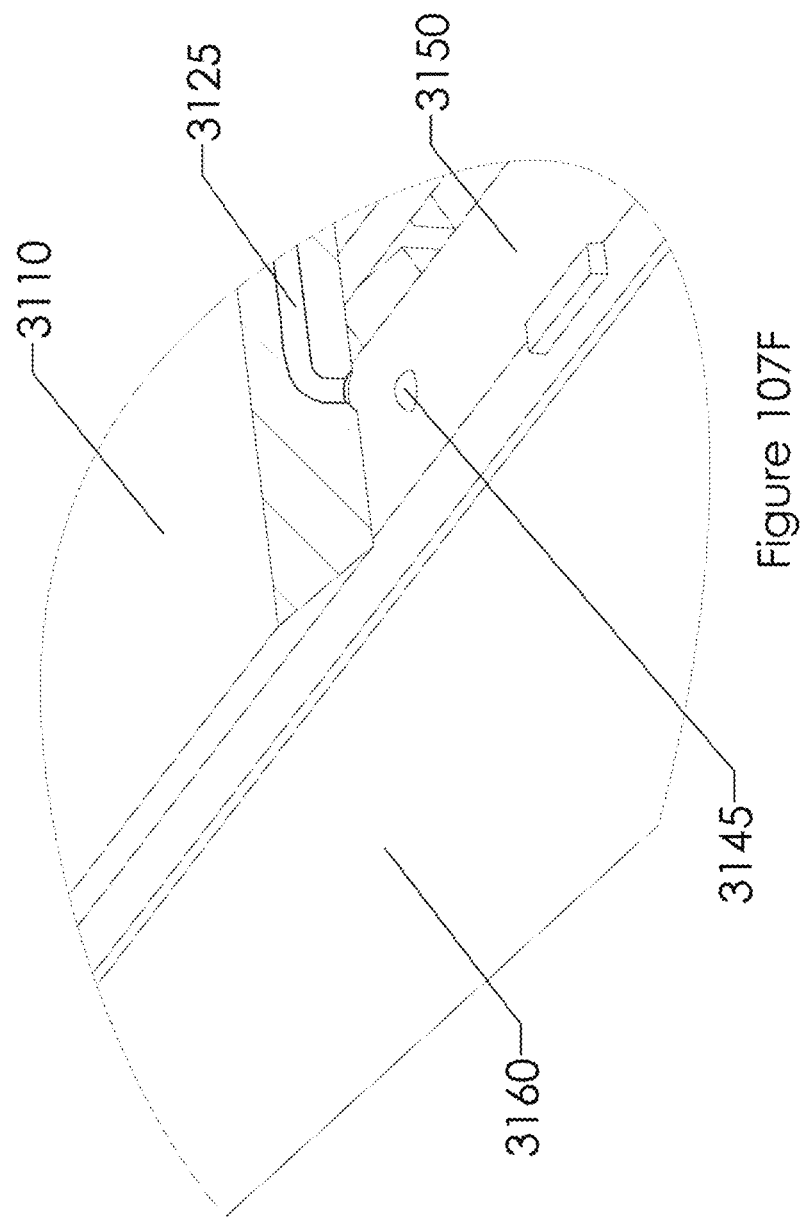

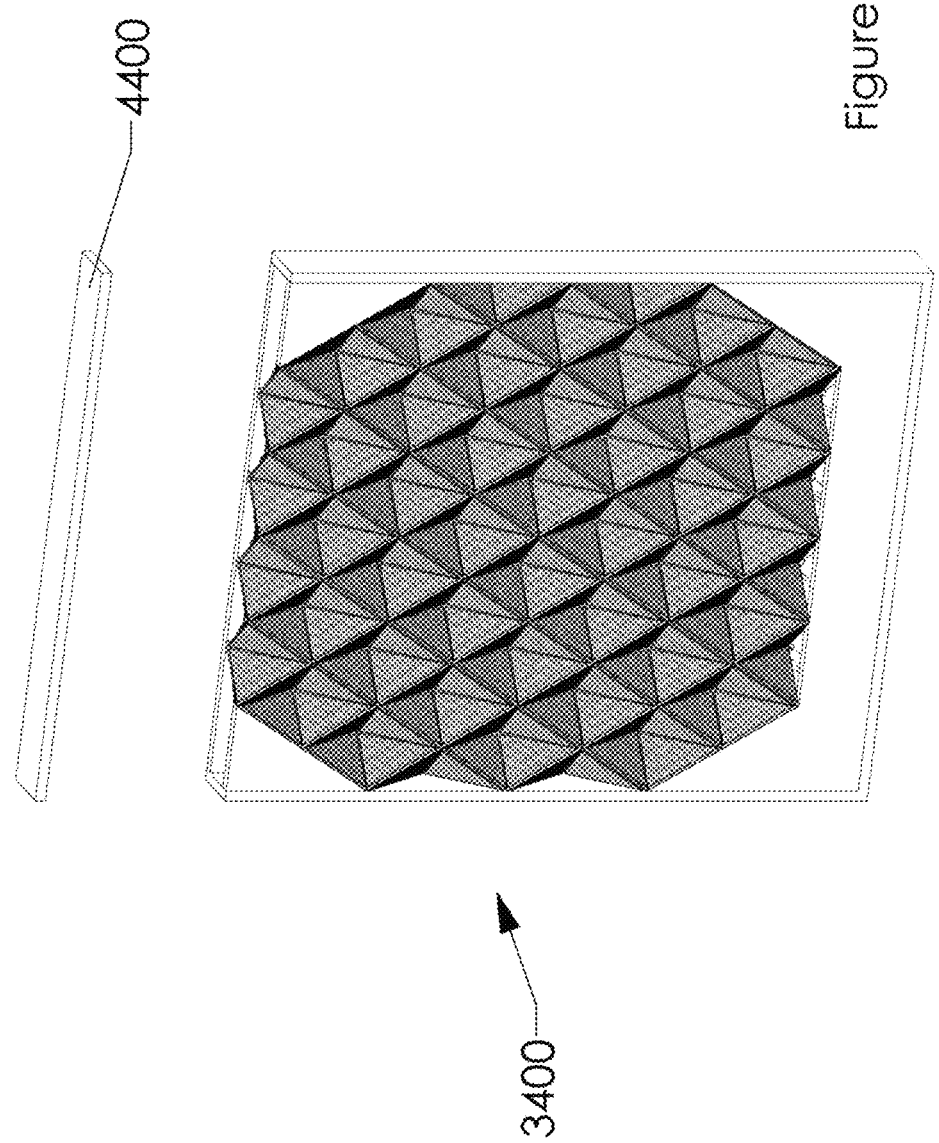

PYRAMIDAL WALL SECTIONS

BACKGROUND OF THE INVENTION

Various embodiments relate generally to modular wall systems, methods, and devices and, more specifically, relate to wall sections that can be used to create walls for a pyramidal-shaped structure.

This section is intended to provide a background or context. The description may include concepts that may be pursued, but have not necessarily been previously conceived or pursued. Unless indicated otherwise, what is described in this section is not deemed prior art to the description and claims and is not admitted to be prior art by inclusion in this section.

The ability to create structures quickly can be very important for effective emergency response. Additionally, having materials which are lightweight and space-efficient allows for quick deployment in remote locations.

BRIEF SUMMARY OF THE INVENTION

The below summary is merely representative and non-limiting.

The above problems are overcome, and other advantages may be realized, by the use of the embodiments.

In a first aspect, an embodiment provides a method of producing a wall section. The method includes vacuum forming a carbon fiber sheet to a pyramidal mold core to create a first layer of the carbon fiber sheet. The first layer includes a plurality of pyramidal shapes. A conductive frame is placed on the carbon fiber sheet. The conductive frame has a bird bone core, a plurality of frame connectors electrically connected to the conductive frame and a plurality of locking post slot areas. First solar panel post slots are trimmed from the first layer and vents are cut in the carbon fiber sheet to expose the plurality of frame connectors. At least a portion of the carbon fiber sheet is clamped to the conductive frame. The carbon fiber sheet is wrapped around the conductive frame and over the first layer to create a second layer of the carbon fiber sheet. Second solar panel post slots are trimmed from the second layer such that the first solar panel post slots and the second solar panel post slots overlap. The second layer is trimmed to expose the plurality of locking post slot areas. The method also includes affixing locking posts to the peaks of the plurality of pyramidal shapes.

BRIEF DESCRIPTION OF THE SEVERAL VIEWS OF THE DRAWINGS

Aspects of the described embodiments are more evident in the following description, when read in conjunction with the attached Figures.

FIG. 56B shows the extracted circuits of the connection rack.

FIG. 80A shows a detail of the—A—male connector ends and—B—female connector ends.

FIG. 80C shows a cross section of the corner exposing the O-ring groove and the O-ring.

FIG. 96 shows a cropped view of the cross section of an—A—&—B—junction and the insertion tool with a magnetic securing post loaded on it.

FIG. 104C shows an exploded view of a capacitor cell.

FIG. 104D shows a cropped, detailed area of a section of the insulated cover and honeycomb anode.

FIG. 104E shows the insulated cover with the anode conductive posts showing through the capacitor cover holes.

FIG. 105B shows the reverse side of the insulated cover joined with a honeycomb anode.

FIG. 105C is a section view of an LED and the cathode LED channel.

FIG. 105D is a section view of tapered cover bosses on an insulated cover.

FIG. 105E is a cropped detail of one covered boss and the cathode LED channel.

FIG. 105F shows the honeycomb anode separated from the insulated cover.

FIG. 105G is shows the LED in the exploded view of FIG. 105F.

FIG. 106 shows the indicator LED.

FIG. 107A shows a capacitor cell casing and a honeycomb cathode.

FIG. 107B shows the capacitor cell casing and the honeycomb cathode separated.

FIG. 107C shows a cropped detail of a cathode conductive post.

FIG. 107D shows a partially assembled capacitor cell.

FIG. 107E shows a cropped detail of the capacitor cell.

FIG. 107F shows another view of the capacitor cell.

Figure 108A:
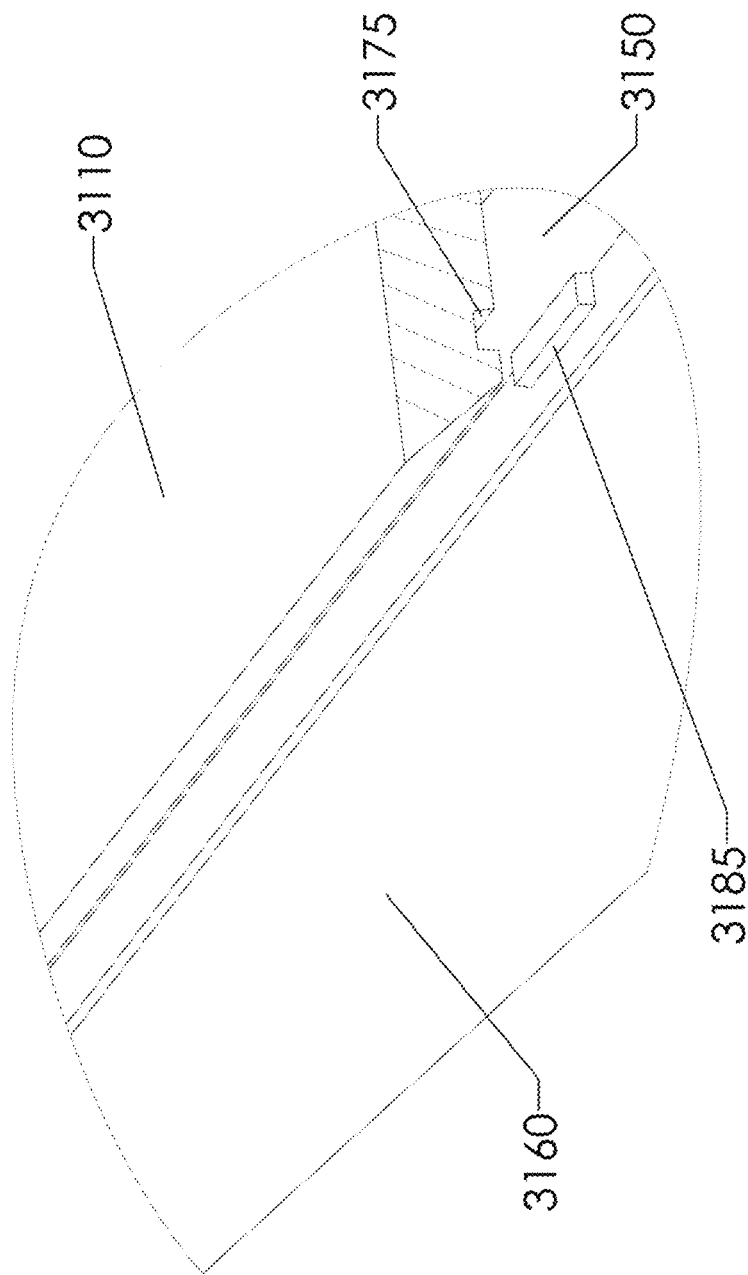

FIG. 108A shows a cropped detail of the top of the capacitor cell.

Figure 108B:
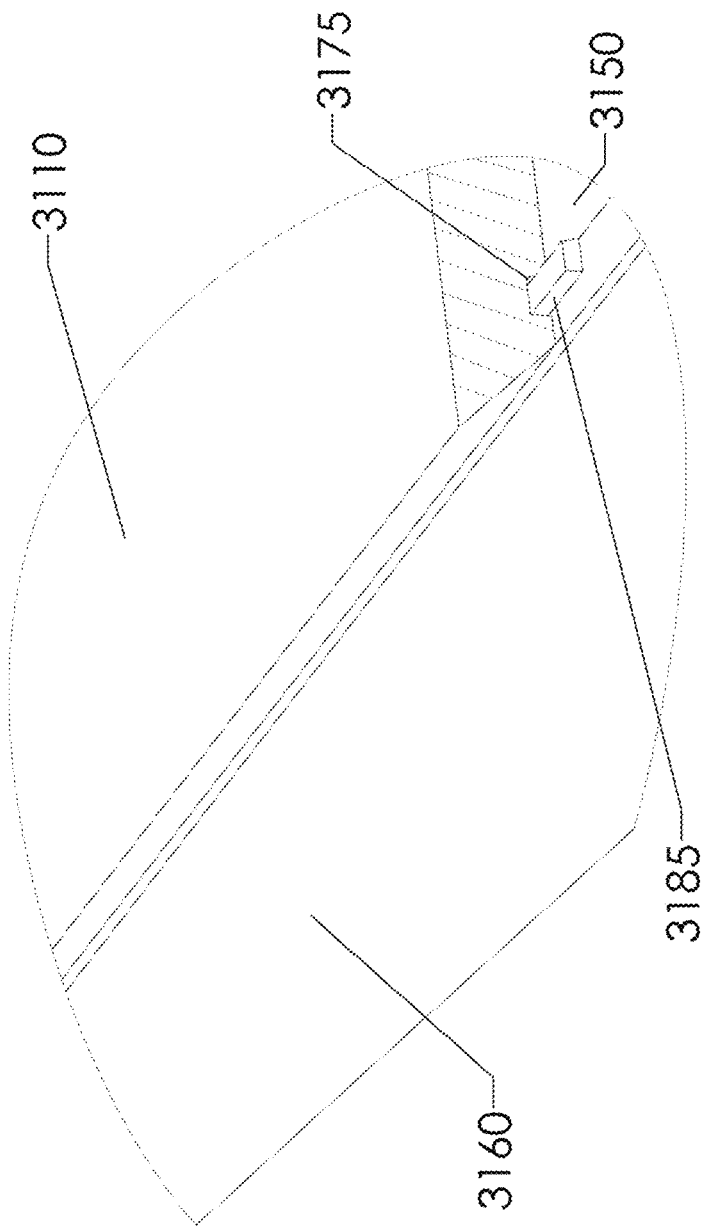

FIG. 108B shows another view of the top of the capacitor cell.

Figure 109:
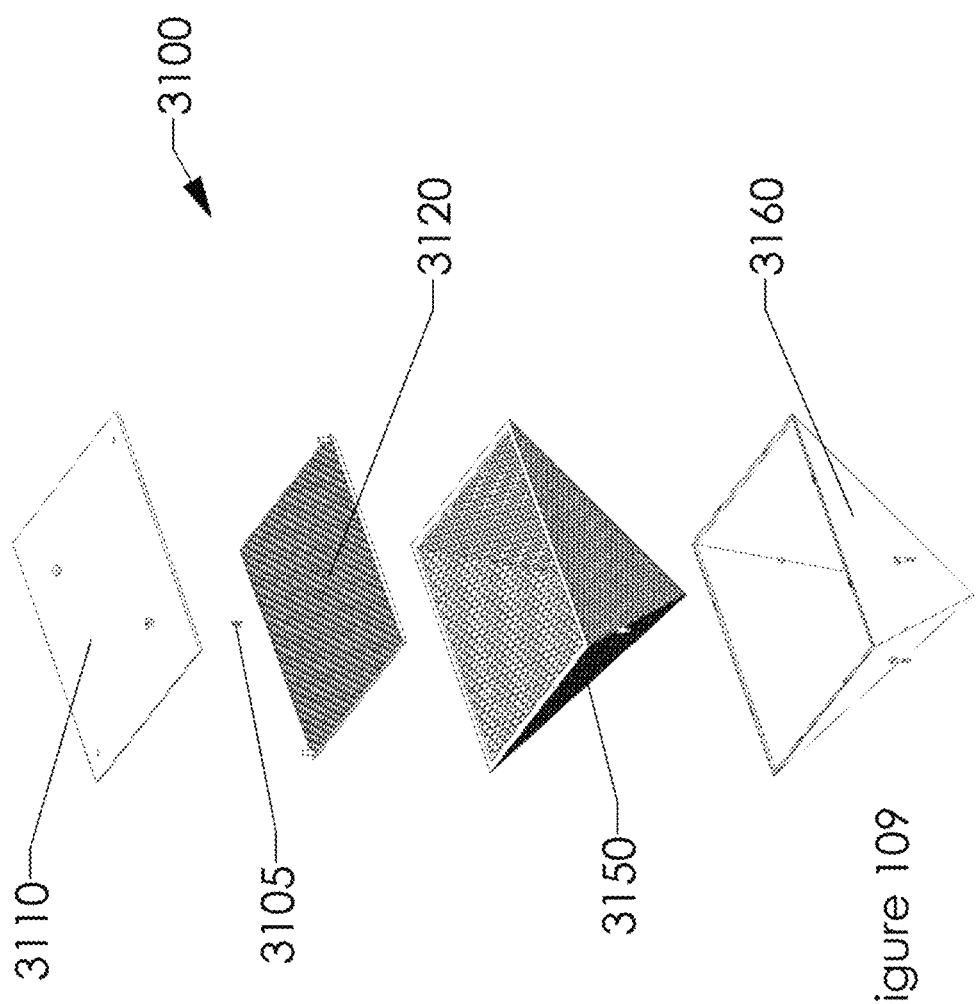

FIG. 109 shows an exploded view of the capacitor cell.

Figure 110:
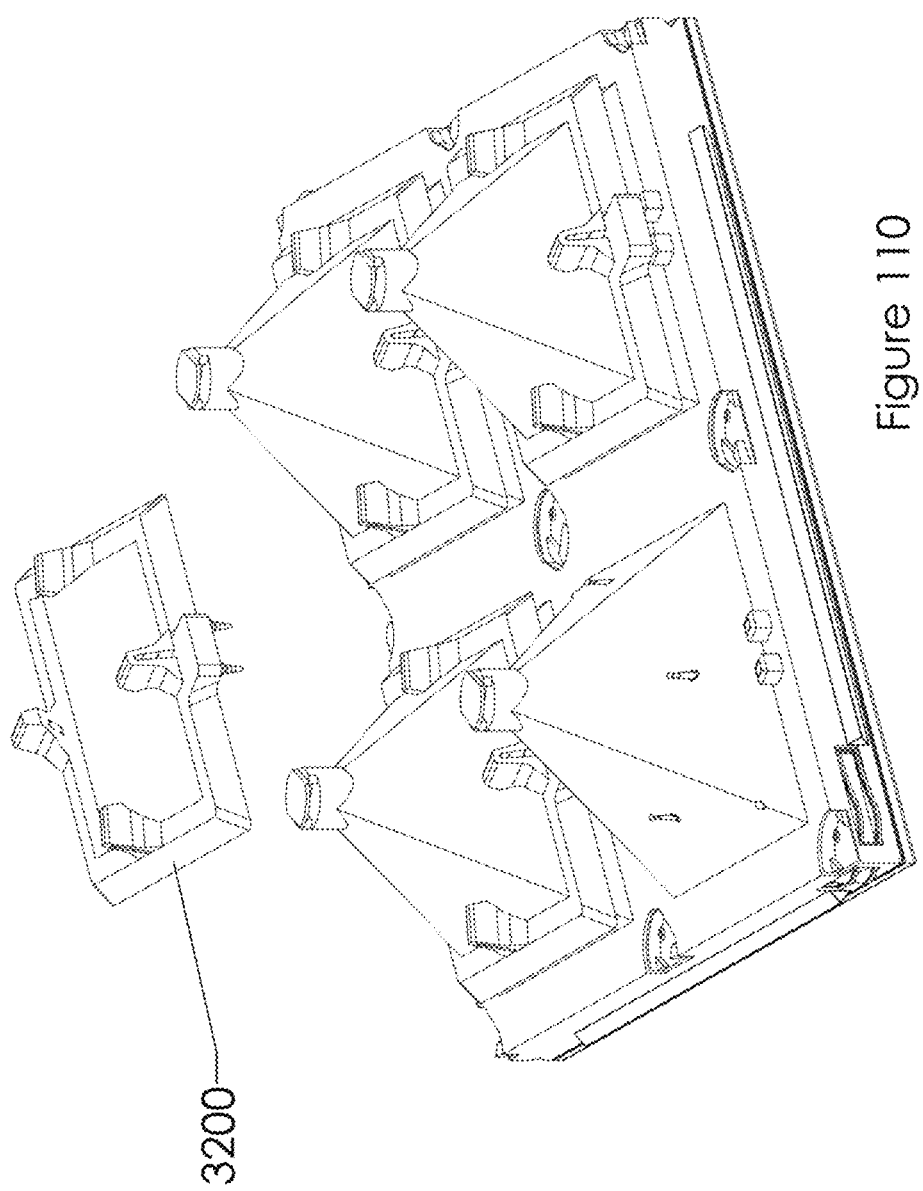

FIG. 110 shows a capacitor rack removed from a complete (male) capacitor wall section.

Figure 111:
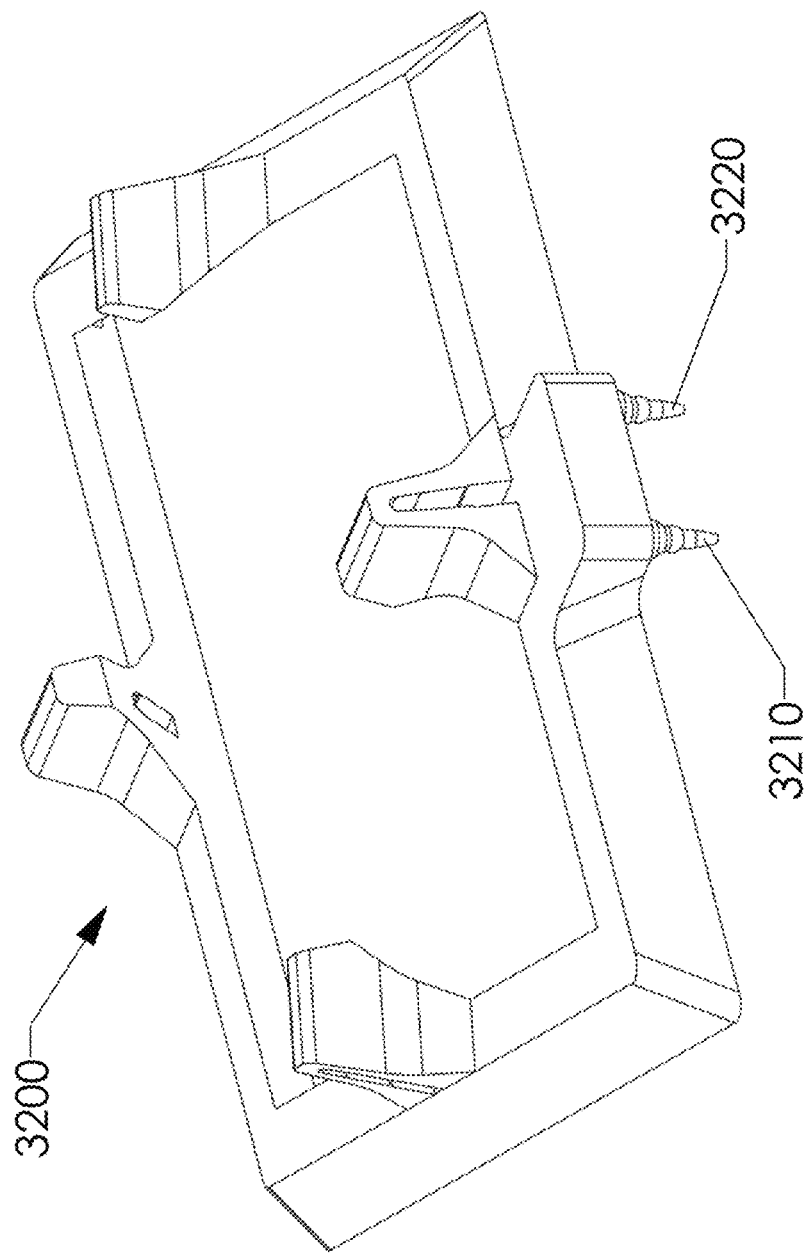

FIG. 111 shows a capacitor rack.

Figure 112:
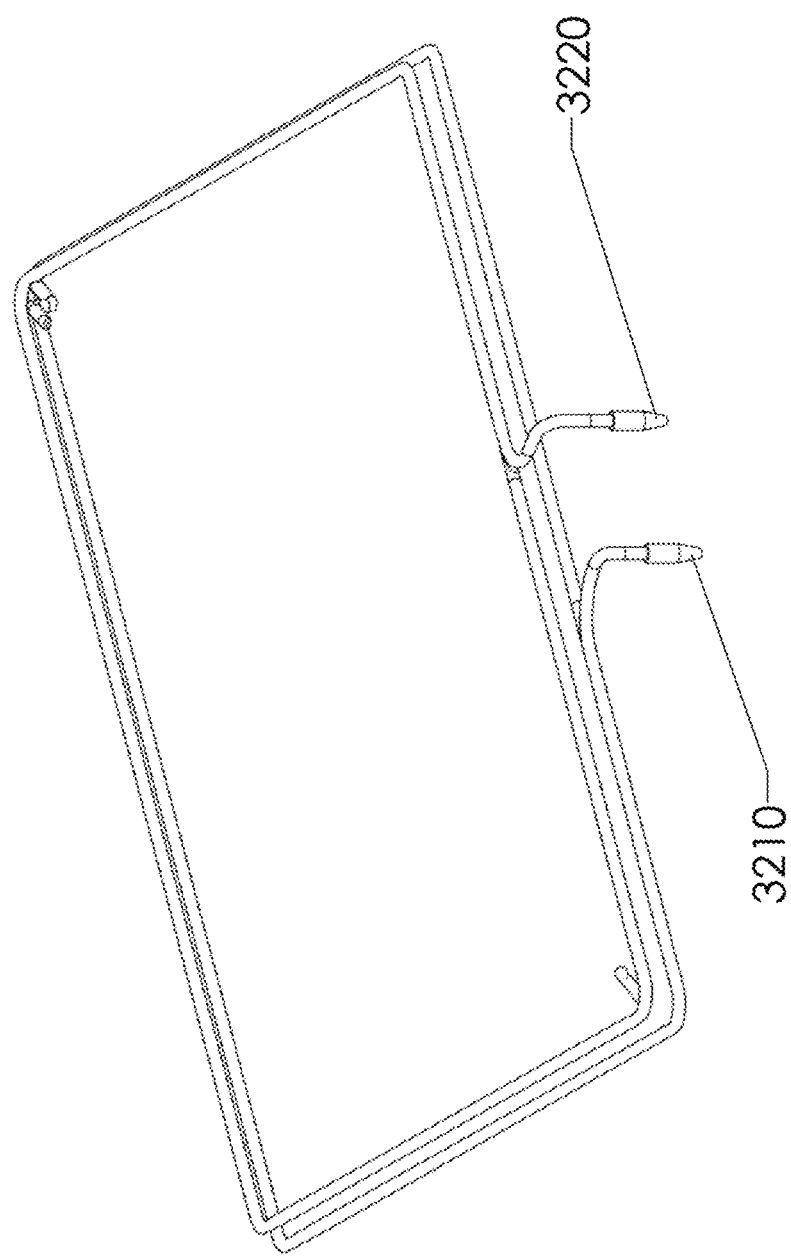

FIG. 112 shows the capacitor rack circuit.

Figure 113:
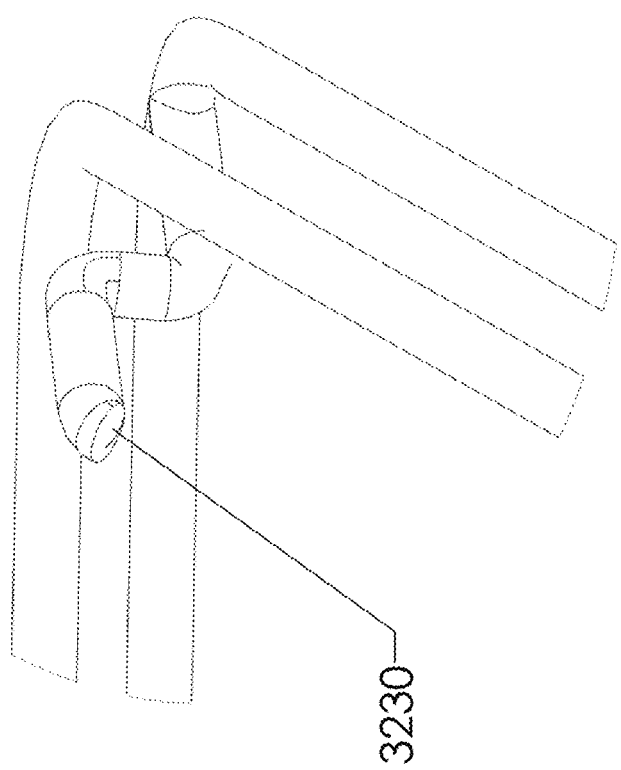

FIG. 113 shows a circuit contact to the cathode.

Figure 114:
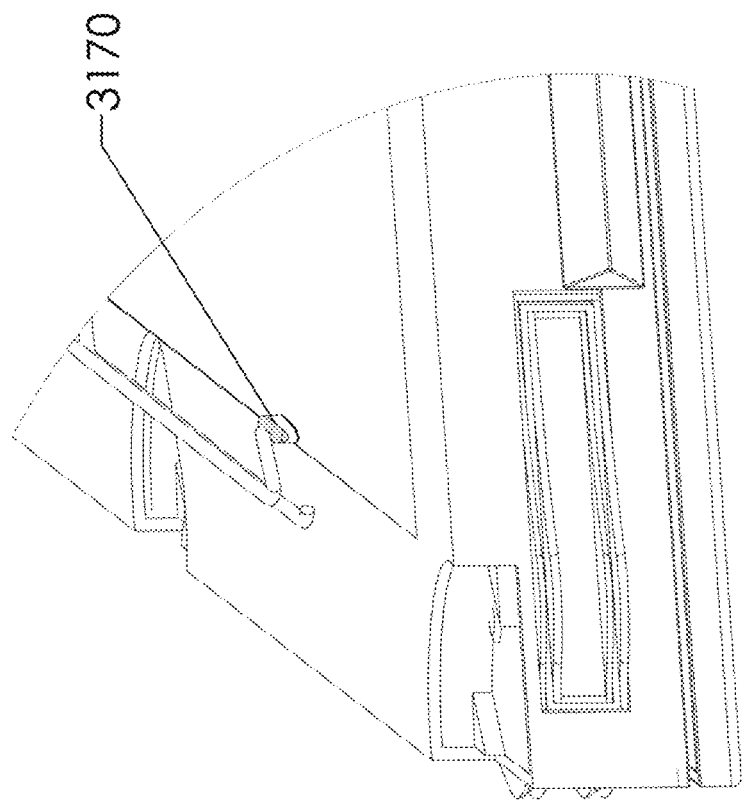

FIG. 114 shows a hatch on the tip of a cathode connection post.

Figure 115:
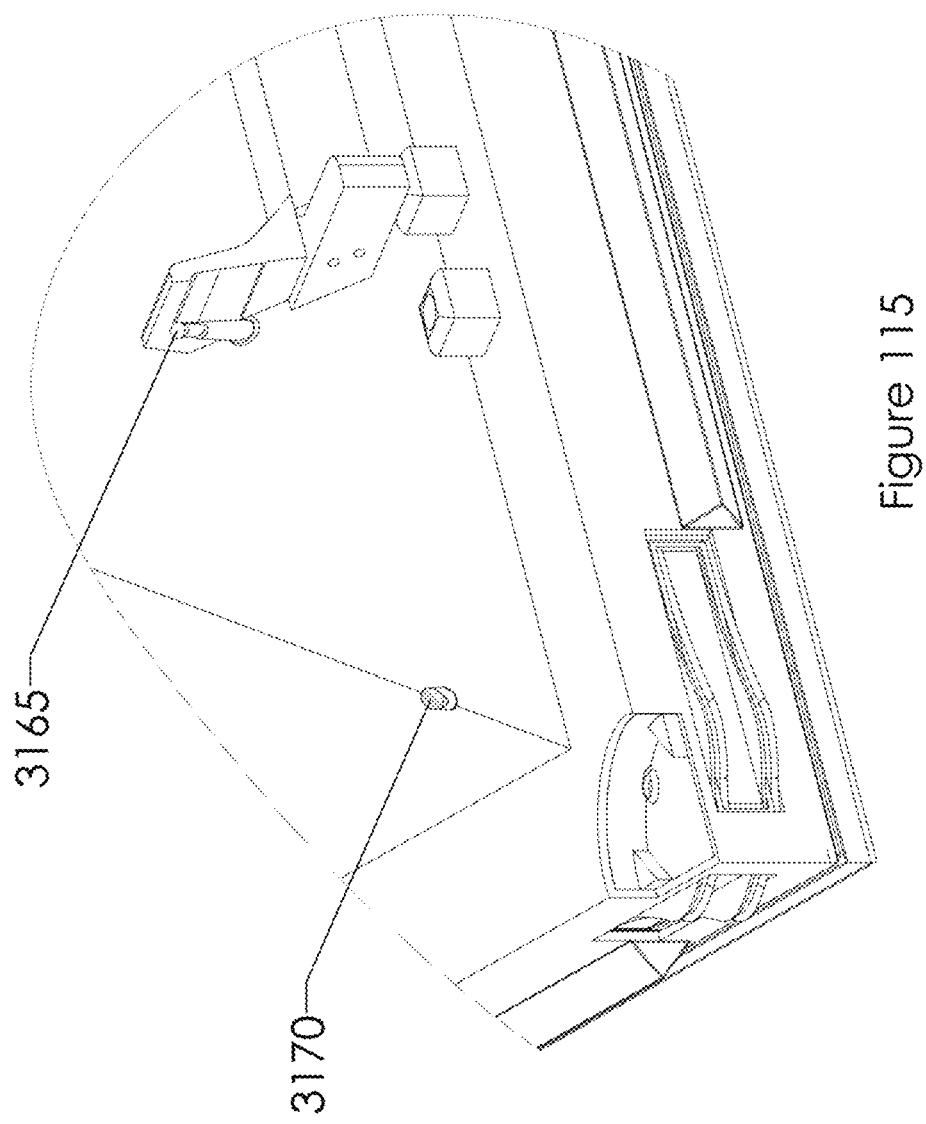

FIG. 115 shows a detail of cathode connection post and the capacitor rack.

Figure 116:
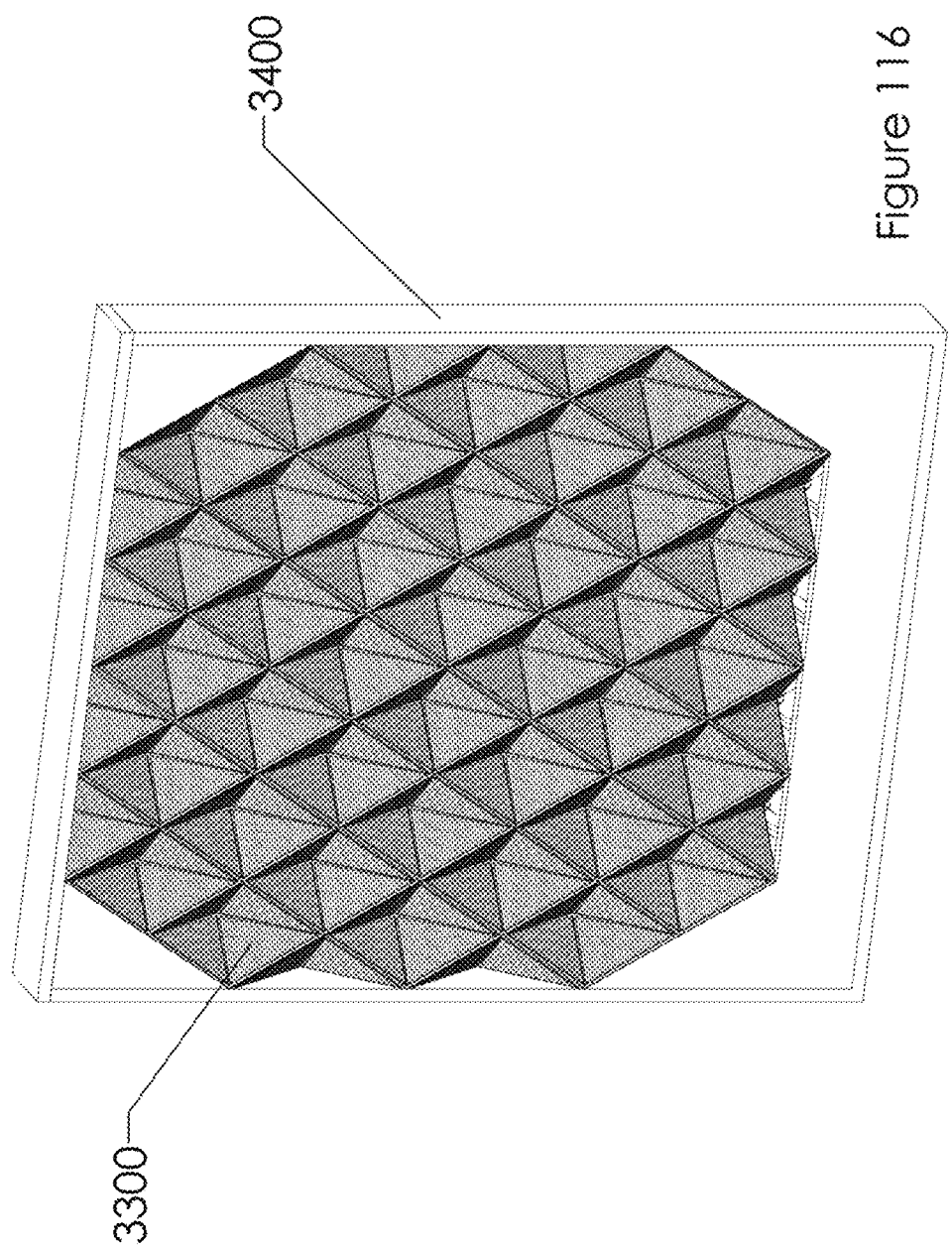

FIG. 116 shows an example of a solar panel wall in a pyramid wall frame.

Figure 117:
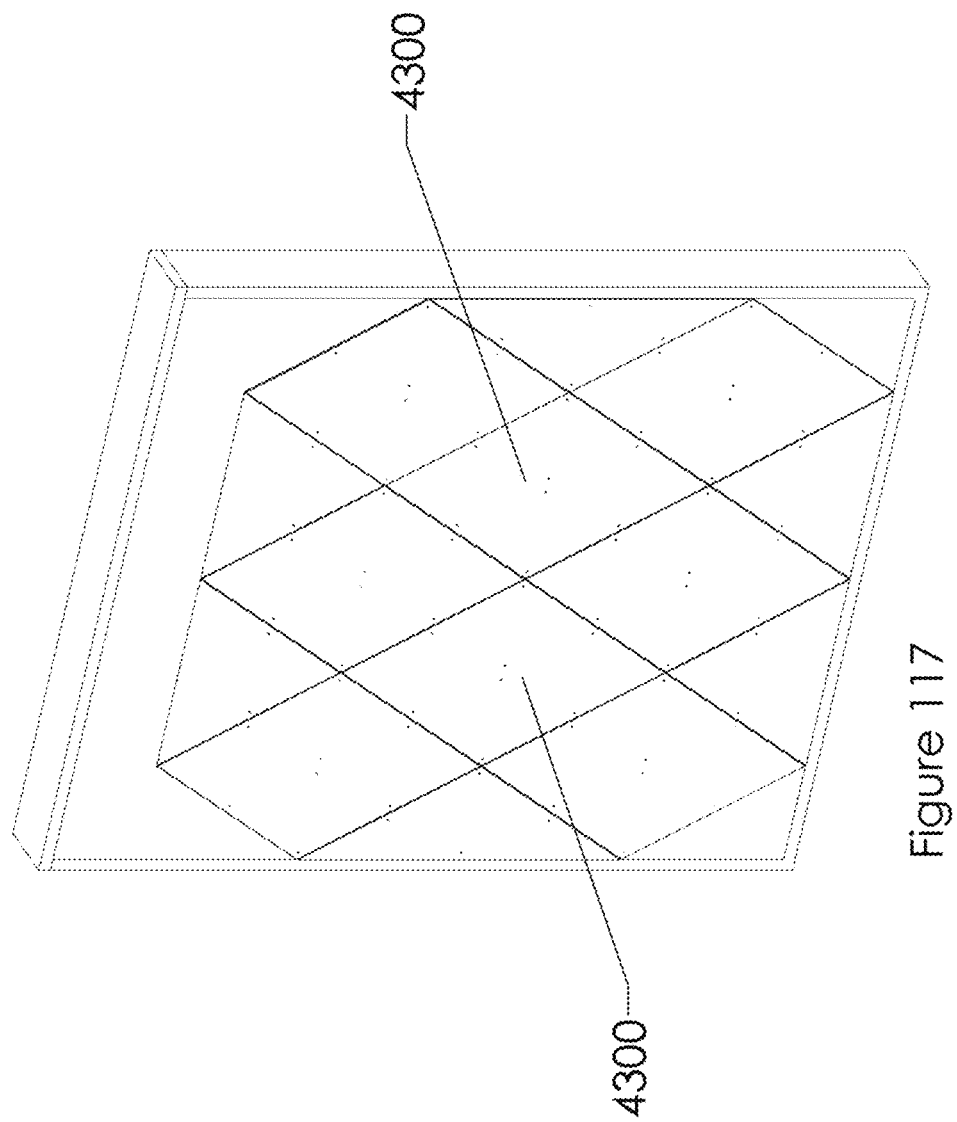

FIG. 117 shows the backside of a pyramid wall frame.

Figure 118:
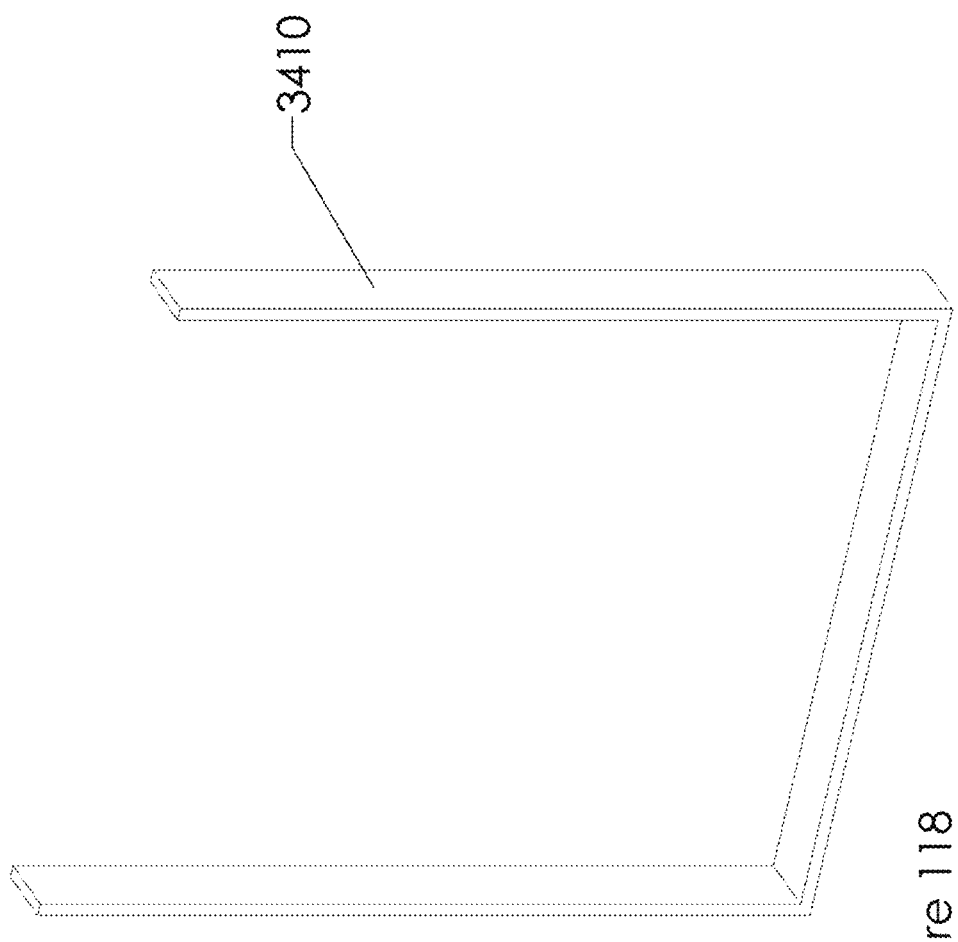

FIG. 118 shows the U-shaped base of the pyramid wall frame.

Figure 119:
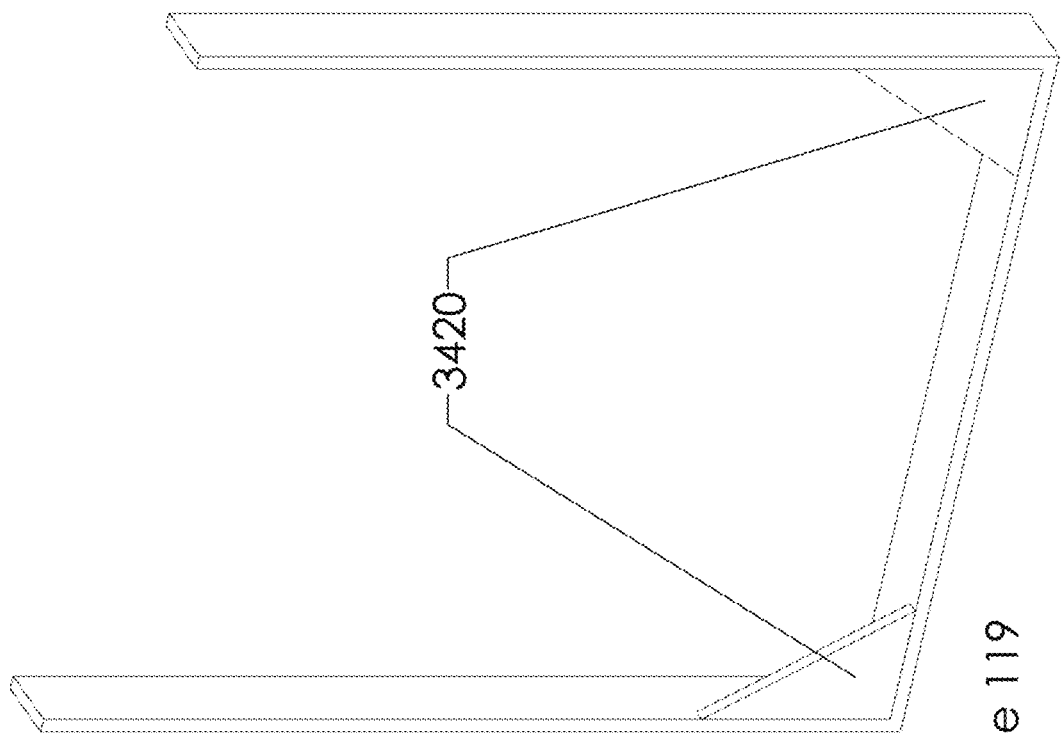

FIG. 119 shows pyramid frame corners added to the frame.

Figure 120:
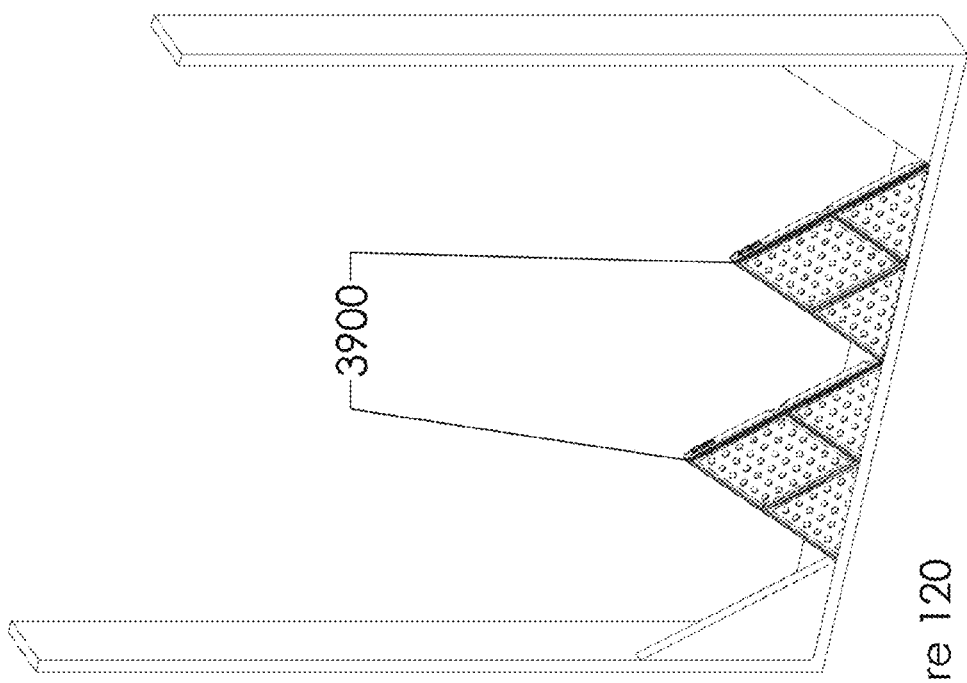

FIG. 120 shows top half female sections inserted at the bottom of the frame.

Figure 121:
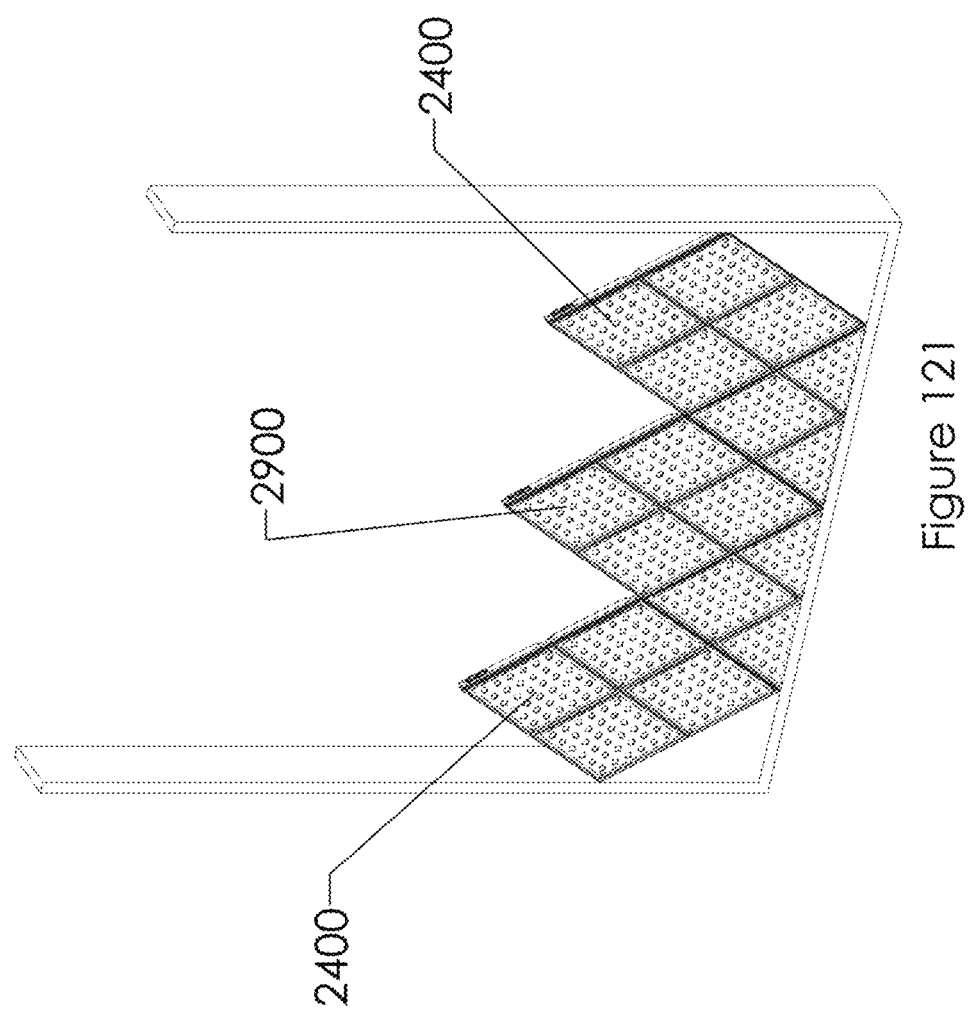

FIG. 121 shows the frame with one male side—A—wall section and two female side—B—wall sections.

Figure 122:
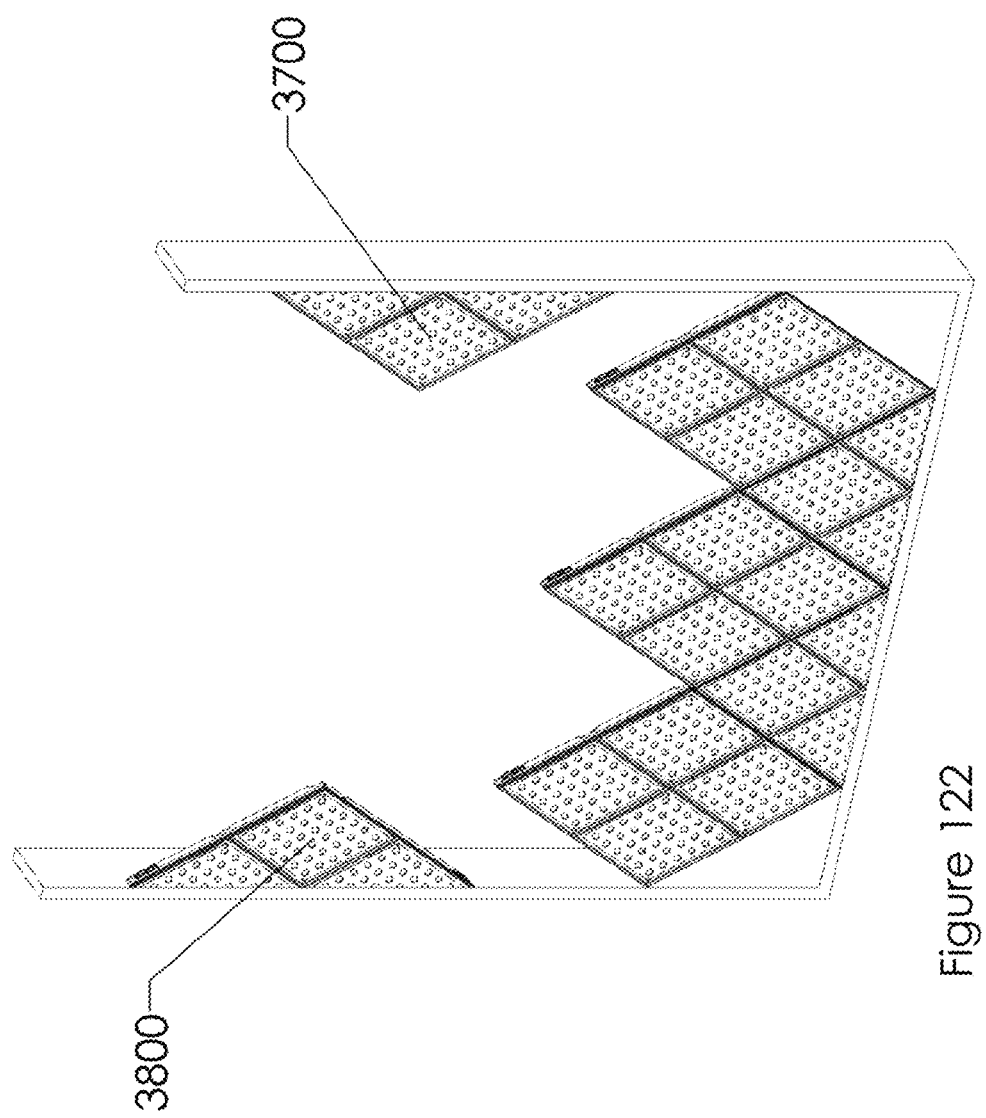

FIG. 122 shows the frame with two half female sections.

Figure 123:
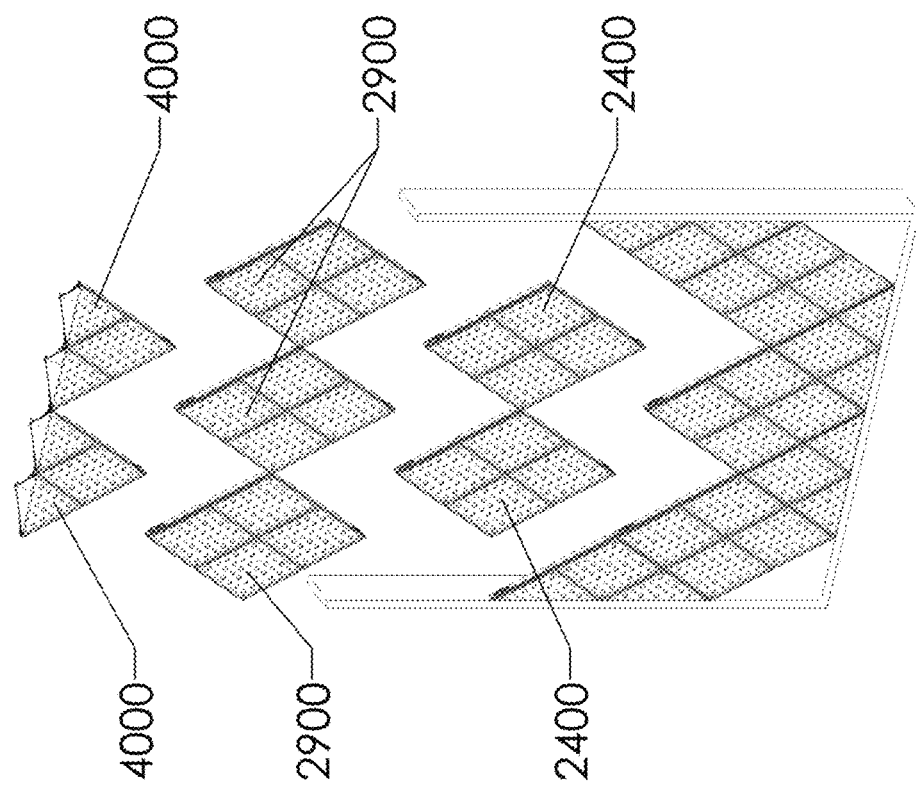

FIG. 123 shows the frame with the remainder of sections.

Figure 124:
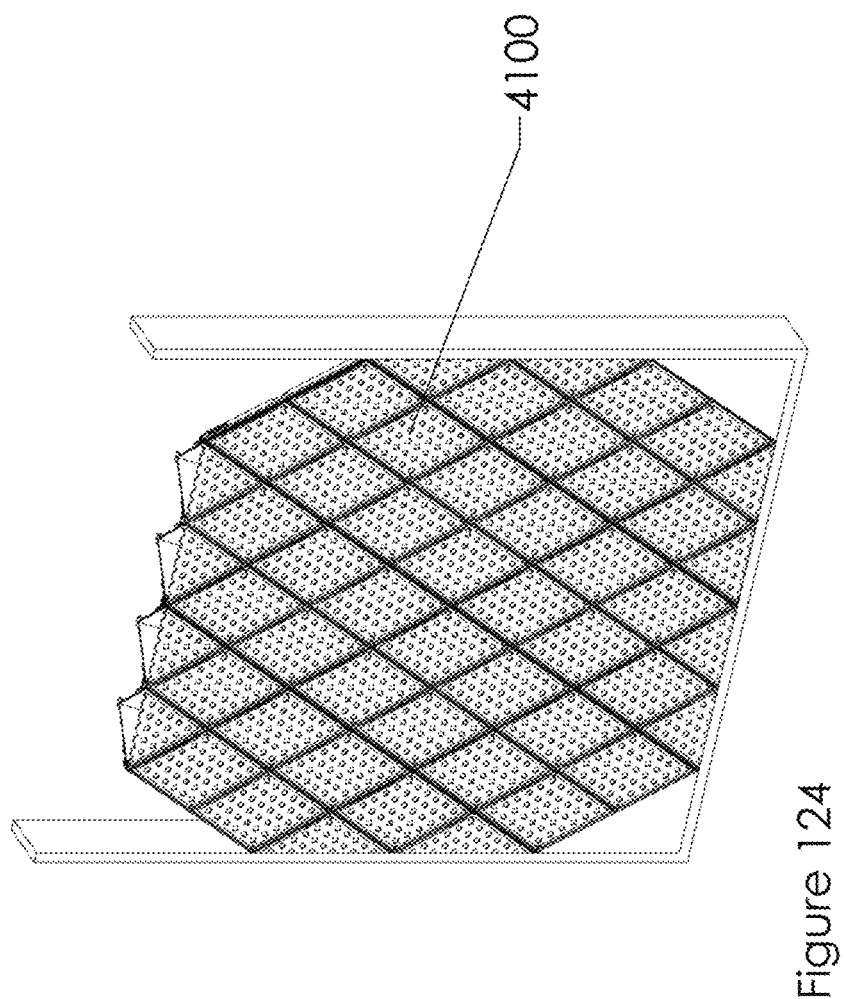

FIG. 124 shows the frame with the capacitor wall.

Figure 125:
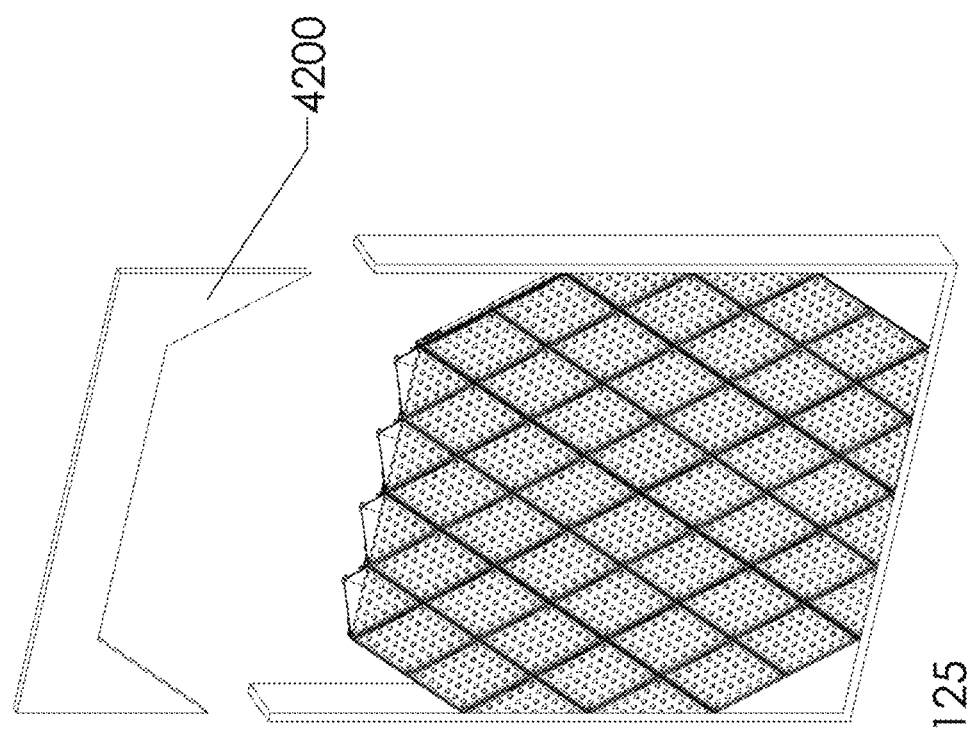

FIG. 125 shows the frame with the frame cover.

Figure 126A:
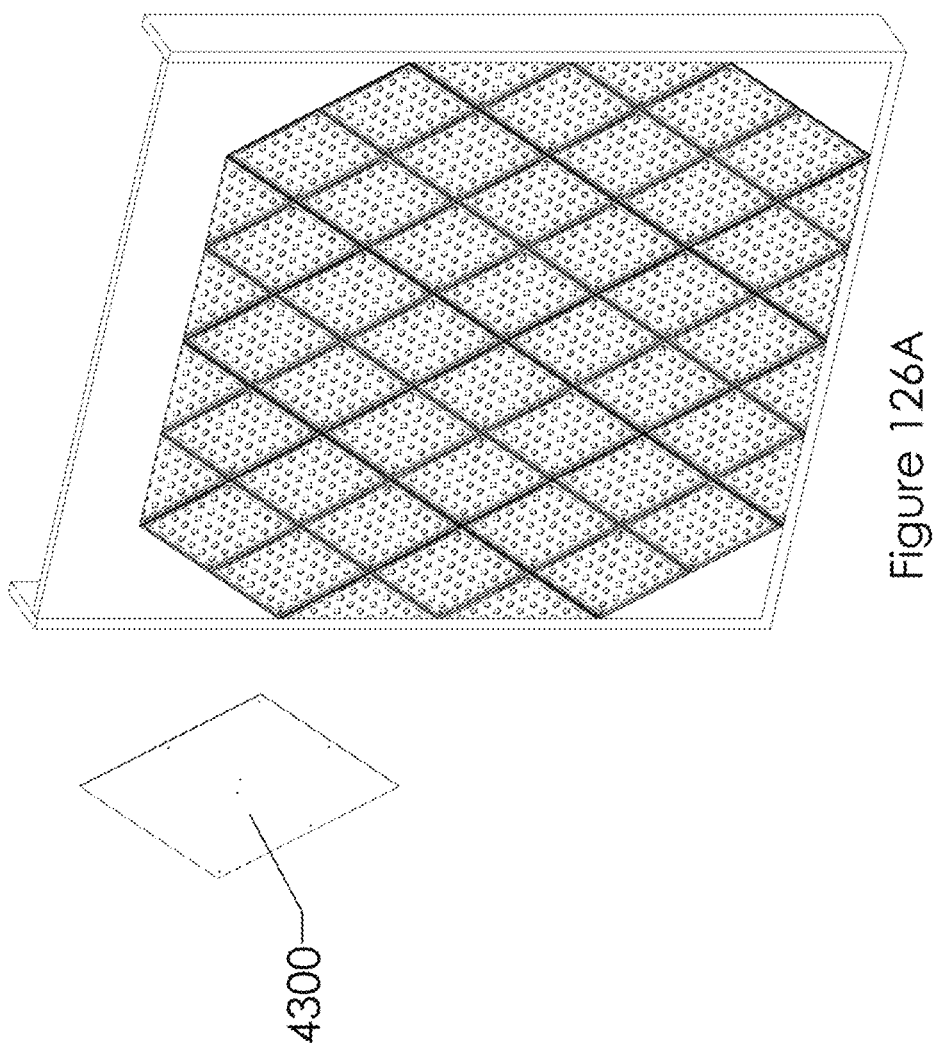

FIG. 126A shows the capacitor shield.

Figure 126B:
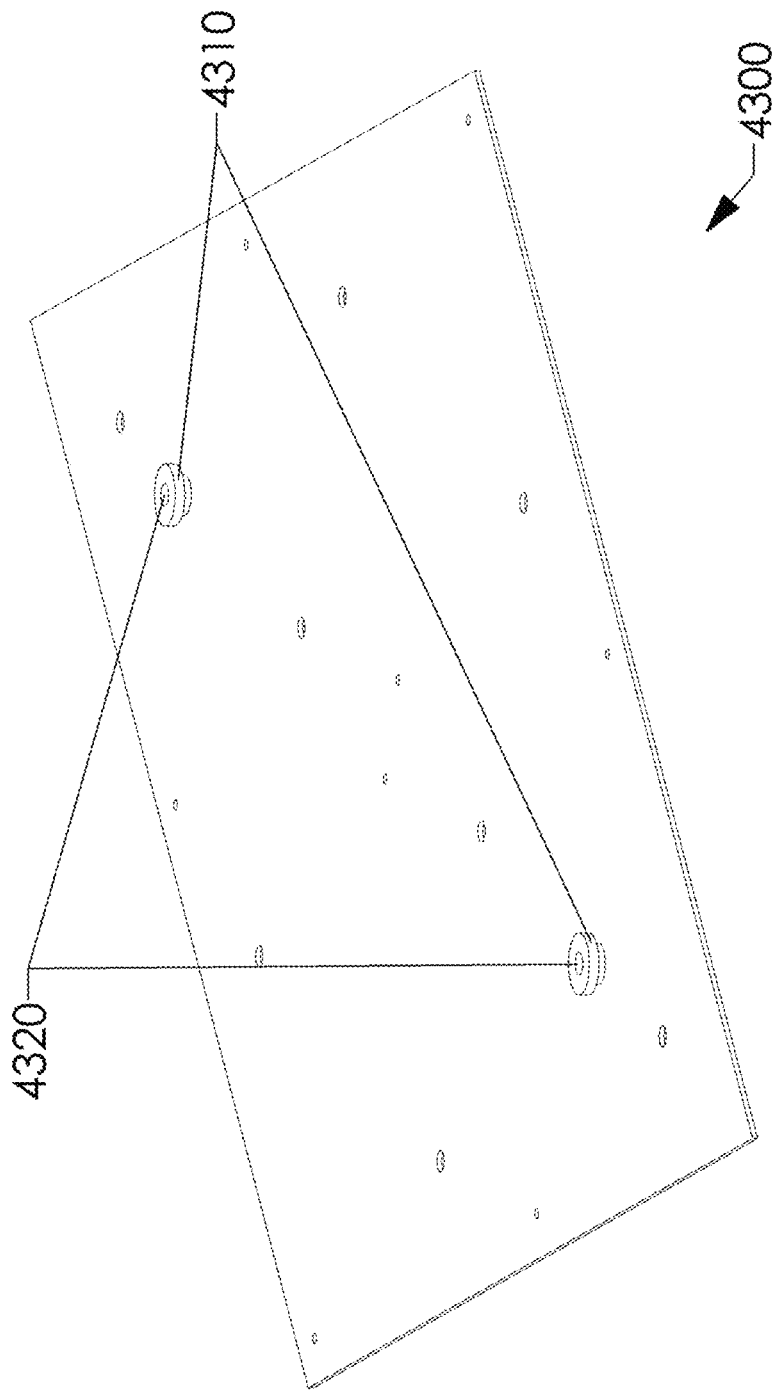

FIG. 126B shows the capacitor shield with maintenance handles.

Figure 127:
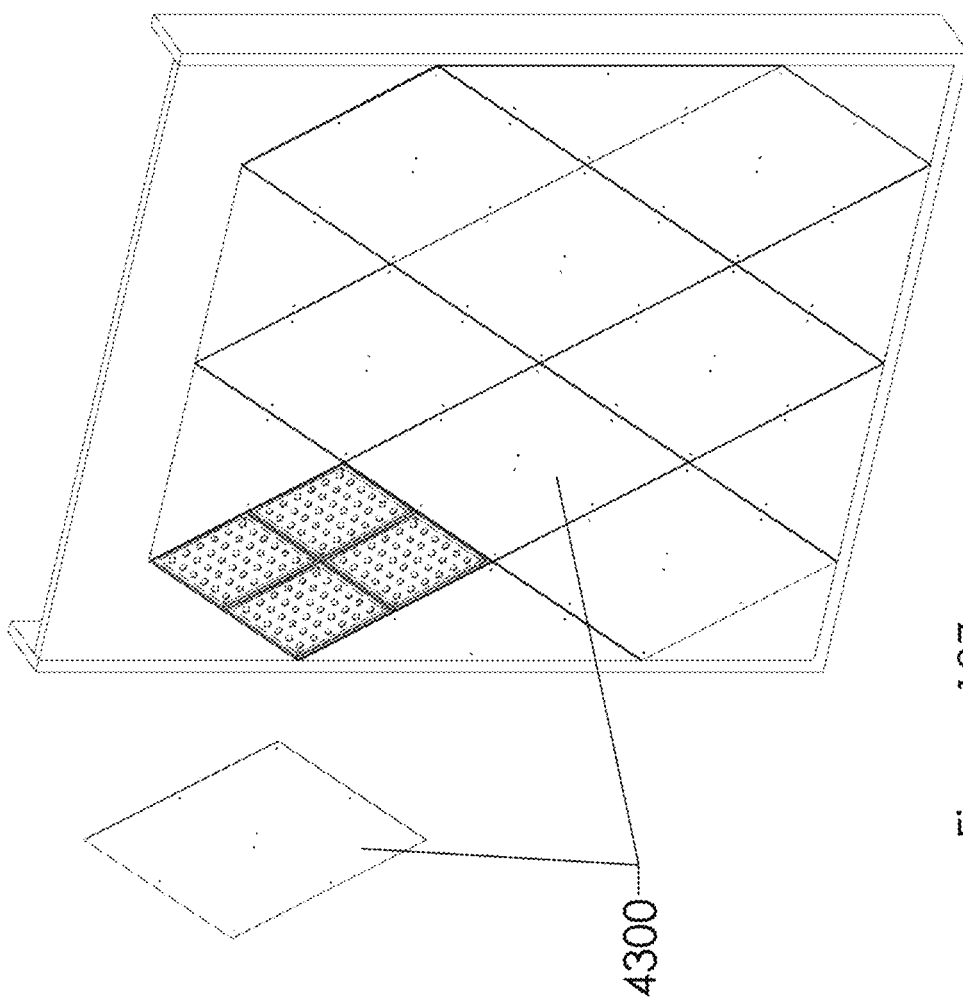

FIG. 127 shows the frame with multiple capacitor shields.

Figure 128:
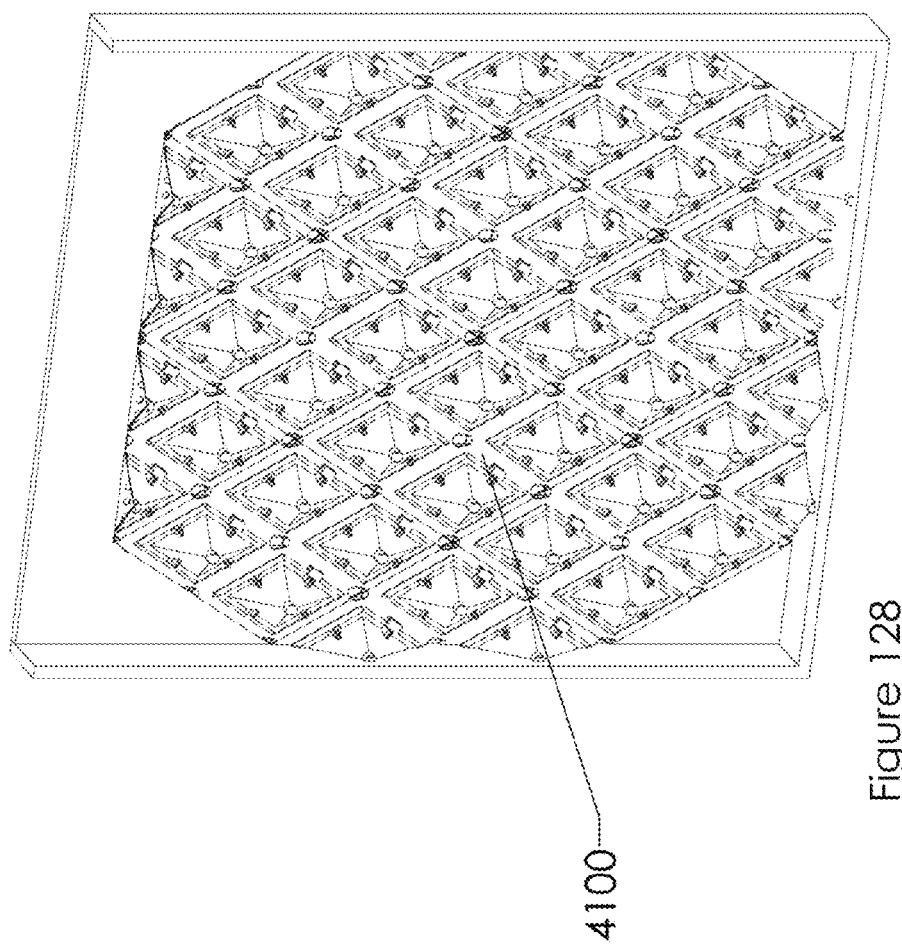

FIG. 128 shows another view of the pyramid wall frame.

Figure 129:
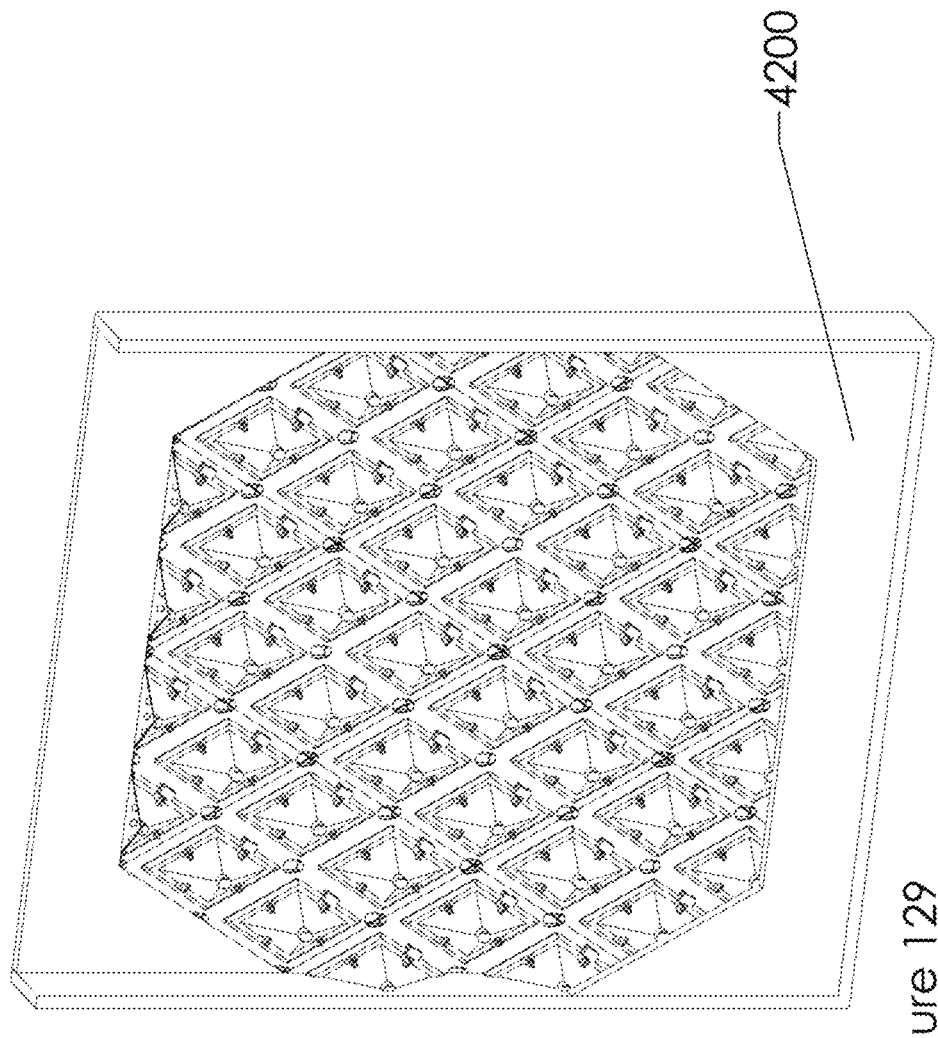

FIG. 129 shows the bottom of the pyramid wall frame with a frame cover.

Figure 130:
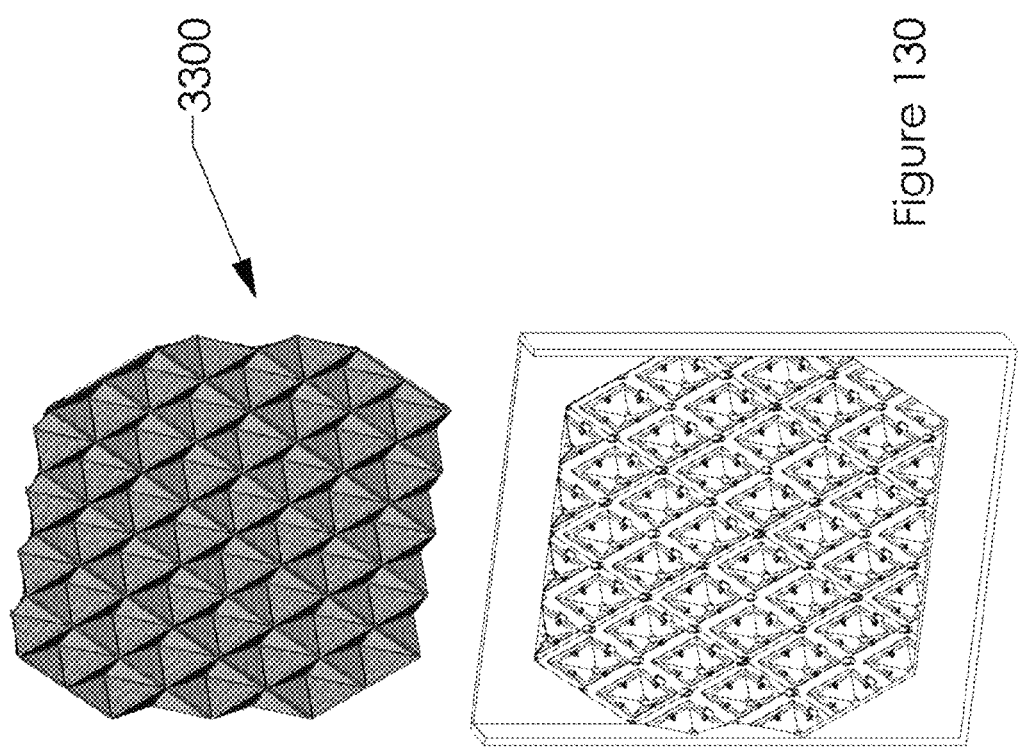

FIG. 130 shows the assembly with the solar panel wall.

Figure 131:
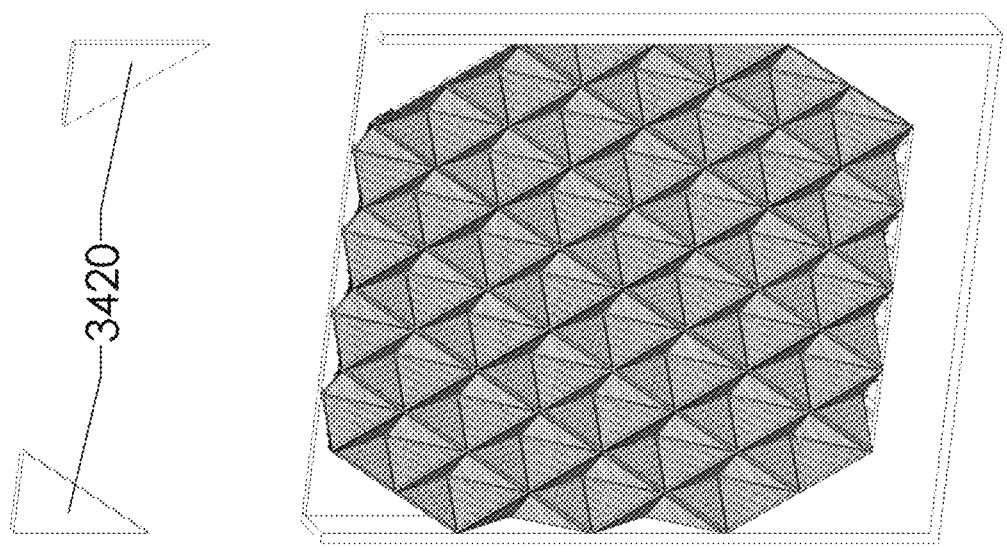

FIG. 131 shows the frame with pyramid frame corners.

FIG. 132 shows the pyramid wall frame with a top cover.

DETAILED DESCRIPTION OF THE INVENTION

This patent application claims priority from US Provisional Patent Application No. 62/321,287, filed Apr. 12, 2016, the disclosure of which is incorporated by reference herein in its entirety.

The non-limiting embodiment shown in the figures demonstrate a sequence of manufacturing and assembly steps involved in making diamond wall sections. Various elements of this embodiment may be described with specific measurements. In other embodiments, the dimensions of the elements may be adjusted accordingly, for example, to produce smaller or larger diamond wall sections. In further embodiments, the sequence of manufacturing and assembly steps may be reordered and various steps may be combined and/or omitted.

The pyramid shape has many benefits including strength and increased surface area. One main idea behind the pyramid wall system is threefold:
1) to create a lightweight, inexpensive, modular system that is self-sustaining with power.
2) to increase its capacity for energy storage and efficiency of its solar panels. The pyramid configuration of solar panels gives them 38% more surface area to be exposed to solar energy.
3) the exposed inside/out pyramid pattern reduces wind resistance on the sidewalls of tractor-trailers, similar to the idea of dimples on a golf ball used to extend flight. The reduced drag alone can save at least 11% annual fuel costs per vehicle.

The pyramid wall system is adaptable to structural frameworks that form many different geometric shapes (polyhedral) including, but not limited to, tetrahedrons (pyramids with 3 sides and a base), right pyramids (4 sides and a base), cubes, rectangular cuboids, etc. Wall sections may be sectioned further to form the boundary edge of a frame to support each face of the structure.

Figure 1:
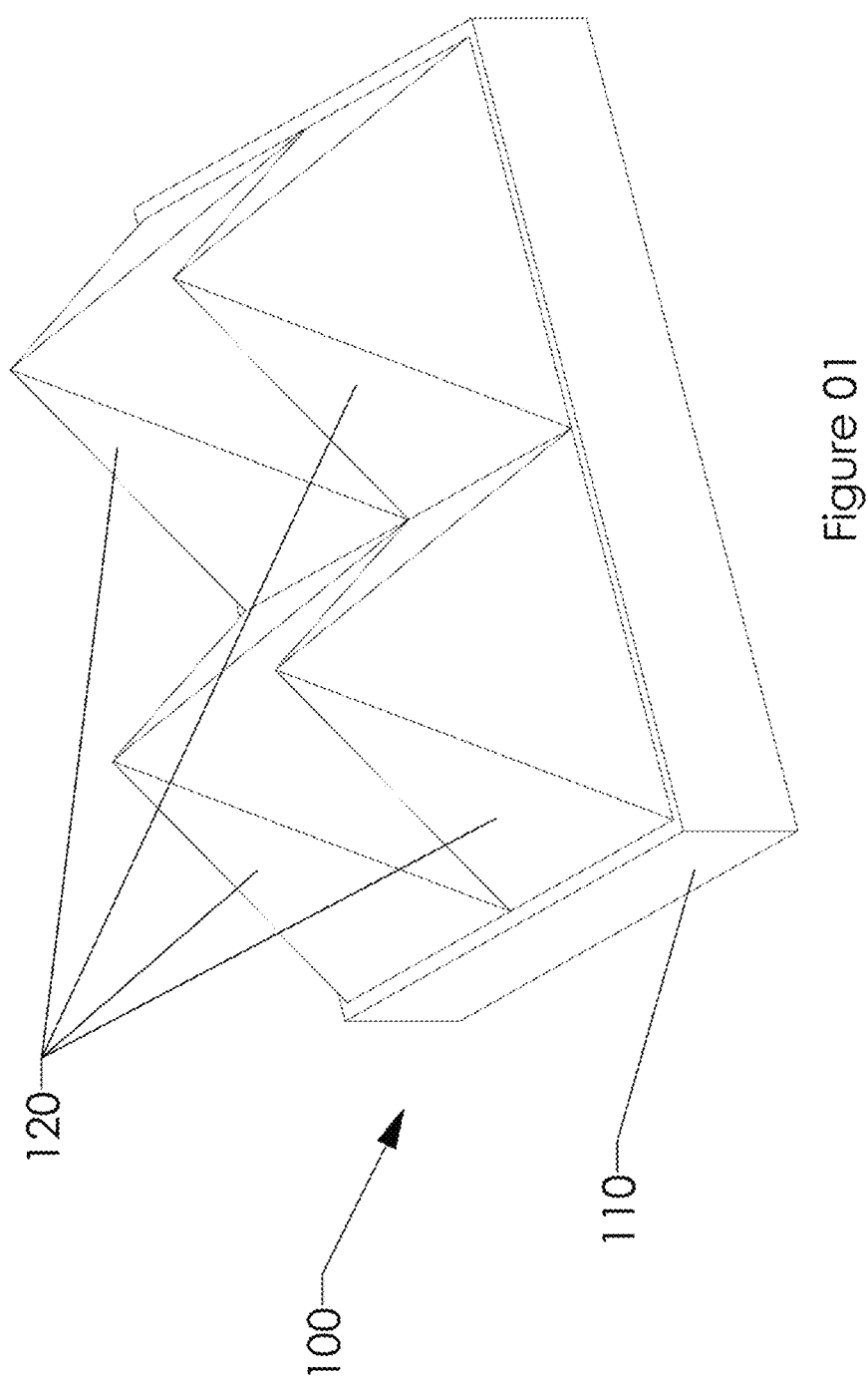
FIG. 01 shows a pyramid mold core in accordance with an embodiment.

The pyramid mold core 100 shown in FIG. 01 is the underlying form used to produce the carbon fiber housing. It may be 3D printed in thermoplastic using a process called Fused Filament Fabrication (FFF), also called Fused Deposition Modelling (FDM). In this process, plastic filament is fed into an extruder which melts and feeds it through a nozzle. The filament may have composite fibers added as well for additional strength and dimensional stability. Data from a 3D model is converted into code which determines the path of the extruder head, the speed of the path, flow rate of material and temperature. The extruder head is attached to a dual gantry setup, allowing servo motors to position it over a level build plate at various points along the X, Y & Z axis. There may be two or more extruder heads, each controlled independently.

The pyramid mold core 100 may be partially hollow with a latticed interior, or solid filled and/or electroplated for rigidity. The "foot print" 110 of the housing is diamond shaped, just under 29"×18" diagonally and 2" thick. It supports four sets of pyramid shaped bosses 120 which are just under 5" high from each base to their apices. The entire mold core 100 can be made in one piece.

Figure 2:
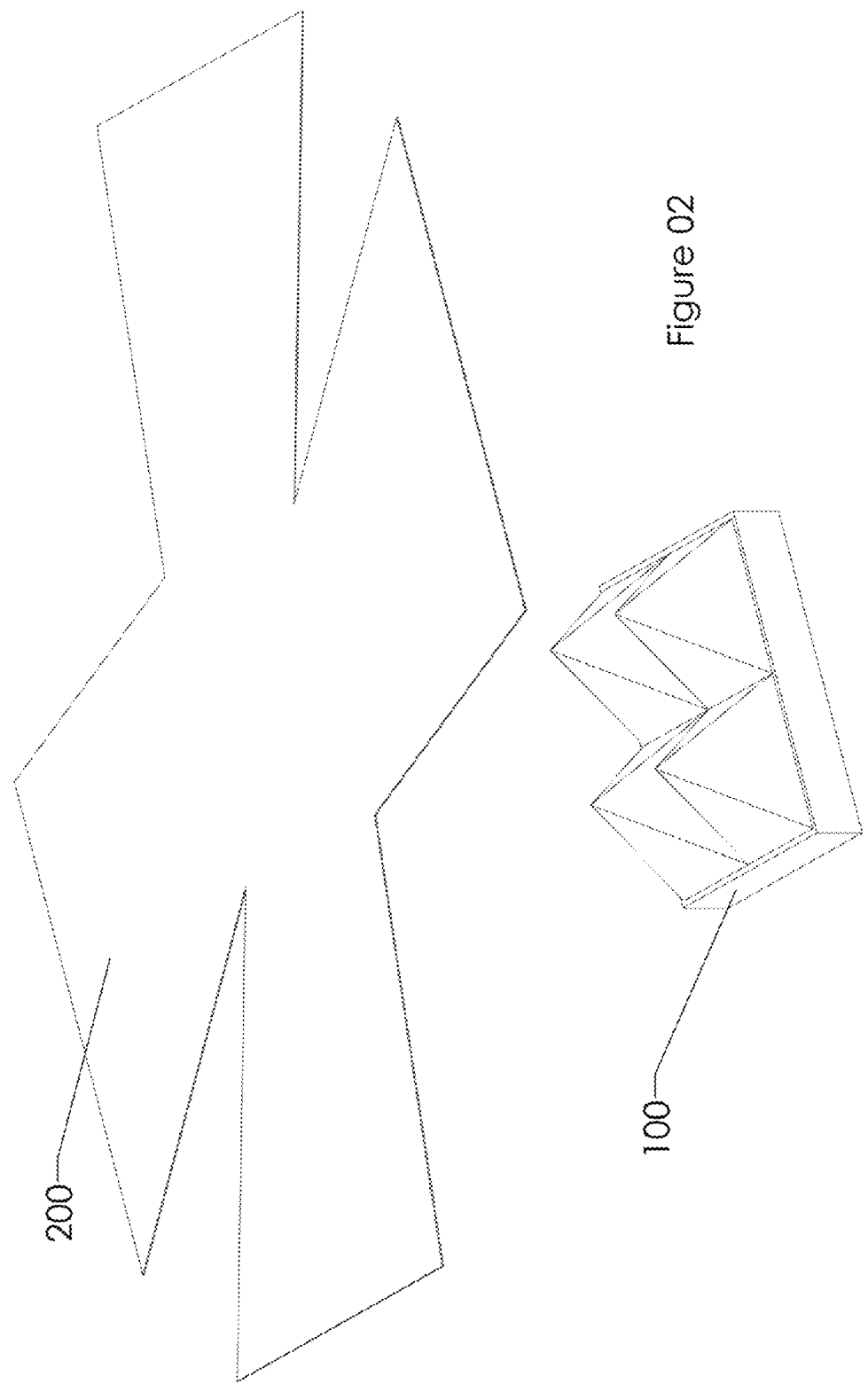
FIG. 02 shows a carbon fiber sheet sized to the pyramid mold core.
Figure 3:
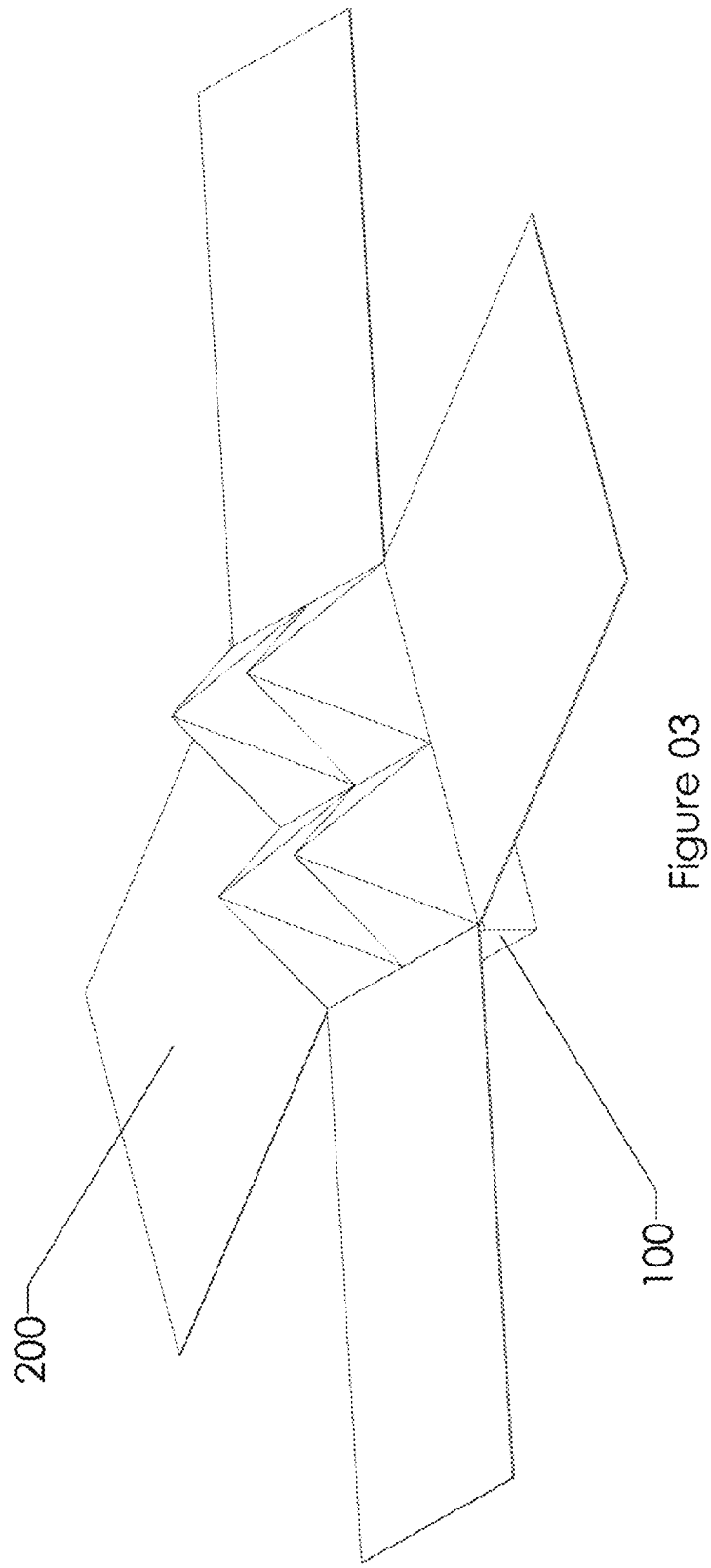
FIG. 03 shows the carbon fiber sheet after it has been vacuum formed to the pyramid mold core.

FIG. 02 shows a carbon fiber sheet 200 used to make the housing. Carbon fiber or its equivalent has several advantages over conventional materials and construction methods. It is lighter, stronger and more durable than wood or metal and can be formed into shapes not possible with these materials. It may be between 1 mm and 1.75 mm thick. The carbon fiber sheet 200 may be cut into a pattern based on where the seams are to be located and/or to provide openings when positioned. In FIG. 03 the carbon fiber sheet 200 is vacuum formed to take on the shape of the pyramid mold core 100.

Figure 4:
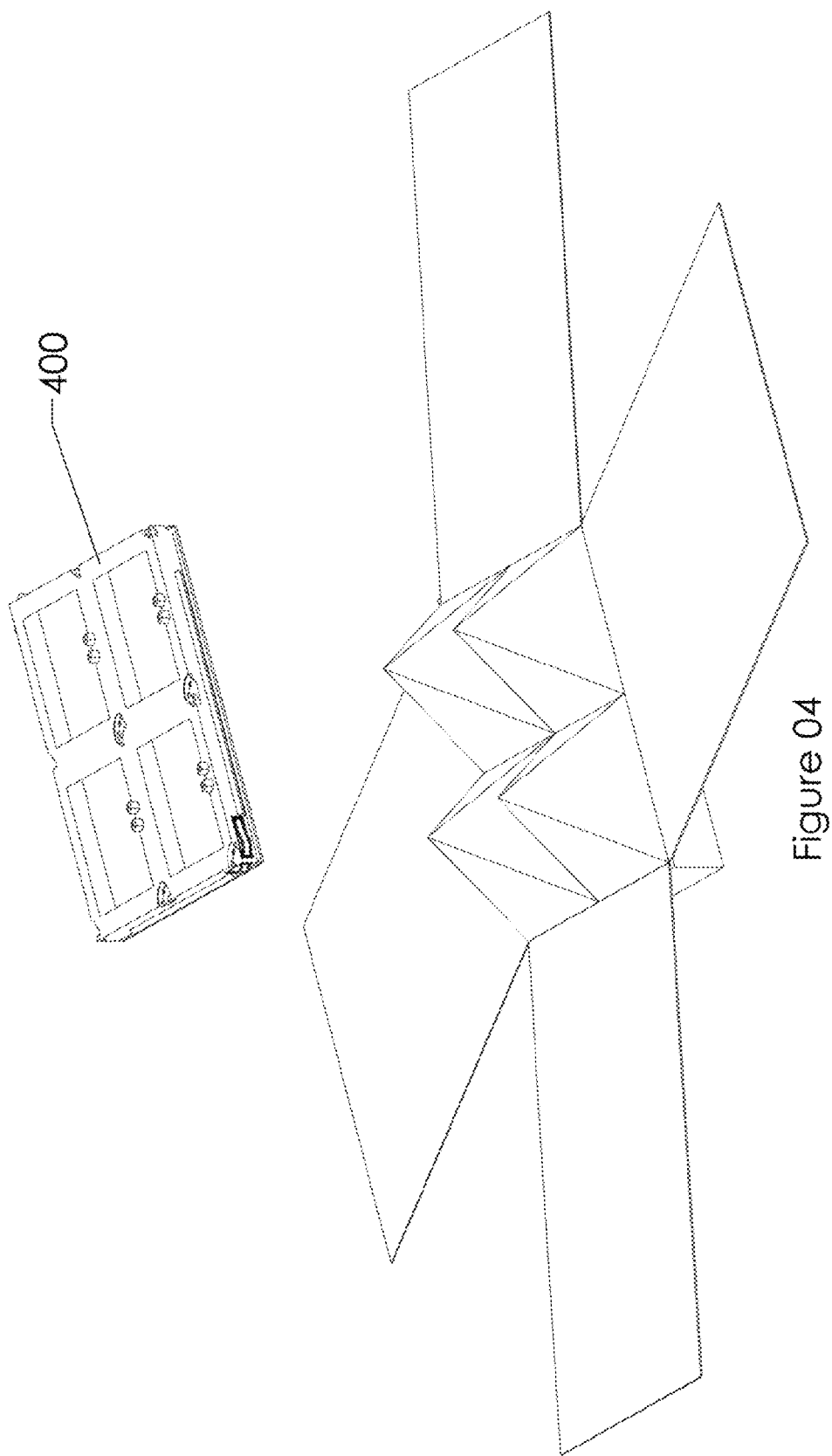
FIG. 04 shows a male conductive frame.

FIG. 04 shows a male conductive frame 400. This frame 400 creates a wireless unit and reduces the chance of long term damage by being embedded in the composite housing. This frame 400, referred to as a male—A—conductive frame, follows the contour of the pyramid walls. As shown in FIGS. 05-17, the frame 400 is 3D printed with dual materials; the first being an insulative thermoplastic which forms the outer shell (500), as well as the first and second insulative layers (which alternate between the conductive layers). The second material may be conductive, such as a graphene infused thermoplastic as one non-limiting example. It forms the first and second conductive layers as well as the "bird bone" core 1300, a hollow light weight internal structure to allow airflow.

This bird bone core 1300 is a structural component providing increased strength at a fraction of the weight. The bird bone core 1300 also provides airflow (e.g., an inert gas flow) which allows a positive ionic current as low pressure gas flows through the lattice increasing current flow. As described below, the bird bone core 1300 also provides a conductive path for sections with solar panels 1800.

In one non-limiting embodiment, the outer shell 500 has post slots 510 along the top face to allow locking posts 1660 to connect the diamond sections. This design may be used where space between back to back wall sections is restricted.

In another non-limiting embodiment, post/slot combinations can be part of the outer shell 500 when space is not as restricted. Post slots 510 would be replaced with a raised cylindrical post that has a blind channel cut into the side. The profile of the channel has a "T" shaped cross section with a radiused inner face. (See FIGS. 14, 40, 83, 87, 88 & 97 for original post slots 510). Locking posts 1660 may be replaced with shouldered cylindrical bosses to create a "T" shaped post to fit inside these channels. (See FIGS. 36-39, 85, 87 & 88 for original locking posts 1660).

Figure 14:
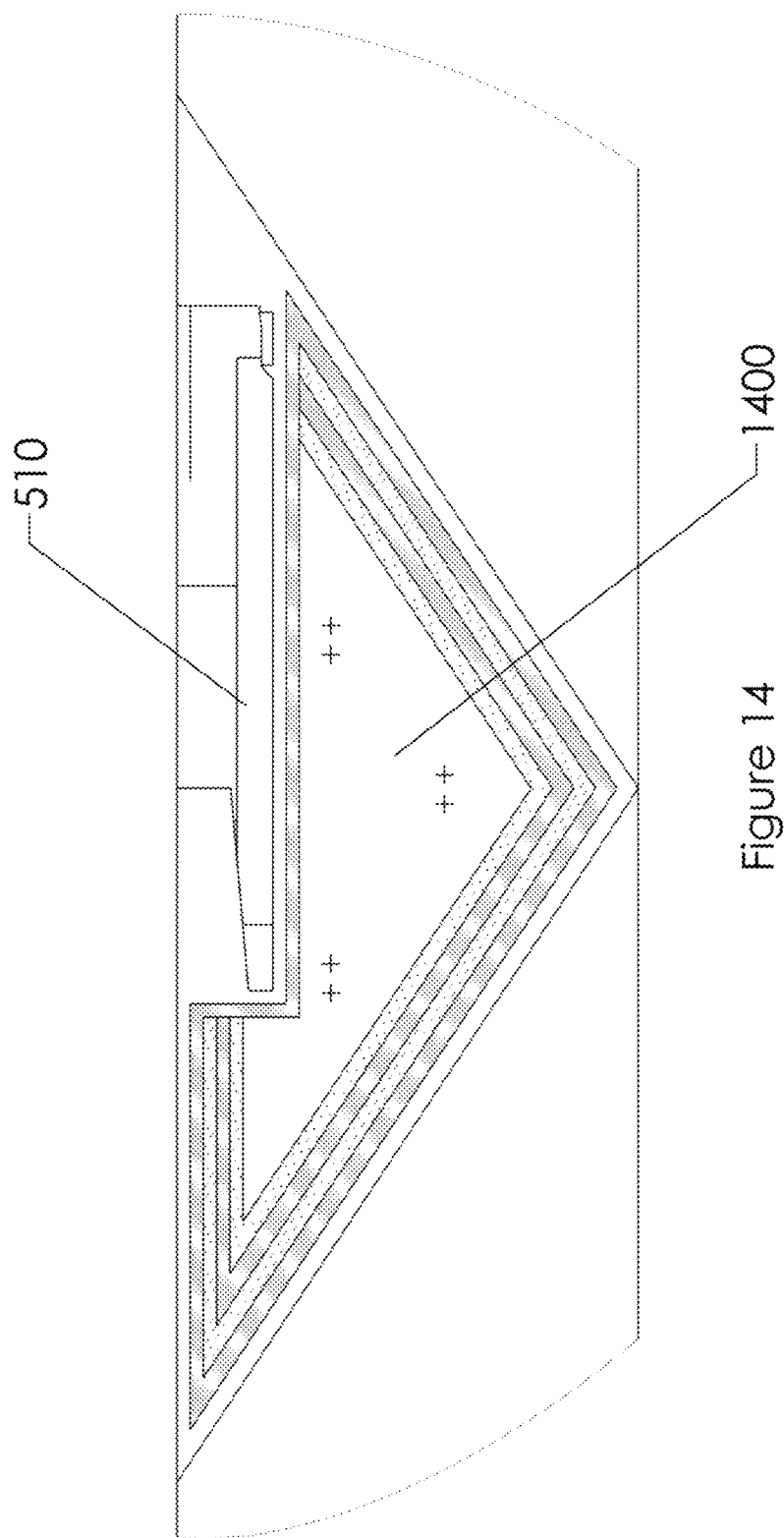
FIG. 14 shows an alternate cross section of the male conductive frame.

In this non-limiting embodiment, the frame 400 is greatly simplified by removing slot features that cut into various layers of conductors and insulators (see FIG. 14). The "V" shaped bosses 520 and grooves 530 along the sides help with alignment and securing. Four sets of ball socket bosses 540 connect the panel rack plugs to the first and second conductive layers. Each corner along the long diagonal has open rectangular slots 550 between connector tabs 560 for the first conductive layer 900 and connector tabs 570 for the second conductive layer 1200. The frame 400 is then placed over the raw carbon fiber material 200.

Figure 5:
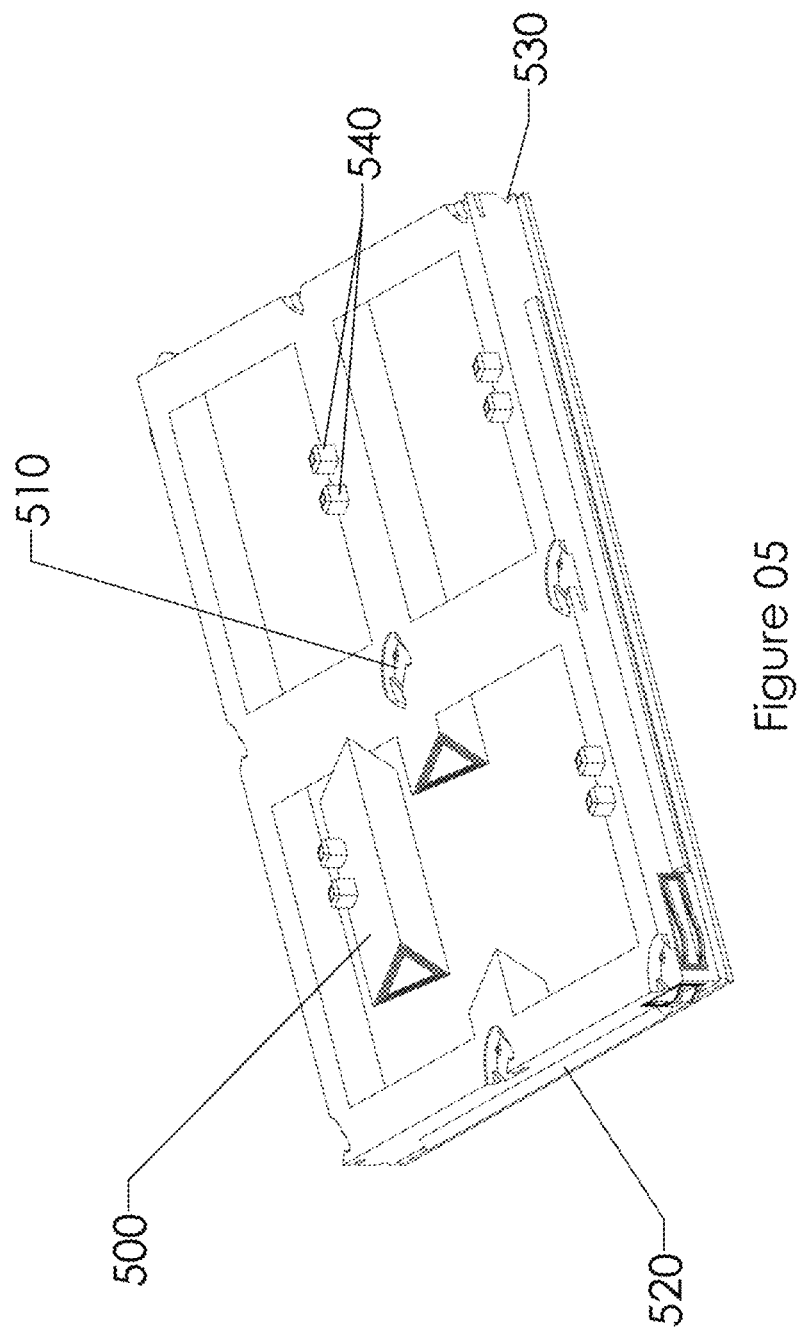
FIG. 05 shows a close-up of a section of the male conductive frame.

FIG. 05 highlights a cross section 500 of the frame 400. FIGS. 06-13 isolate various components and features of this cross section.

Figure 6:
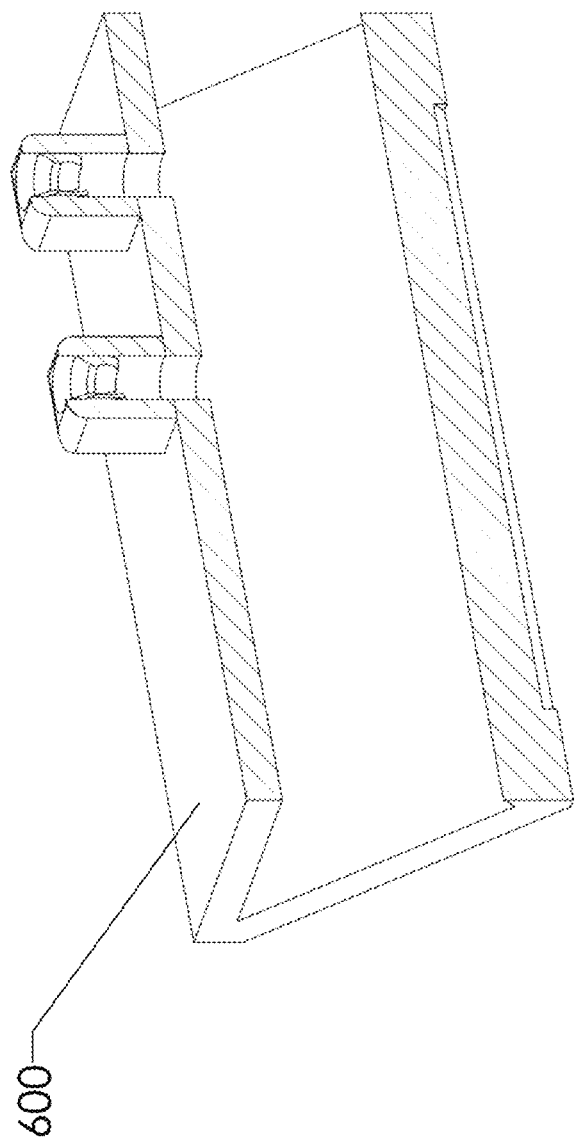
FIG. 06 shows an outer shell section of the male conductive frame.

FIG. 06 shows the outer shell section 600 having half of the "V" profile of this cross section. Here, the ball socket bosses 540 and ball socket snap fits 700 are shown. They may be made of an insulative thermoplastic.

Figure 7:
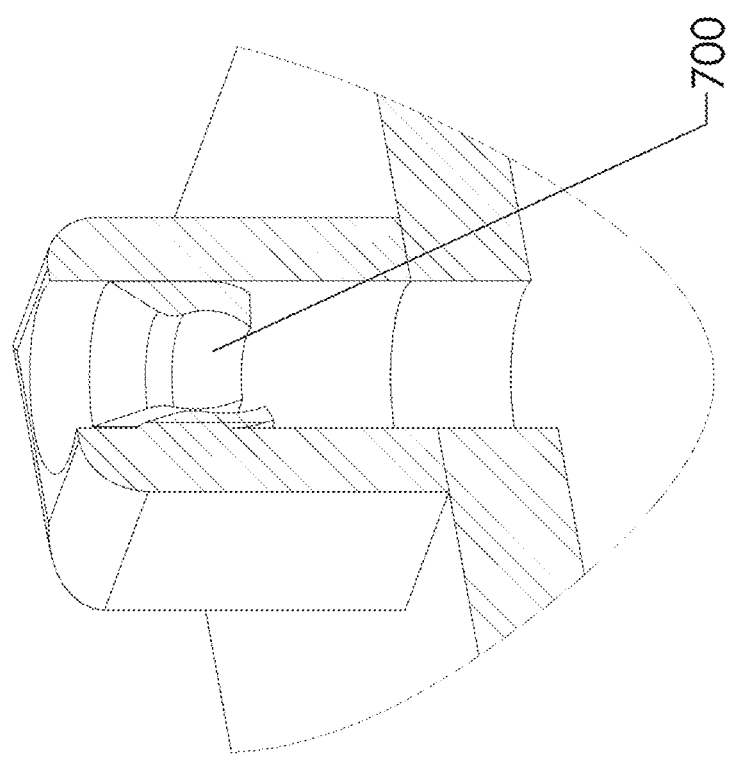
FIG. 07 shows ball socket detail of the outer shell section for a panel rack plug.
Figure 61:
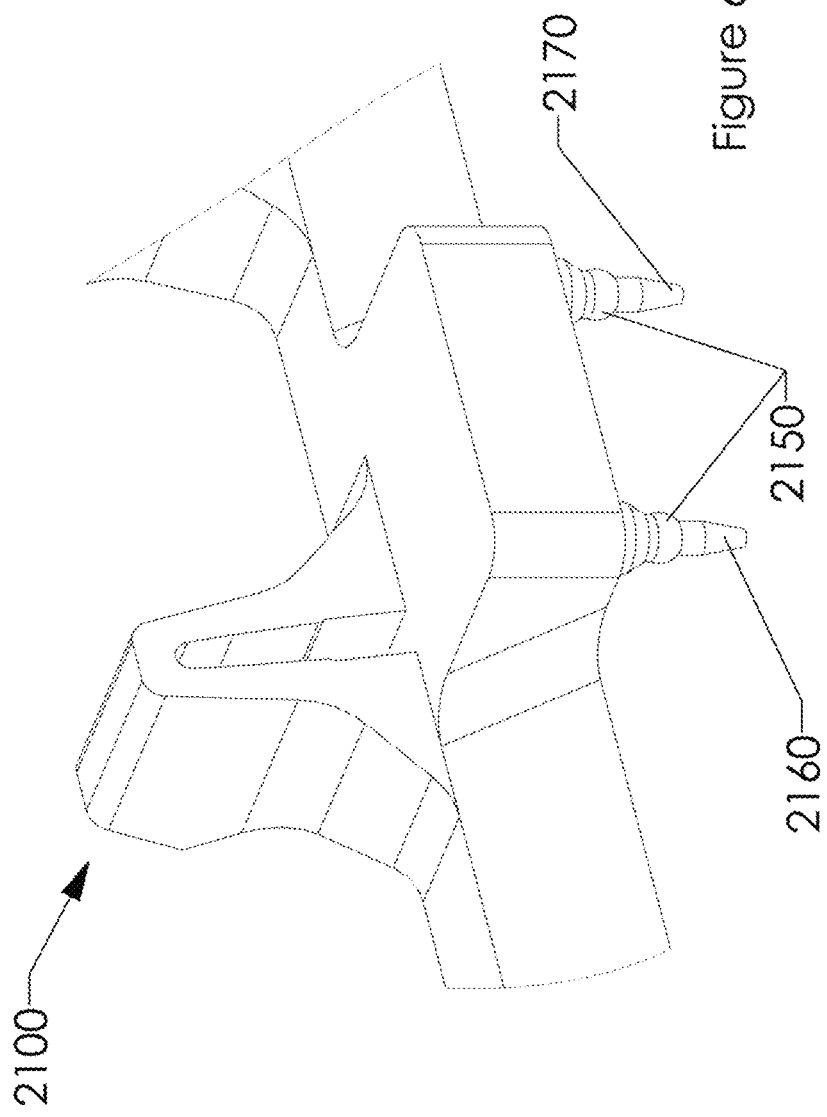
FIG. 61 shows a cutaway of a connection rack.

FIG. 07 shows details of one of the ball socket snap fits 700 used to secure the ball joints 2150 of the panel rack plugs (see FIG. 61). They have a spherical cavity with three relief slots to help conform to the ball shaped plug and then engage the ball shaped plug when in place.

Figure 8:
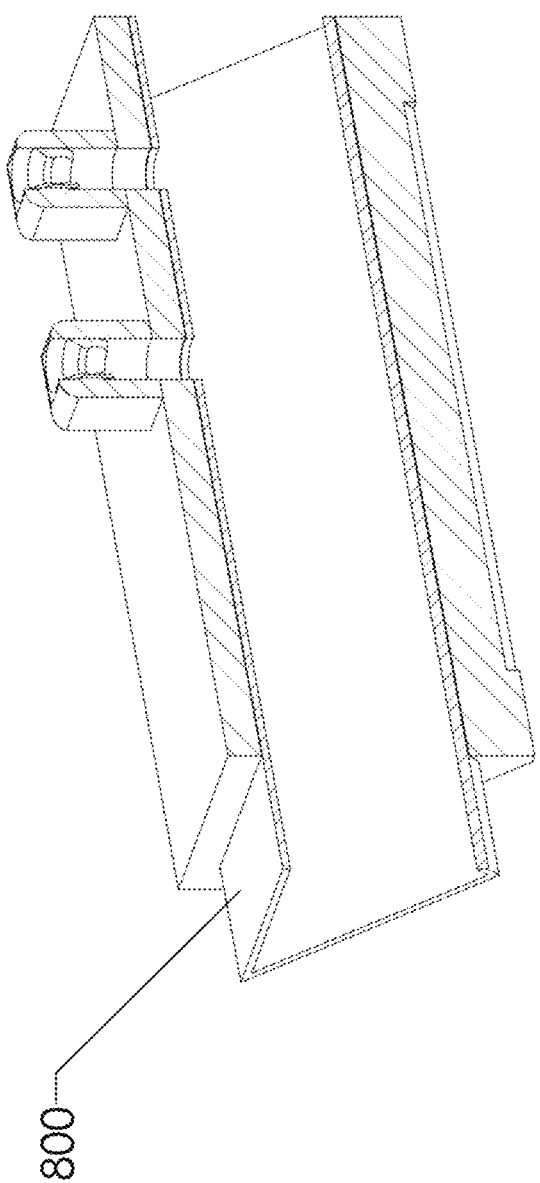
FIG. 08 shows a first insulative layer of the male conductive frame.

FIG. 08 shows the first insulative layer 800 which is the same material as the outer shell. It can be differentiated because it follows the contour of the first conductive layer (see FIG. 9). In this non-limiting embodiment, the material is approximately 1/32" thick.

Figure 9:
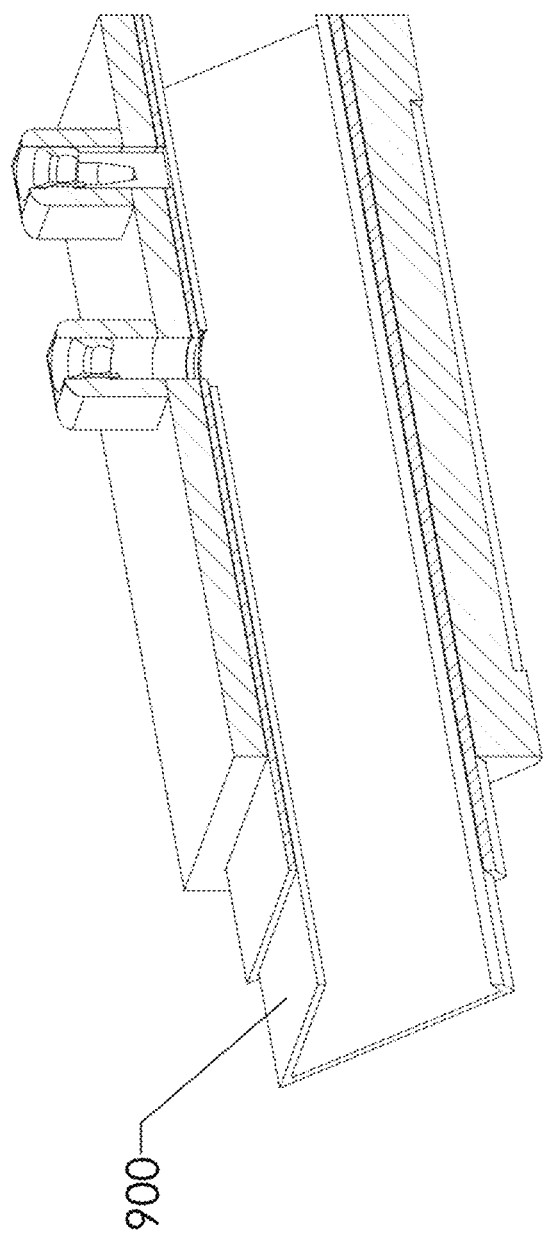
FIG. 09 shows a first conductive layer of the male conductive frame.

FIG. 09 shows the first conductive layer 900 which may be printed with a graphene infused/embedded thermoplastic (or equivalent). This layer 900 conducts a negative charge, terminates with a conical shaped receptacle 1000 and may be approximately 1/32" thick in this non-limiting embodiment.

Figure 10:
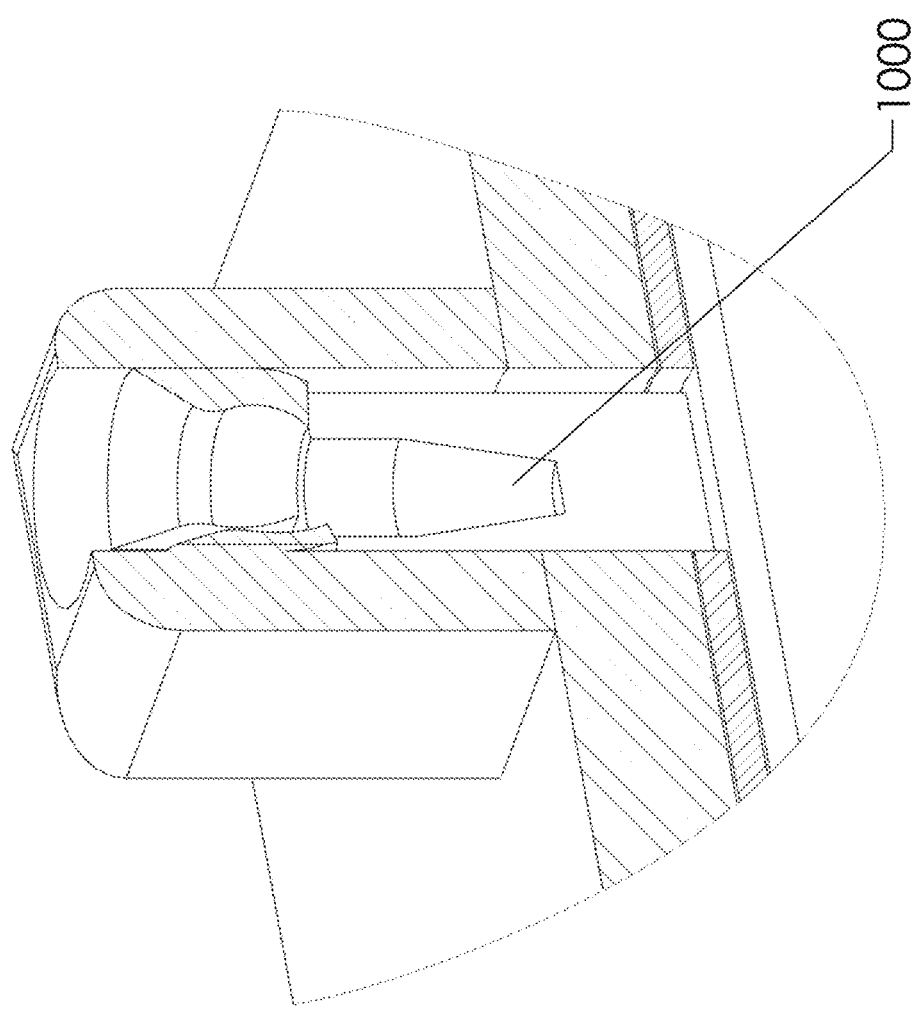
FIG. 10 shows contact detail of the first conductive layer.

In FIG. 10, the details are shown of the conical shaped receptacle 1000 for the plug tip. This is the electrical contact for the first conductive layer 900 when the ball joint 2150 (see FIG. 61) is in place in the ball socket snap fits 700 inside of their ball socket bosses 540.

Figure 11:
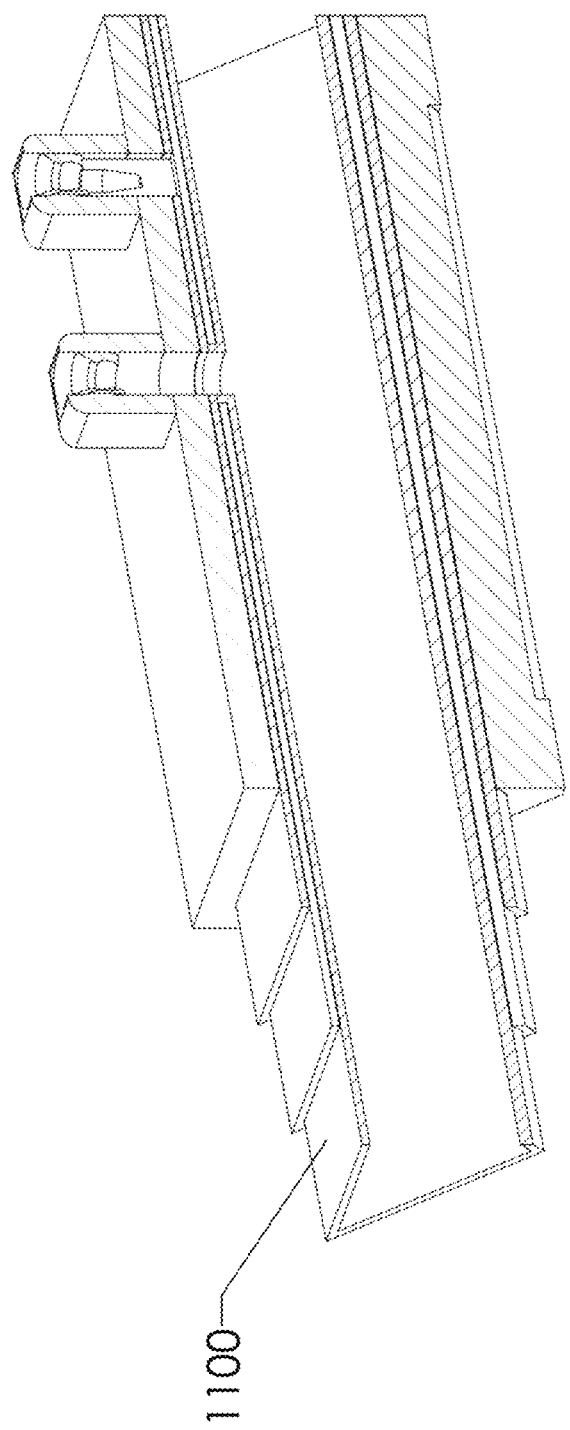
FIG. 11 shows a second insulative layer of the male conductive frame.

The second insulative layer 1100, shown in FIG. 11, is the same material as the outer shell 600 and the first insulative layer 800. This second insulative layer 1100 is sandwiched between the first and second conductive layers 900, 1200 and, in this non-limiting embodiment, is approximately 1/32" thick.

Figure 12:
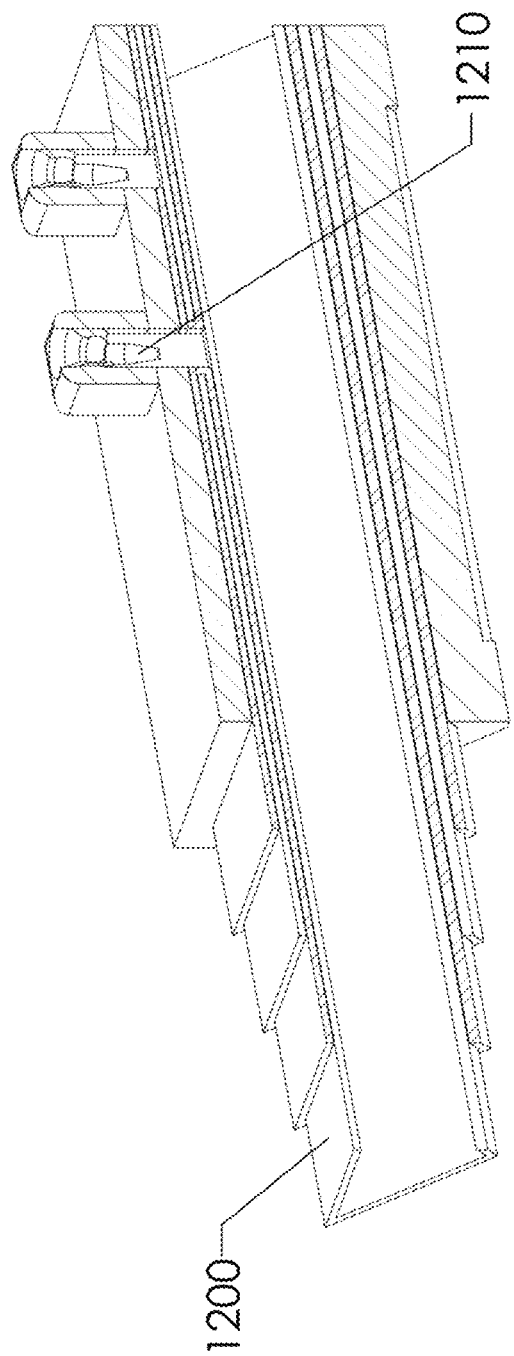
FIG. 12 shows a second conductive layer of the male conductive frame.

FIG. 12 shows the second conductive layer 1200. This layer 1200 is the same material as the first conductive layer 900 except that it conducts a positive charge and terminates with a conical shaped receptacle 1210. It can be considered a shell of the "bird bone" core 1300 (shown in FIG. 13) but is distinguished because it follows the contour of the second insulative layer 1100. In this non-limiting embodiment, the second conductive layer 1200 is approximately 1/32" thick.

Figure 13:
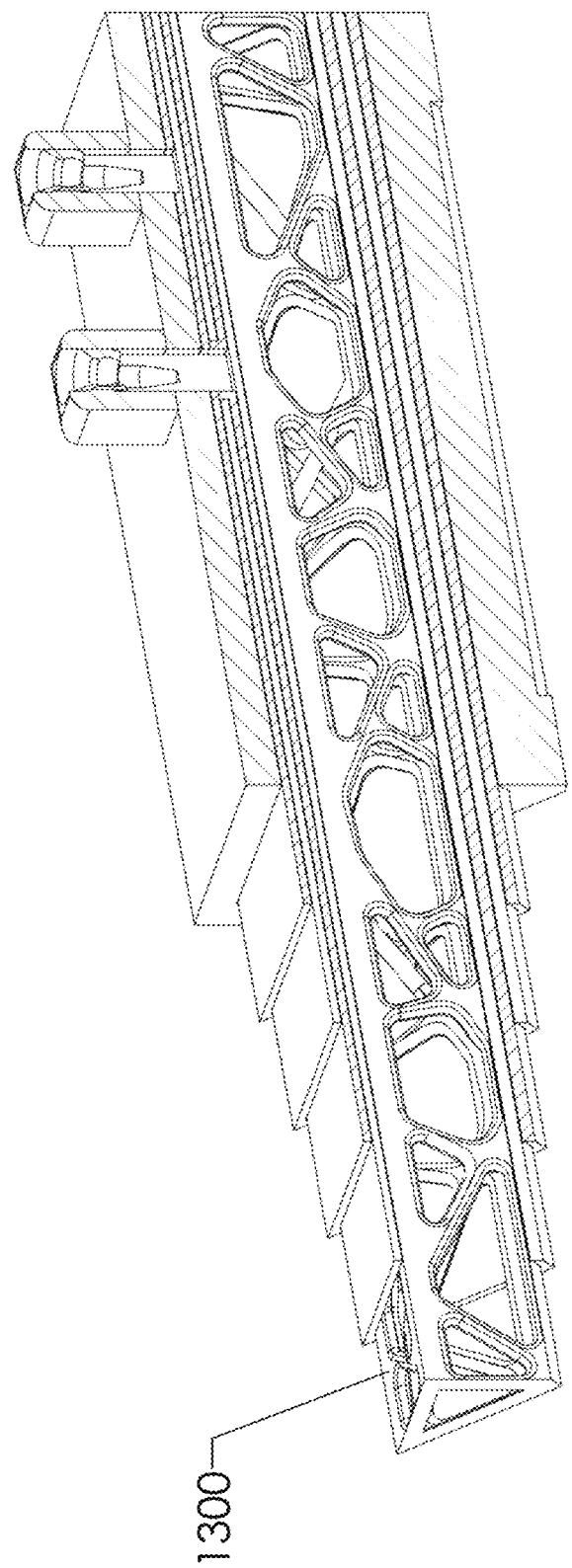
FIG. 13 shows a bird bone section of the male conductive frame.

The bird bone section 1300 of FIG. 13 is also the same material as the first and second conductive layers 900, 1200 and carries a positive charge. The shape of this core 1300 can be hollow and organic, like a bird bone in order to be lightweight and to offer some structural reinforcement while allowing airflow.

FIG. 14 shows an alternate cross section of the layers of the frame in an end view. Starting at the center 1400, the "bird bone" 1300 is positively charged, surrounding the center 1400 is the second conductive layer 1200 (positively charged), then the second insulative layer 1100, then the first conductive layer 900 (negatively charged), then the first insulative layer 800 and finally the shell 600 on the outside. Post slots 510 are shown at the top of the image. (Note that in this example, the second insulative layer 1100 is not continuous, for example, due to limited space).

Figure 15:
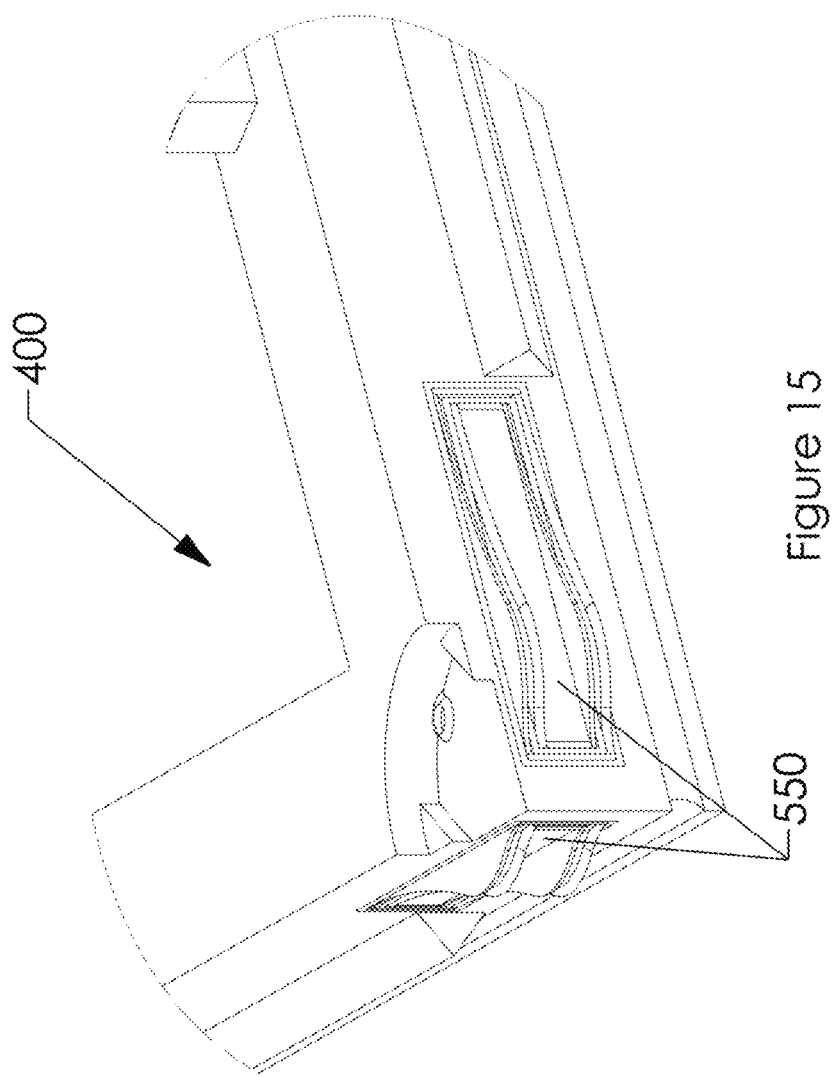
FIG. 15 shows connector detail of the male conductive frame.
Figure 16:
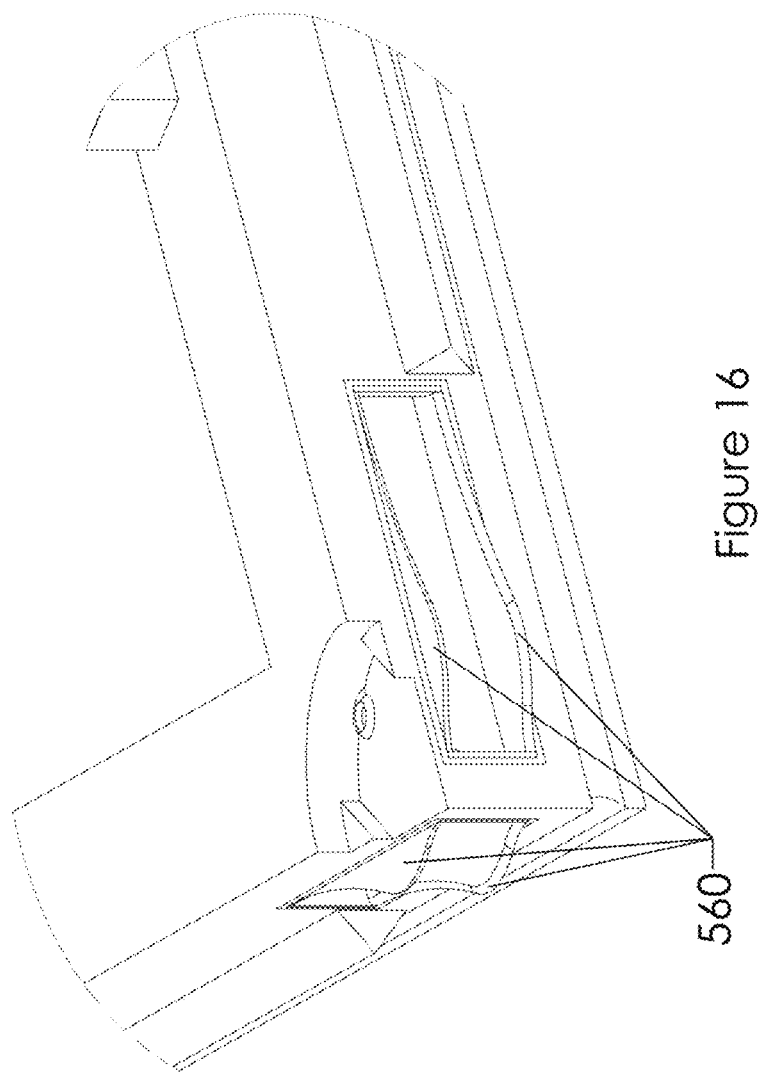
FIG. 16 shows male frame connector tabs for a first conductive layer of the male conductive frame.
Figure 17:
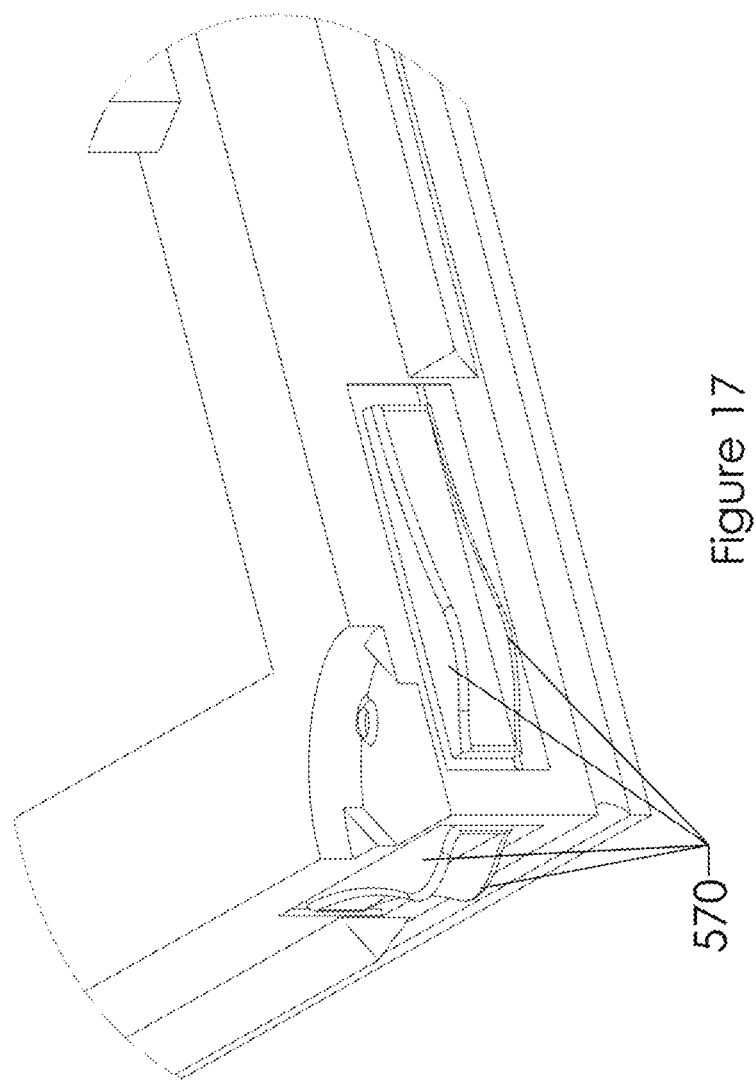
FIG. 17 shows male frame connector tabs for second conductive layer of the male conductive frame.

FIG. 15 shows a cropped view of a male—A—conductive frame 400, with open rectangular slots 550 at the corners. These slots are openings in the conductive "bird bone" core 1300 to allow the flow of low pressure gas between panel sections when they are connected. FIG. 16 shows an isolated view of the connector tabs 560 for the first conductive layer 900. The outer border of this layer and these tabs is the first insulative layer 800. FIG. 17 shows an isolated view of the connector tabs 570 for the second conductive layer 1200. The outer border of this layer and these tabs is the second insulative layer 1100.

Figure 18:
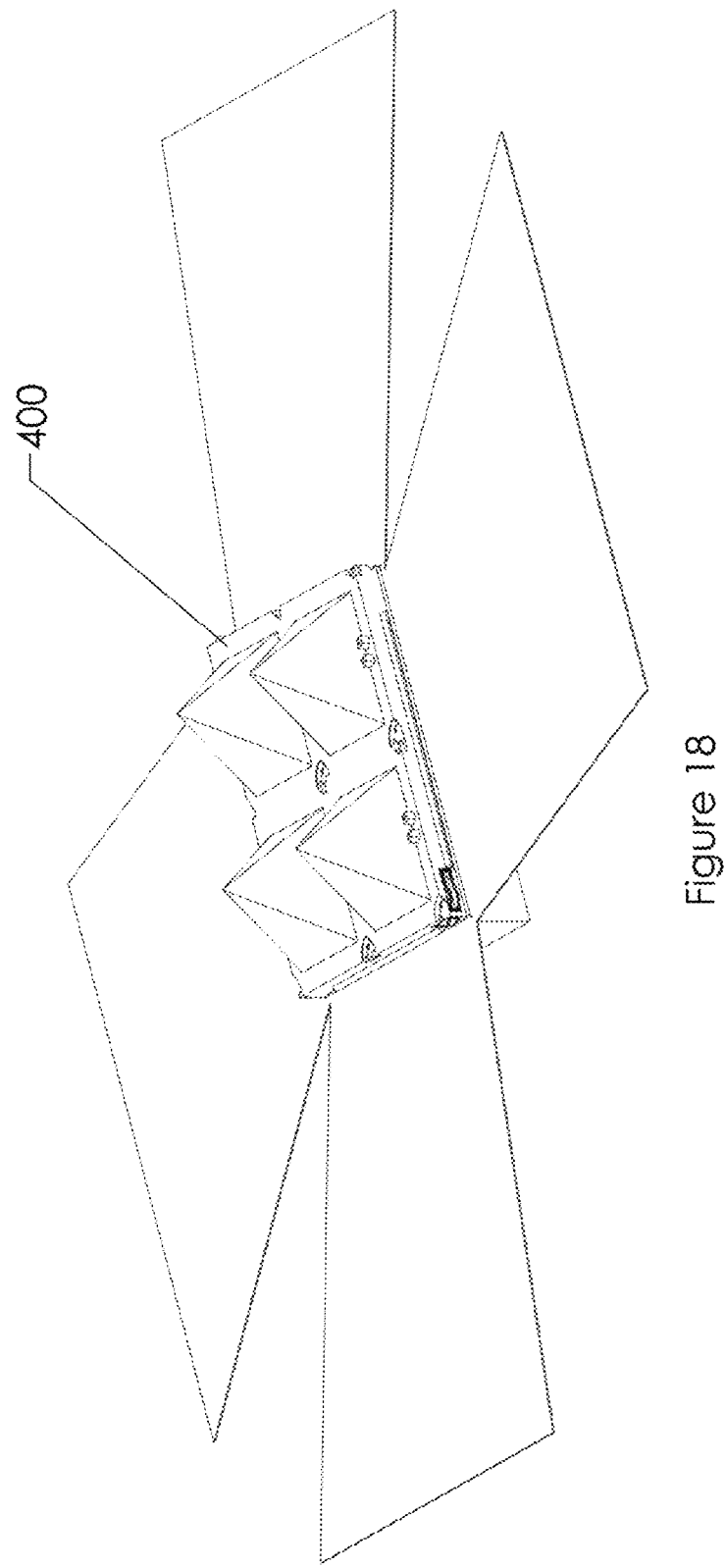
FIG. 18 shows the frame positioned with the pyramid mold core.
Figure 19:
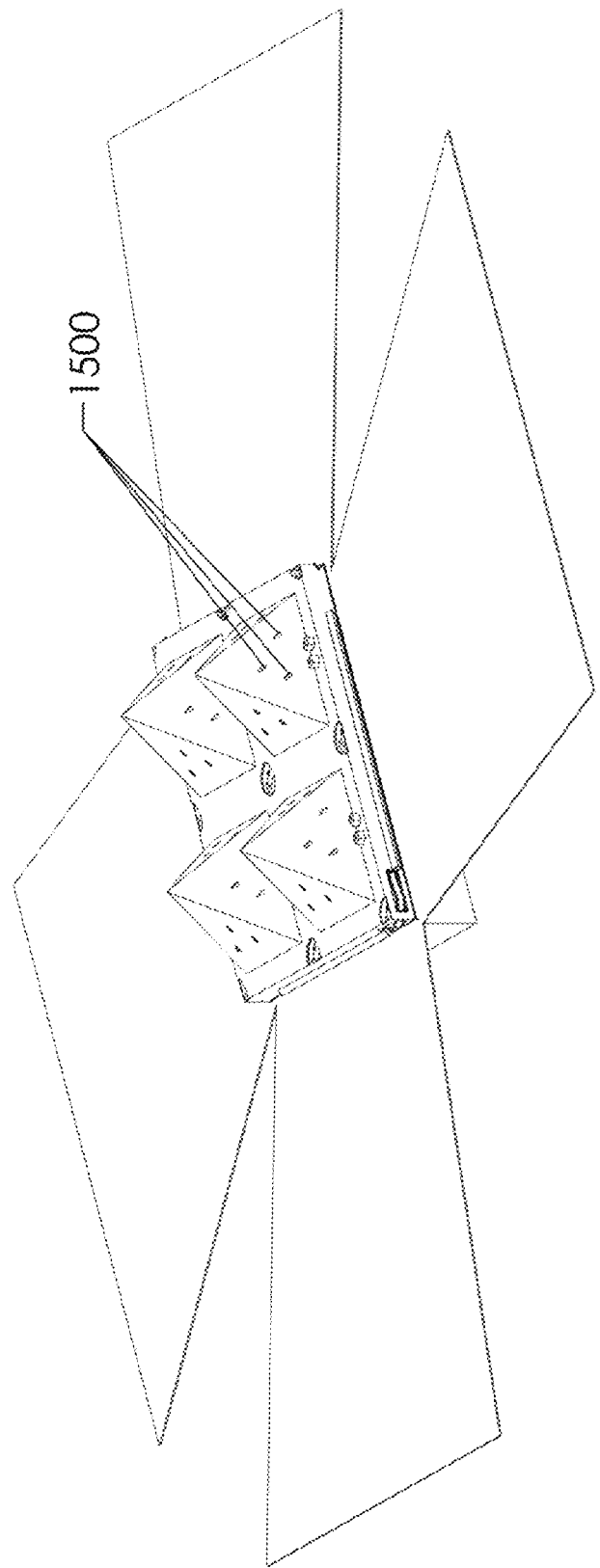
FIG. 19 shows "keyhole" slots in carbon fiber sheet.
Figure 20:
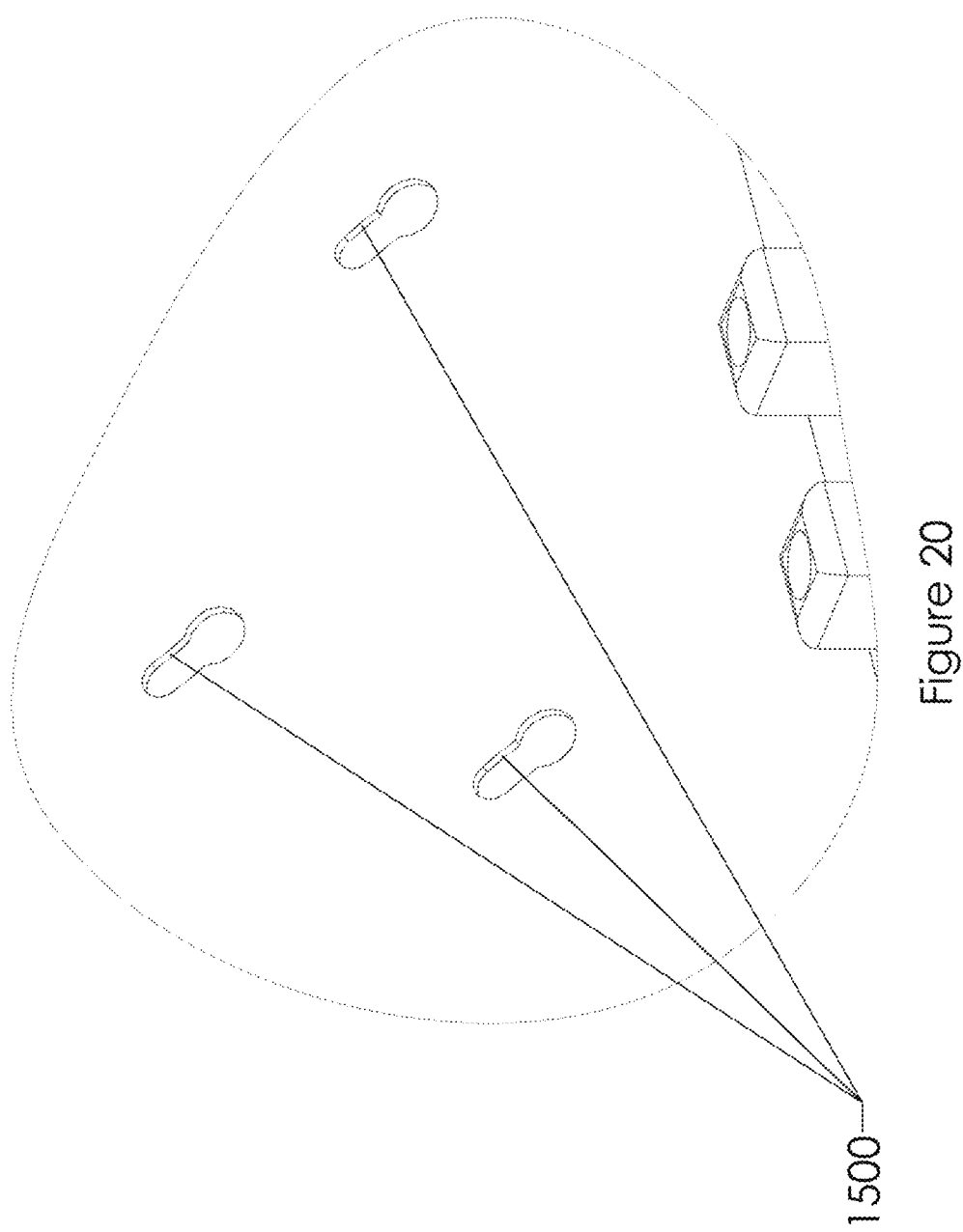
FIG. 20 shows close-up detail of the "keyhole" slots.
Figure 21:
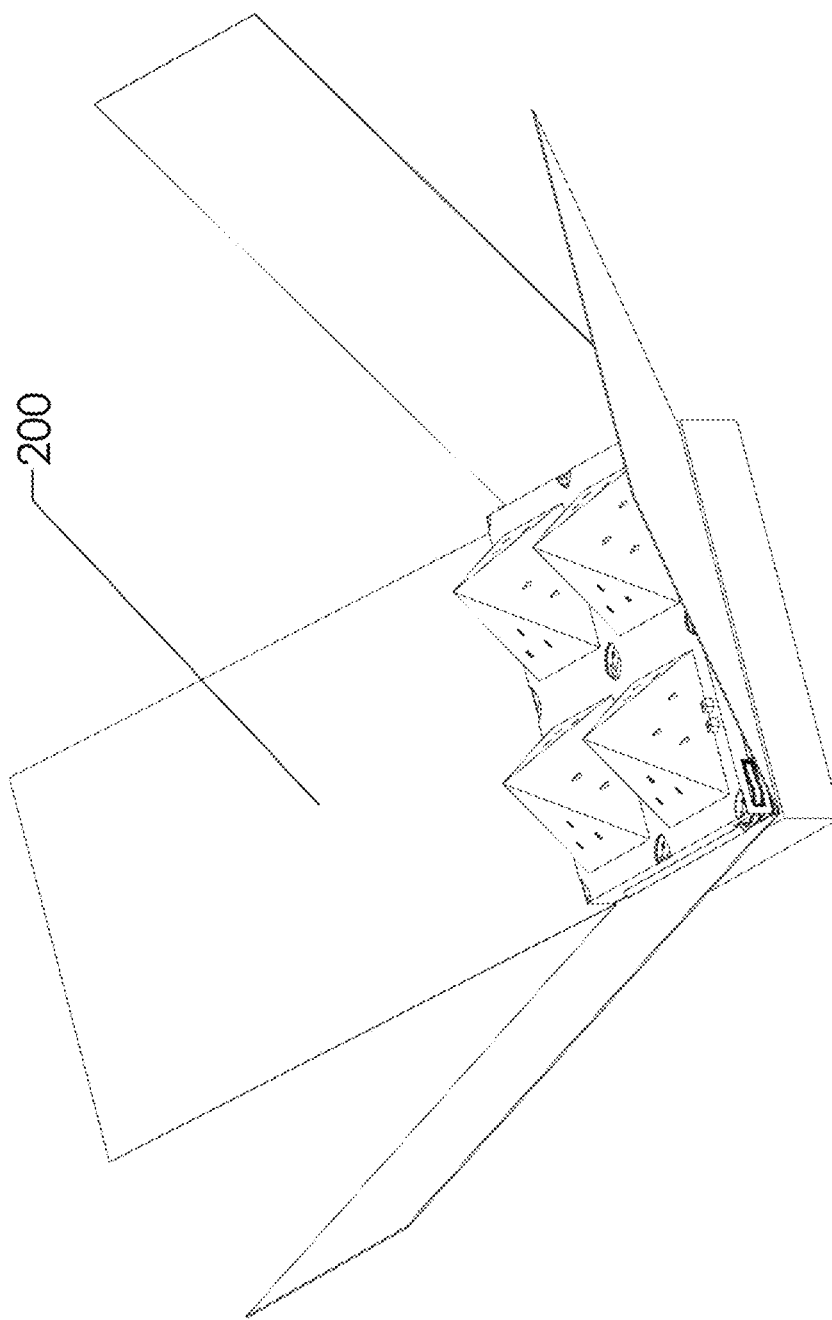
FIG. 21 shows the carbon fiber sheet preparing to wrap around the frame.
Figure 22:
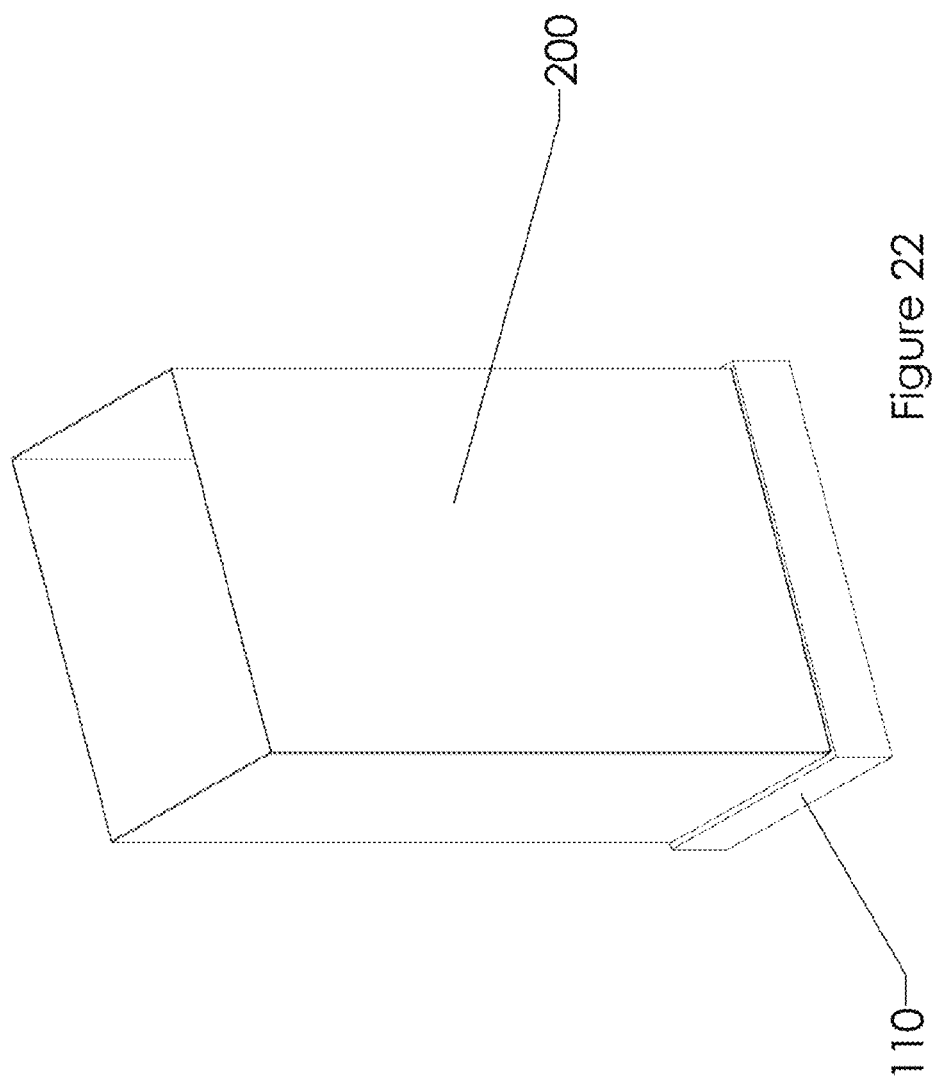
FIG. 22 shows the outside edges of the carbon fiber sheet pulled up, exposing the "foot print" of the housing.

FIG. 18 shows a male—A—conductive frame 400 in position on a vacuum formed, carbon fiber sheet 200. FIG. 19 shows one set of three "keyhole" slots 1500 cut into the first layer of a vacuum formed, carbon fiber sheet 200. FIG. 20 shows a detail of the profiles of the "keyhole" slots 1500. The narrow section of each slot 1500 retains the shoulder of a post 1810 on the back of a solar panel 1800, when it is put in position. There are four sets of slots 1500 for each pyramid shaped boss and four pyramid shaped bosses total for each carbon fiber housing. FIG. 21 shows the outside edges of the carbon fiber sheet 200 preparing to wrap around the frame 400 and on top of itself. FIG. 22 shows the outside edges of the carbon fiber sheet 200 pulled up, exposing the "foot print" 110 of the housing to allow clearance for the clamp fixture 1600.

Figure 23:
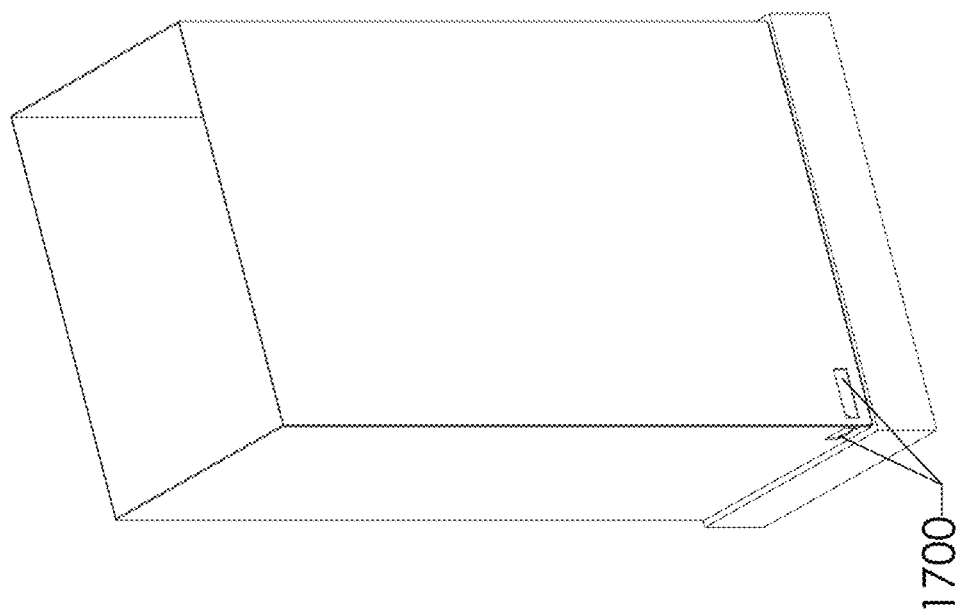
FIG. 23 shows two vents cut into the carbon fiber sheet.
Figure 24:
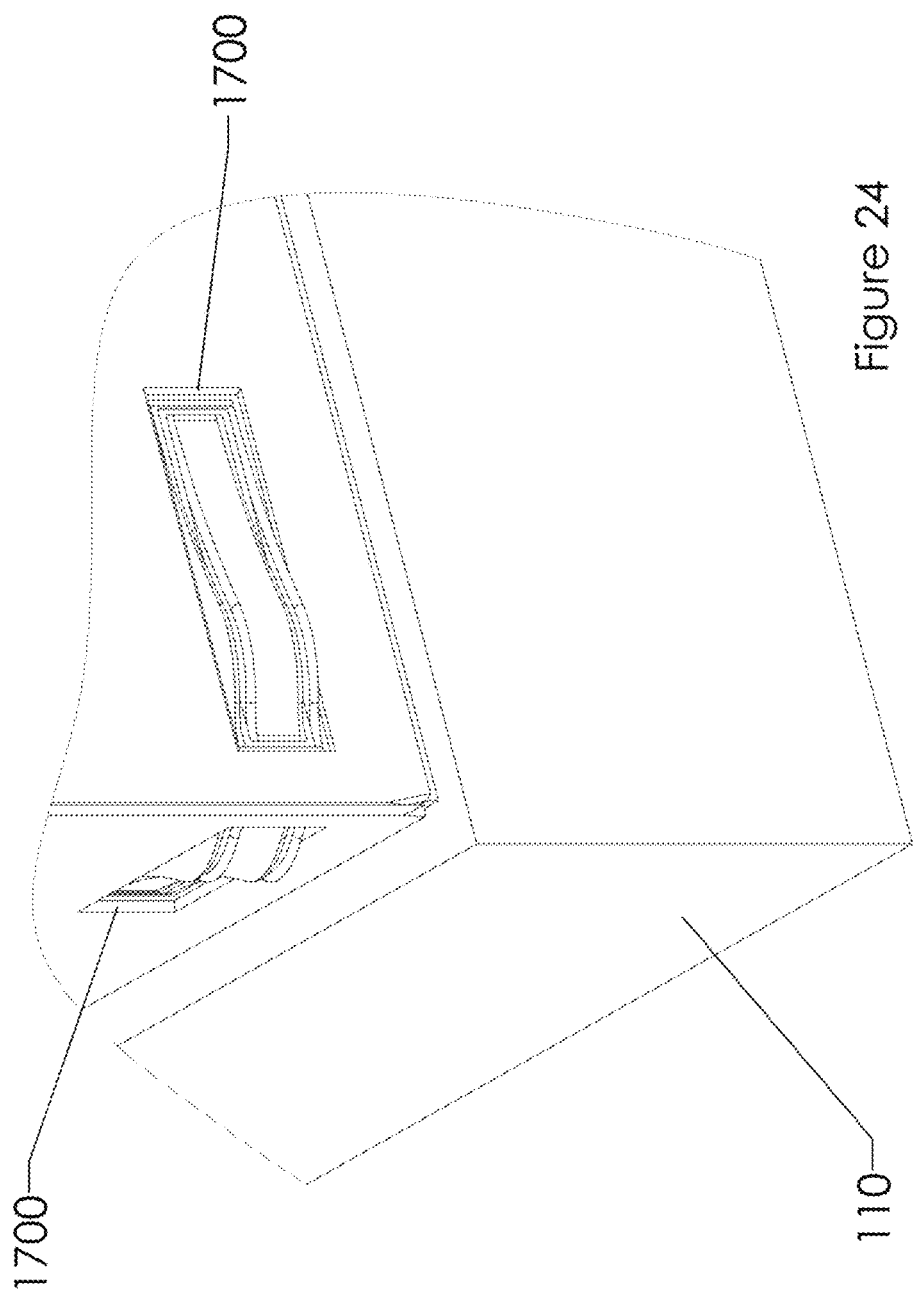
FIG. 24 shows a detail of the vents.

FIG. 23 shows two vents 1700 being cut into the carbon fiber sheet 200 at the long diagonal corner (opposite corner obscured in this view). These cuts are to allow clearance for the open rectangular slots 550, the connector tabs 560 & 570. FIG. 24 shows a detail of the vents 1700.

Figure 25:
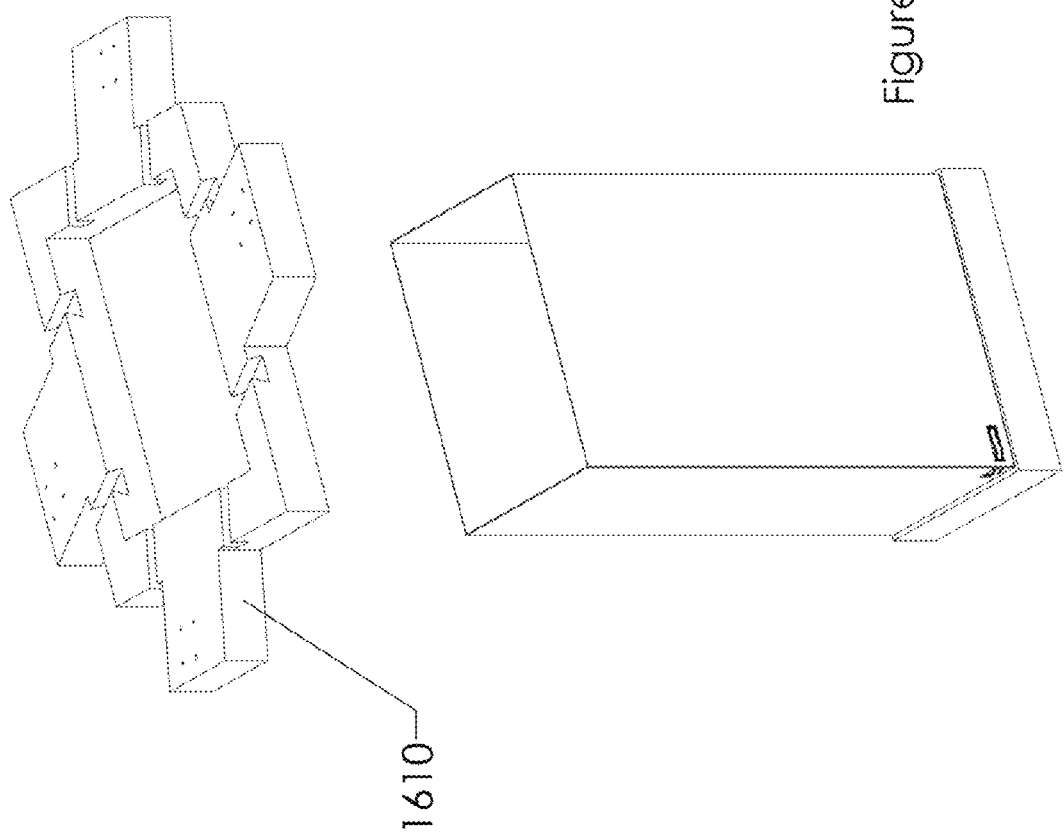
FIG. 25 introduces the clamp base.
Figure 26:
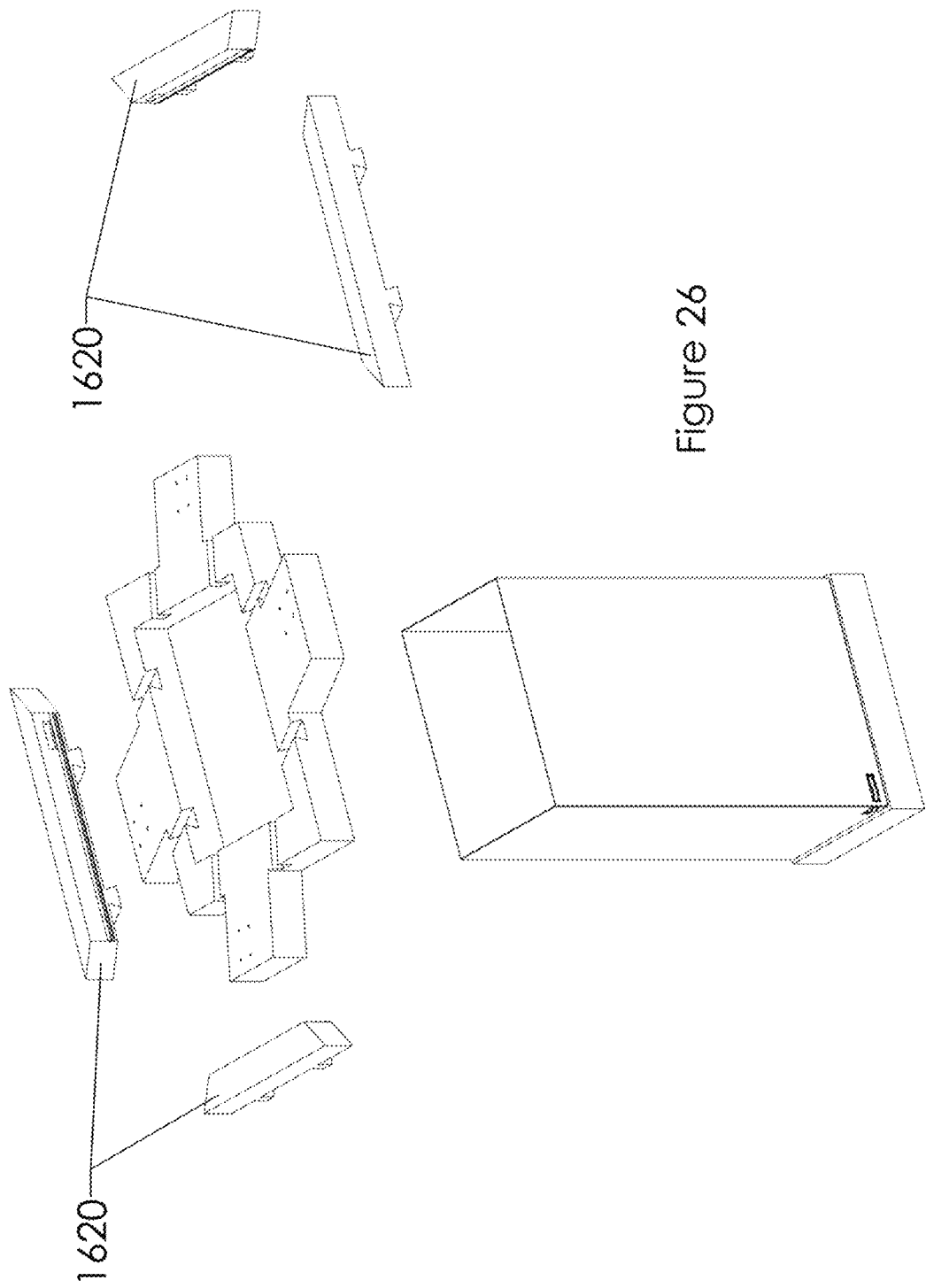
FIG. 26 introduces four slide action slides.
Figure 27:
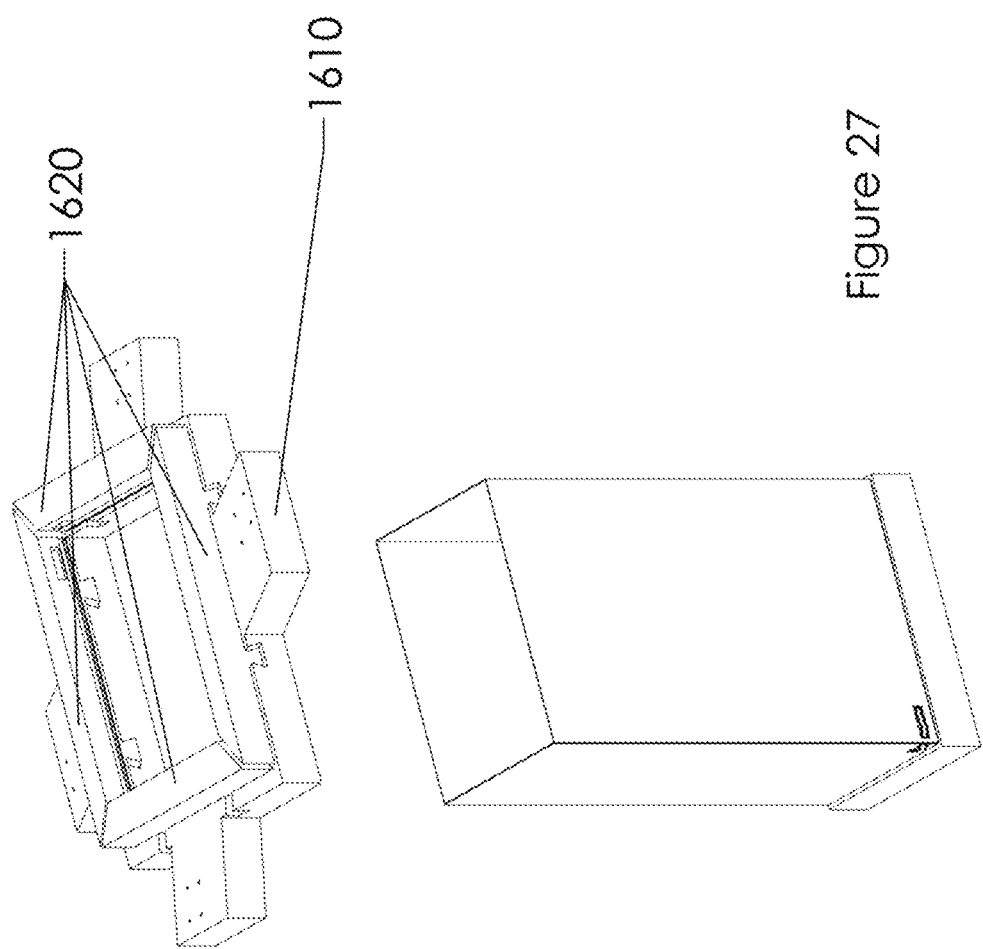
FIG. 27 shows the slide action slides positioned on the clamp base.

FIG. 25 introduces the clamp base 1610 and FIG. 26 introduces four slide action slides 1620 and FIG. 27 shows the slide action slides 1620 positioned on the clamp base 1610.

Figure 28:
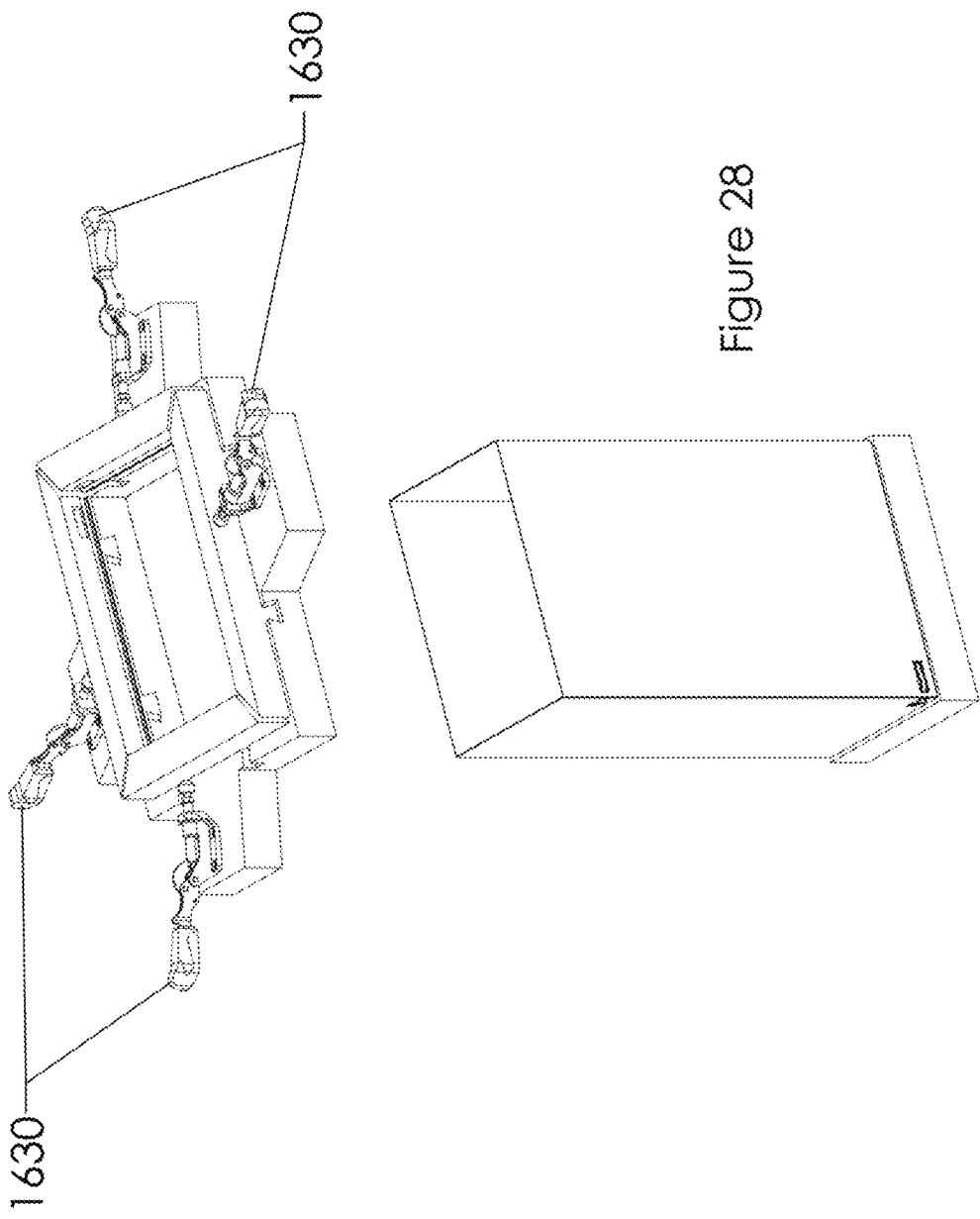
FIG. 28 shows the inline clamps in position on the clamp base.
Figure 29:
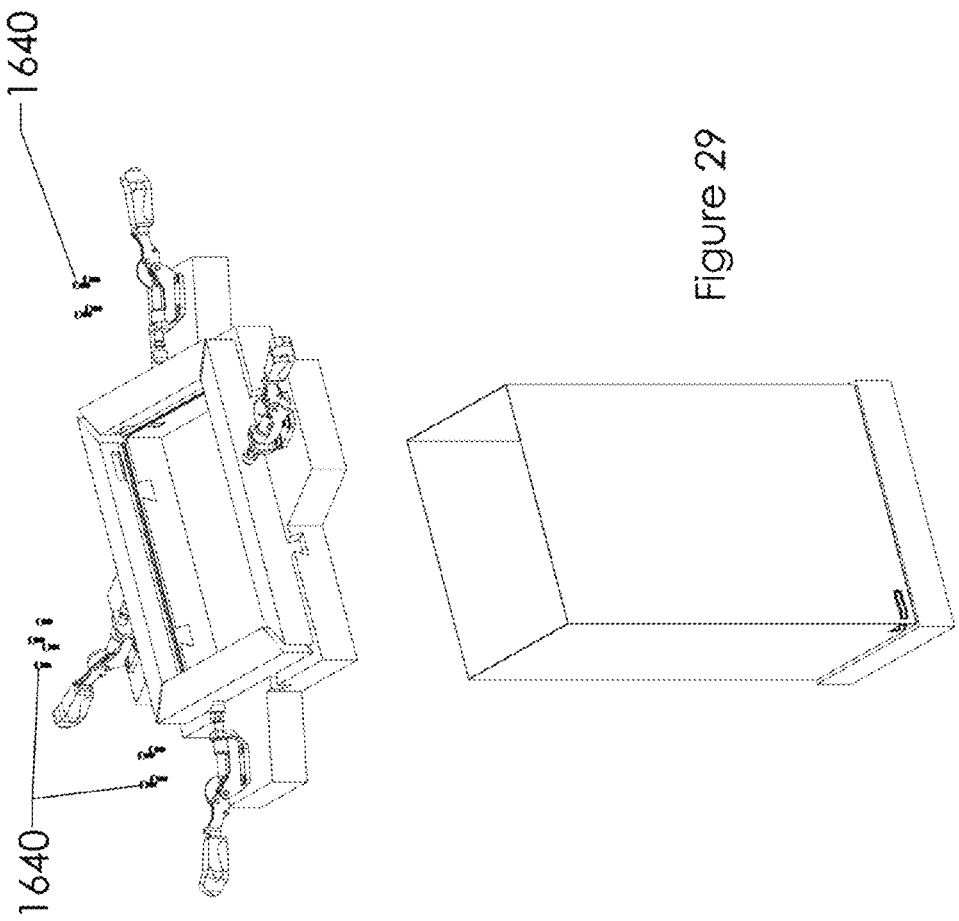
FIG. 29 introduces the inline clamp hardware.
Figure 30:
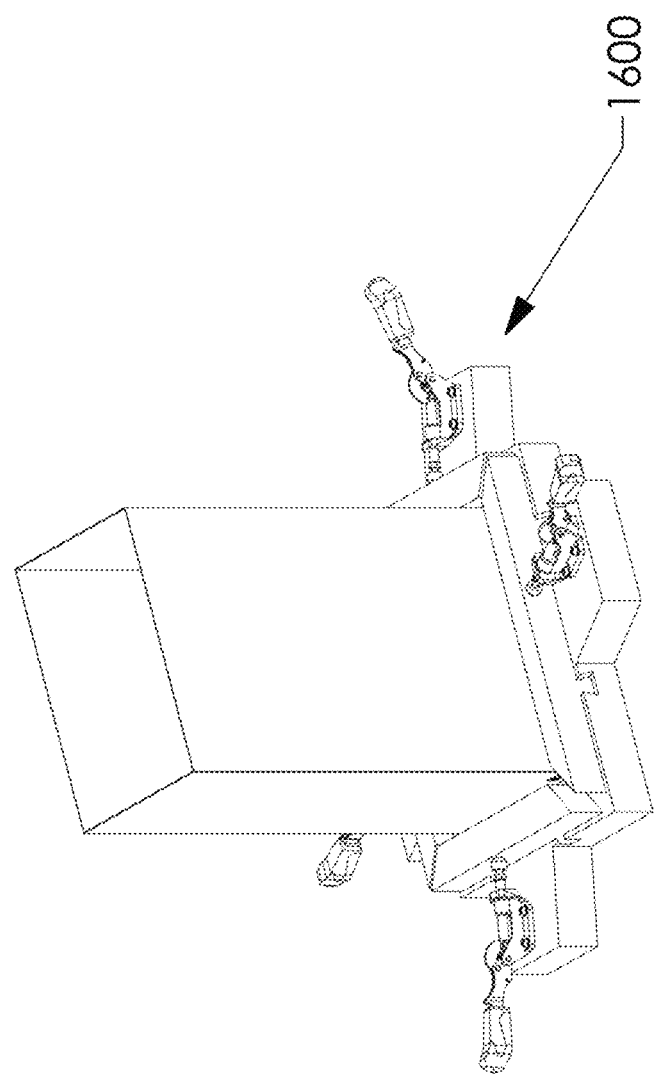
FIG. 30 shows the clamp fixture in position with handles down and open.

FIG. 28 shows the inline clamps 1630 in position on the clamp base 1610. FIG. 29 introduces the inline clamp hardware 1640. One of the four clamps has the hardware already in position. FIG. 30 shows the clamp fixture 1600 in position with handles down and open.

Figure 31:
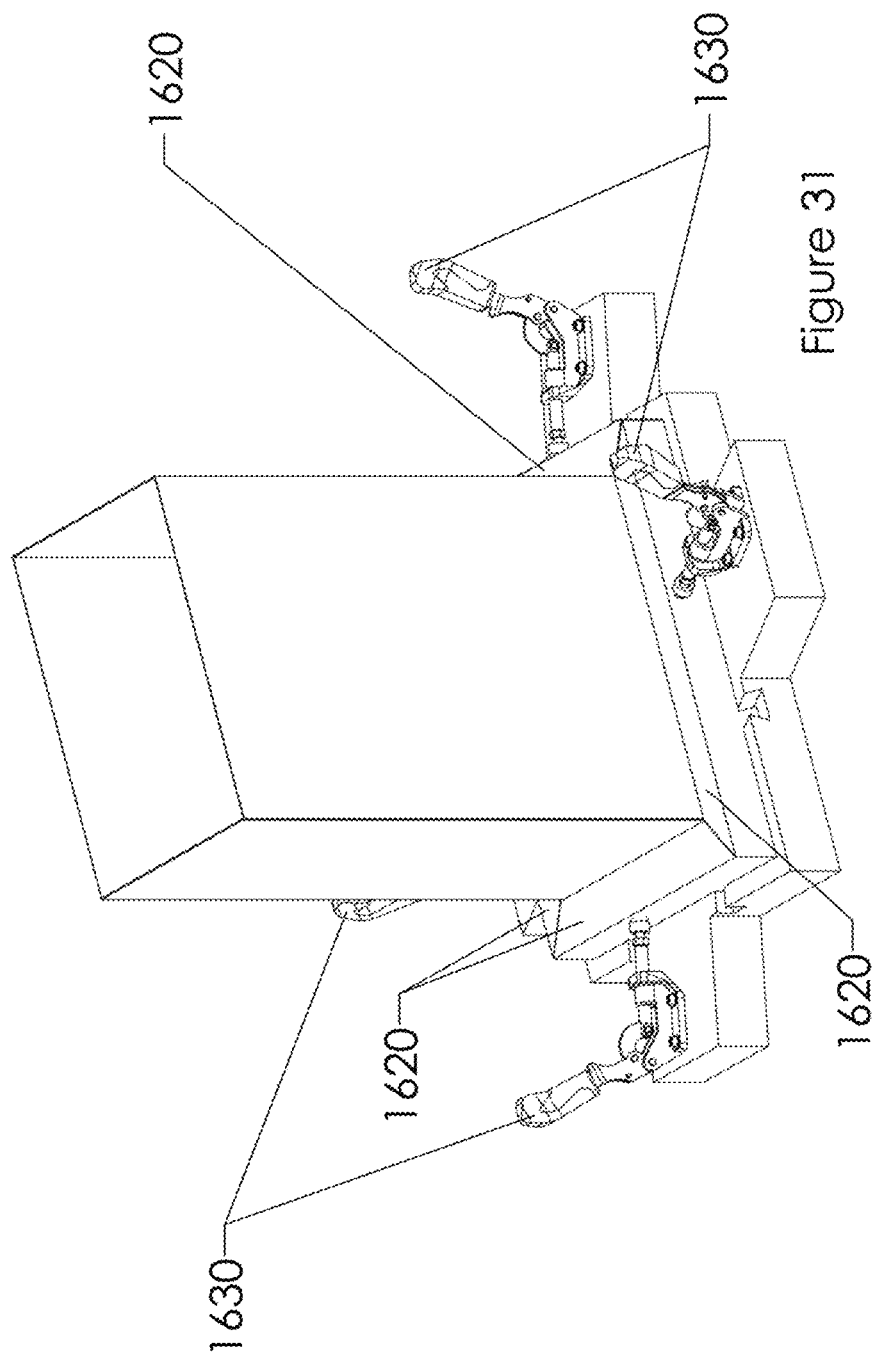
FIG. 31 shows the inline clamps with handles up, closing against the slide action slides.
Figure 32:
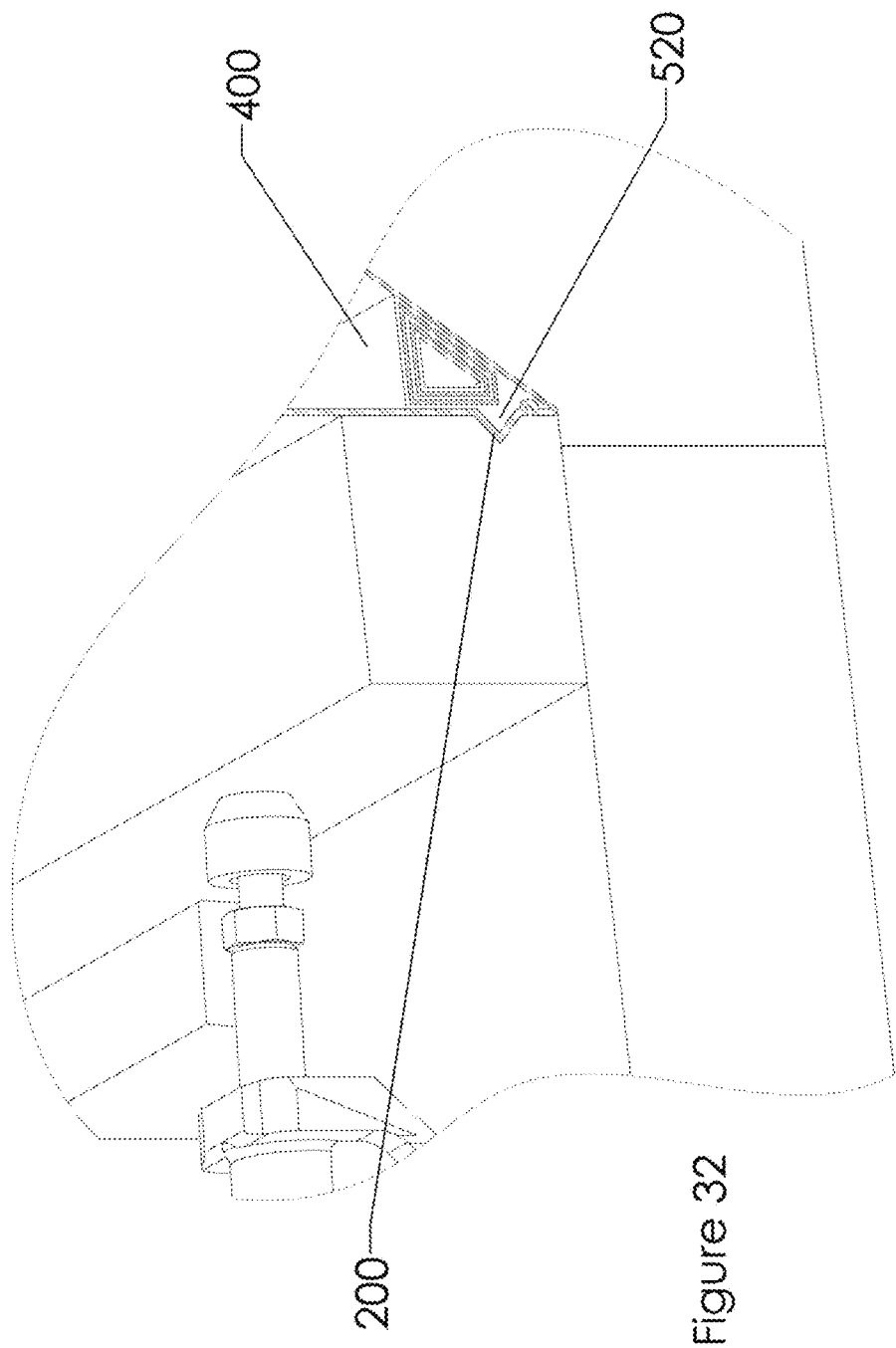
FIG. 32 shows the clamping action against the carbon fiber sheet into a boss on the male—A—conductive frame.

FIG. 31 shows the inline clamps 1630 with handles up, closing against the slide action slides 1620. FIG. 32 shows a detail of the clamping action against the carbon fiber sheet 200 into a V shaped boss 520 on the male—A—conductive frame 400.

Figure 33:
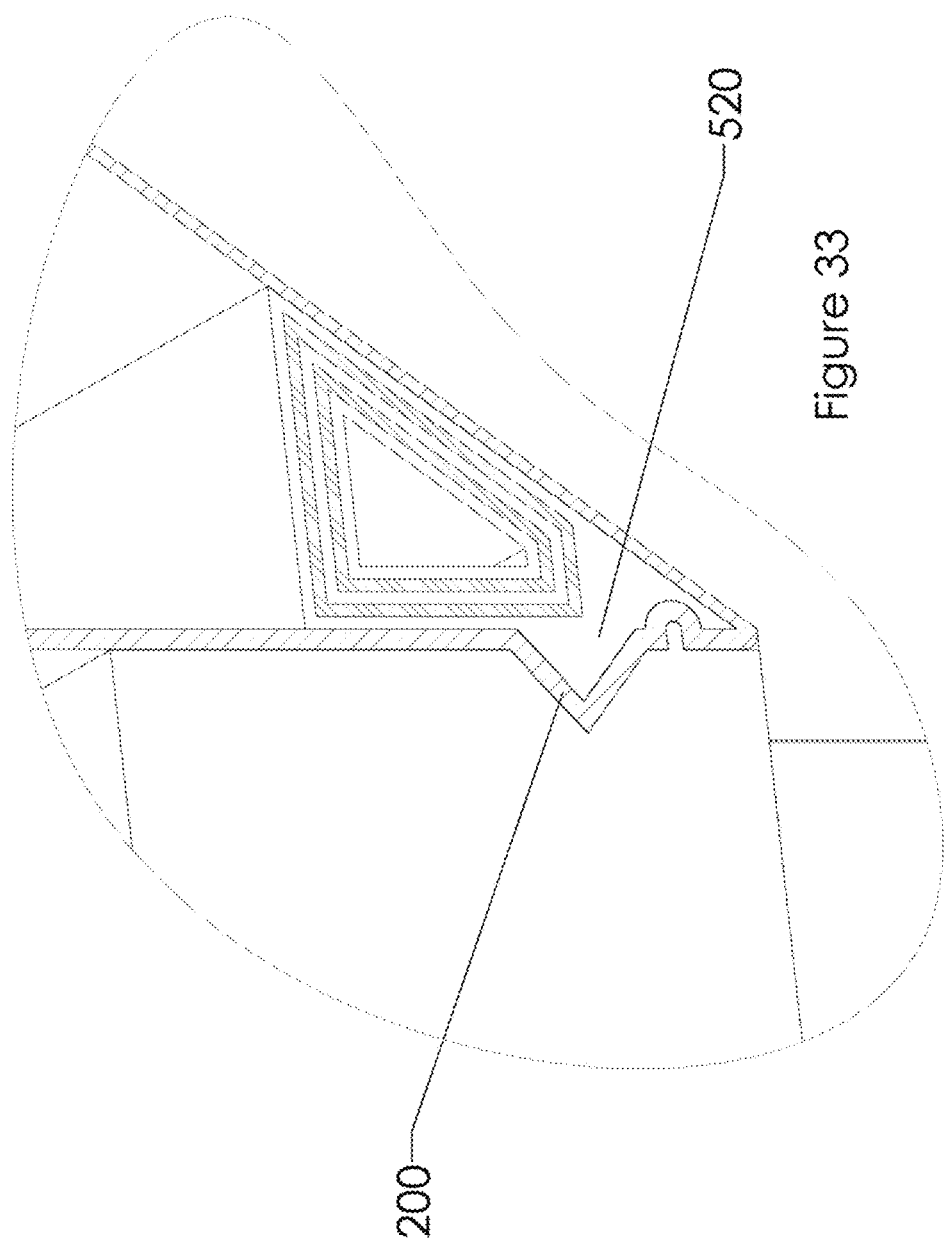
FIG. 33 shows a close-up detail of the area affected by the clamping action.
Figure 34:
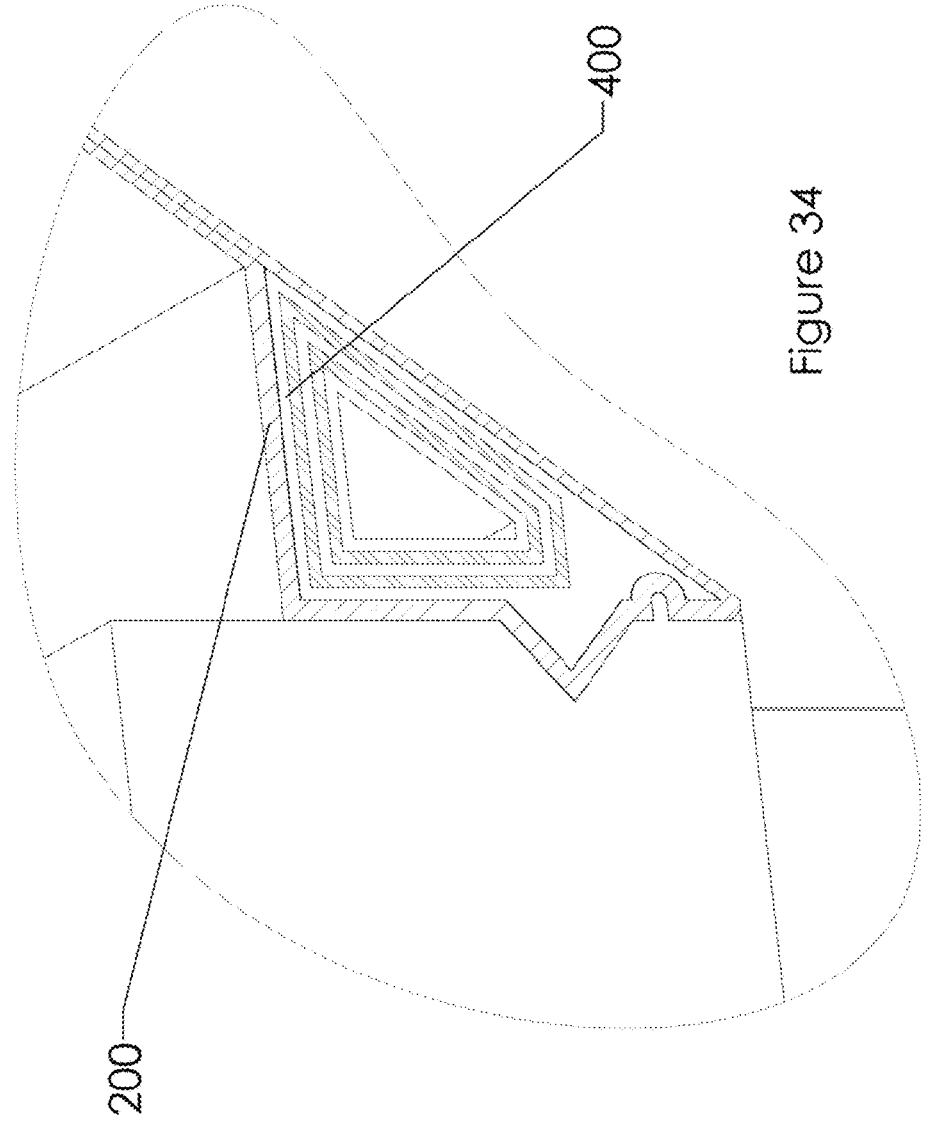
FIG. 34 shows a close-up detail of area where the carbon fiber wraps over the top of the male conductive frame and back onto itself.

FIG. 33 shows a close-up detail of the area affected by the clamping action including the carbon fiber sheet 200 and the V shaped boss 520. FIG. 34 shows a close-up detail of the area where the carbon fiber sheet 200 wraps over the top of the male conductive frame 400 and back onto itself in a second layer.

Figure 35:
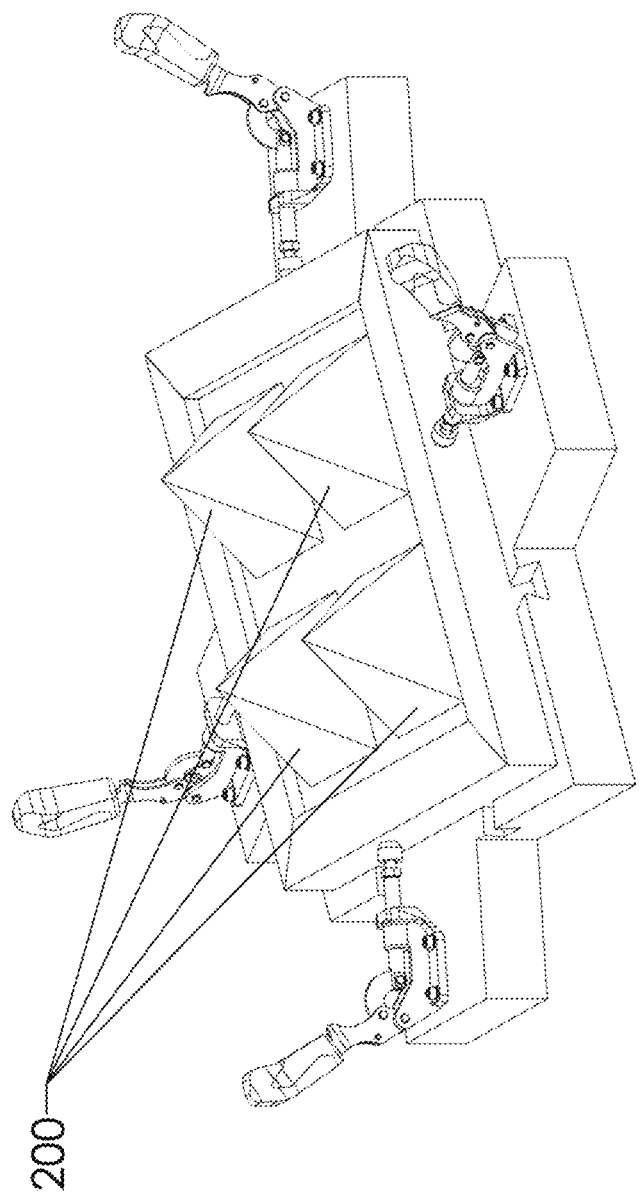
FIG. 35 shows the carbon fiber sheet completely wrapped over itself.
Figure 36:
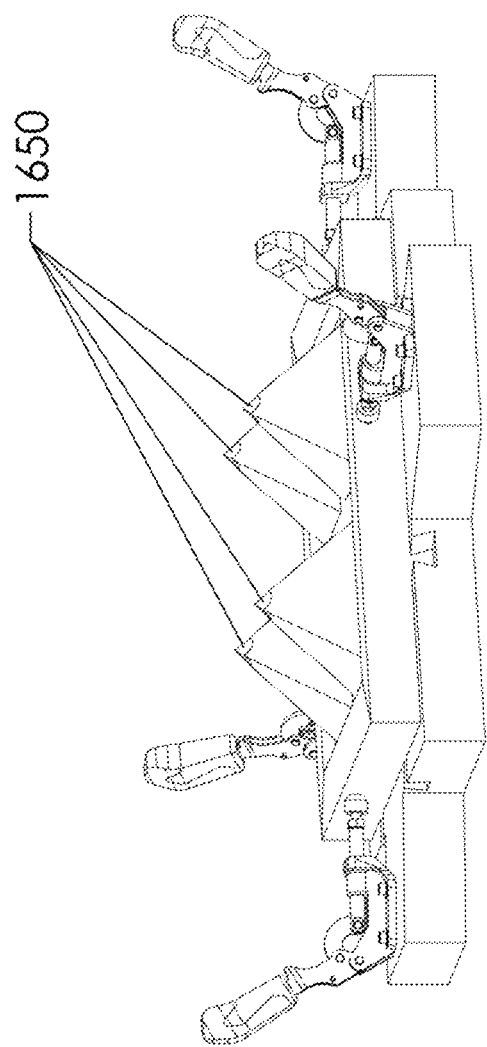
FIG. 36 shows circular cutouts into the top layer of the carbon fiber sheet.

FIG. 35 shows the carbon fiber sheet 200 completely wrapped over itself completing the second layer. FIG. 36 shows circular cutouts 1650 into the top layer of the carbon fiber sheet 200, but not into the first layer. This is to create a recess for the locking posts 1660 to be bonded in.

Figure 37:
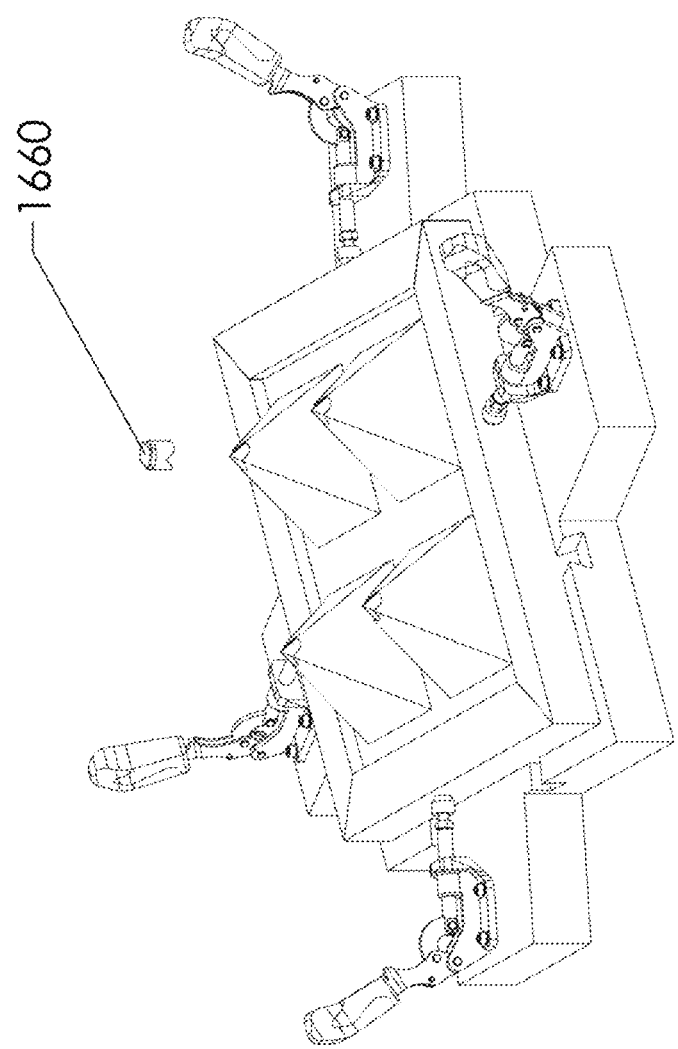
FIG. 37 introduces a locking post.
Figure 38:
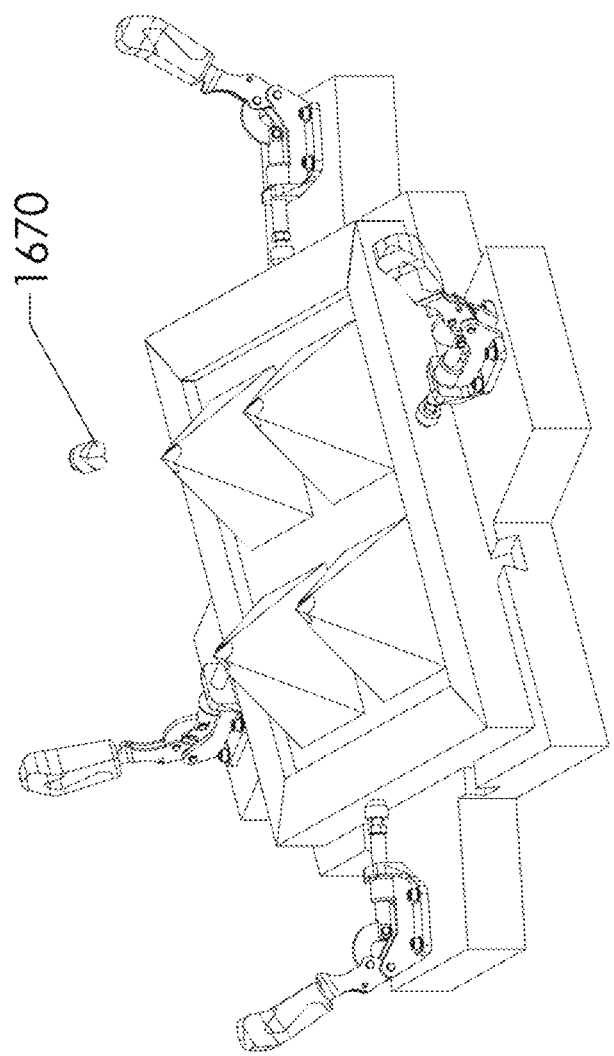
FIG. 38 reveals the bottom side of the locking post.
Figure 39:
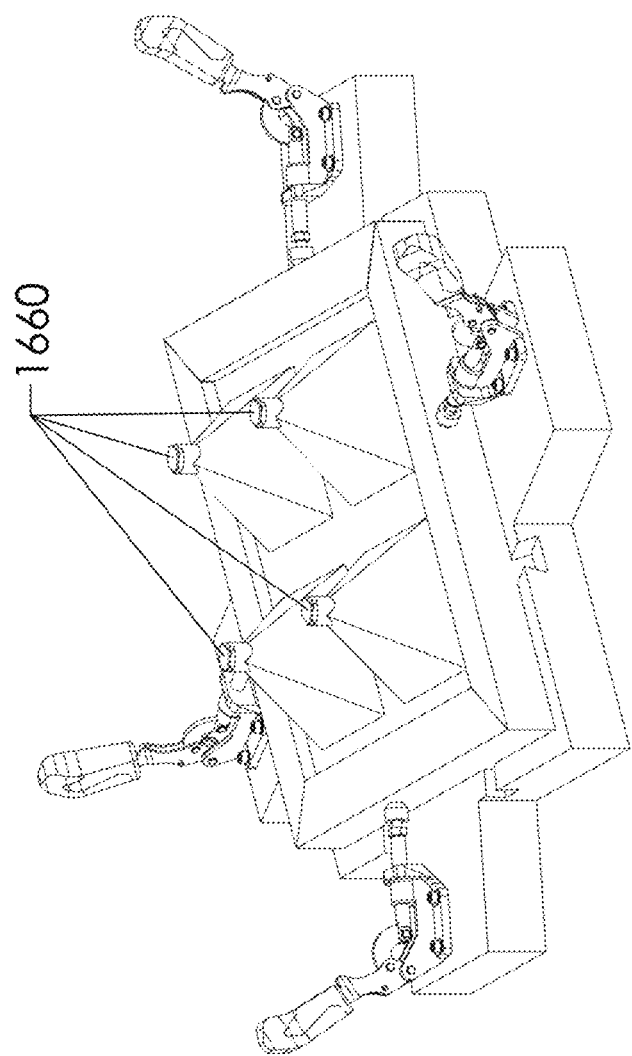
FIG. 39 shows all four locking posts in position.

FIG. 37 introduces a locking post 1660. FIG. 38 reveals the bottom side of a locking post 1660. These four faces 1670 and/or the exposed faces of the circular cutouts 1650 have glue applied there to bond the posts 1660. FIG. 39 shows all four locking posts 1660 in position.

Figure 40:
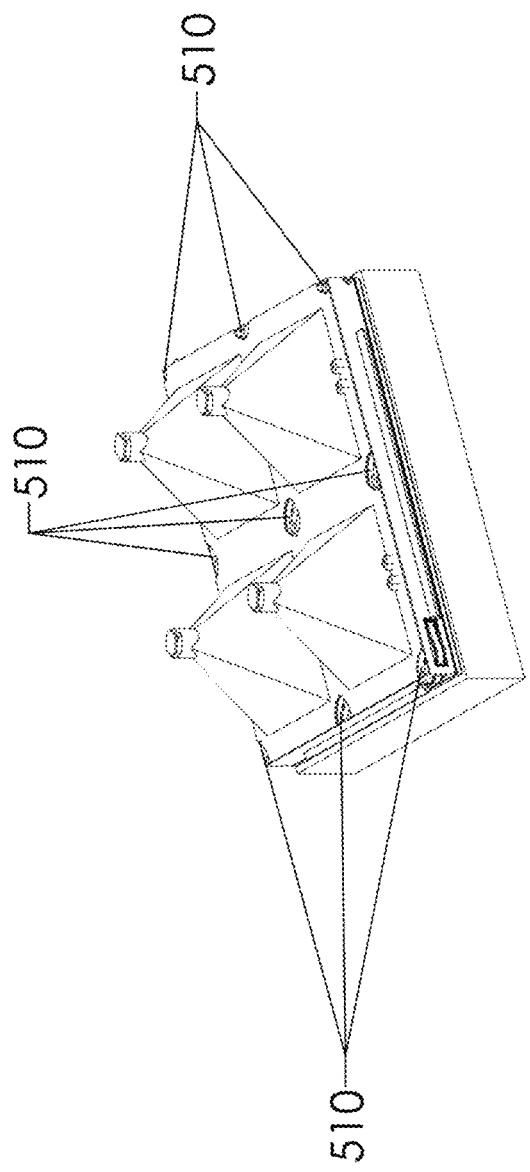
FIG. 40 shows the wrap trimmed to expose the post slots.
Figure 41:
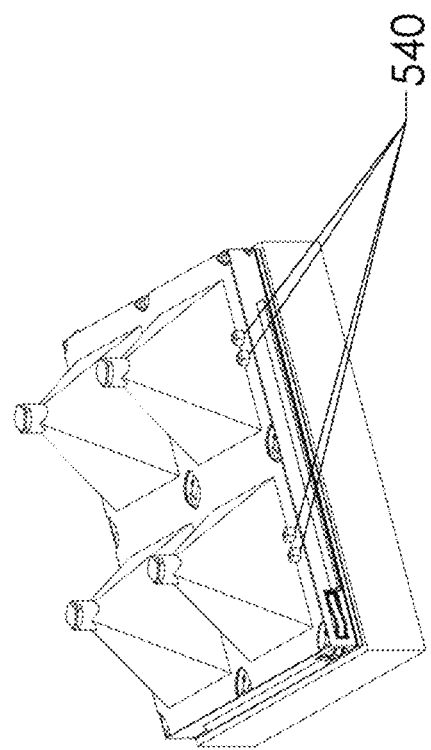
FIG. 41 shows wrap trimmed to expose bosses with ball socket detents.

FIG. 40 shows the wrap trimmed to expose the post slots 510 and FIG. 41 shows the wrap trimmed to expose ball socket bosses 540 with ball socket snap fits 700.

Figure 42:
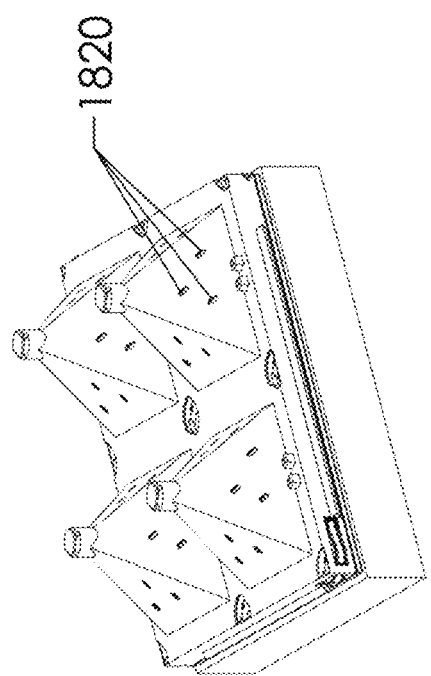
FIG. 42 shows one set of three oval slots cut into the second layer of the carbon fiber sheet.
Figure 43:
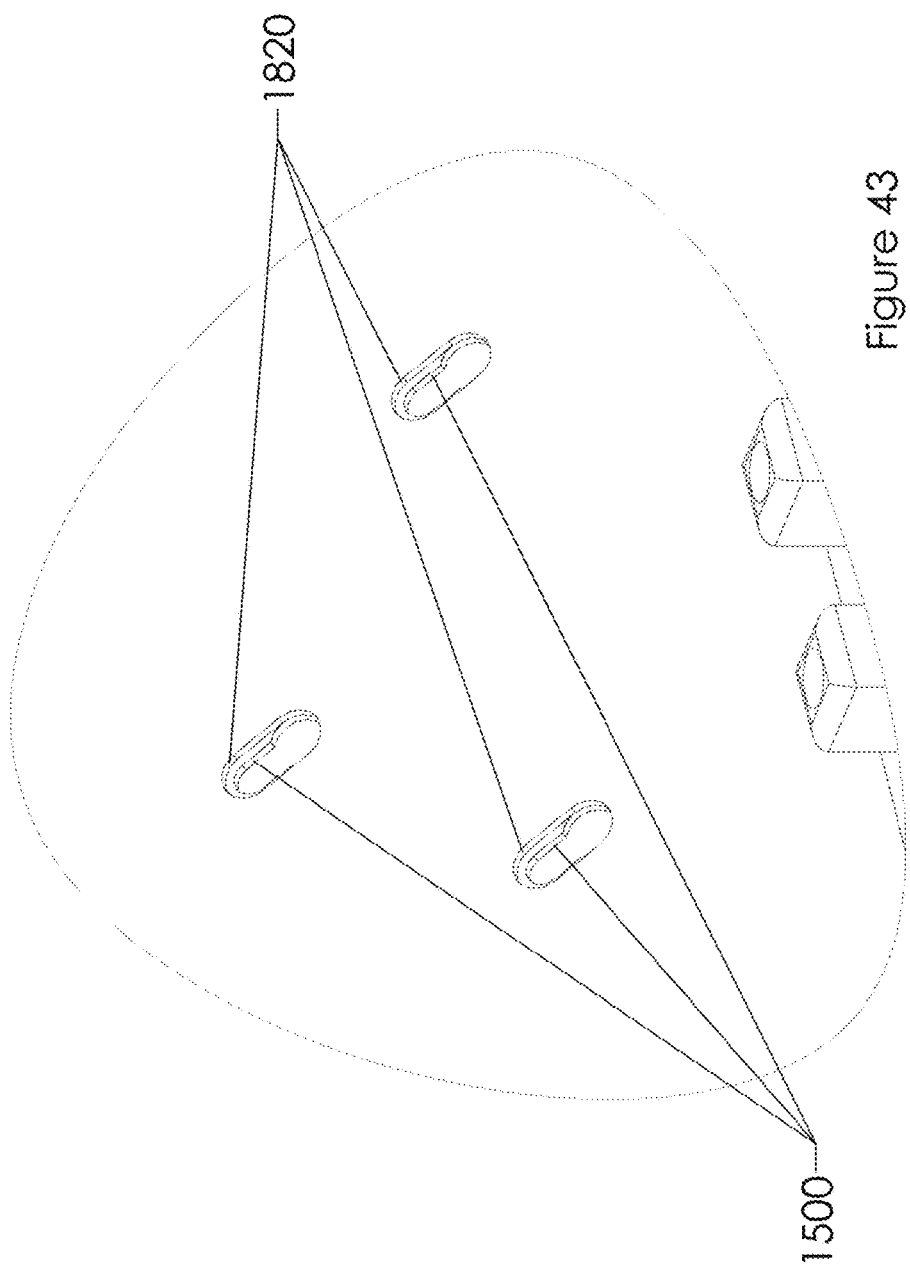
FIG. 43 shows a detail of the profile of the oval slots on top of the "keyhole" slots.

FIG. 42 shows one set of three oval slots 1820 cut into the second layer of a vacuum formed, carbon fiber sheet 200. FIG. 43 shows a detail of the profile of the oval slots 1820 on top of the "keyhole" slots 1500. These slots 1820 are aligned with the "keyhole" slots 1500 on the first layer and provide a stop against the head of a post 1810 on the back of a solar panel 1800 when it is put in position. There are four sets of slots 1820, 1500 for each pyramid boss 120 and a total of four pyramid bosses 120 for each carbon fiber housing.

Figure 44:
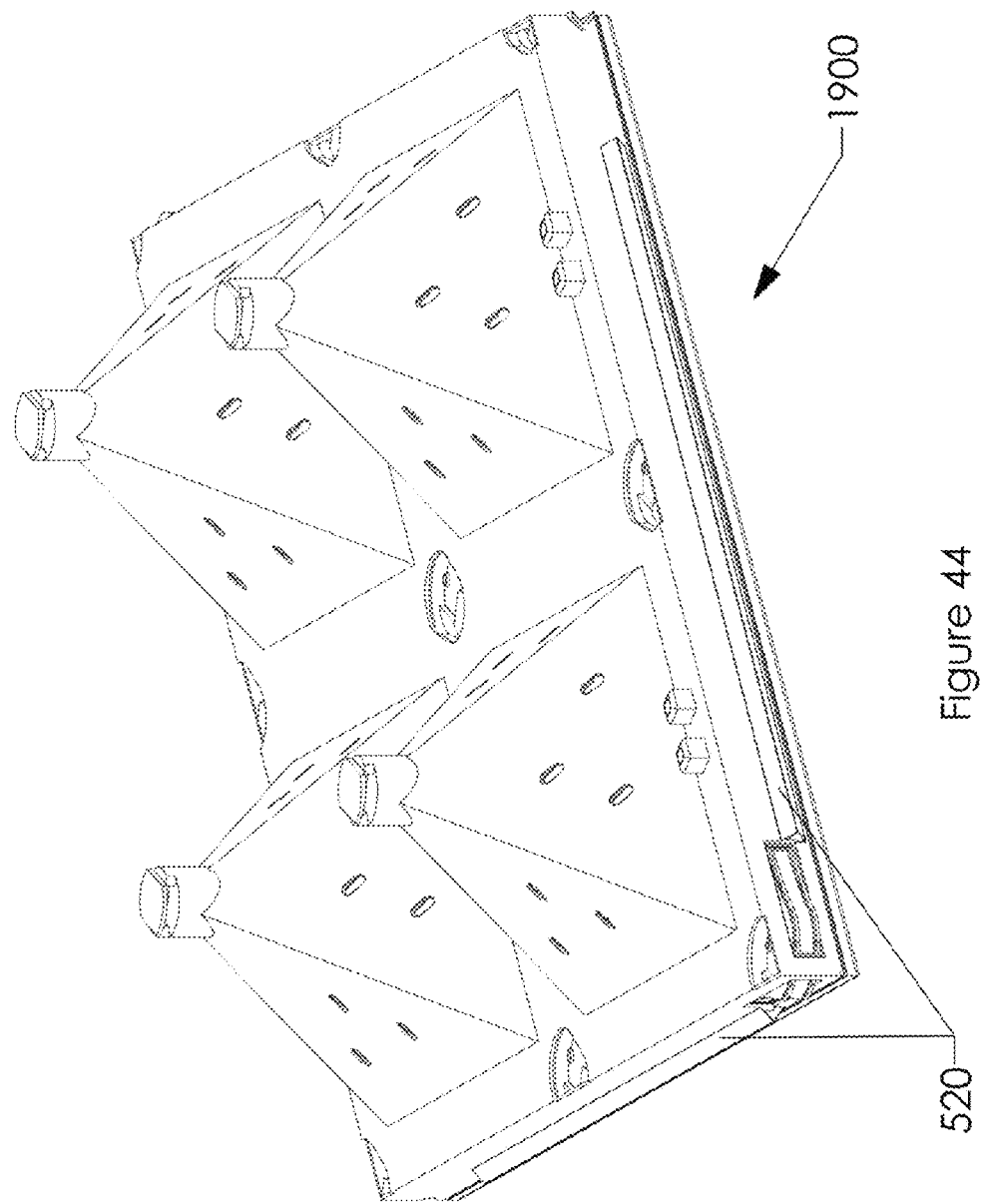
FIG. 44 shows a complete male side wall and bosses.
Figure 45:
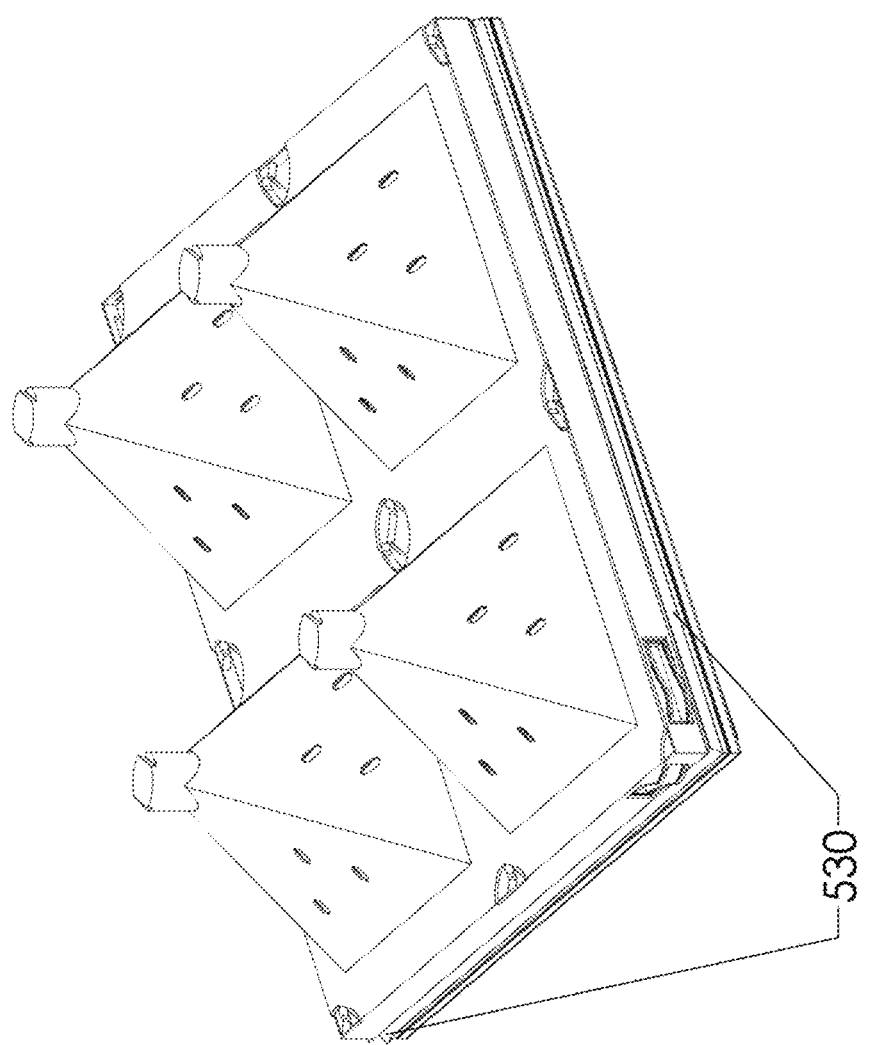
FIG. 45 shows the male side wall oriented to show the grooves.

FIG. 44 shows a complete male side wall 1900 (minus solar panels) and V shaped bosses 520. FIG. 45 shows the male side wall 1900 (minus solar panels) oriented to show the V shaped grooves 530.

Figure 46:
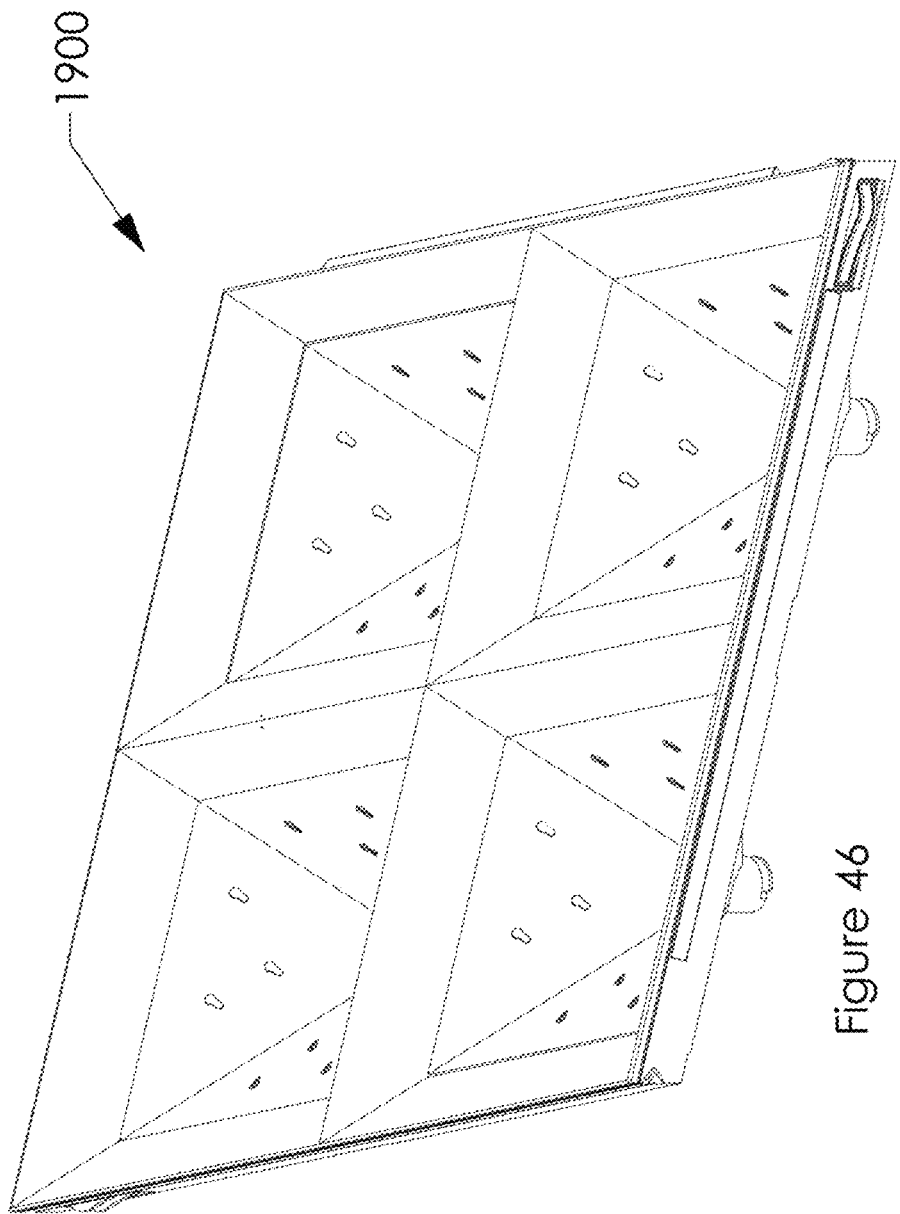
FIG. 46 shows the reverse (top) side of a male side wall.

FIG. 46 shows the top side (inside) of a male side wall 1900 (minus solar panels) before the insertion of solar panels 1800.

Figure 47:
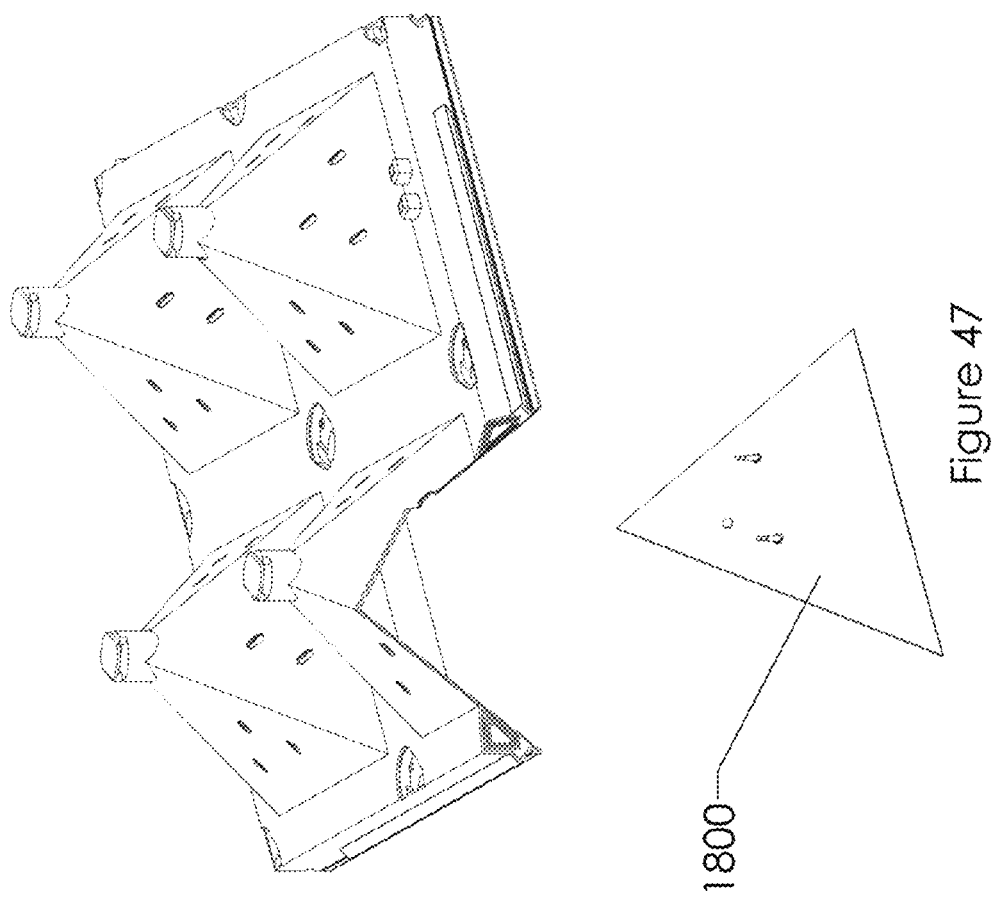
FIG. 47 shows a cutaway view of a solar panel prepared to be inserted into a male side wall.
Figure 48:
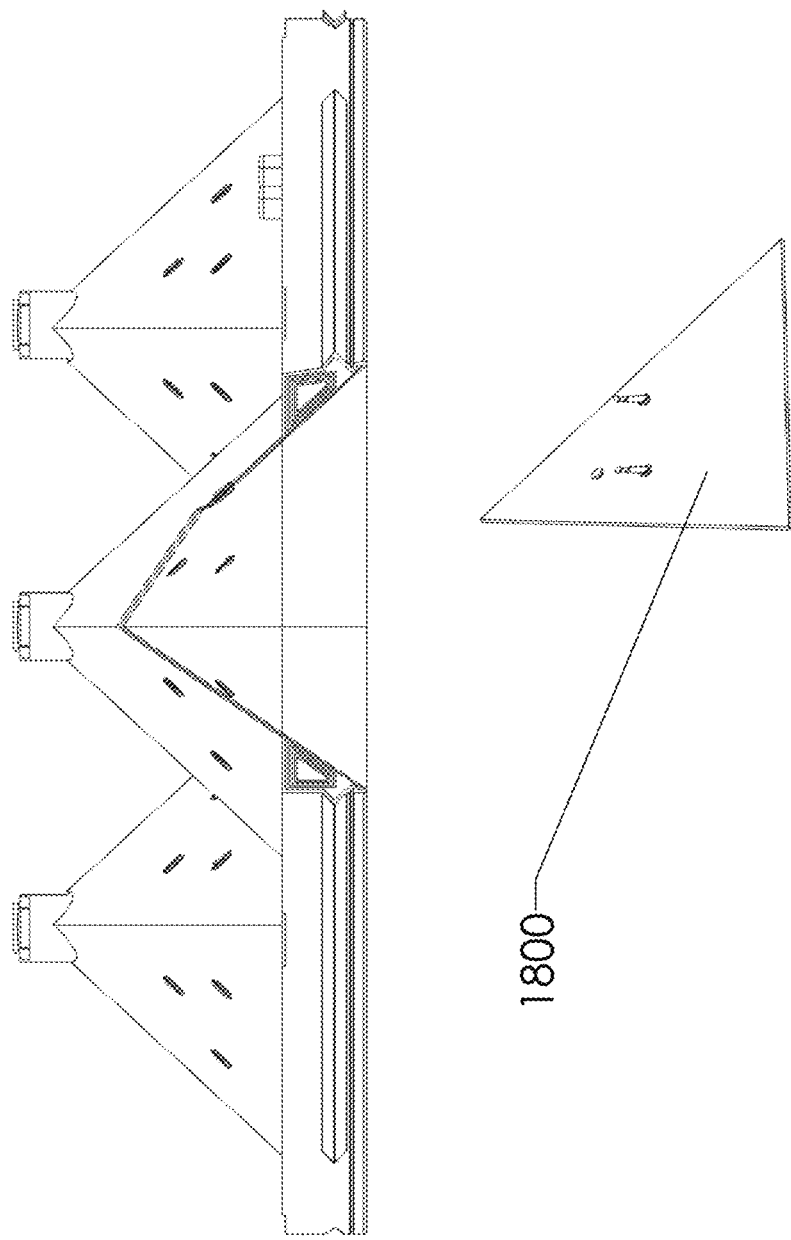
FIG. 48 shows the cutaway view along the long, diagonal edge.
Figure 49:
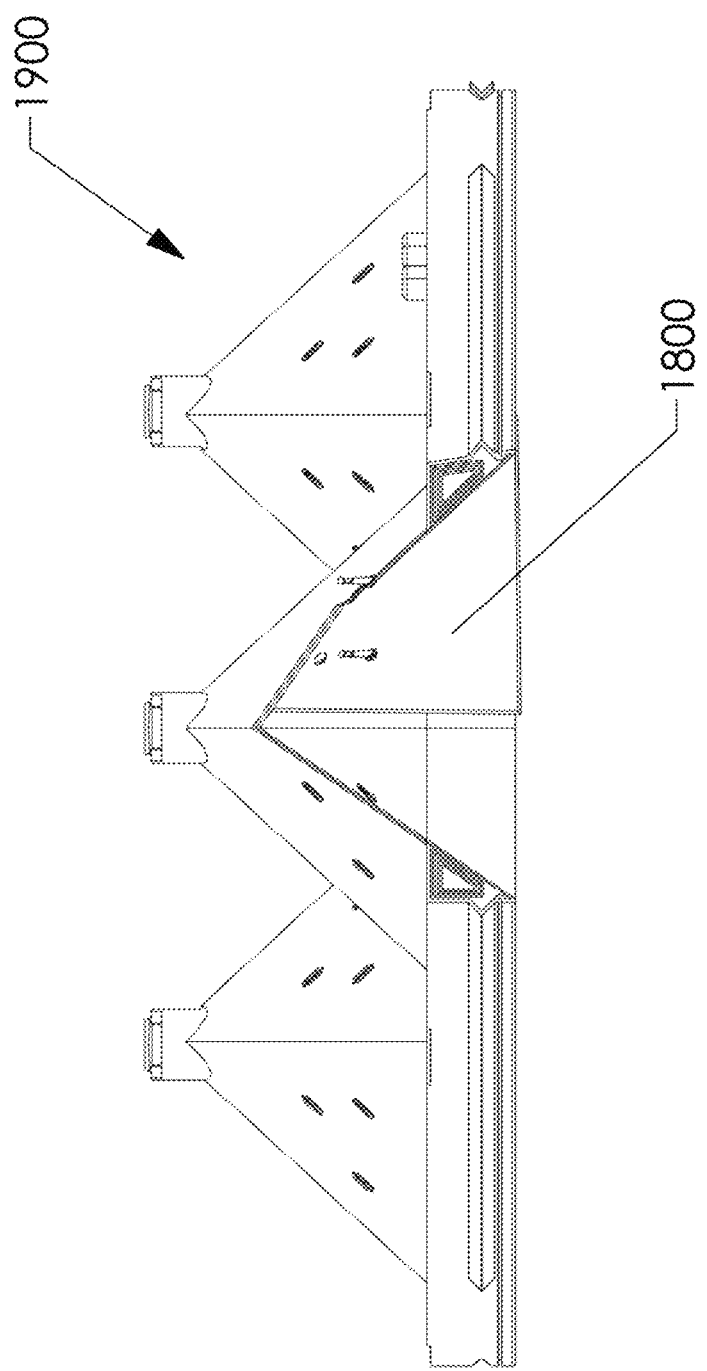
FIG. 49 shows the solar panel in place in the male side wall.

FIG. 47 shows a single solar panel 1800 prepared to be inserted into a male side wall 1900 with a cutaway of the face it is sliding into and an adjacent face. FIG. 48 shows the cutaway view in FIG. 47 but along the long, diagonal edge (normal to a plane that bisects the short diagonal edges). FIG. 49 shows the single solar panel 1800 in place into a male side wall 1900 with the same cutaway view as in FIG. 48.

Figure 50:
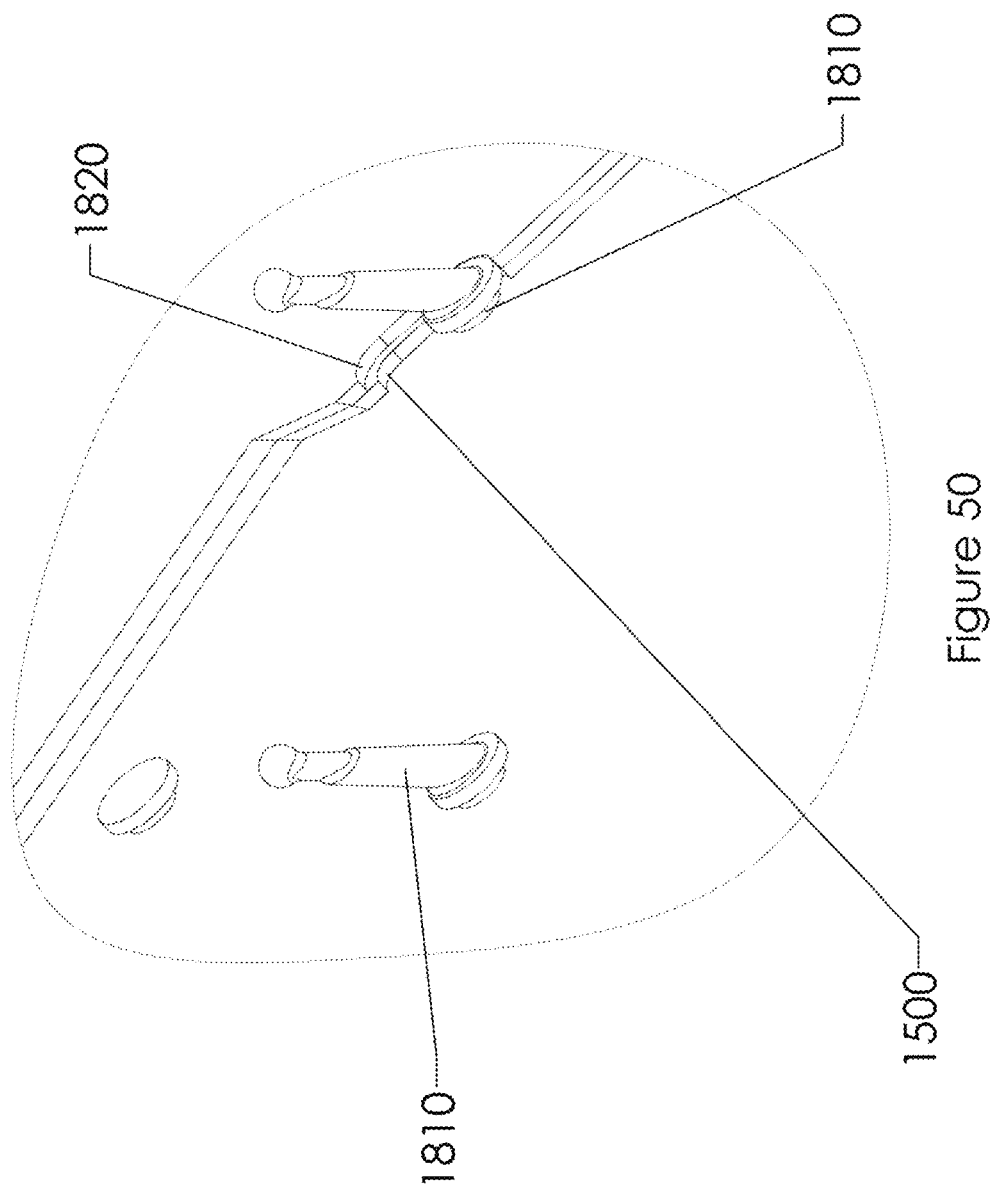
FIG. 50 shows a cropped detail of two solar panel posts in the male side wall.
Figure 51:
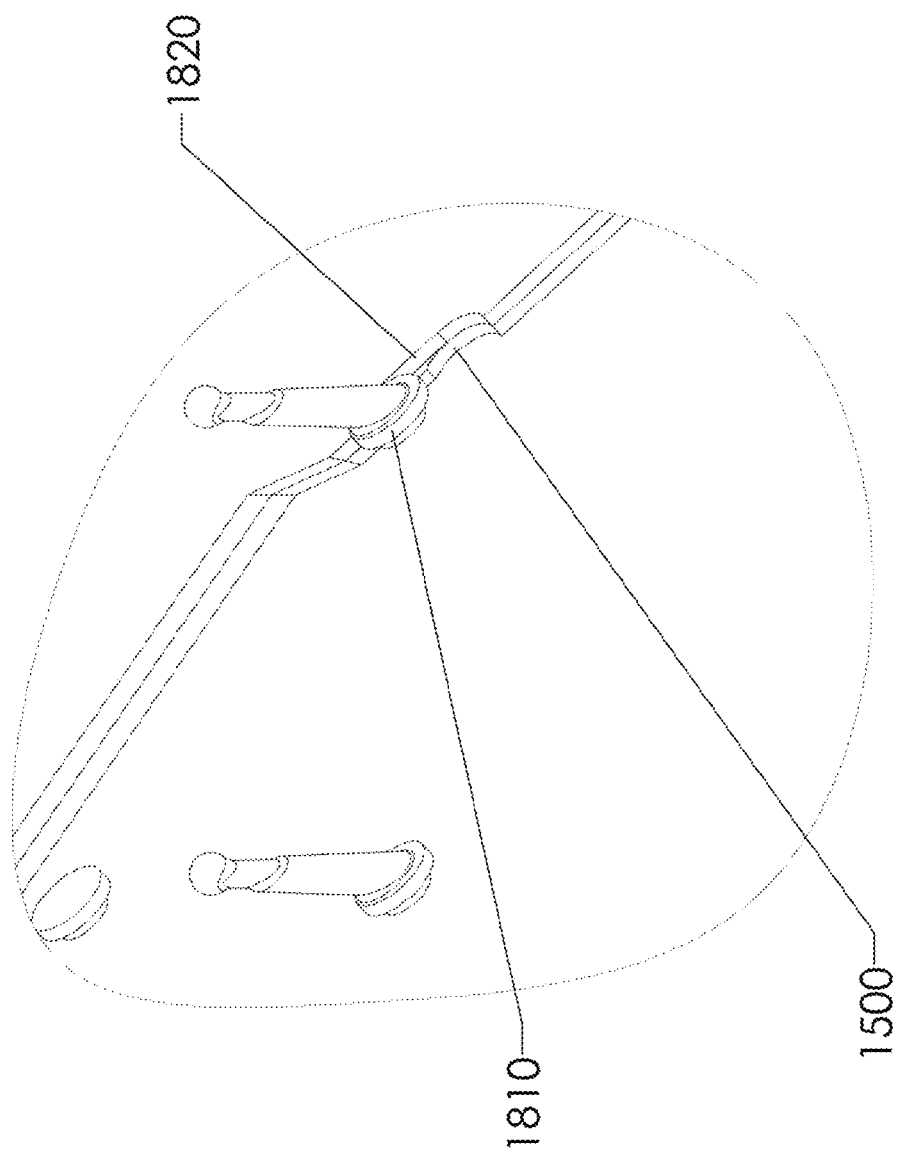
FIG. 51 shows a solar panel post locked in position in a "keyway" slot.
Figure 52:
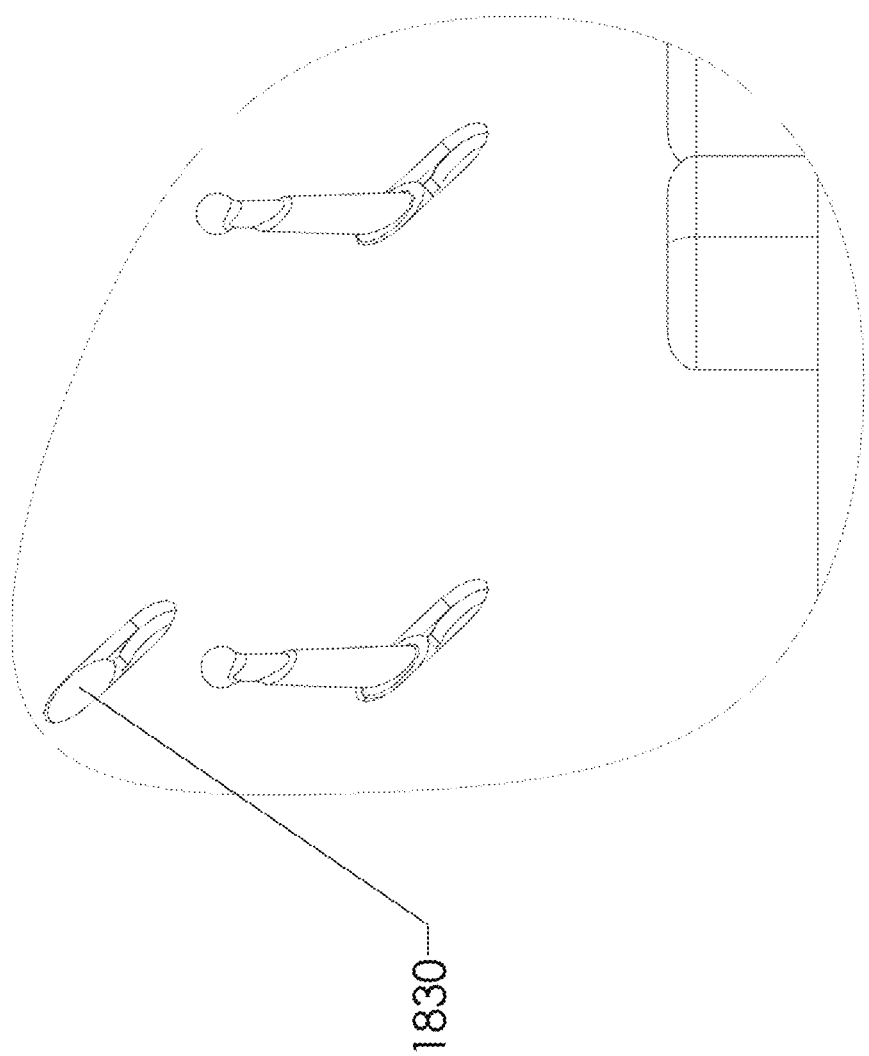
FIG. 52 shows a detail of the solar panel locked in position.

FIG. 50 shows a cropped detail of a cutaway of two solar panel posts 1810 with one post 1810 inserted at the wide section of a "keyway" slot 1500 and its shoulder resting at one end of an oval slot 1820. FIG. 51 shows a solar panel post 1810 locked in position with its shoulder on top of the narrow section of a "keyway" slot 1500 and pushed against the opposite end of an oval slot 1820. FIG. 52 shows a detail of both posts 1810, as well as a reinforcement tab 1830 on the back of a solar panel 1800 locked in position.

Figure 53:
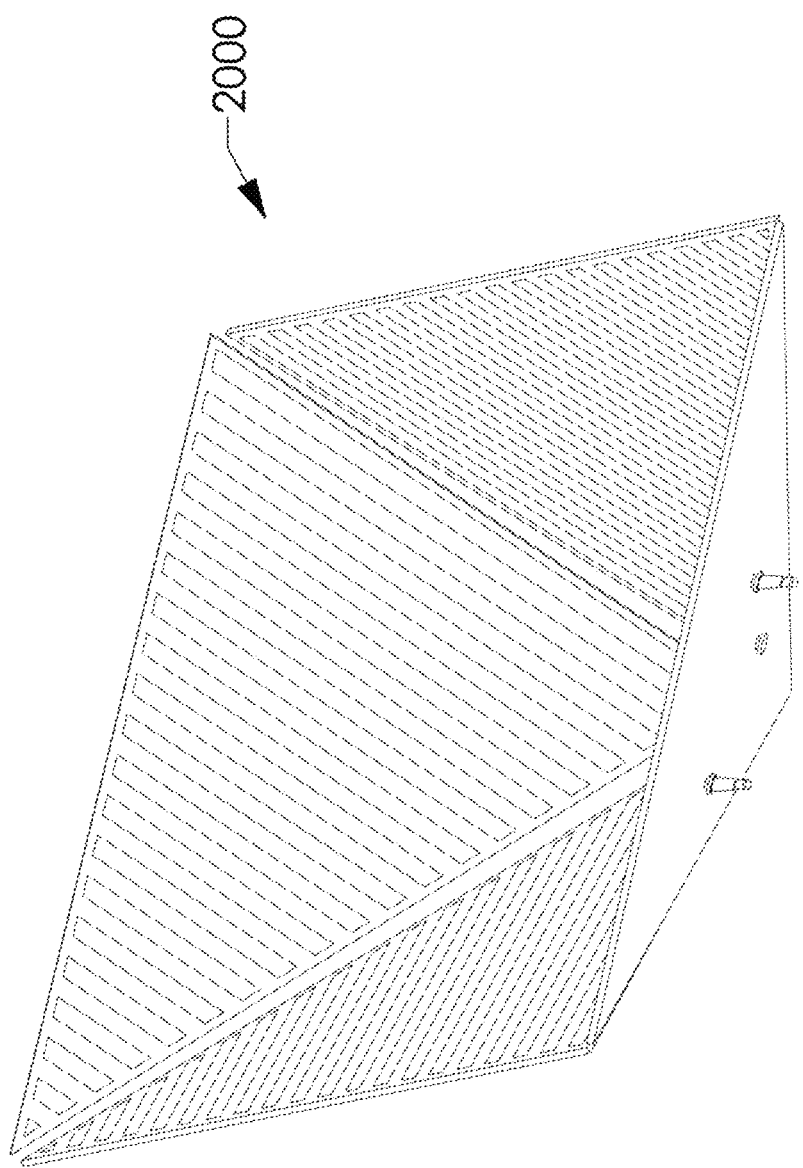
FIG. 53 shows a module of four solar panels in relative position.
Figure 54:
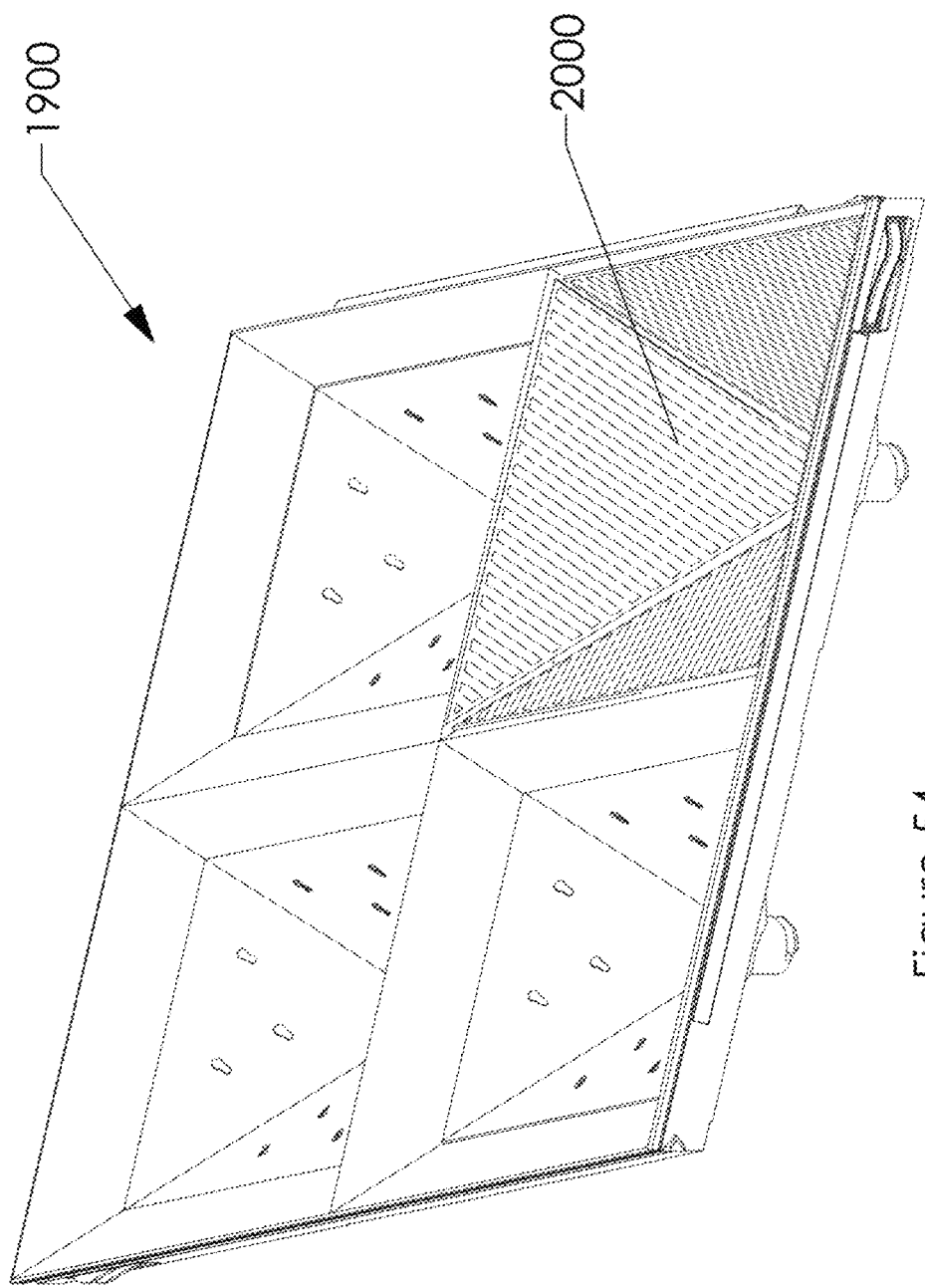
FIG. 54 shows a solar panel module locked in place in a male side wall.

FIG. 53 shows a module 2000 of four (4) solar panels 1800 in relative position and FIG. 54 shows a solar panel module 2000 locked in place in a male side wall 1900.

Figure 55:
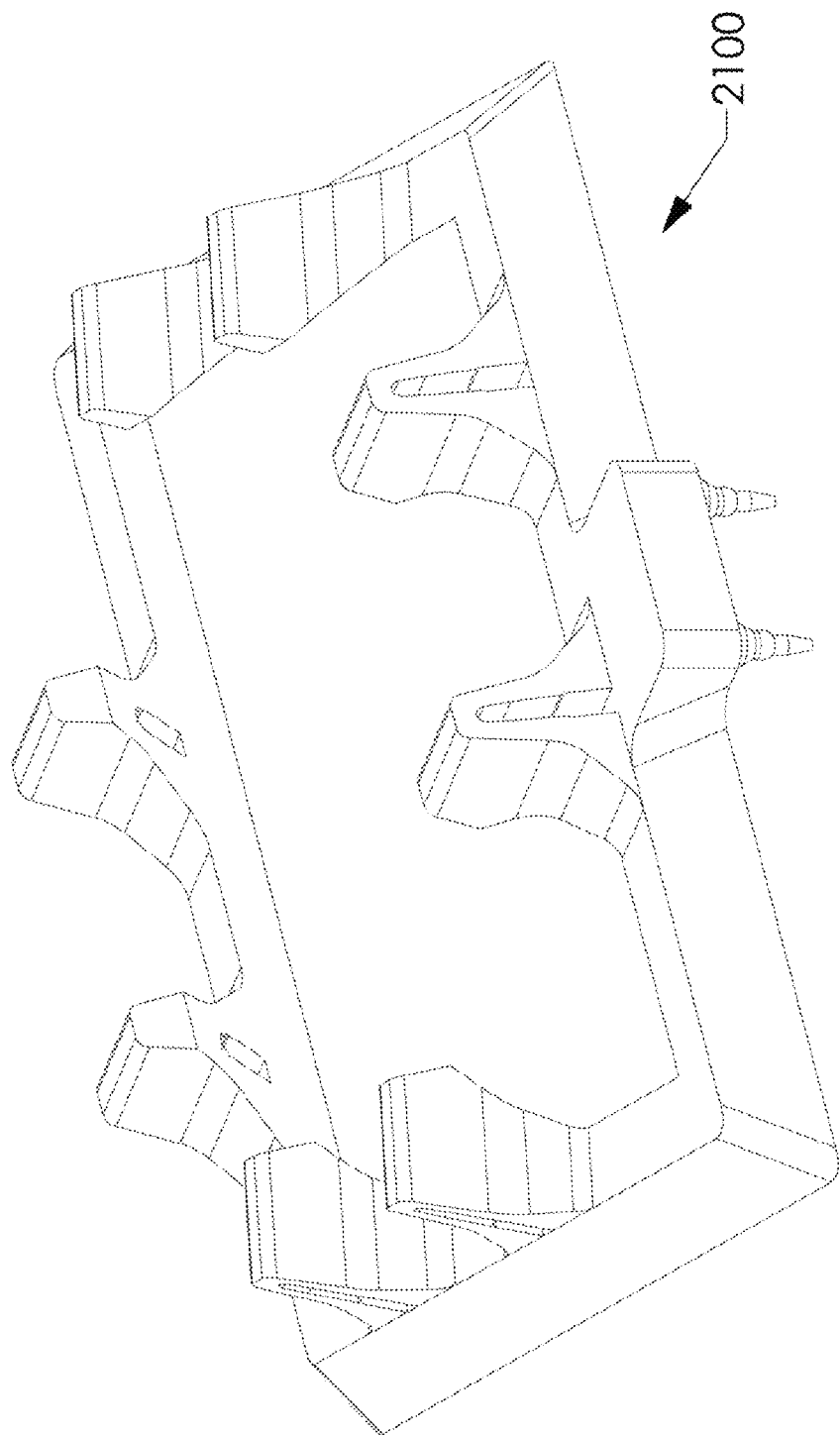
FIG. 55 shows a connection rack.

FIG. 55 shows a connection rack 2100 used to join a solar panel module 2000 and connect it to the first conductive layer 900 and the second conductive layer 1200. These racks 2100 are beneficial because they eliminate exposed wires and, if damaged, can be easily replaced. Because they are arranged in parallel, individual racks 2100 can be replaced without interrupting current flow.

Figure 56A:
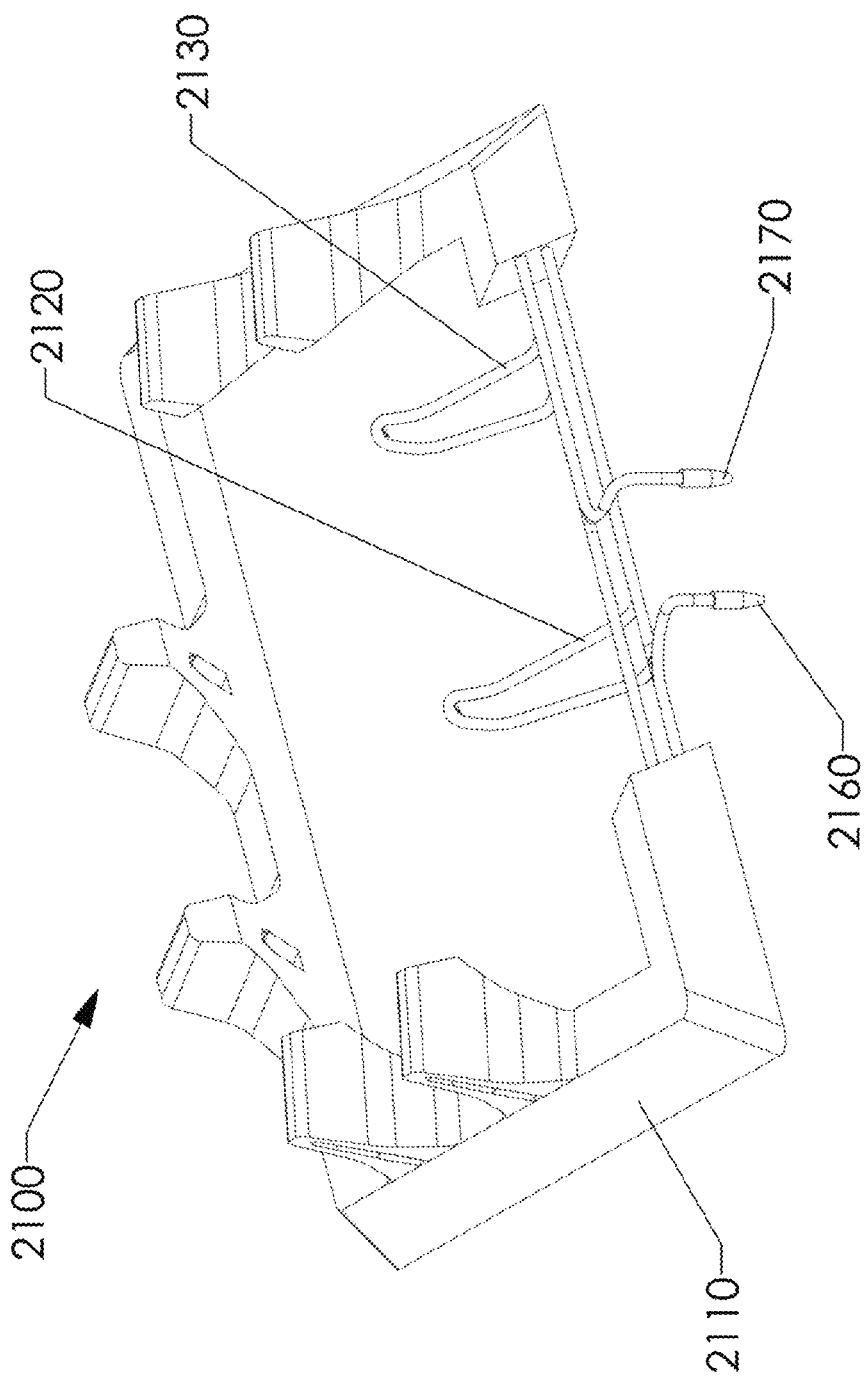
FIG. 56A shows a cutaway view of the connection rack.

FIG. 56A shows a cutaway view of a connection rack 2100. It shows its connection rack body 2110, solar rack positive circuit 2120, solar rack negative circuit 2130, positive lead 2160 and negative lead 2170. FIG. 56B shows two views of the extracted circuits for clarity. They are solar rack positive circuit 2120 and positive lead 2160, in the left view, and, in the right view, solar rack negative circuit 2130 and negative lead 2170.

In one non-limiting example, the connection rack 2100 will consist of metal conductive circuits 2120, 2130 overmolded with a thermoplastic body. In another non-limiting example, the components may be 3D printed with dual extruder heads. In this process, the body 2110 is printed using an insulative thermoplastic, while a second material will make the conductive circuits 2120, 2130, possibly using a graphene infused thermoplastic similar to the male conductive frame 400. In a further, non-limiting example, the body 2110 is 3D printed or molded in sections and locks in conductive wire.

Figure 57:
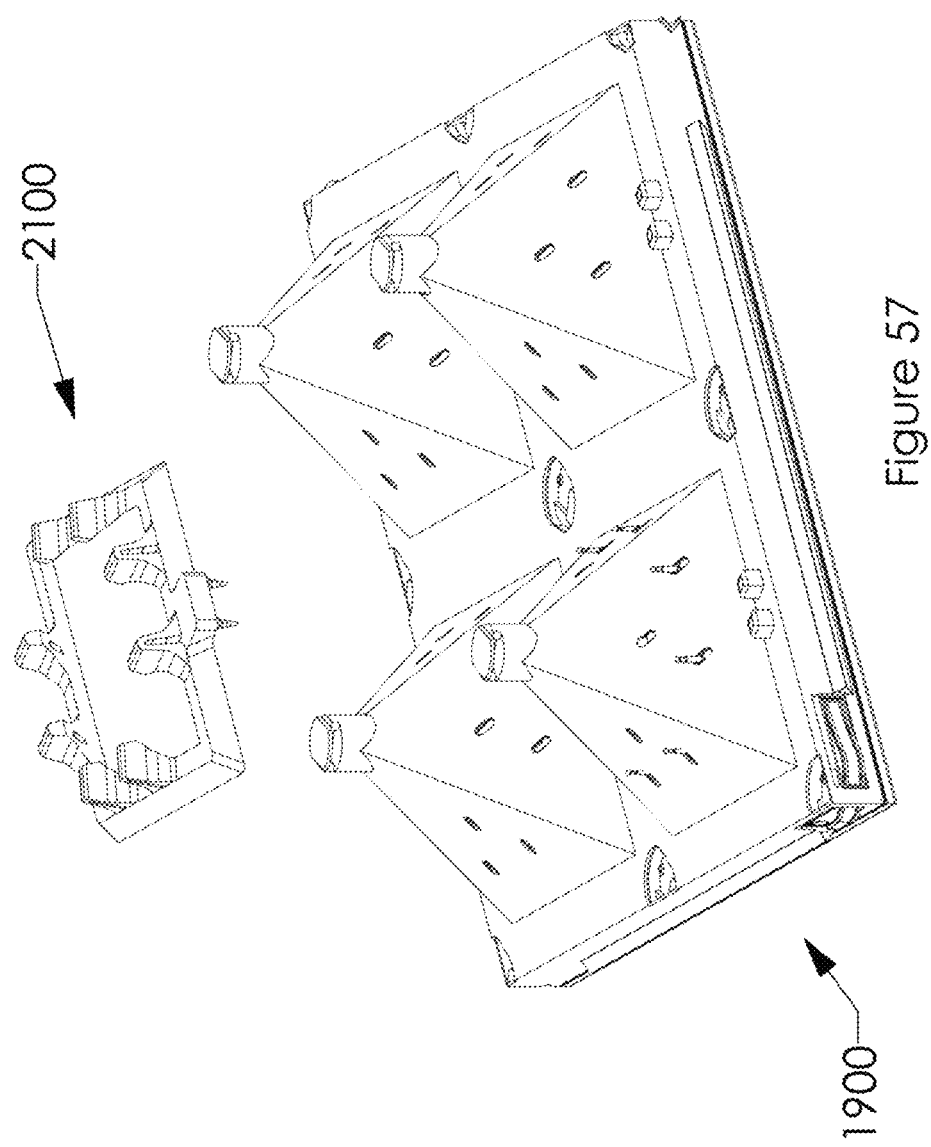
FIG. 57 shows a connection rack oriented to join a male side wall.
Figure 58:
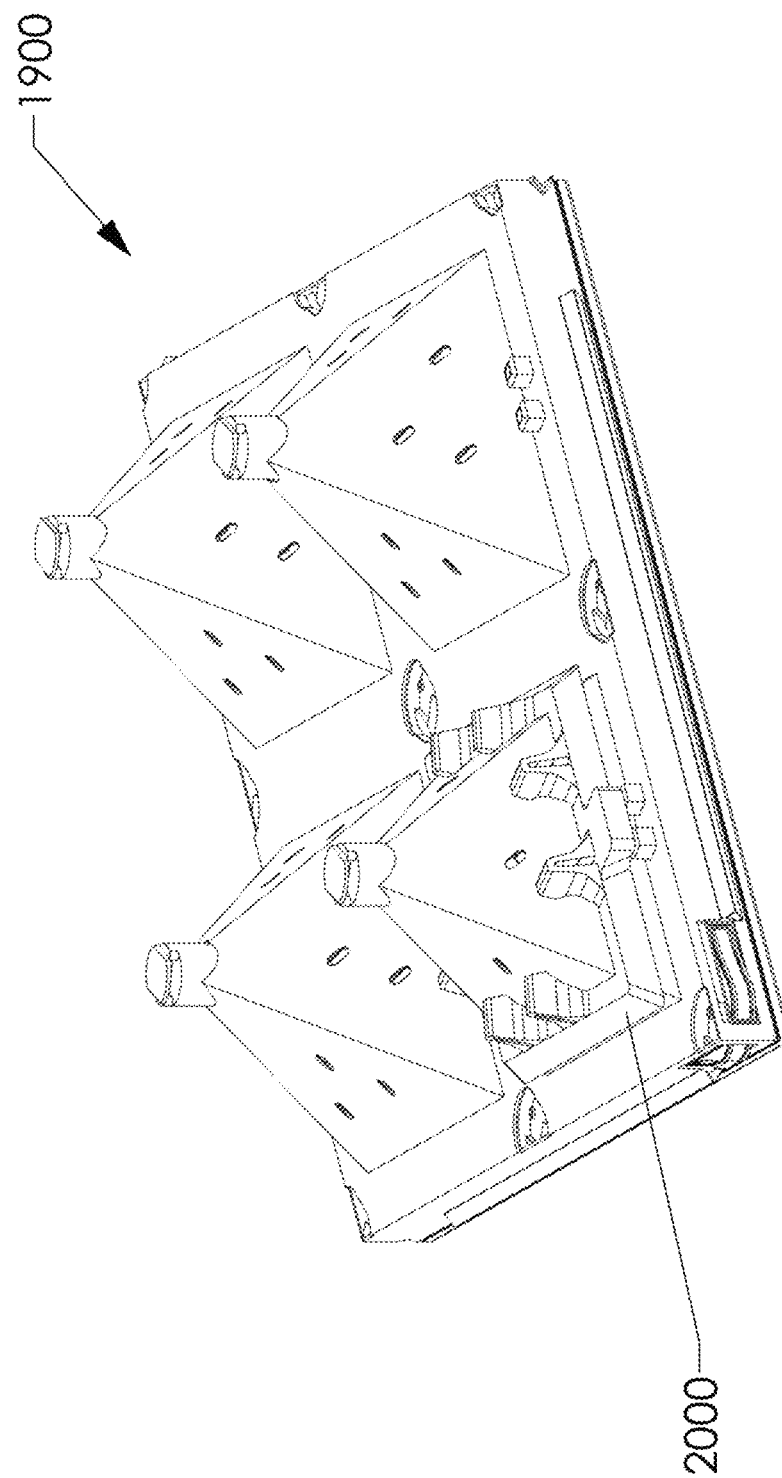
FIG. 58 shows a connection rack locked in place with a male side wall.
Figure 59:
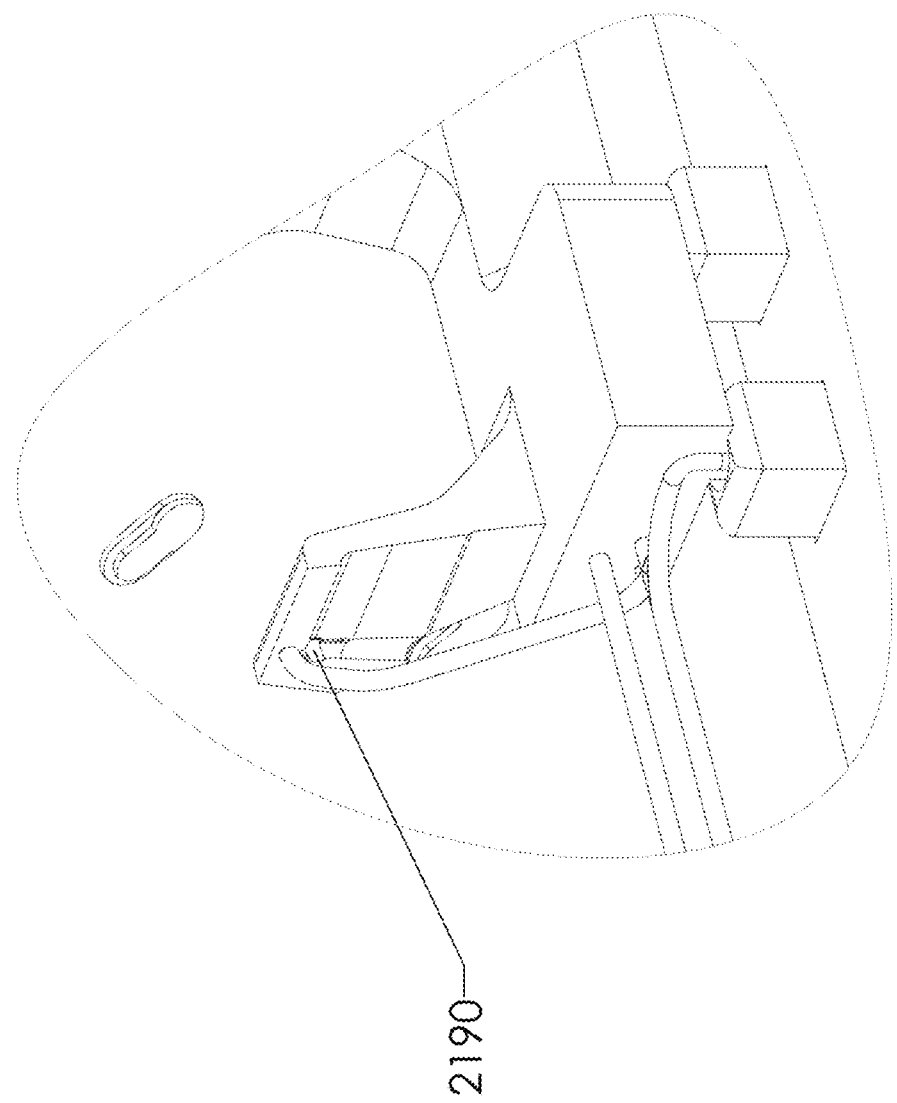
FIG. 59 shows a cutaway detail of a detent socket on a connection rack.

FIG. 57 shows a connection rack 2100 oriented to join a male side wall 1900. FIG. 58 shows the connection rack 2100 locked in place with the male side wall 1900. FIG. 59 shows a cutaway detail of one of the eight (8) detent sockets 2190 on a connection rack 2100. The detent sockets 2190 are used to retain the bulbous tip of the conductive lead on the solar panel post 1810. In this image, the solar panel 1800 and its post 1810 are hidden to reveal the cavity of the detent socket 2190.

Figure 60:
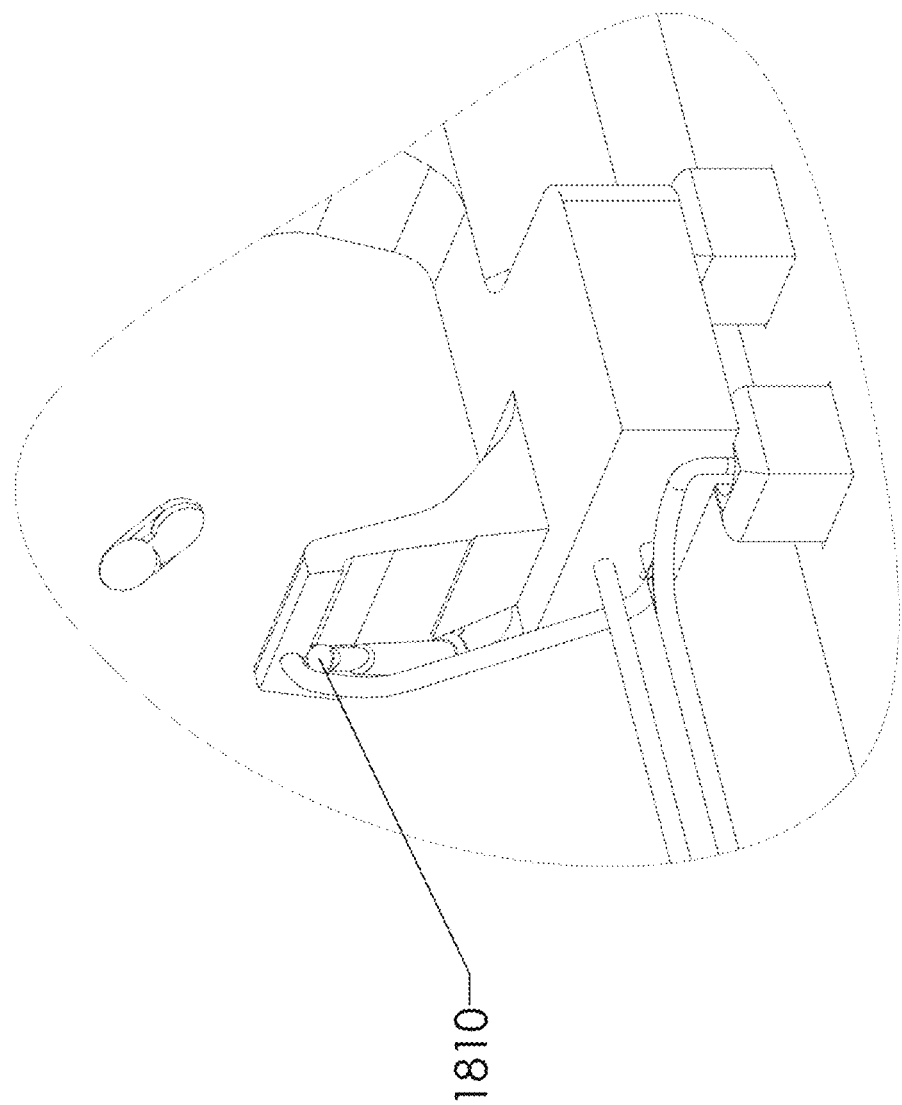
FIG. 60 shows a cutaway detail of a conductive lead on the solar panel post locked into a detent socket.

FIG. 60 shows a cutaway detail (similar to FIG. 59), where the bulbous tip of a conductive lead on the solar panel post 1810 is exposed as it is locked into a detent socket 2130.

FIG. 61 shows a cutaway of a connection rack 2100. At the bottom is a detail of the ball joints 2150 that go into the ball socket snap fits 700 (see FIG. 7). These snap fits 700 house the exposed positive lead 2160 of the solar rack positive circuit 2120 as well as the exposed negative lead 2170 of the solar rack negative circuit 2130.

Figure 62:
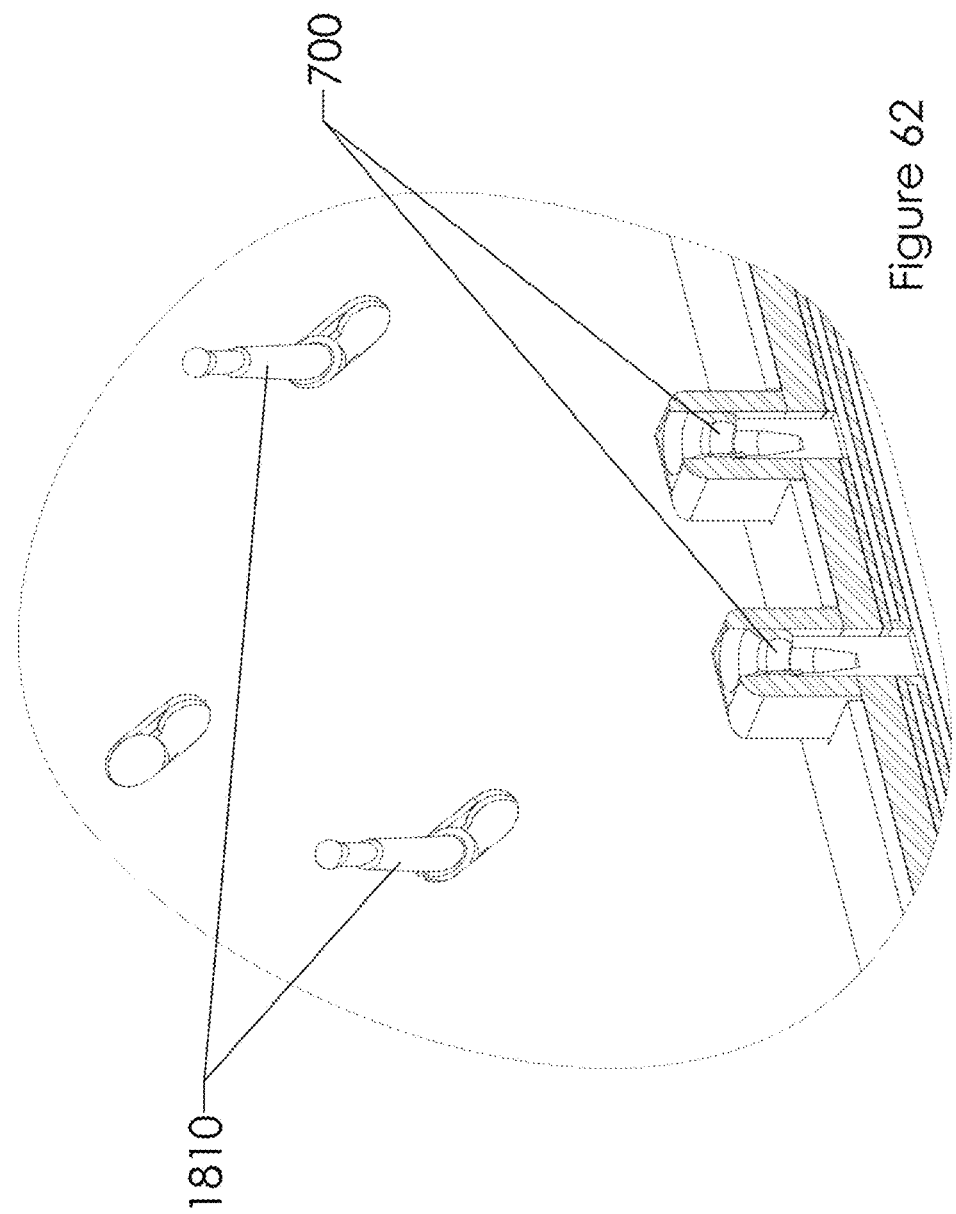
FIG. 62 shows a detail of a cross section of the ball socket snap fits.

FIG. 62 shows a detail of the cross section of the ball socket snap fits 700 (with the connection rack 2100 hidden) and the solar panel posts 1810 exposed.

Figure 63:
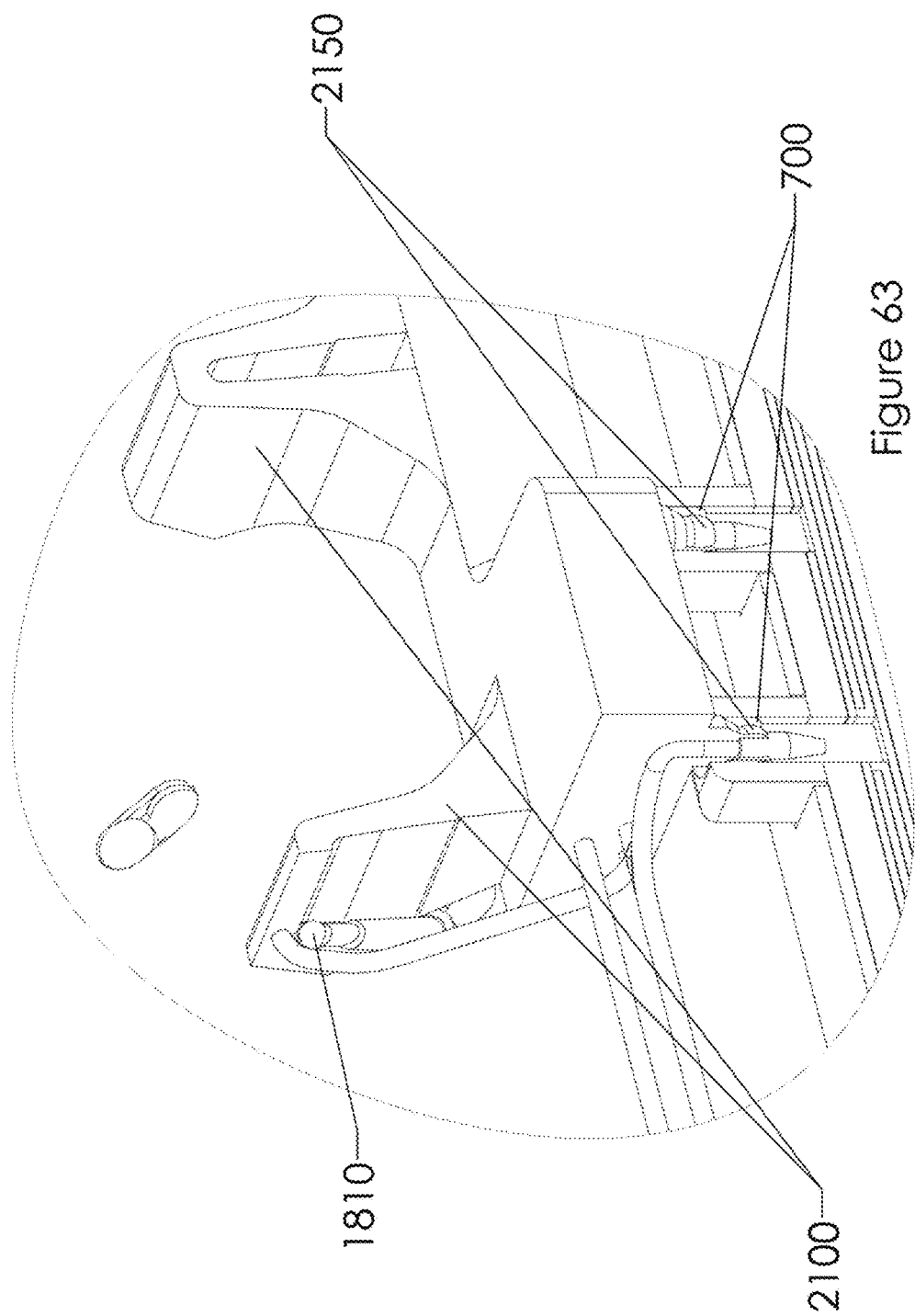
FIG. 63 shows a view of the ball joints locked into the ball snap fits.

FIG. 63 shows a view (similar to FIG. 60), but reveals the ball joints 2150 locked into the ball snap fits 700 and a cutaway of the connection rack 2100 exposing a solar panel post 1810 in place.

Figure 64:
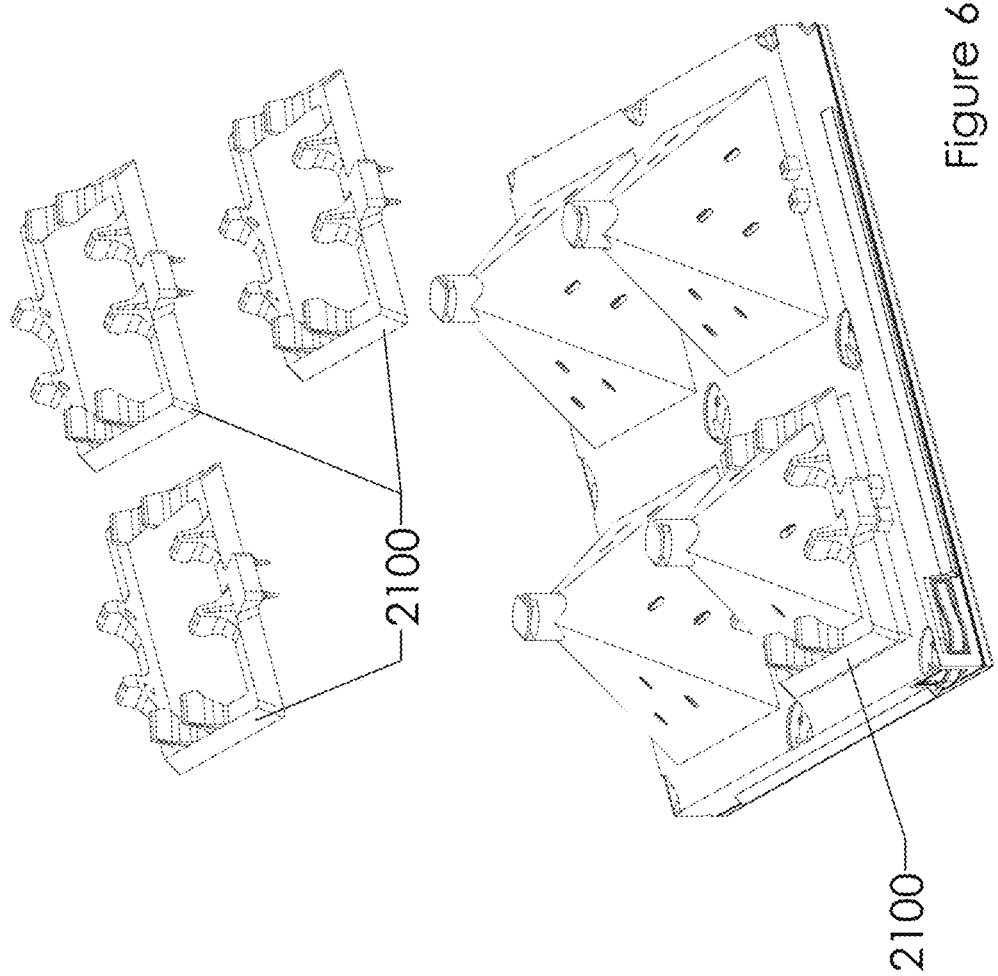
FIG. 64 introduces the remaining connection racks.
Figure 65:
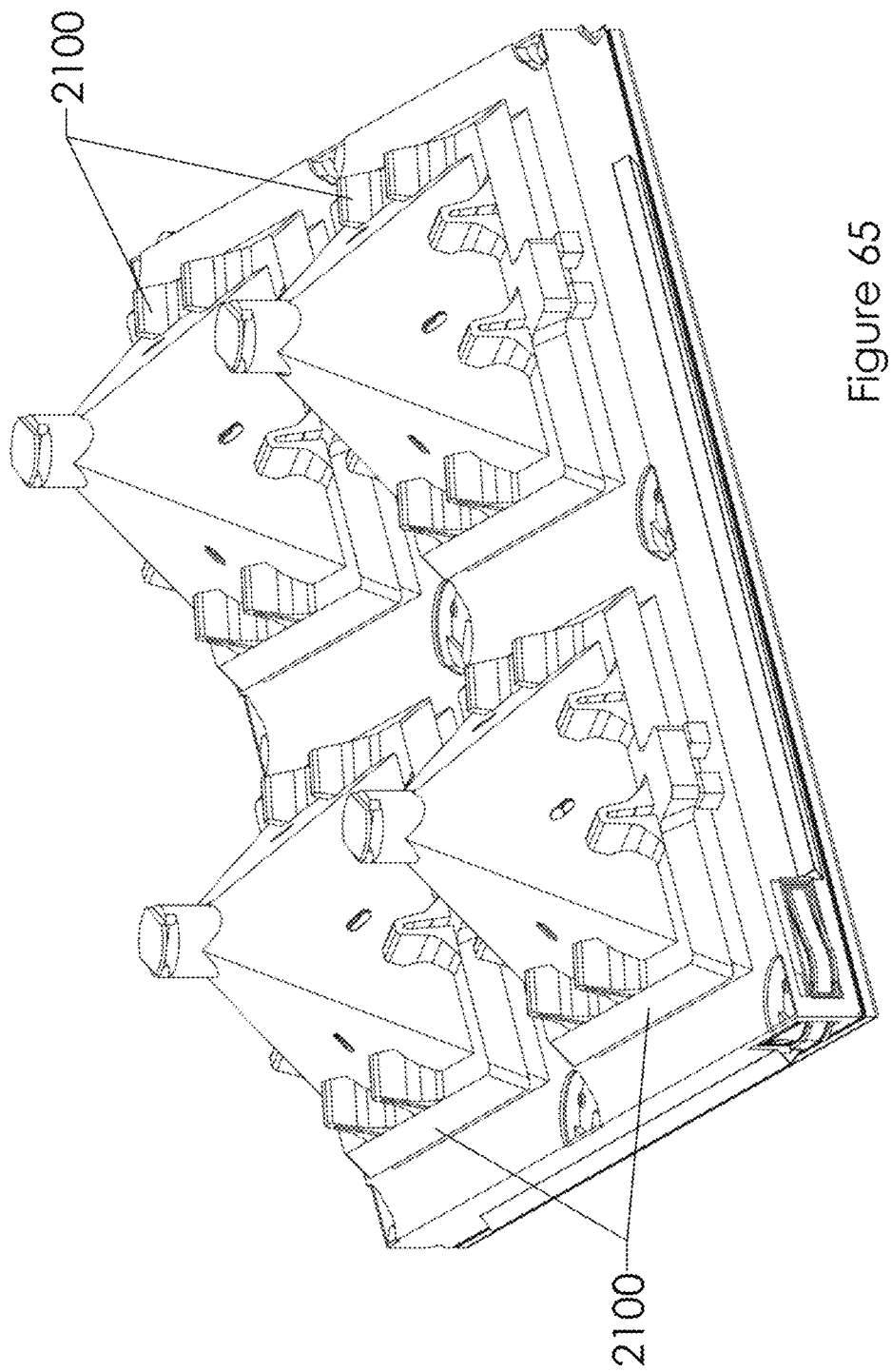
FIG. 65 shows all connection racks locked into place.

FIG. 64 introduces the three (3) remaining connection racks 2100 to complete the backside of a solar panel section. FIG. 65 shows all four (4) connection racks 2100 locked into place.

Figure 66:
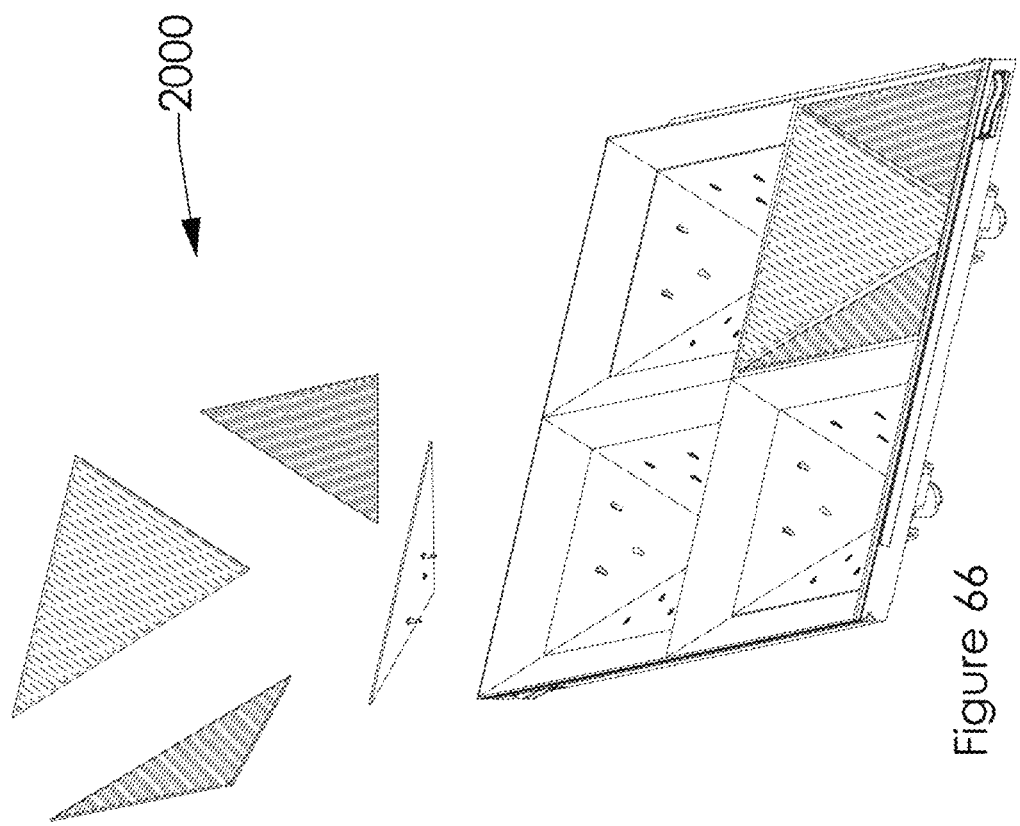
FIG. 66 shows a second module of solar panels separated and ready to be locked into place.
Figure 67:
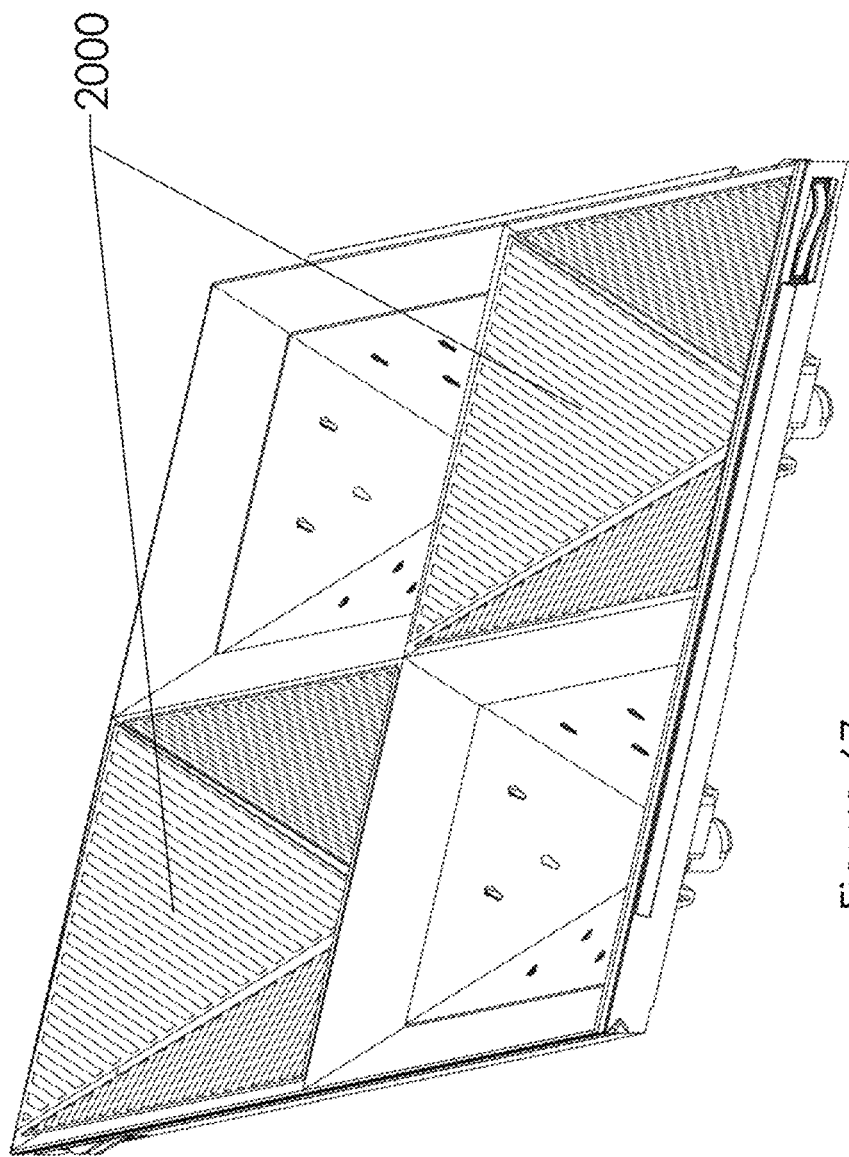
FIG. 67 shows the second module of solar panels locked into place.
Figure 68:
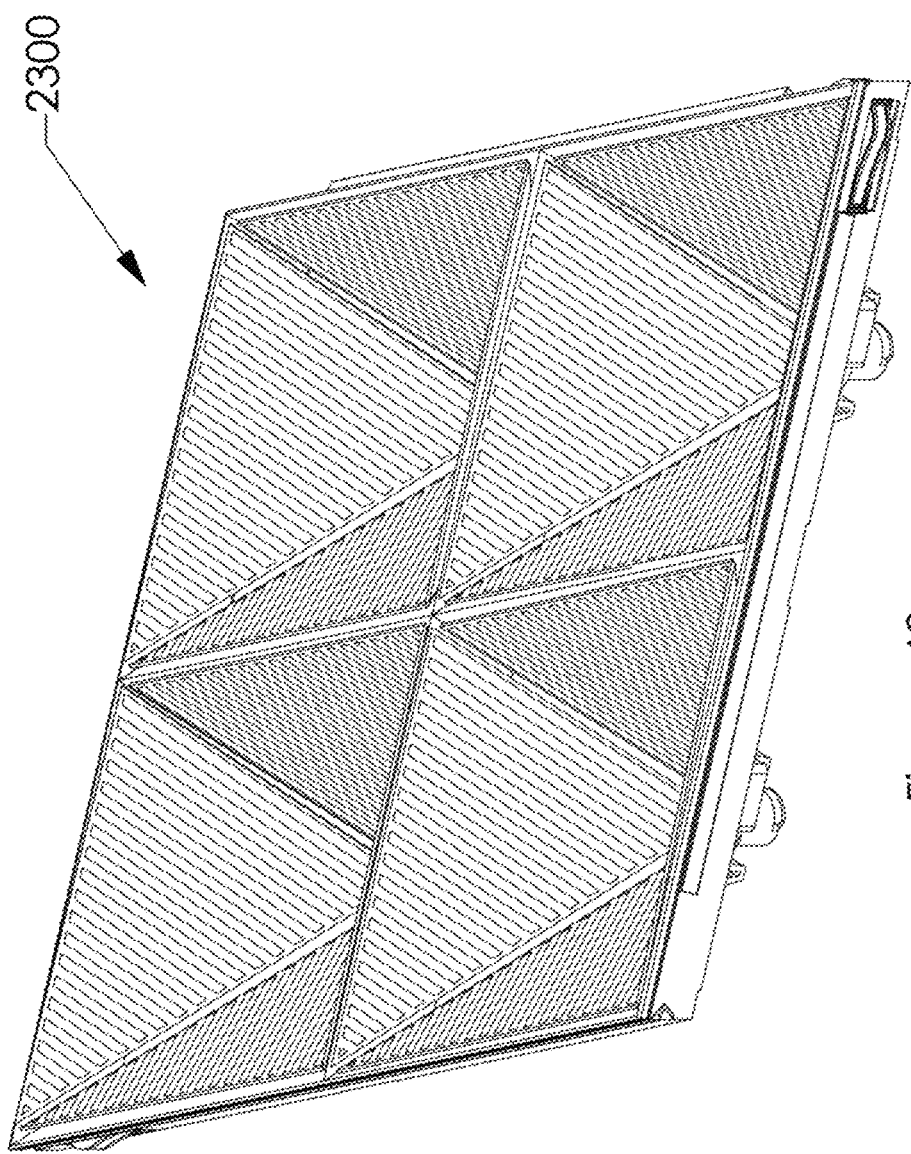
FIG. 68 shows a completed assembly of a male solar panel section from the solar panels side.

FIG. 66 shows a second module of four (4) solar panels 2000 separated and ready to be locked into place. FIG. 67 shows the second module of four (4) solar panels 2000 locked into place. FIG. 68 shows a completed assembly of a male solar panel section 2300 from the exposed solar panels side.

Figure 69:
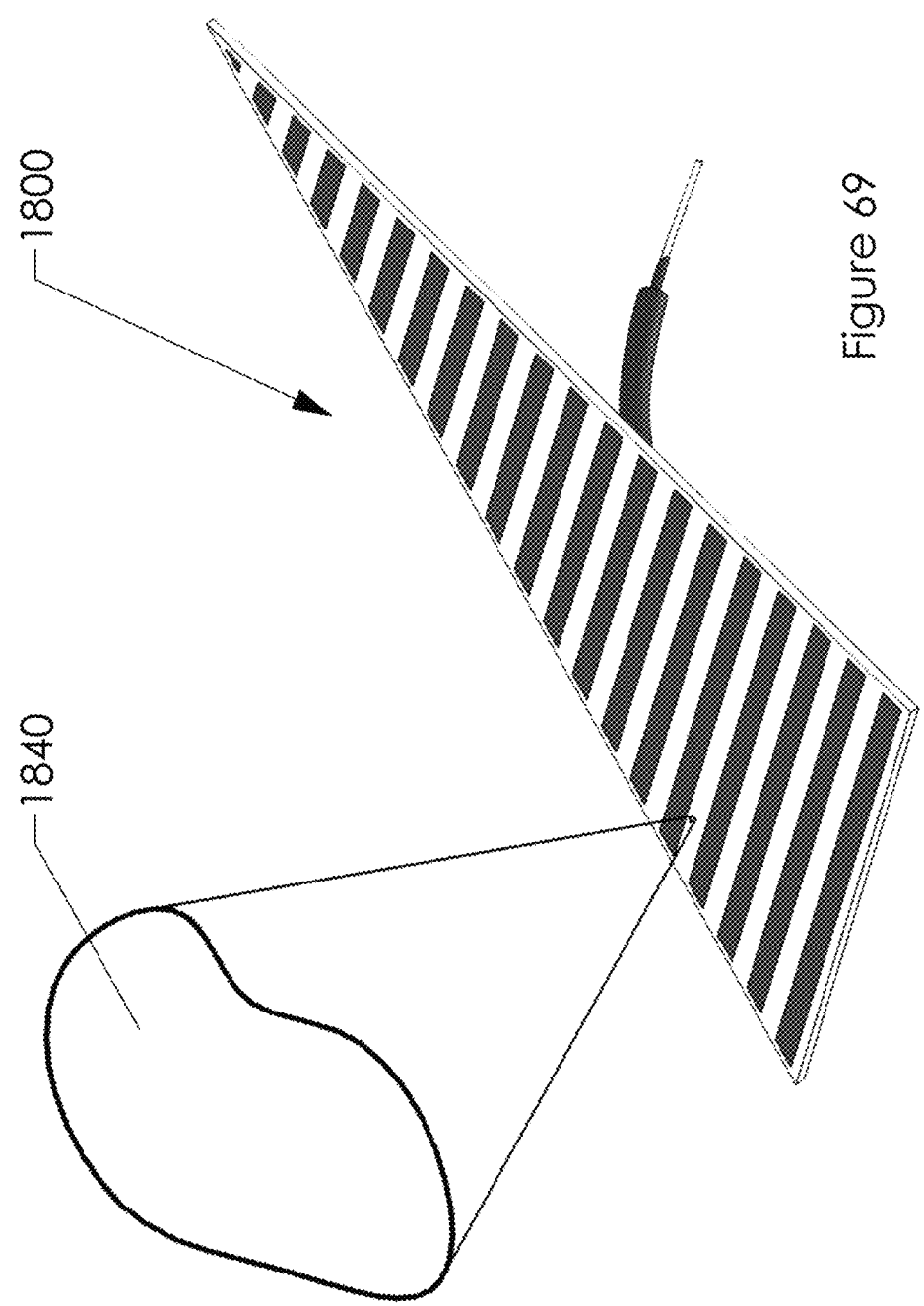
FIG. 69 shows a close-up view of a solar panel.
Figure 70:
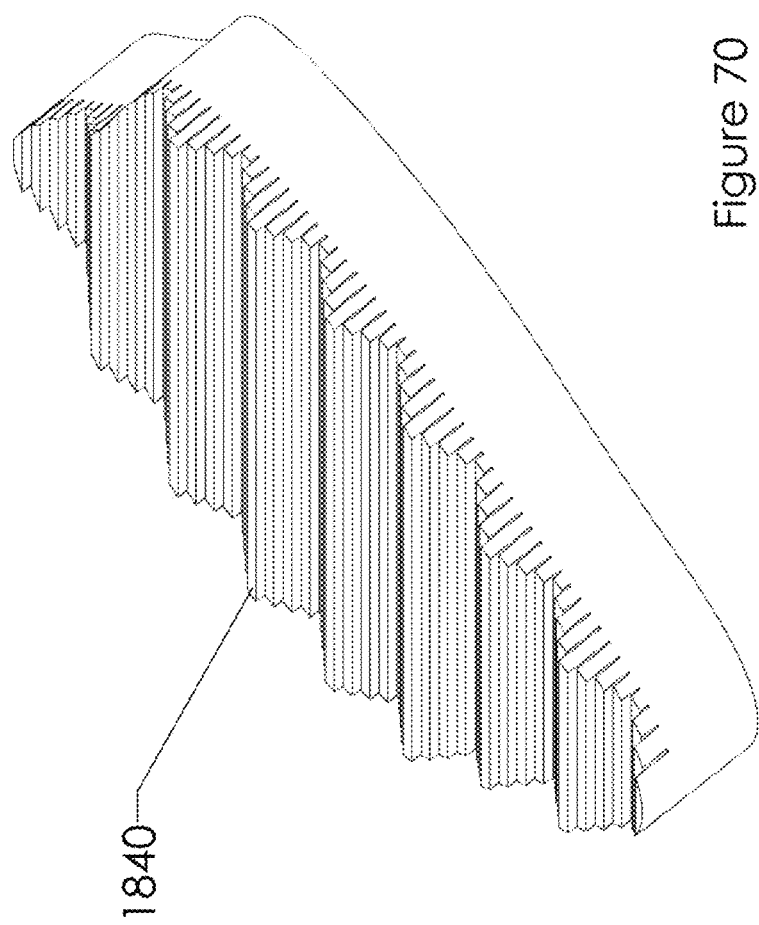
FIG. 70 shows exaggerated detail of the casing of the panel.

FIG. 69 shows a solar panel 1800 and the area to be detailed of a transparent casing 1840 (which is shown in FIG. 70). This casing consists of wave patterned, refraction steps on the outside surface of the panel 1800. In one non-limiting embodiment, the cells on the photovoltaic (PV) solar panel 1800 are 3D printed with multiple extruder heads, each assigned a different material. The first extruder prints an insulative backing. A second prints a conductive path for the bottom positive cell layer using conductive ink. A third prints a positively "doped" semi-conductive layer and a fourth prints a negatively doped semi-conductive layer. The second extruder can be reintroduced and prints a conductive path for the top negative layer.

At various levels of the build, in one non-limiting embodiment, the print is stopped to insert components, restarted and then encapsulate parts which are combined into an integrated circuit or IC. This IC may be a junction box consisting of bypass and blocking diodes in parallel to prevent a back flow of current and to allow continuous electricity in case an individual cell is damaged. In another non-limiting embodiment, the entire IC subassembly can be 3D printed at once using multiple extruder heads, each with a separate material in the same fashion that the cells are printed.

FIG. 70 shows exaggerated detail of wave patterned, transparent, refraction steps 1840 on the casing of the panel, as referenced in FIG. 69. These steps increase the surface area that is exposed to sunlight. In one non-limiting embodiment, this casing is produced as an injection molded component using an optical quality polymer and then polished. The edges are then bonded onto the top layer of the cell and complete the solar panel 1800. In another non-limiting embodiment, the casing is 3D printed using a different process, such as Stereolithograhy (SLA), and then polished to refine the refraction steps 1840.

Figure 71:
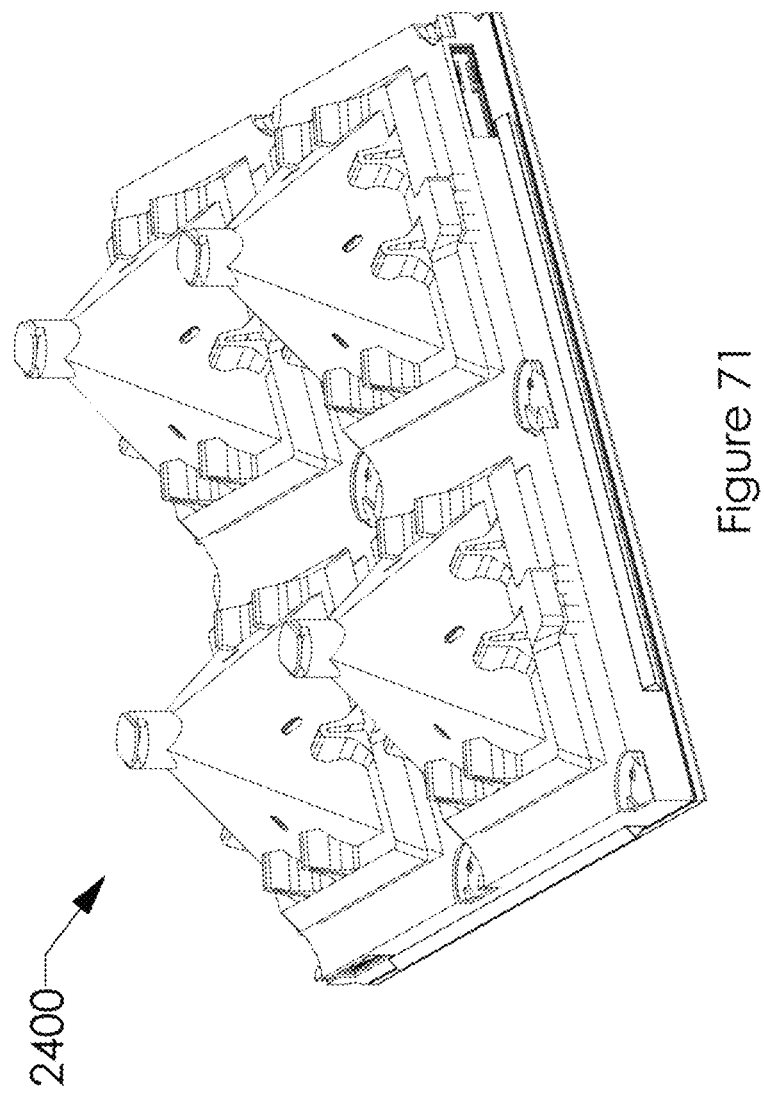
FIG. 71 shows a female—B—wall section from the connection rack side.
Figure 72:
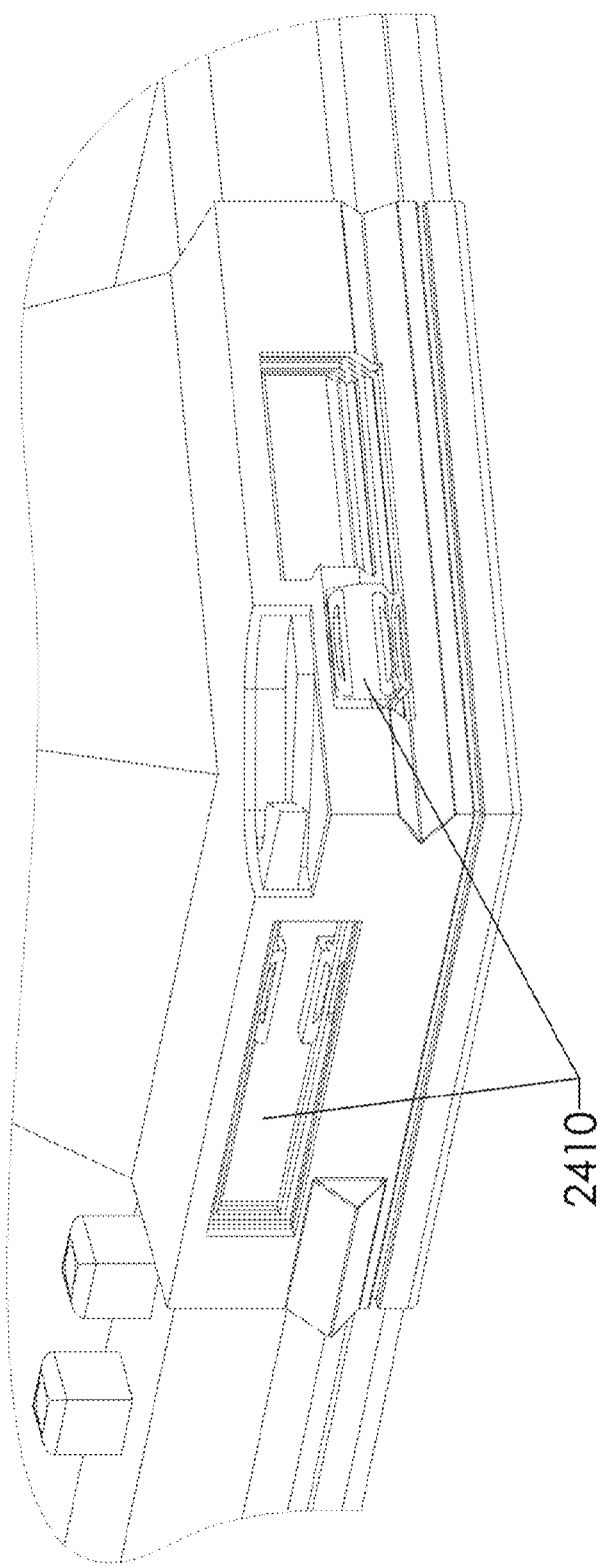
FIG. 72 shows a detail of the combined female connector ends.
Figure 73:
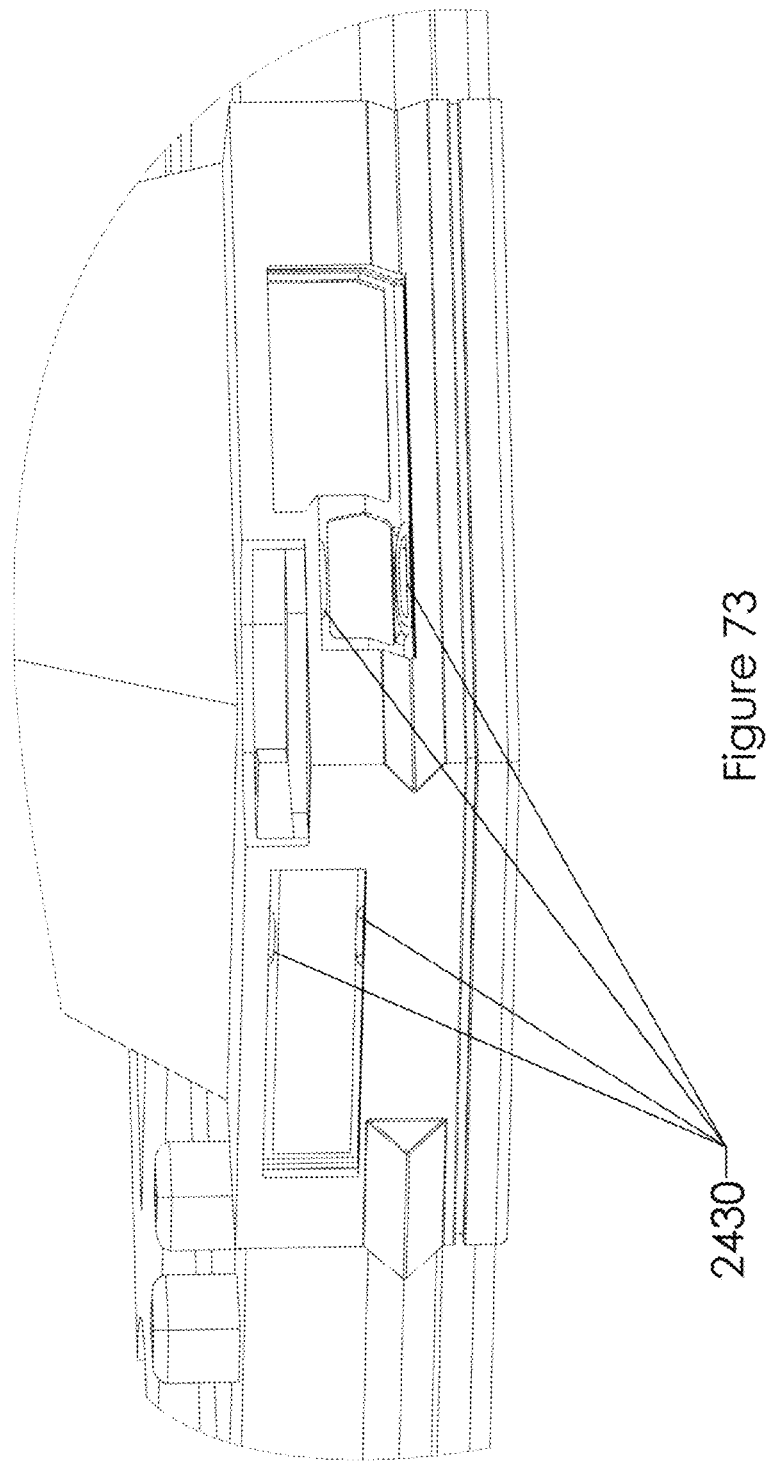
FIG. 73 shows a detail of the connector ends of the female first conductive layer.

FIG. 71 shows a female—B—wall section 2400 from the connection rack side. FIG. 72 shows a detail of the combined female connector ends 2410. FIG. 73 shows a detail of the connector ends of the female first conductive layer 2430. (A female first insulative layer is obscured).

Figure 74:
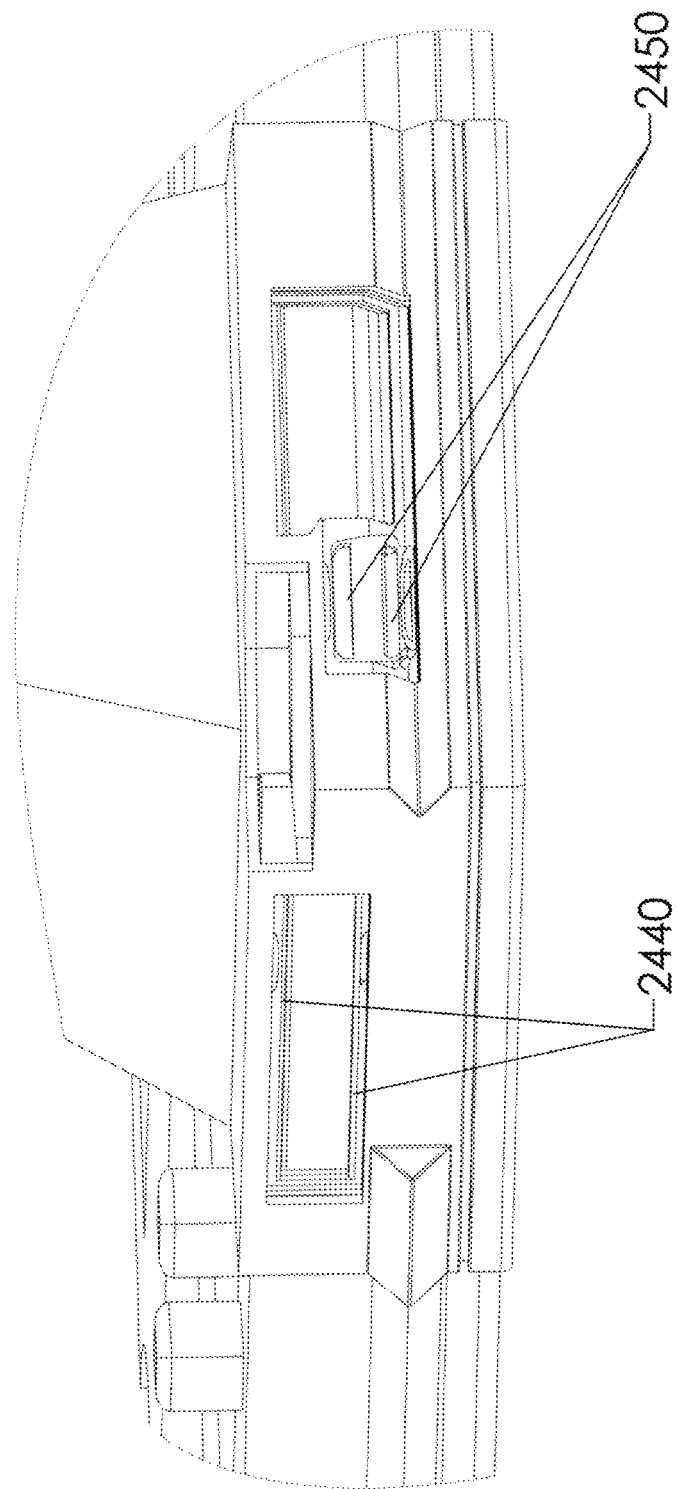
FIG. 74 shows a detail of the female second insulative layer.
Figure 75:
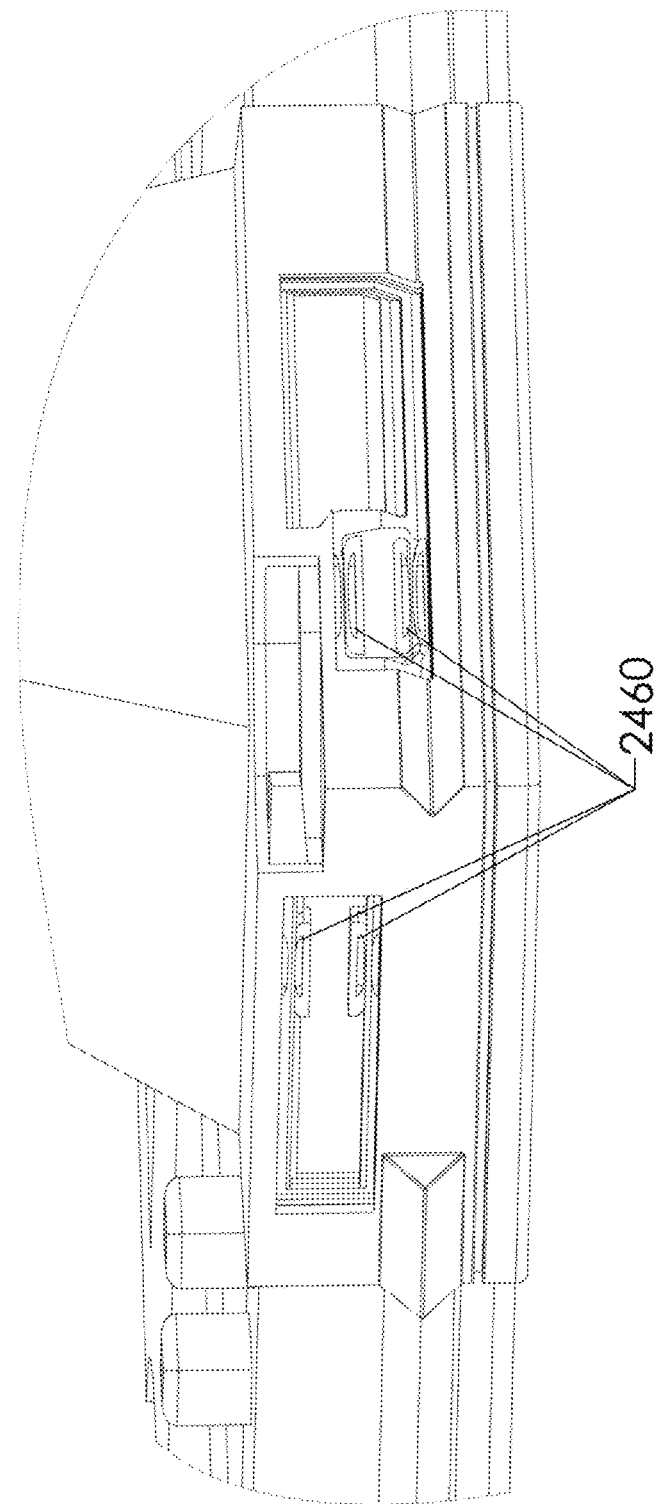
FIG. 75 shows a detail of the connector end's female second conductive layer.

FIG. 74 shows a detail of the female second insulative layer 2440 and its reinforced, connective sheath 2450 on the right side. FIG. 75 shows a detail of the connector end's female second conductive layer 2460.

Figure 76:
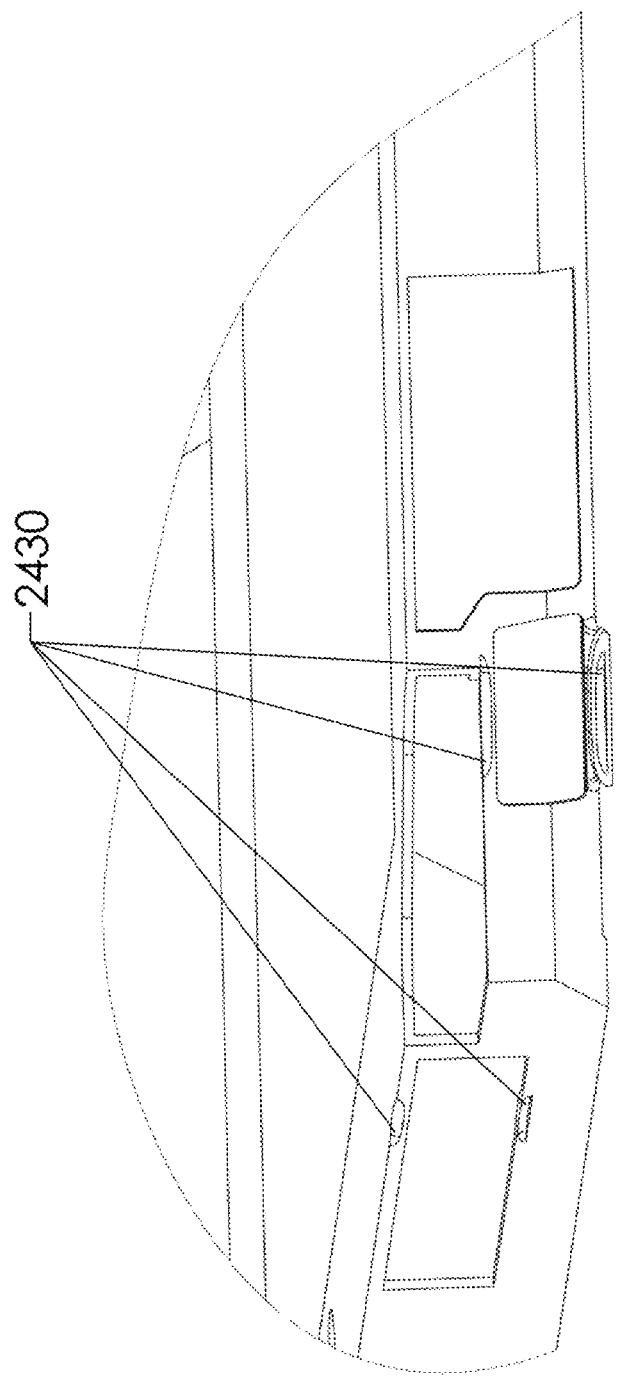
FIG. 76 shows a detail of the isolated connector ends of the female first conductive layer.
Figure 77:
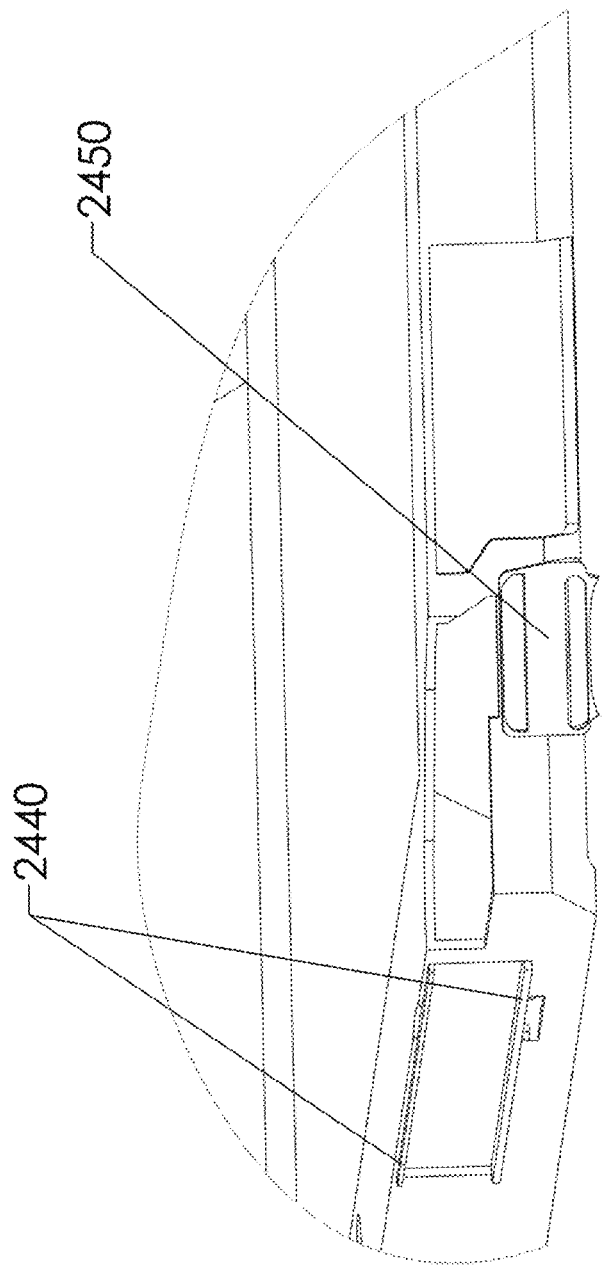
FIG. 77 shows a detail of the isolated female second insulative layer.
Figure 78:
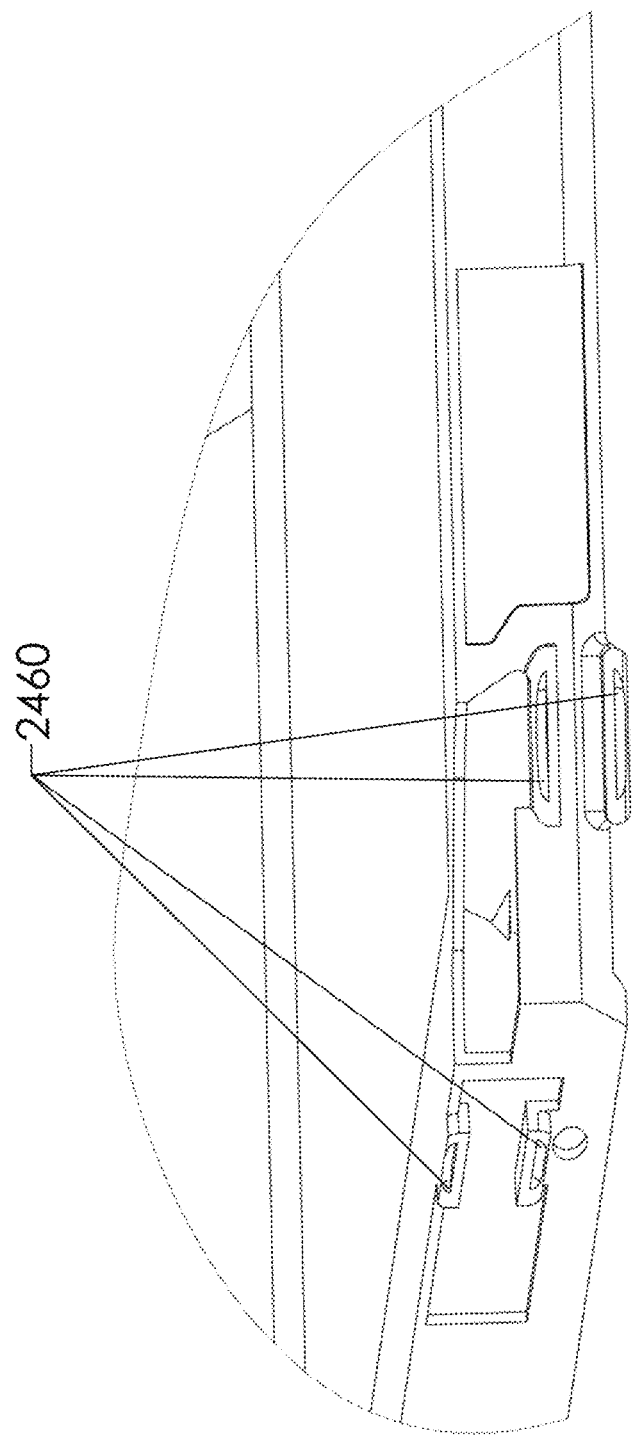
FIG. 78 shows a detail of the isolated connector ends of the female second conductive layer.

FIG. 76 shows a detail of the isolated connector ends of female first conductive layer 2430. FIG. 77 shows a detail of the isolated female second insulative layer 2440 and its reinforced, connective sheath 2450 on the right side. FIG. 78 shows a detail of the isolated connector ends of the female second conductive layer 2460.

Figure 79:
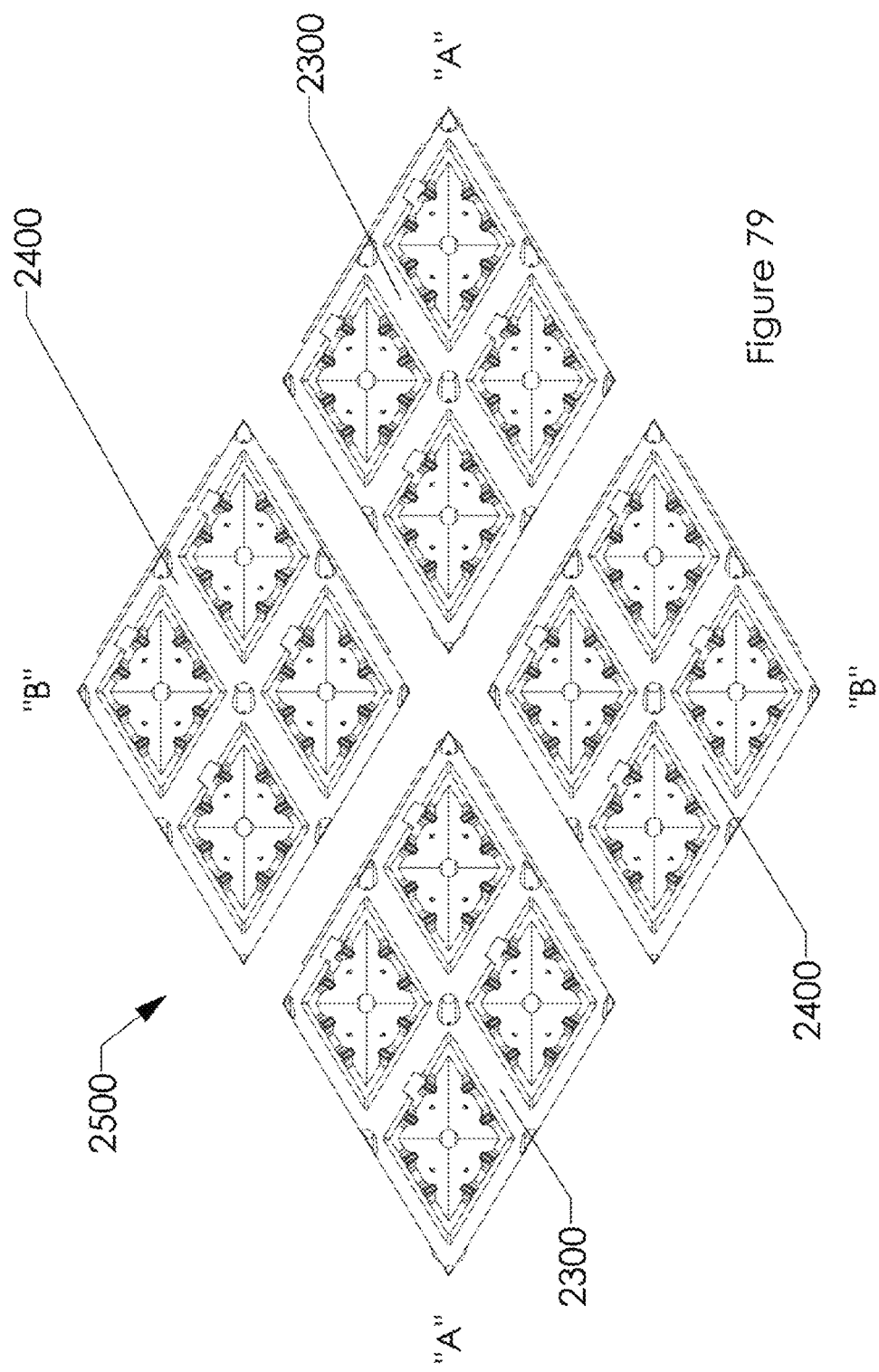
FIG. 79 shows male—A—and female—B—wall sections in relative position.

FIG. 79 shows male—A—wall sections 2300 and female—B—wall sections 2400 in relative position from the connector side.

Figure 80B:
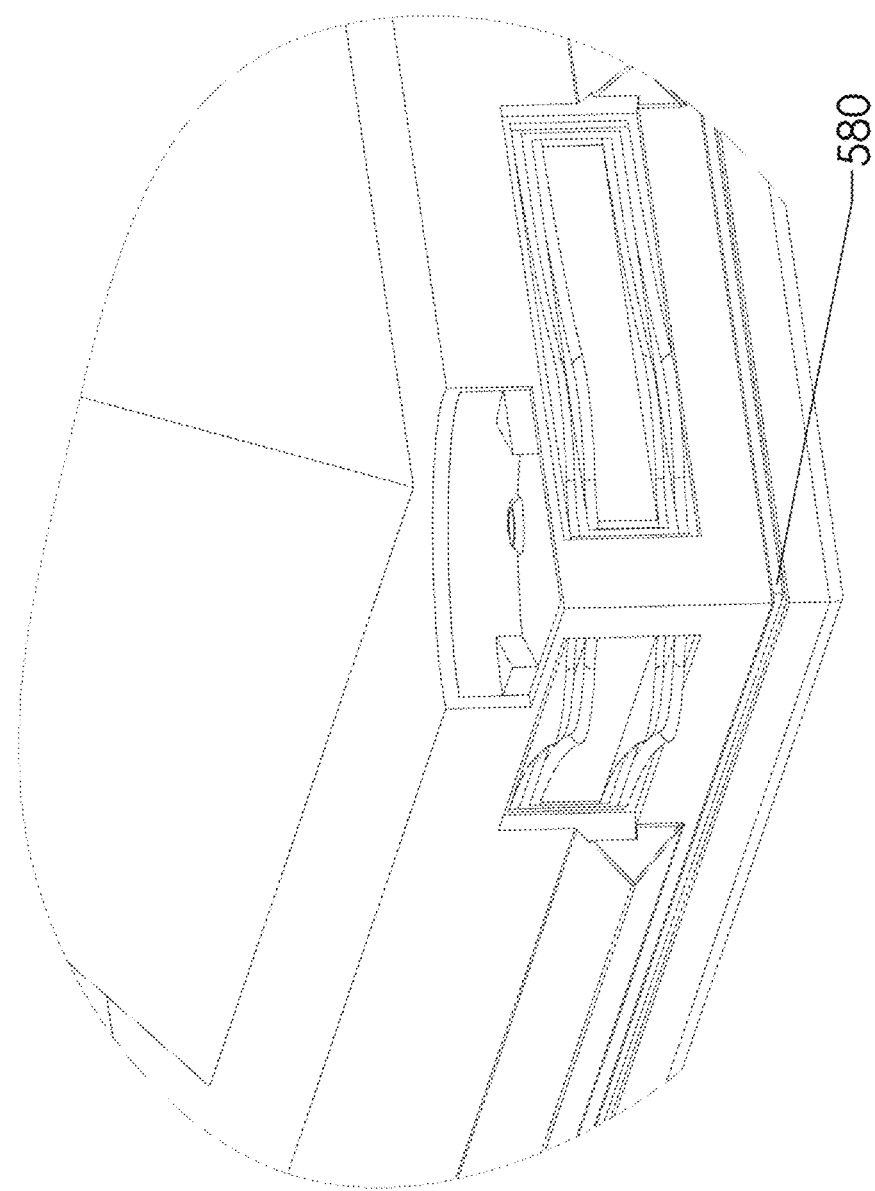
FIG. 80B shows a close-up of an O-ring groove.

FIG. 80A shows a detail of the—A—male connector ends (combined 550, 560 and 570),—B—female connector ends 2410, cutout vents 1700 at mating corners, V shaped bosses 520, V shaped grooves 530 and O-ring groove 580. FIG. 80B shows a close-up of an O-ring groove 580. This is used to seal the wall sections together and prevent moisture from penetrating either side. The groove surfaces may be coated with glue to reinforce the seal. FIG. 80C shows a cross section of the corner exposing the O-ring groove 580 and the O-ring 590.

Figure 81:
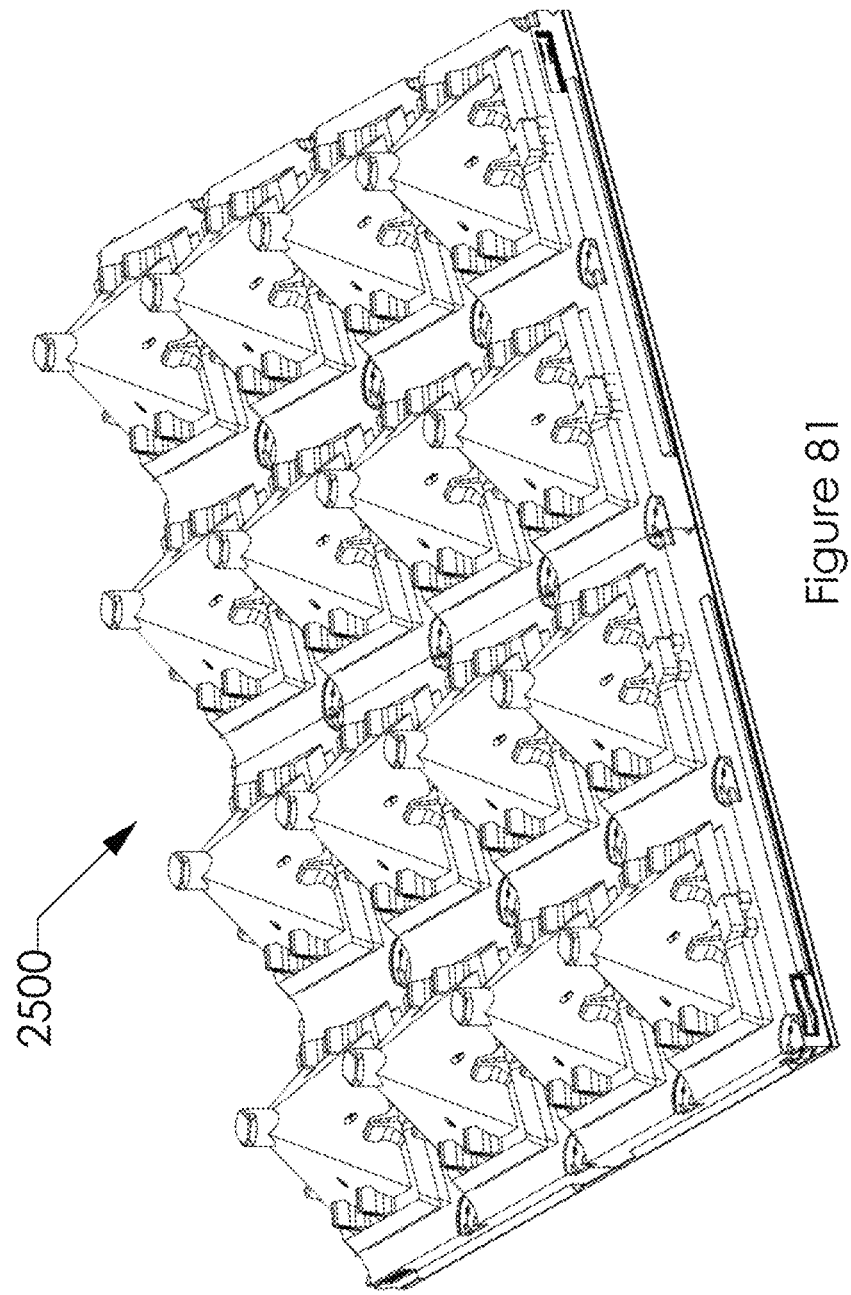
FIG. 81 shows male—A—and female—B—wall sections locked in place in a modular array.
Figure 82:
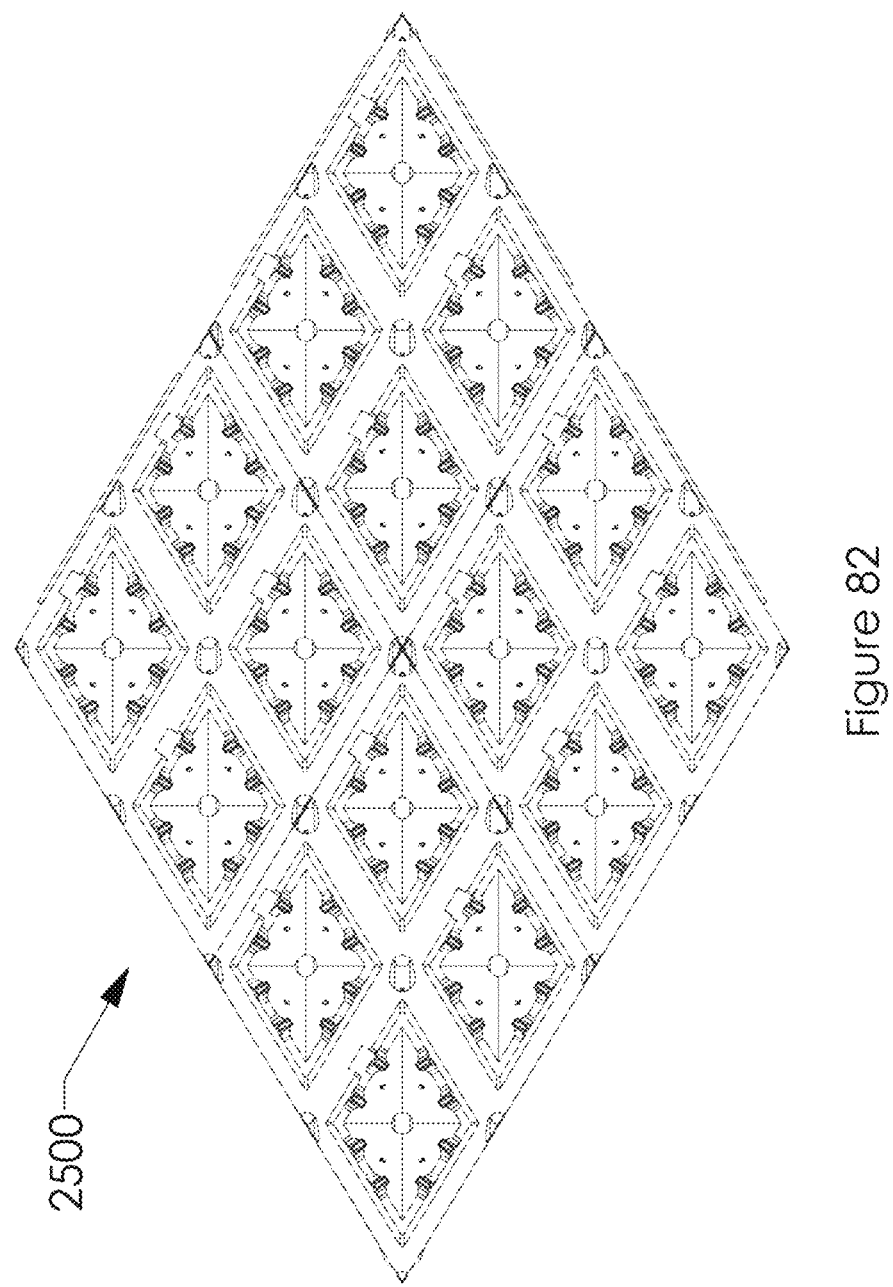
FIG. 82 shows alternate view of male—A—and female—B—wall sections locked in place in the modular array.

FIG. 81 shows male 2300—A—and female 2400—B— wall sections locked in place in a modular array 2500 from the connector side view. FIG. 82 shows alternate view of male—A—and female—B—wall sections 2300, 2400 locked in place in the modular array 2500 from the connector side view (here, normal to the underside face).

Figure 83:
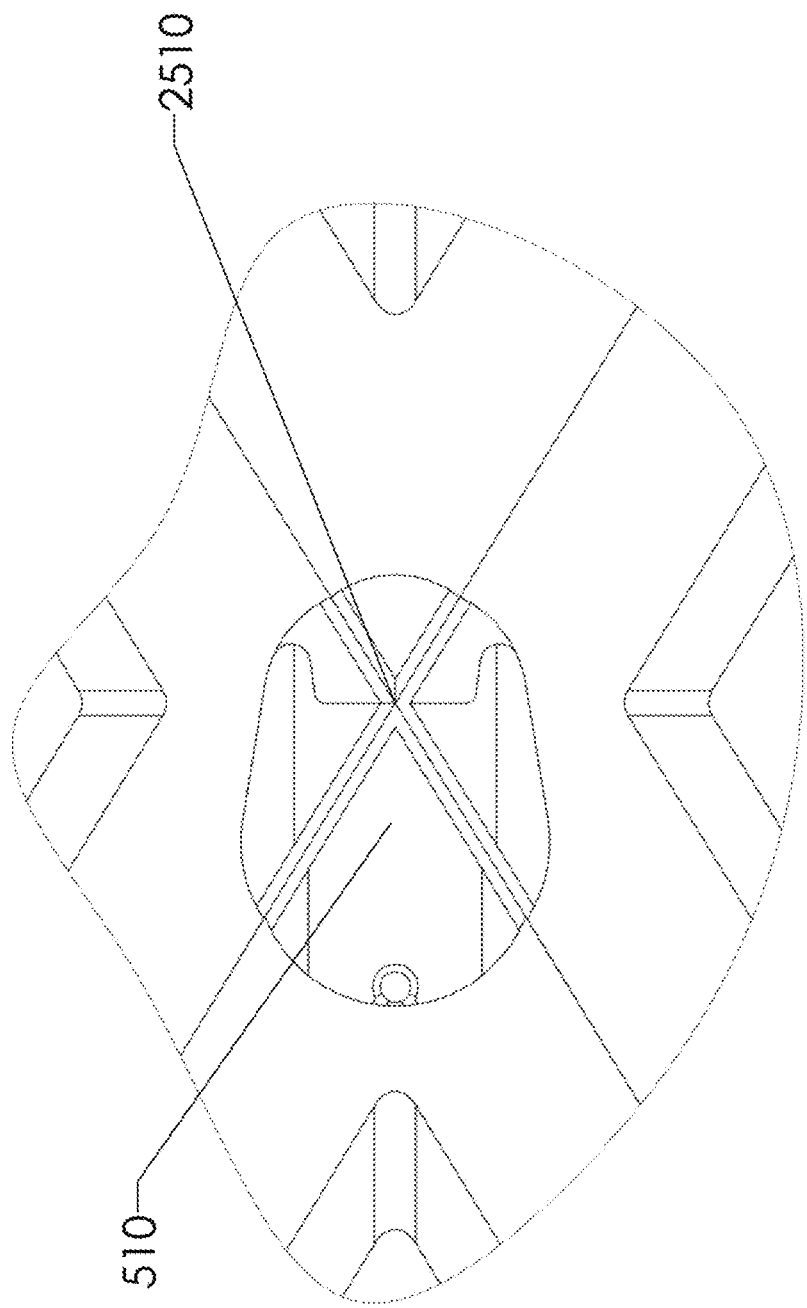
FIG. 83 shows a cropped detail of the junction of—A—&—B—sections which form a post slot.
Figure 84:
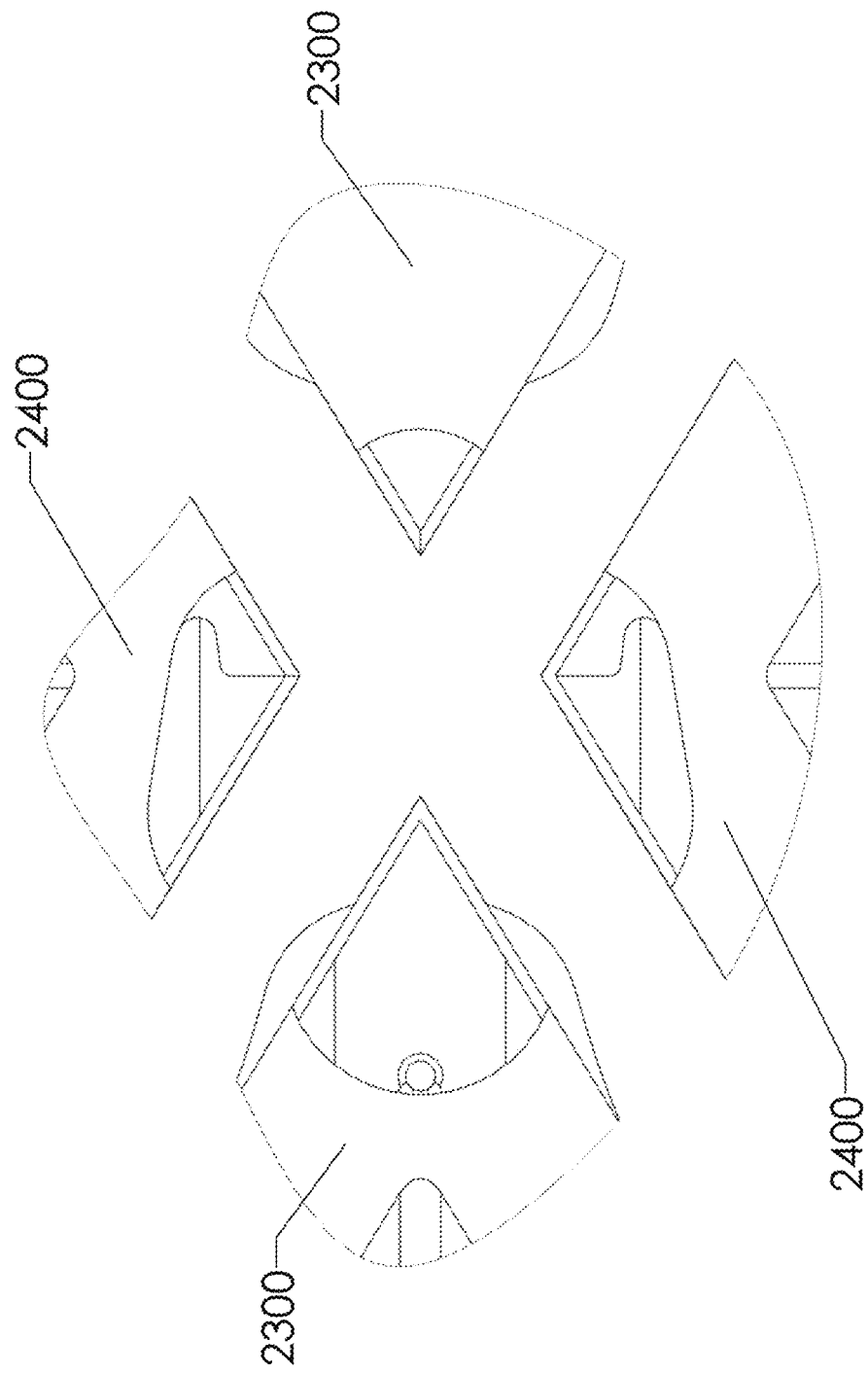
FIG. 84 shows a cropped detail of a laterally exploded junction of—A—&—B—sections.

FIG. 83 shows a cropped detail of the junction of—A— and—B—sections 2510 which form a post slot 510. FIG. 84 shows a cropped detail of a laterally exploded junction of—A—and—B—sections 2510.

Figure 85:
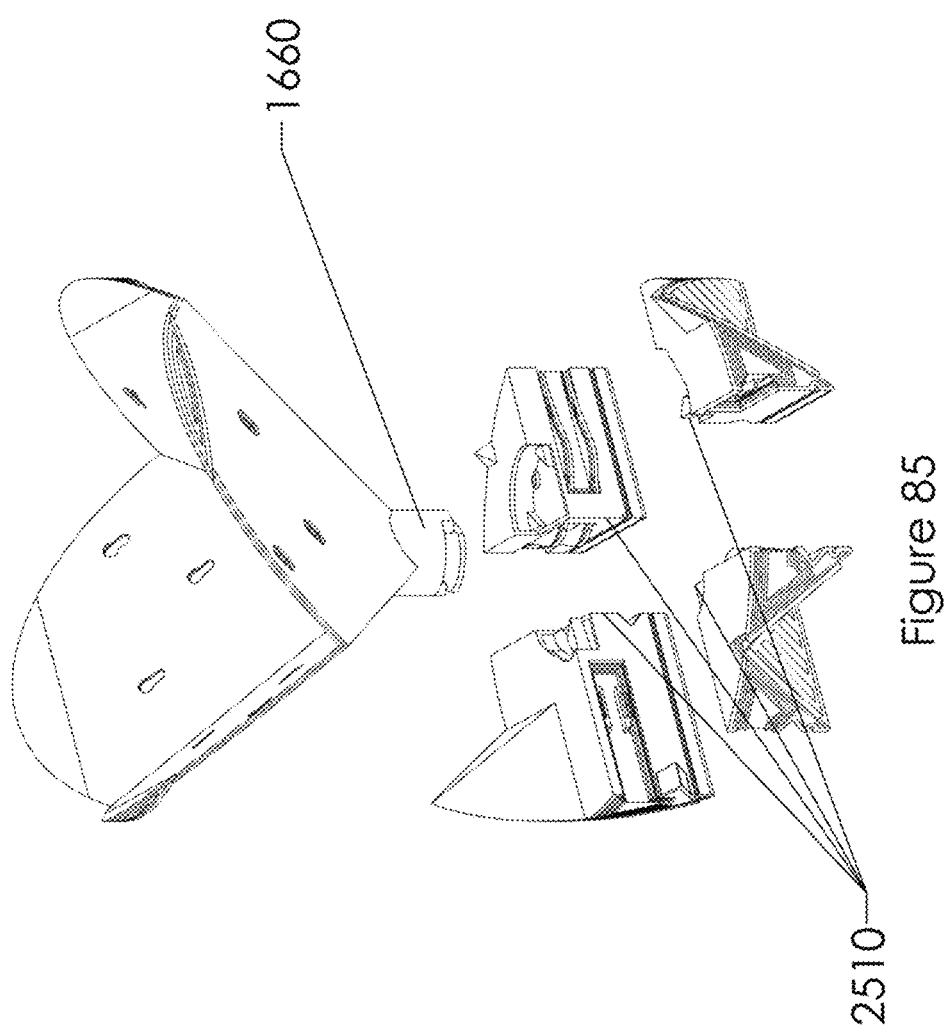
FIG. 85 shows a cutaway dimetric view of the laterally exploded—A—&—B—junction with a locking post from a backing wall section.
Figure 86:
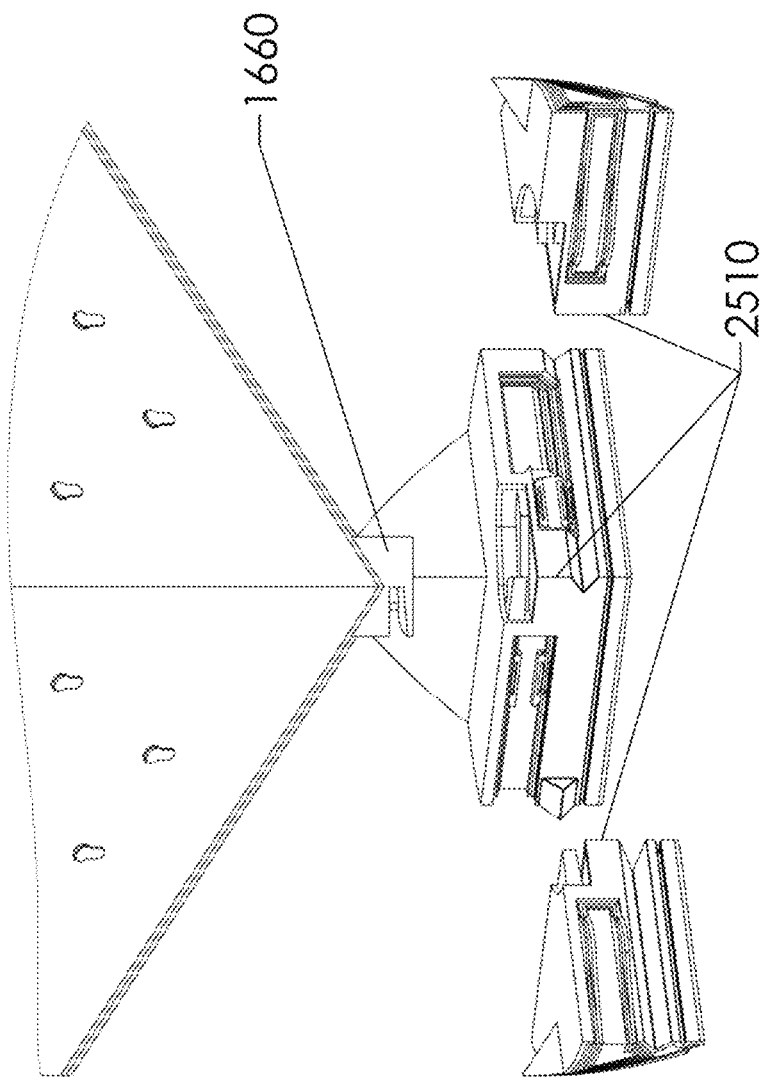
FIG. 86 shows an alternate view of the laterally exploded—A—&—B—junction and locking post.
Figure 87:
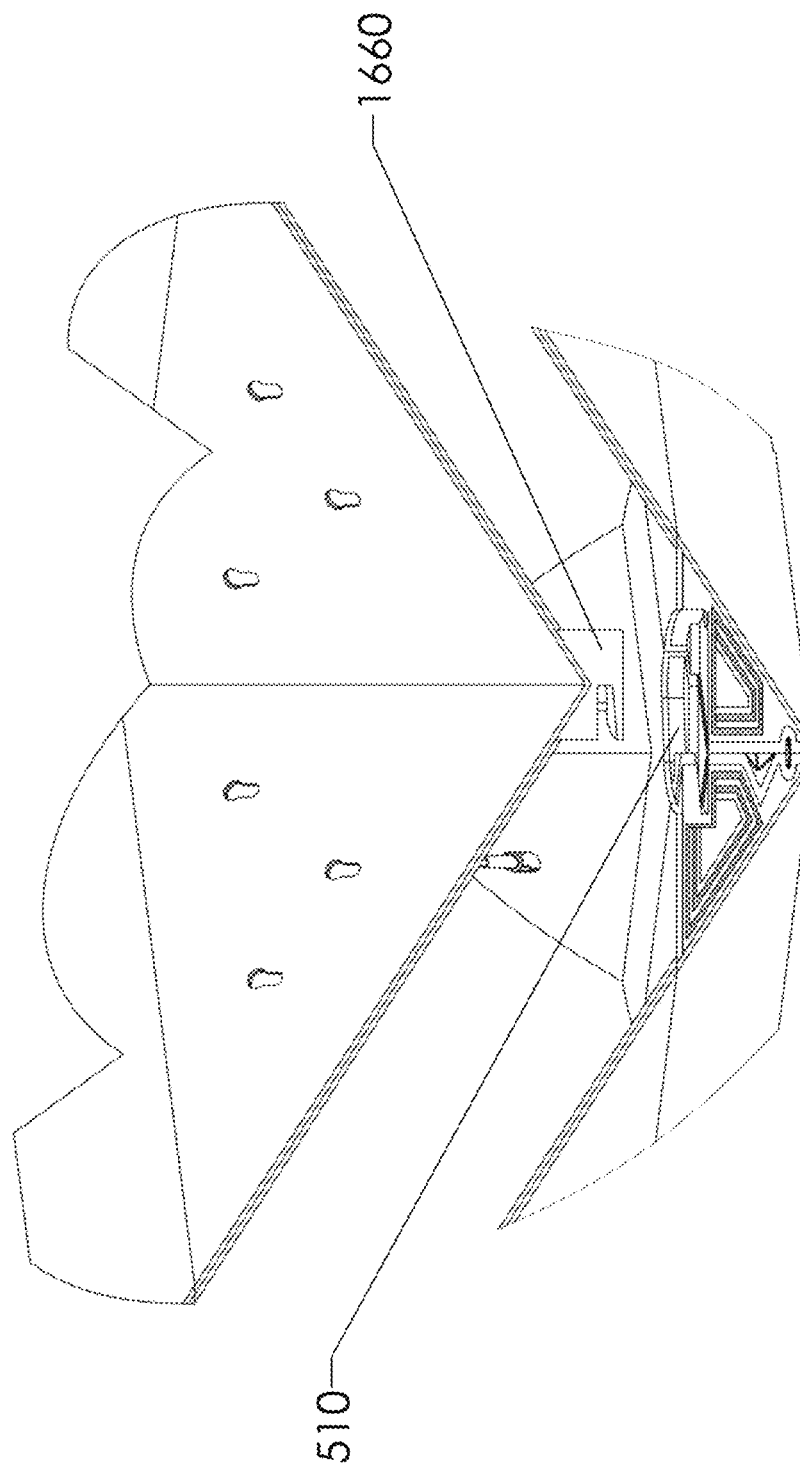
FIG. 87 shows an—A—&—B—junction joined together.
Figure 88:
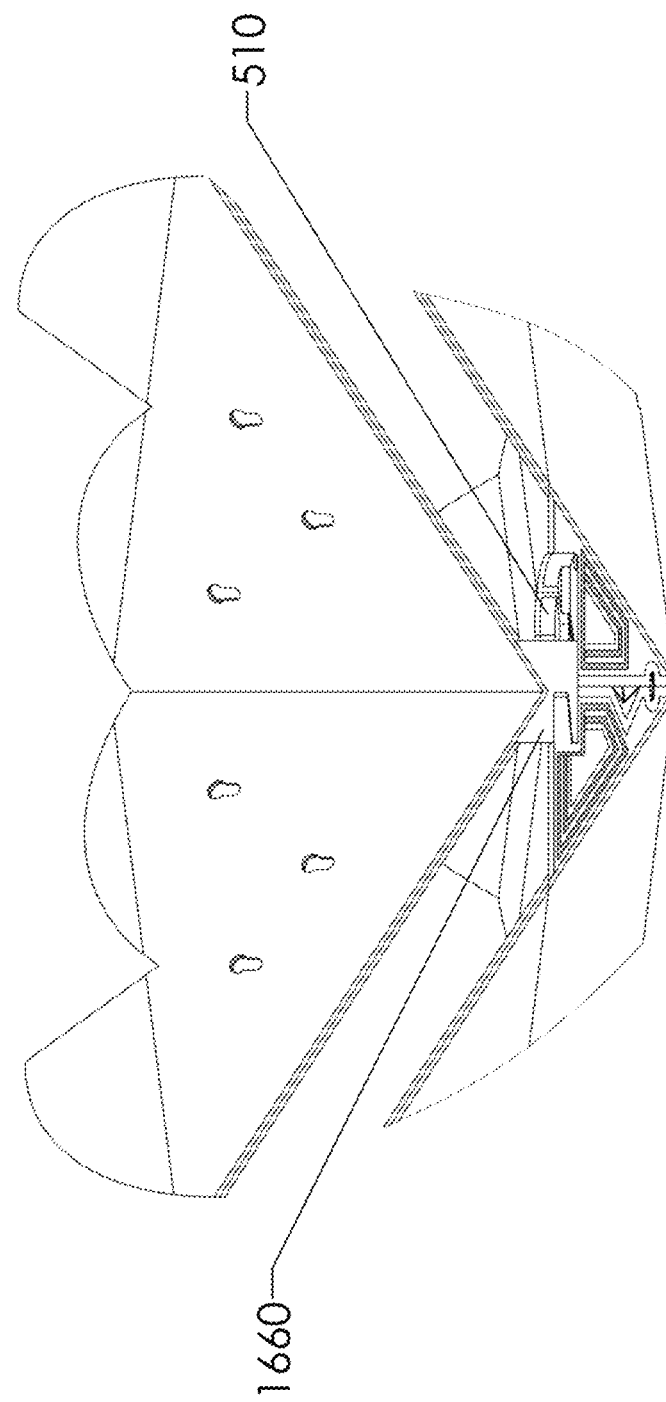
FIG. 88 shows a locking post secure in the post slot.
Figure 89:
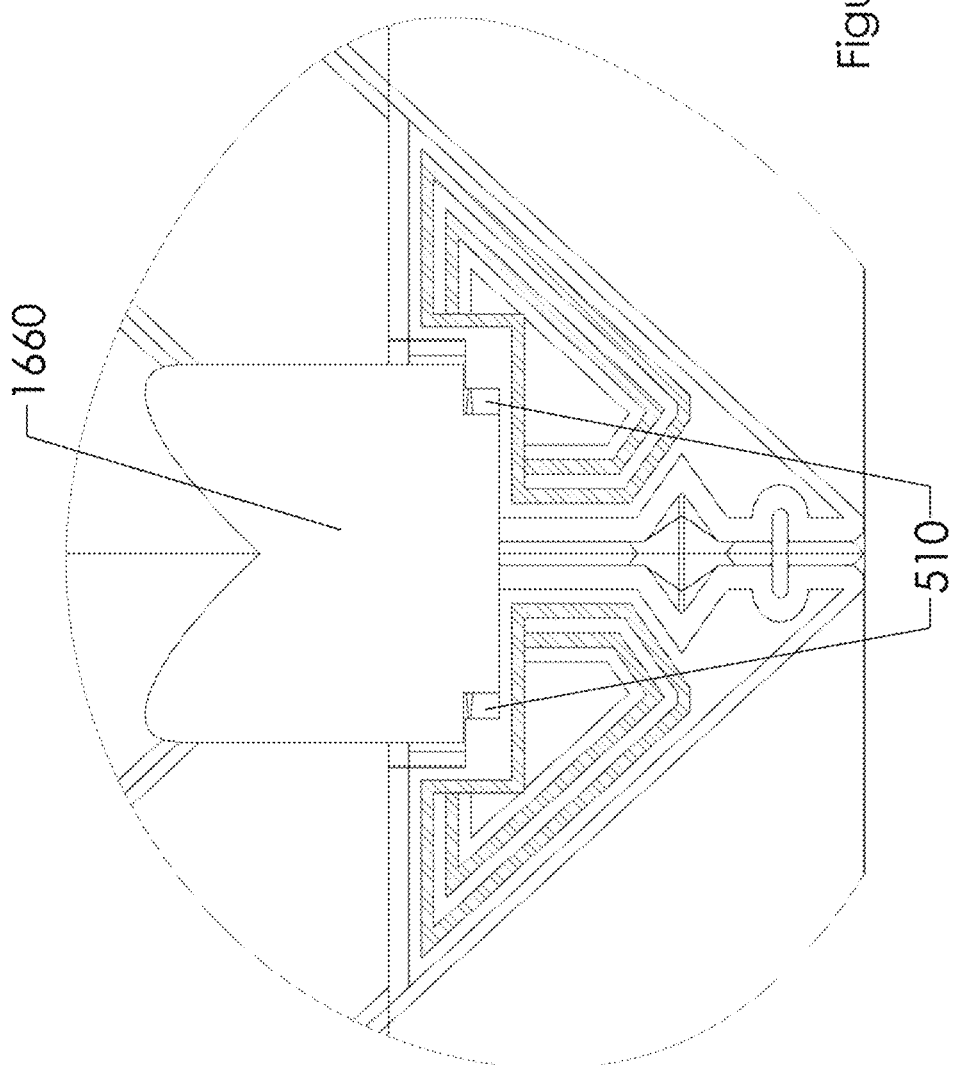
FIG. 89 shows a rotated view of the locking post secure in the post slot.

FIG. 85 shows a cutaway dimetric view of the laterally exploded—A—and—B—junction 2510 with a locking post 1660 from a backing wall section oriented to join the modular array 2500. FIG. 86 shows an alternate view of the assembly in FIG. 85, normal to a plane that bisects the short diagonal edges. FIG. 87 shows an—A—and—B—junction 2510 joined together. A locking post 1660 is oriented to insert into a post slot 510 and join a backing wall section to the modular array 2500. FIG. 88 shows the locking post 1660 secure in the post slot 510, from a section view normal to a plane that bisects the short diagonal edges and FIG. 89 shows a section view rotated 90° from the orientation of FIG. 88.

Figure 90:
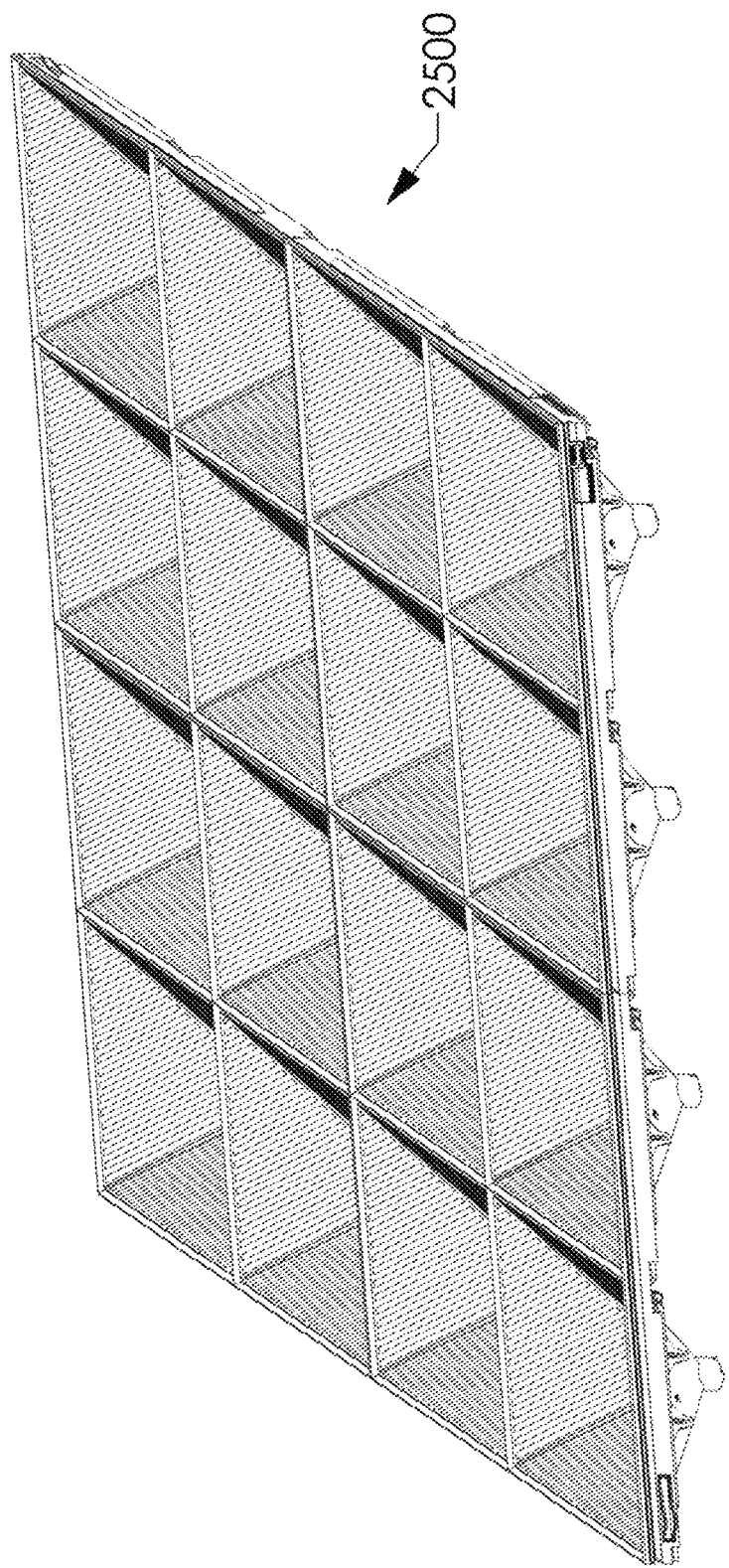
FIG. 90 shows the modular array from the solar panel side.

FIG. 90 shows the modular array 2500 from the solar panel side.

Figure 91:
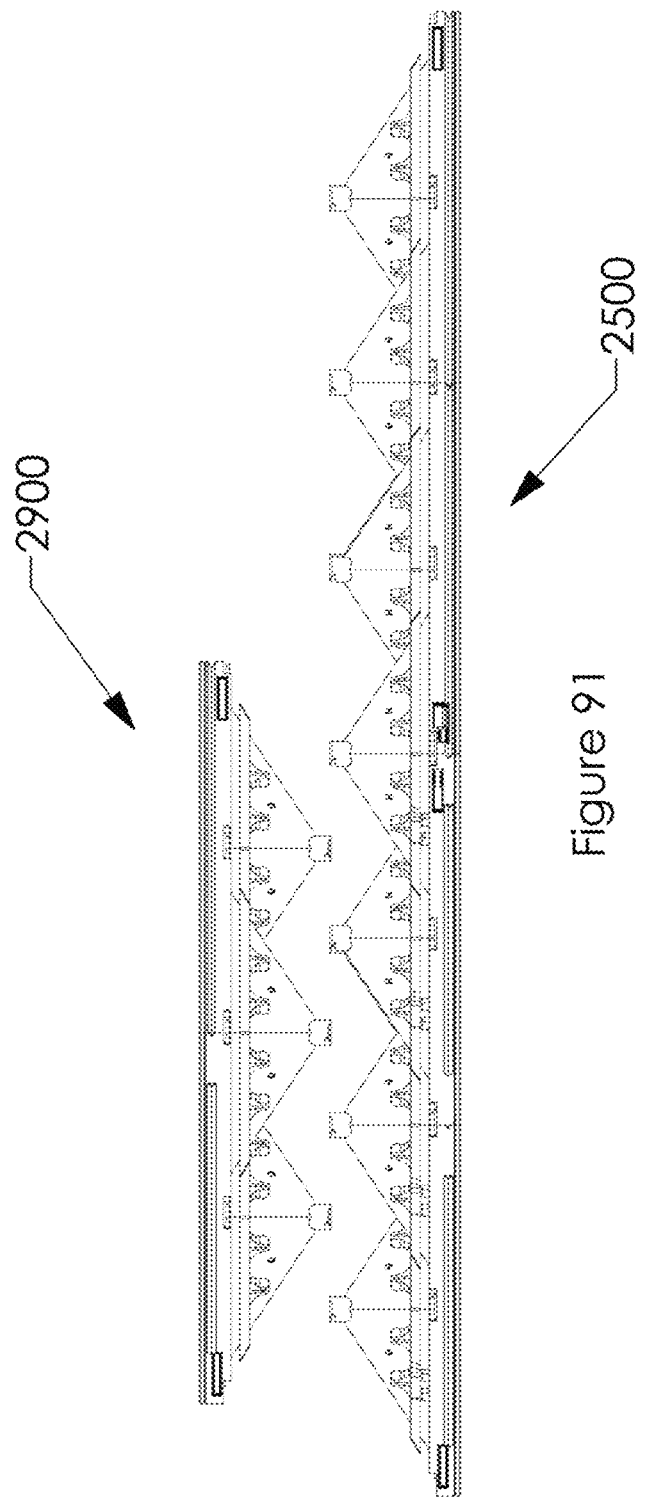
FIG. 91 shows a view of the modular array and a backing wall section.
Figure 92:
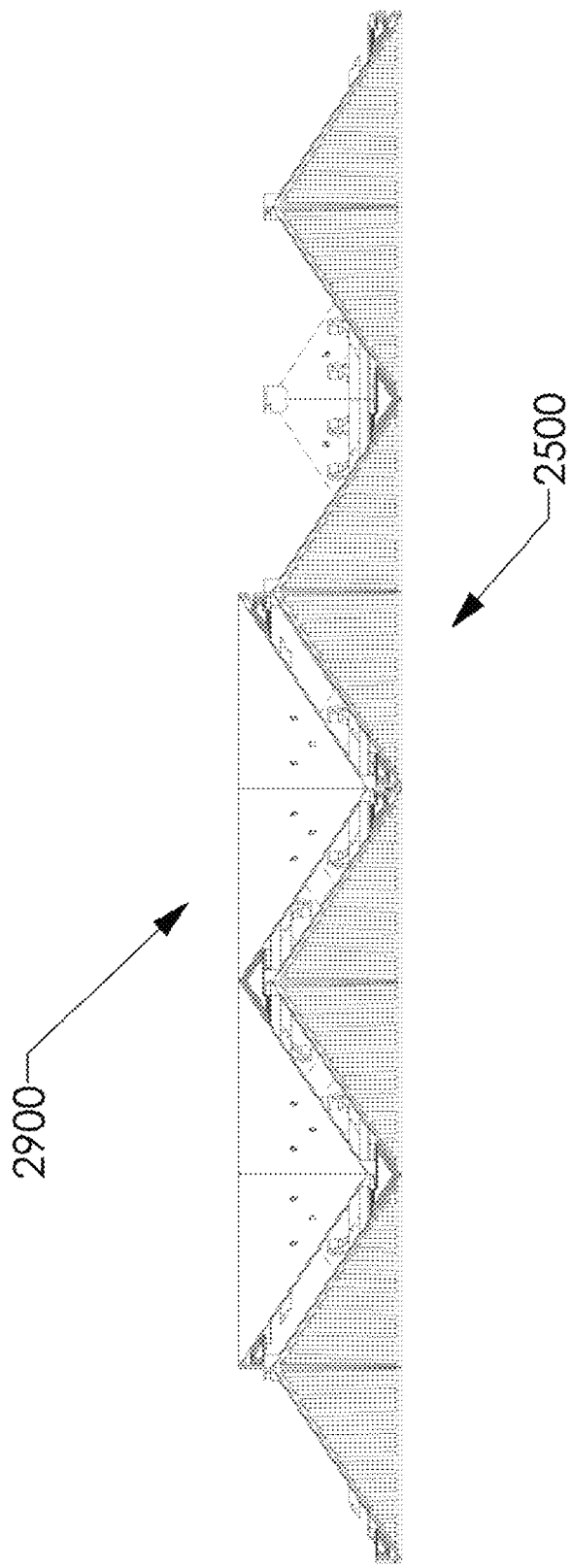
FIG. 92 shows a view of the modular array with the capacitor wall section in position.

FIG. 91 shows a side view of a modular array 2500 and a backing wall section. In this non-limiting embodiment, this backing wall is to be a capacitor wall section 2900. FIG. 92 shows a side section view along the long diagonal of a modular array 2500, with a capacitor wall section 2900 in position.

In order to prevent back-to-back wall sections (such as modular array 2500 and capacitor wall section 2900) from sliding apart a magnetic securing post 3000 is used. The body 3010 of these posts 3000 is made out of thermoplastic and has a rare earth NdFeB locking magnet 3020 bonded into it.

Figure 93A:
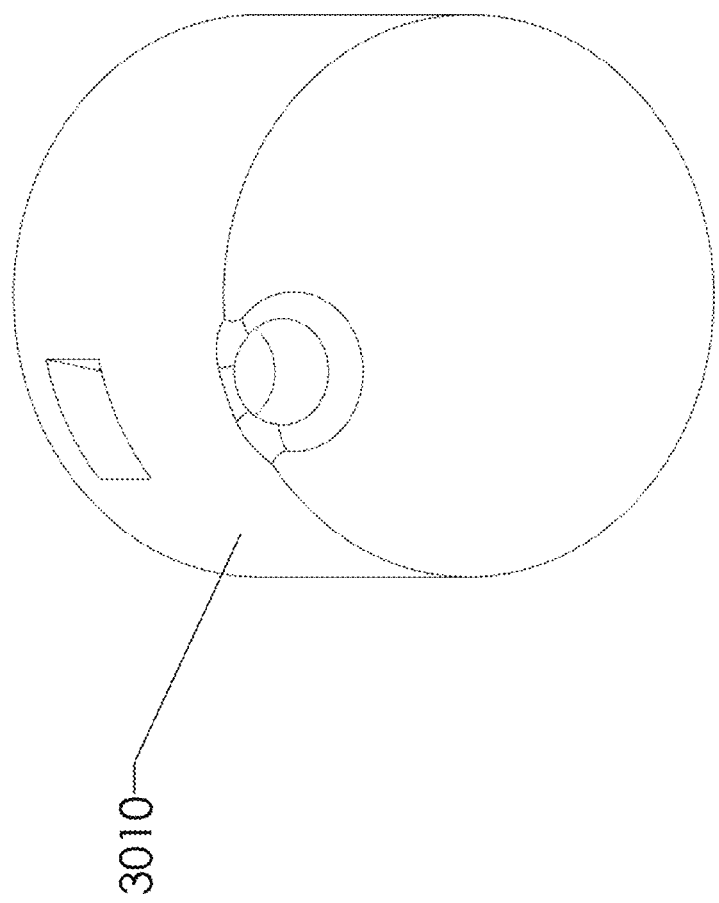
FIG. 93A shows the body of a magnetic securing post.
Figure 93B:
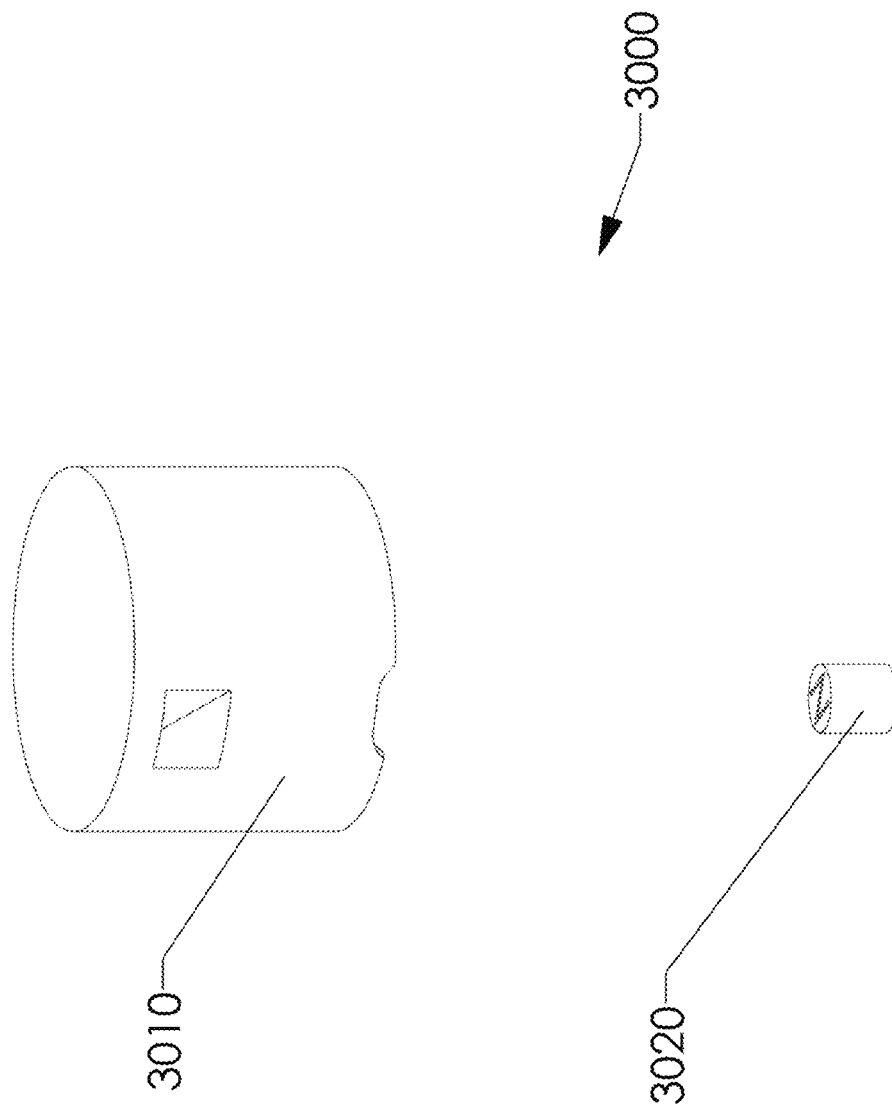
FIG. 93B shows an exploded view of a magnetic securing post.
Figure 93C:
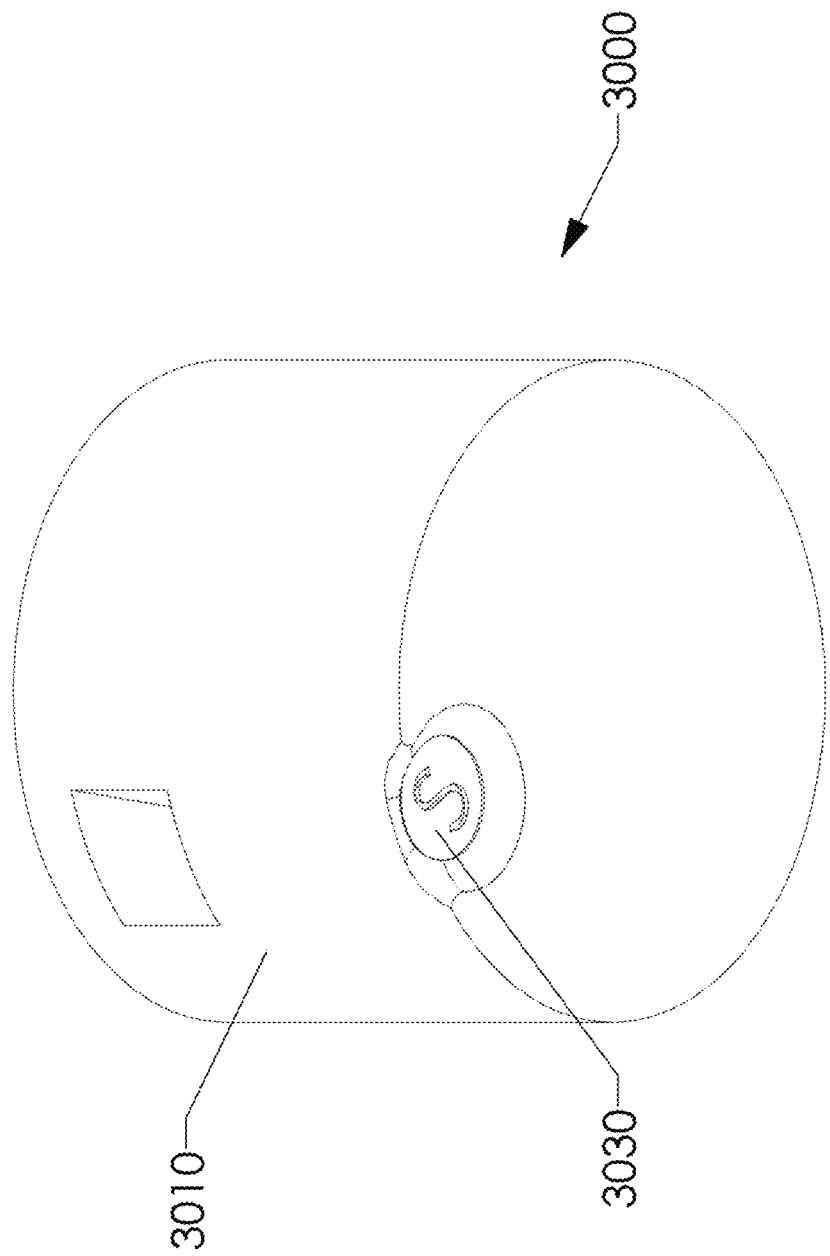
FIG. 93C shows a magnetic securing post with the locking magnet.
Figure 93D:
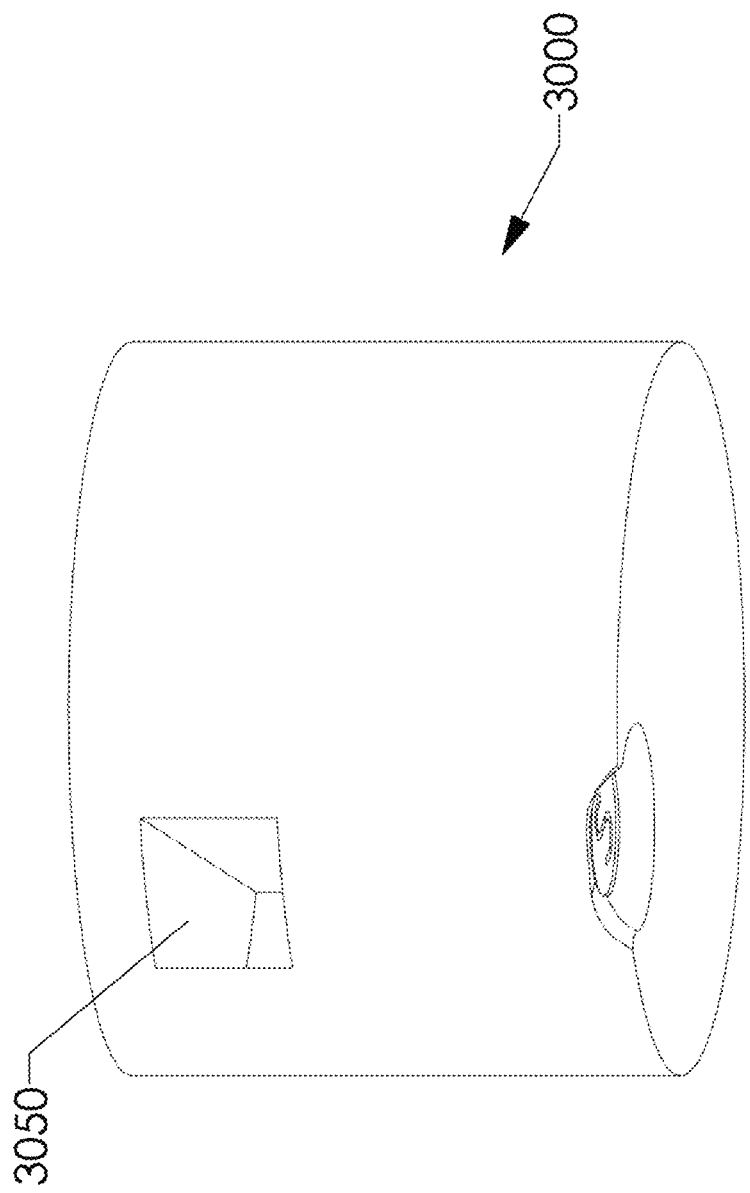
FIG. 93D shows a magnetic securing post with a view of the rectangular thru hole.

FIG. 93A shows the body 3010 of a magnetic securing post 3000. FIG. 93B shows an exploded view of a magnetic securing post 3000. At top is the body 3010 of a magnetic securing post 3000 and at the bottom is the rare earth NdFeB locking magnet 3020. FIG. 93C shows a magnetic securing post 3000 assembled with the rare earth NdFeB locking magnet 3020 bonded in and its South Pole 3030 facing outward. FIG. 93D shows the magnetic securing post 3000 with a clear view of its rectangular thru hole 3050.

Figure 94:
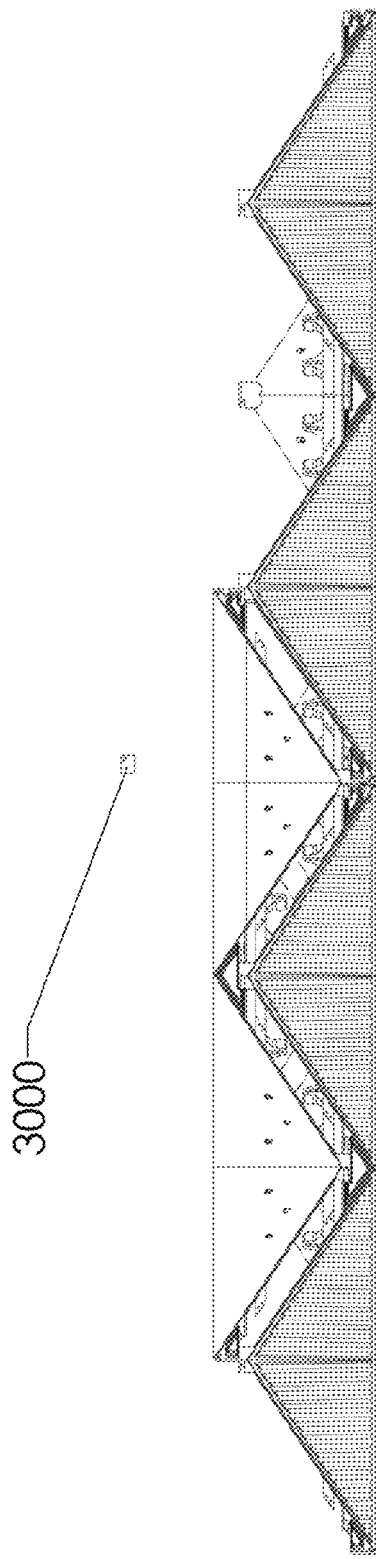
FIG. 94 shows a view of a magnetic securing post in view ready to assemble.

FIG. 94 shows a view similar to FIG. 92 with a magnetic securing post 3000 in view and ready to assemble.

Figure 95A:
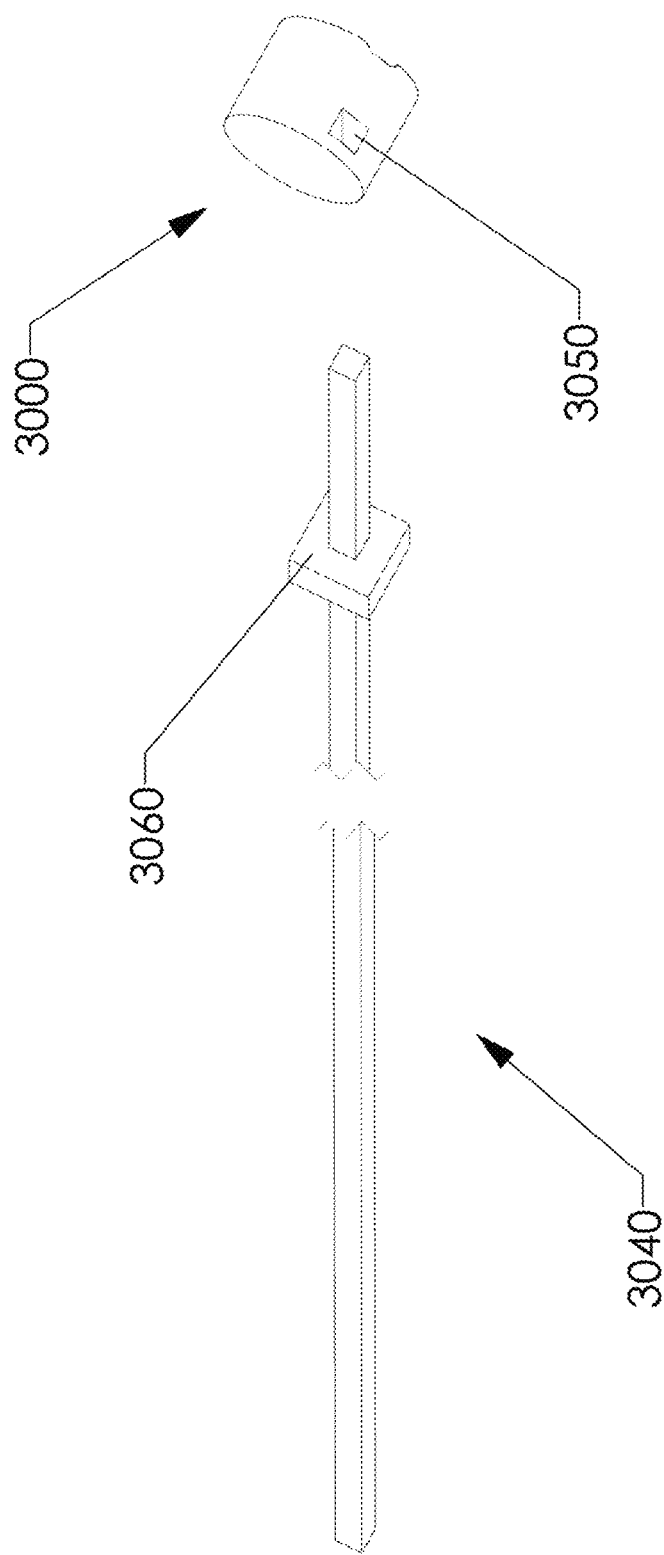
FIG. 95A shows a magnetic insertion tool.
Figure 95B:
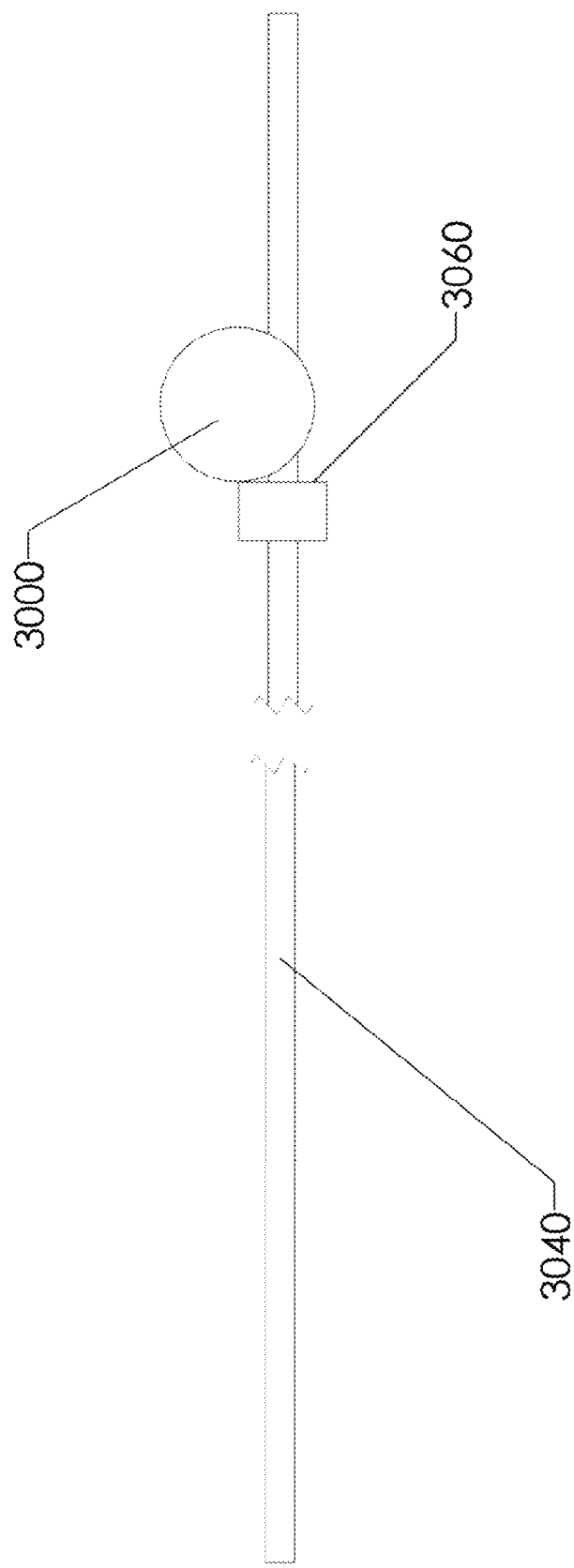
FIG. 95B shows the magnetic securing post slid into position on the magnetic insertion tool.
Figure 95C:
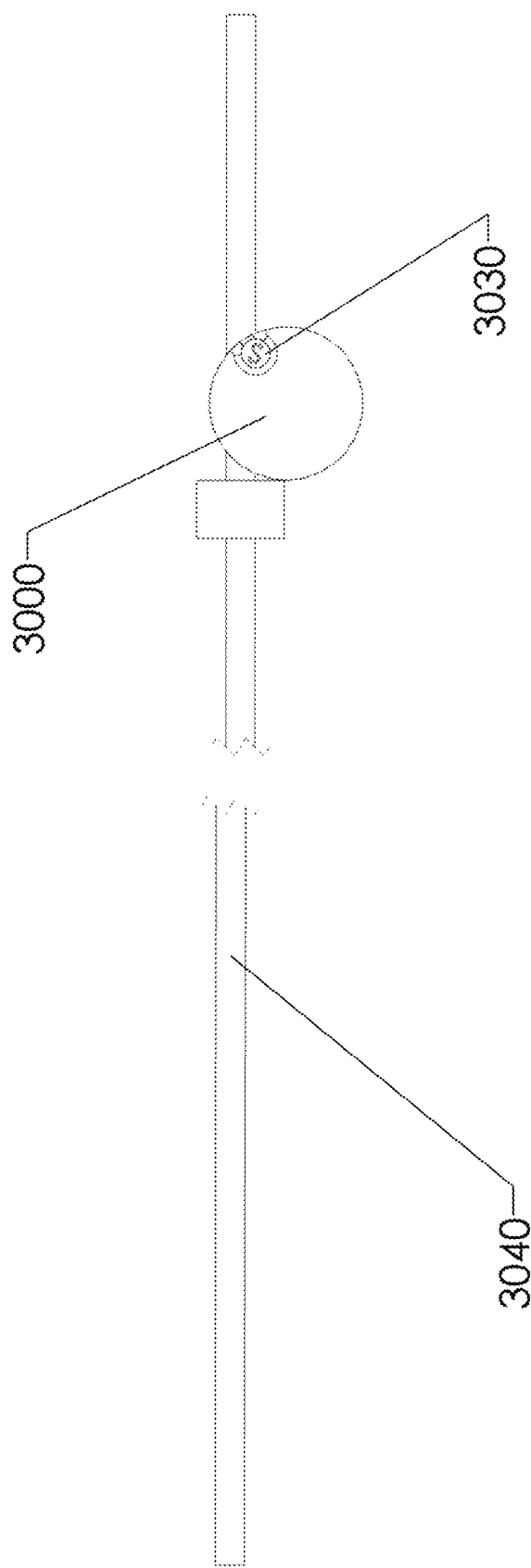
FIG. 95C shows another view of the magnetic securing post on a magnetic insertion tool.

FIG. 95A shows a magnetic insertion tool 3040. The tool body has a rectangular profile to prevent the magnetic securing post 3000 from wobbling and slides into the rectangular thru hole 3050 in the post's body 3010. The tool 3040 also has a shoulder stop 3060 toward one end to prevent the post 3000 from sliding backward as it's being inserted. FIG. 95B shows a magnetic securing post 3000 slid into position against a shoulder stop 3060 on a magnetic insertion tool 3040 and FIG. 95C shows the underside of a magnetic securing post 3000 on a magnetic insertion tool 3040 exposing the South Pole 3030 of its locking magnet 3020.

FIG. 96 shows a cropped view of the cross section of an—A—and—B—junction 2510 and the insertion tool 3040 with a magnetic securing post 3000 loaded on it, ready to be inserted.

Figure 97:
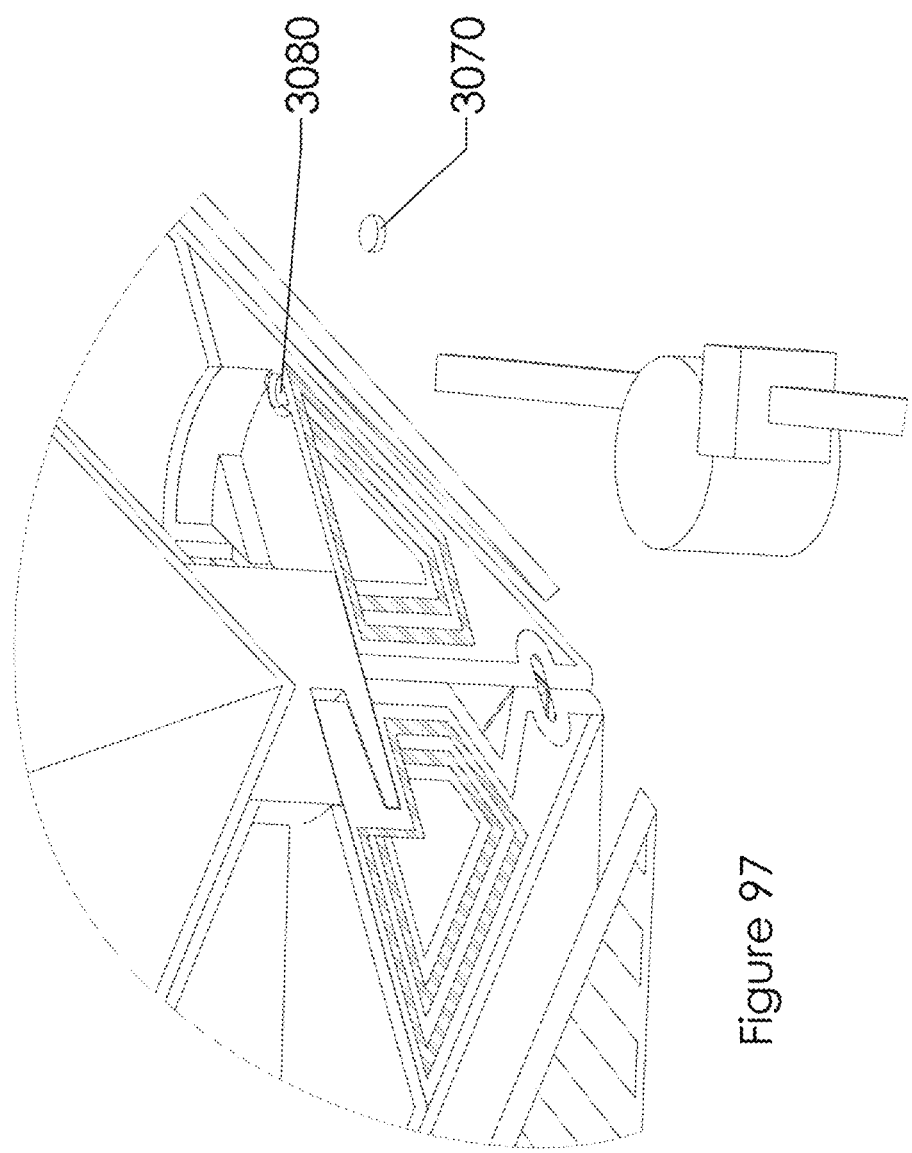
FIG. 97 shows a small steel retaining disk and a steel recess in the post slot.
Figure 98:
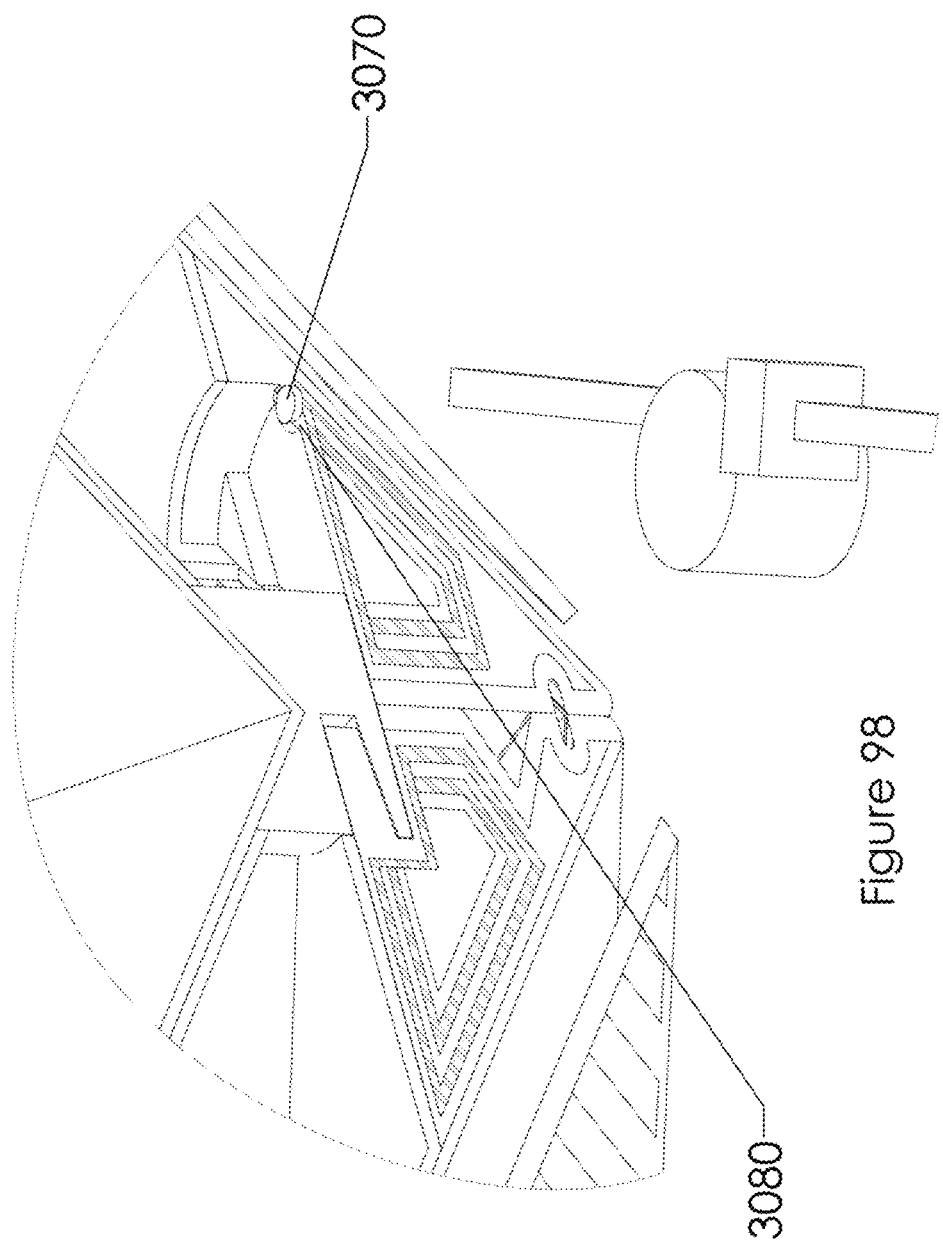
FIG. 98 shows the small steel retaining disk bonded in the steel recess.
Figure 99:
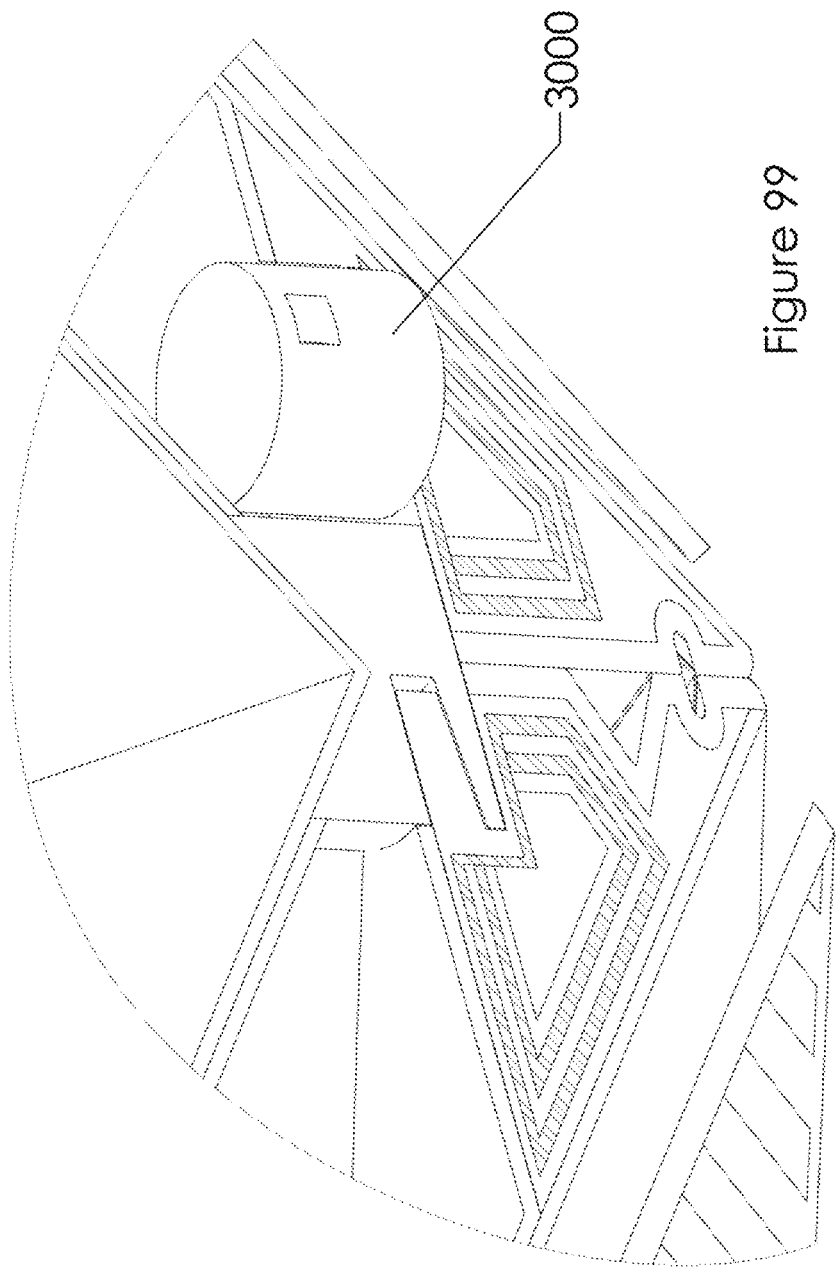
FIG. 99 shows a magnetic securing post locked in position.

FIG. 97 shows a similar view to FIG. 96, with the introduction of a small steel retaining disk 3070 used to hold the magnet in a steel recess 3080 in the post slot 510. FIG. 98 shows the small steel retaining disk 3070 bonded in the steel recess 3080. FIG. 99 shows a magnetic securing post 3000 locked in position with the South Pole 3030 of the locking magnet 3020 magnetically secured to the small steel retaining disk 3070.

Figure 100:
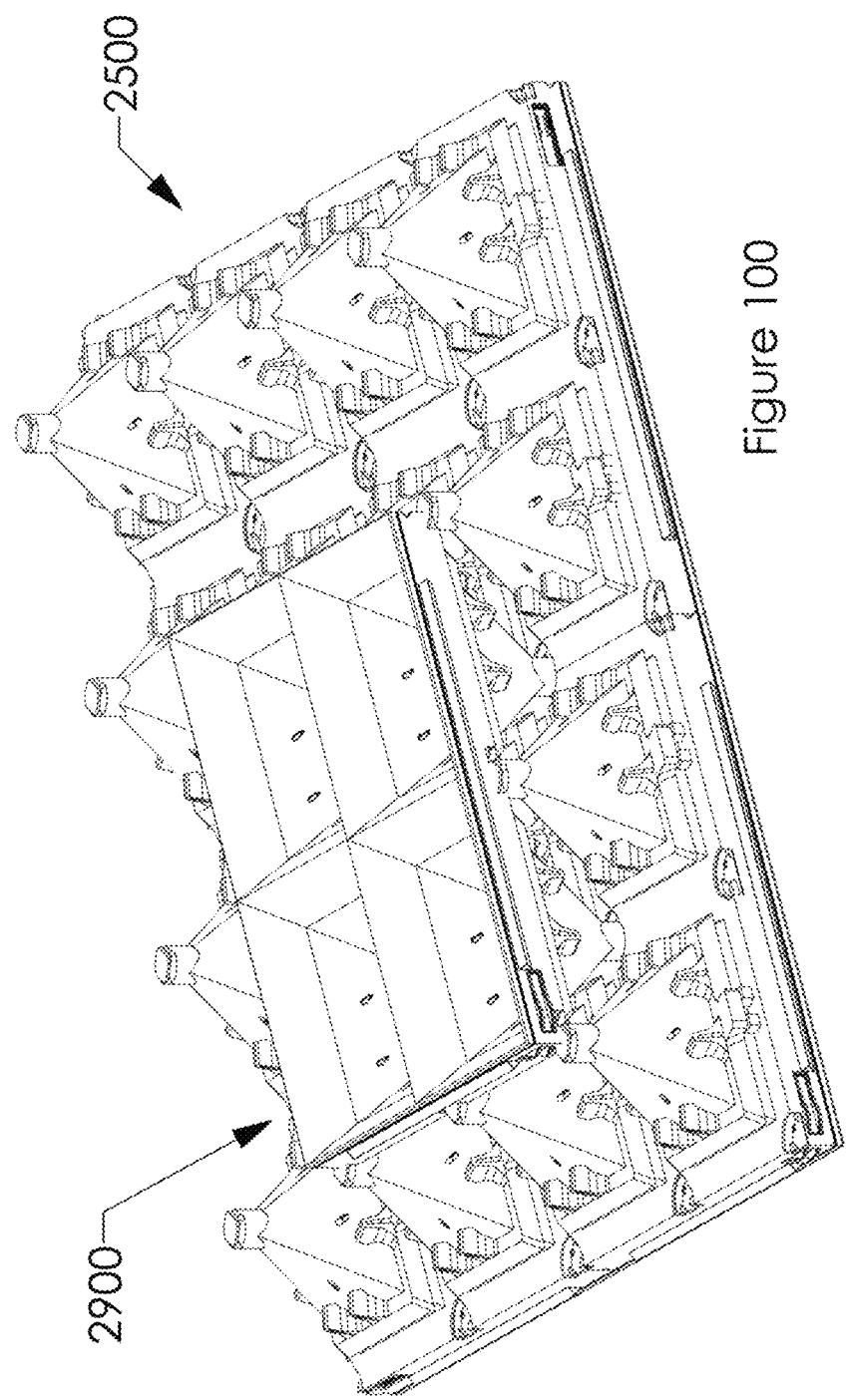
FIG. 100 shows a modular array locked with a sample structural backing.

FIG. 100 shows a modular array 2500 locked with a sample structural backing (here, a capacitor wall section 2900).

Figure 101:
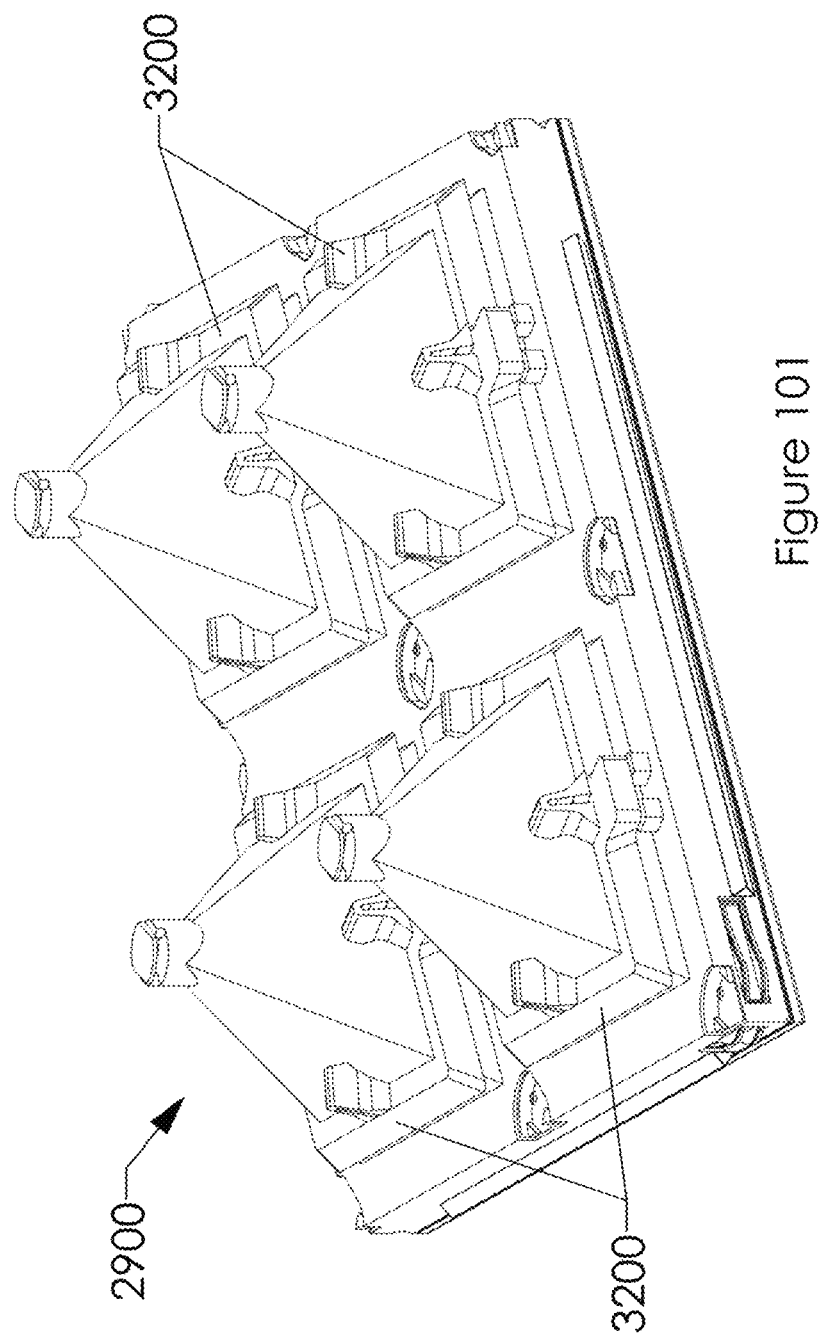
FIG. 101 shows a capacitor wall section.

FIG. 101 shows a complete (male) capacitor wall section 2900. The capacitor rack 3200 shown here is explained in FIG. 111.

Lithium-ion batteries charge and discharge electricity through a chemical reaction. Capacitors store energy via a static charge within a cell. In this non-limiting embodiment, the solar energy collected through the pyramid wall system will be stored in pyramid shaped capacitor cells 3100 as shown in detail in FIGS. 102-109. These cells, called "supercapacitors", "ultra-capacitors" or "double layer capacitors", are particularly suited to compliment battery technology.

These "supercapacitors" have a number of advantages over batteries including: a twenty year life span, lighter weight, 98% efficiency, ability to charge/discharge over a million cycles, use of non-toxic materials, won't overheat and ability to operate down to −40° C. However, conventional supercapacitors can only discharge over a range of seconds to minutes, which makes them ill-suited for applications where continuous power is needed. They cost approximately twenty times more than comparable lithium ion batteries and have about ⅓ of the storage capacity. This capacity is directly related to the surface area of electrodes in the capacitor. Accordingly, the electrodes are printed in a variety of dense patterns with superconductive material.

In one non-limiting embodiment, the capacitor cells 3100 will have electrodes formed into layers of a honeycomb lattice and with a base material of conductive thermoplastic. It is then coated with graphene, or equivalent nano-particles, to increase surface area and a superconductive gel electrolyte is introduced between the layers. This increased surface area increases the storage capacity. The gel electrolyte also increases energy density, extending discharge time to match that of batteries.

Conventional batteries have a high energy density allowing them to be used for applications where power is needed for several hours. But they can also take several hours to charge. Supercapacitors have a high power density, meaning they can charge and discharge in a fraction of seconds to minutes. This is useful when power is needed quickly (microseconds to minutes) to avoid data crashes during a blackout and/or in large amounts (regenerative braking for trains). Batteries are often used for applications that require long term discharge, but degrade significantly over time (limited to a few thousand charge/discharge cycles), especially under heavy load. By shifting load spikes to a supercapacitor, the life of the battery can be extended. In another non-limiting embodiment, lithium-ion batteries can be introduced into the pyramid cells to alternate with the capacitors.

Figure 102:
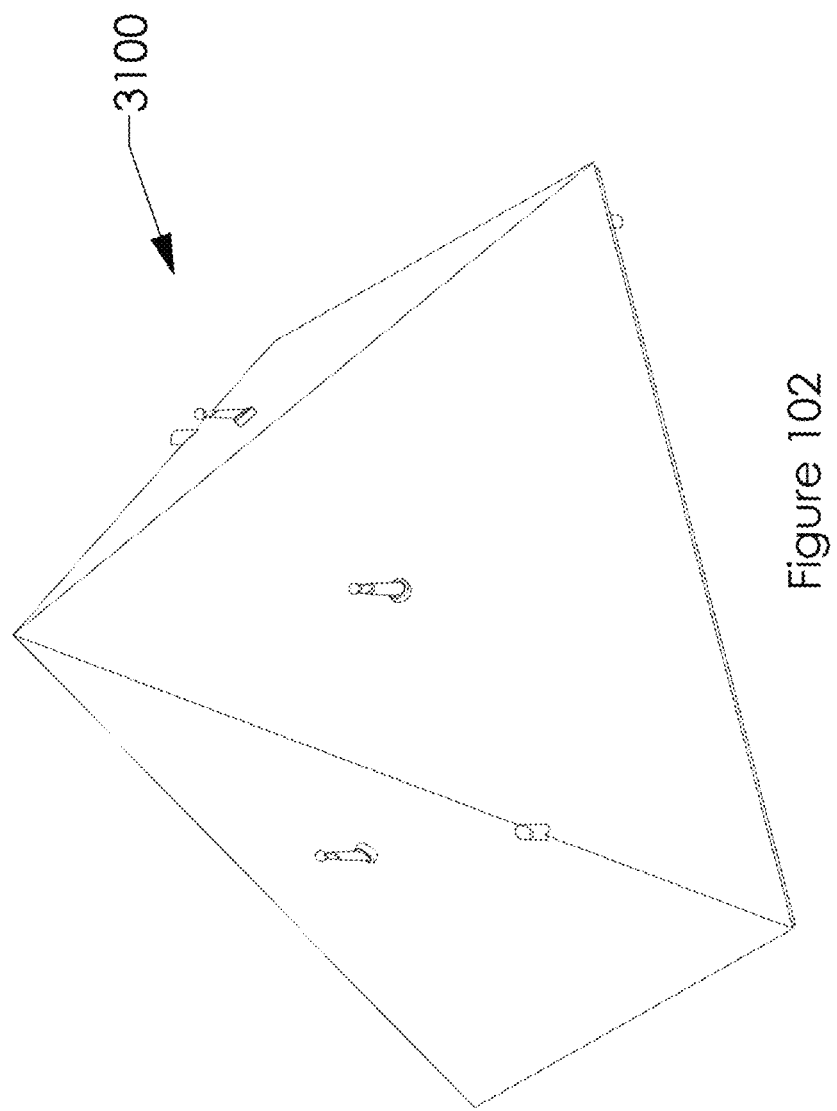
FIG. 102 shows the cathode contact side of a capacitor cell.

FIG. 102 shows the cathode contact side of a capacitor cell 3100. Four of these cells 3100 can be put into a capacitor wall section 2900.

Figure 103A:
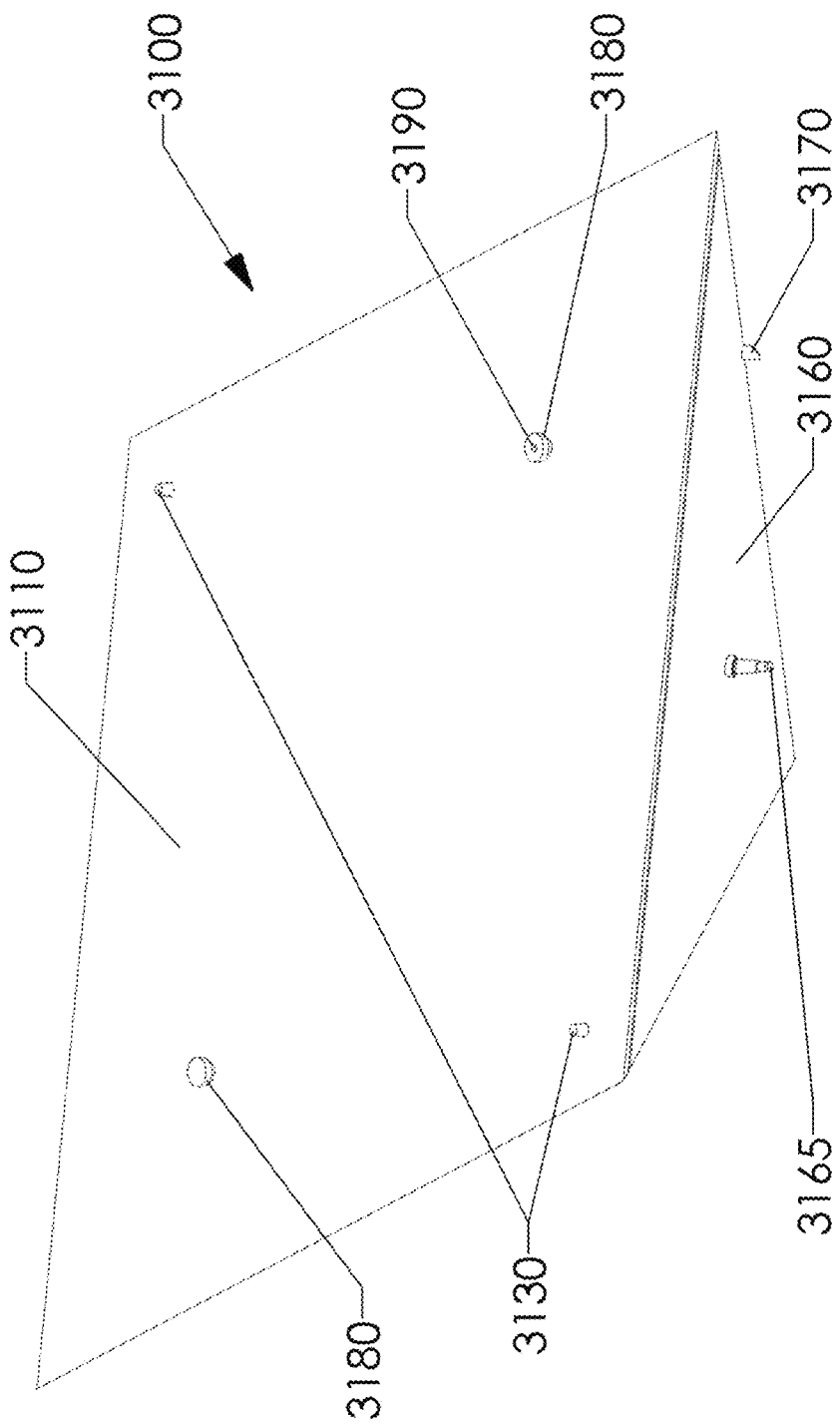
FIG. 103A shows the anode contact side of a capacitor cell.
Figure 103B:
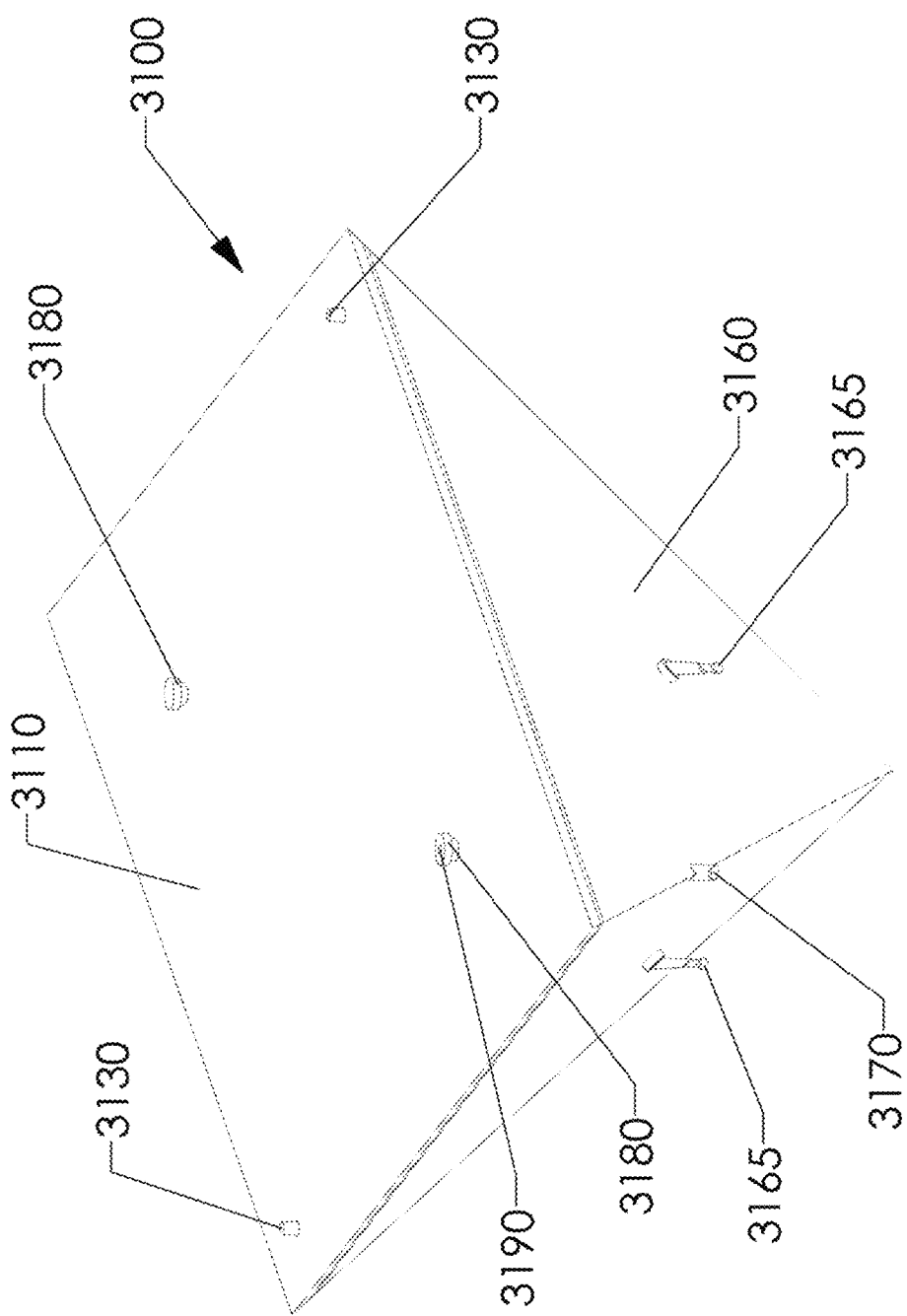
FIG. 103B shows a rotated capacitor cell.

FIG. 103A shows the anode contact side of the capacitor cell 3100. Shown are: the capacitor insulated cover 3110, the two anode conductive posts 3130, one of the four bulbous bosses 3165 that protrude from the capacitor cell casing 3160 to lock in a capacitor rack 3200 (see FIG. 110), one of the two cathode conductive posts 3170, the two capacitor cover handles 3180 and an LED socket 3190. The capacitor handles 3180 may be used to remove a damaged cell, whose status can be determined by viewing an LED through a port hole in one of the handles 3180 that leads to the LED socket 3190. FIG. 103B shows a capacitor cell 3200 rotated to be sectioned in subsequent views and highlighting the same features as FIG. 103A with the inclusion of one more bulbous boss 3165.

Figure 104A:
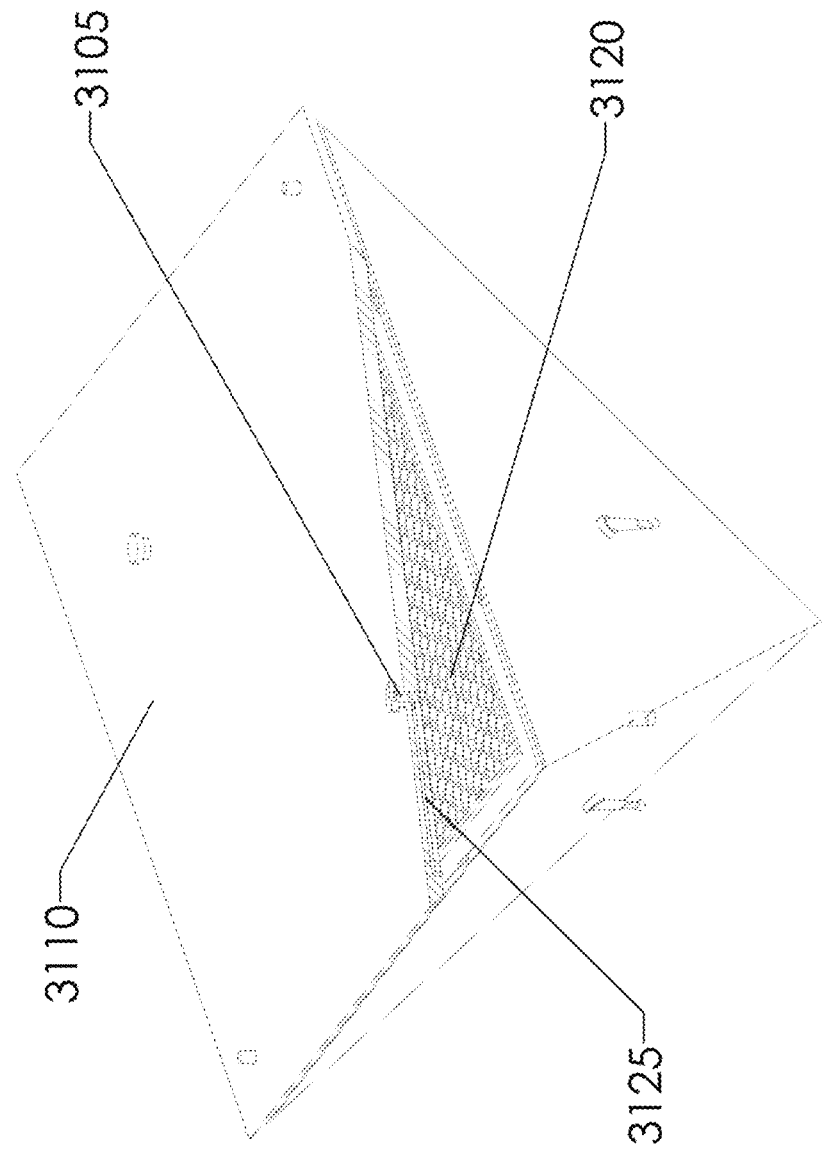
FIG. 104A shows an insulated cover sectioned to reveal a honeycomb anode, an LED and a cathode LED channel.

FIG. 104A shows an insulated cover 3110 sectioned to reveal a honeycomb anode 3120, an LED 3105 and a cathode LED channel 3125. In one non-limiting embodiment this channel 3125 is made by the insulated cover 3110 overmolding an LED lead with insulative, thermoplastic resin. In another no-limiting embodiment, the insulated cover 3110 is 3D printed with a similar material, the printing paused, a wire inserted and the process resumed. In another non-limiting embodiment, the channel 3125 is hollow and coated (or printed) with graphene or another conductive nano-particle material.

Figure 104B:
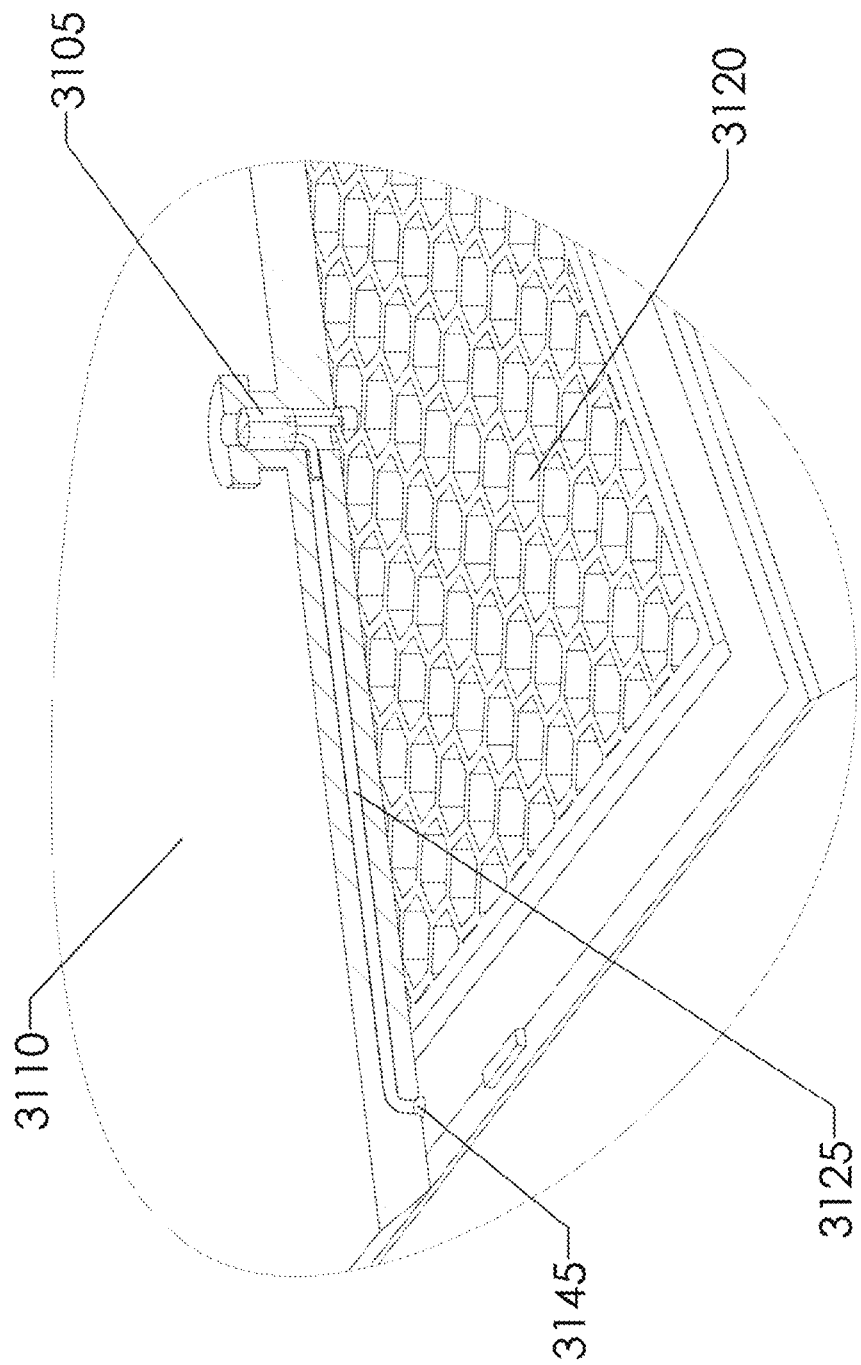
FIG. 104B is a cropped, close-up view of the sectioned, insulated cover.

FIG. 104B is a cropped detail of FIG. 104A and highlights the LED 3105, cathode LED channel 3125 and the cathode channel boss 3145 which protrudes near the edge of a honeycomb cathode 3150 and connects to the cathode LED channel 3125. The honeycomb cathode 3150 is shown in FIGS. 107A-107F.

FIG. 104C shows an exploded view of a capacitor cell 3100, with the insulated cover 3110, honeycomb anode 3120 and LED 3105 removed. The capacitor cell casing 3160 and honeycomb cathode 3150 are in place.

FIG. 104D shows a cropped, detailed area of a section of an insulated cover 3110 and a honeycomb anode 3120. The sectioned area exposes an LED 3105, cathode LED channel 3125 and the LED contact cavity 3115 that is formed into the honeycomb anode 3120 to house the positive lead of the LED 3105.

FIG. 104E shows the insulated cover 3110 joined with a honeycomb anode 3120, with the anode conductive posts 3130 showing through the capacitor cover holes 3140 (shown in FIG. 105A).

Figure 105B:
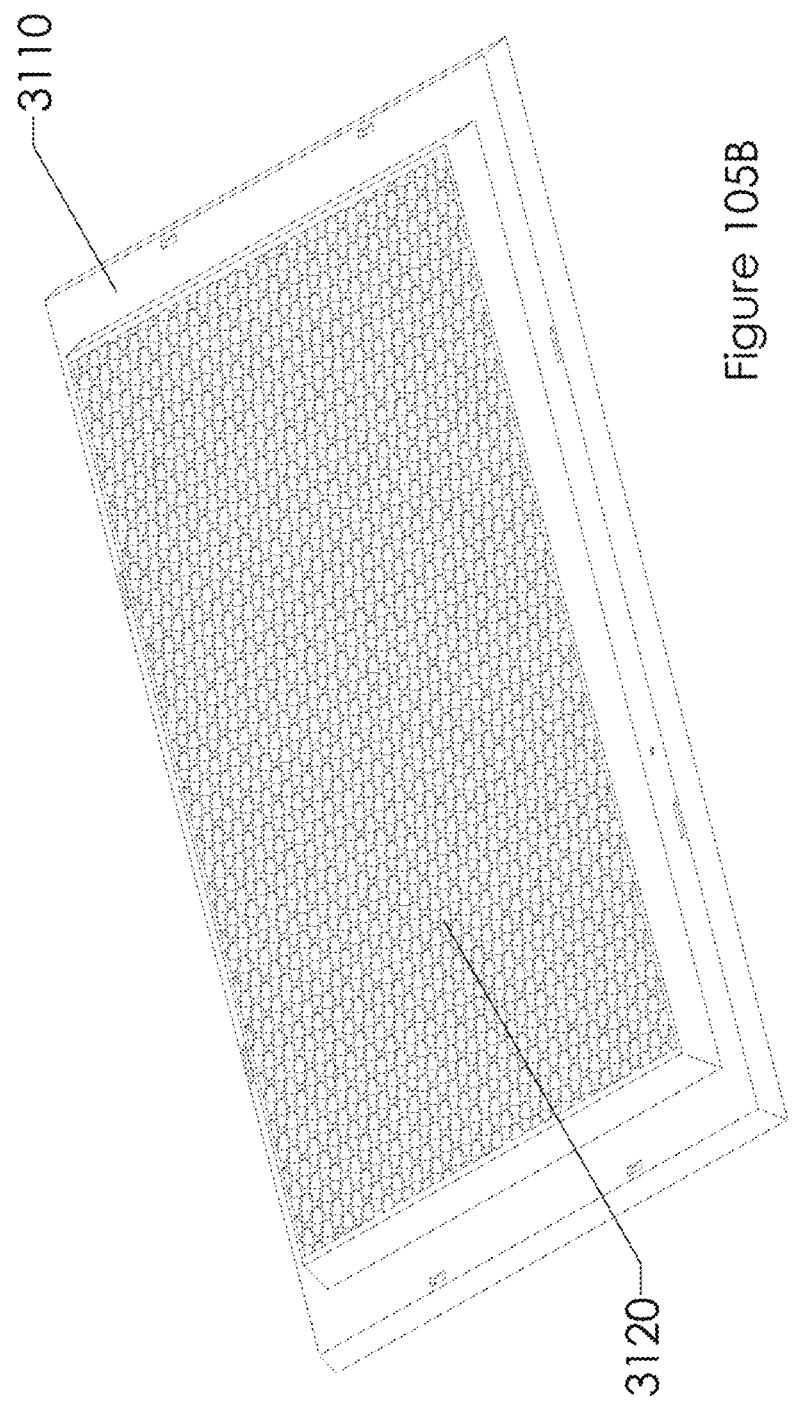
FIG. 105A shows an insulated cover separated from a honeycomb anode.
Figure 105C:
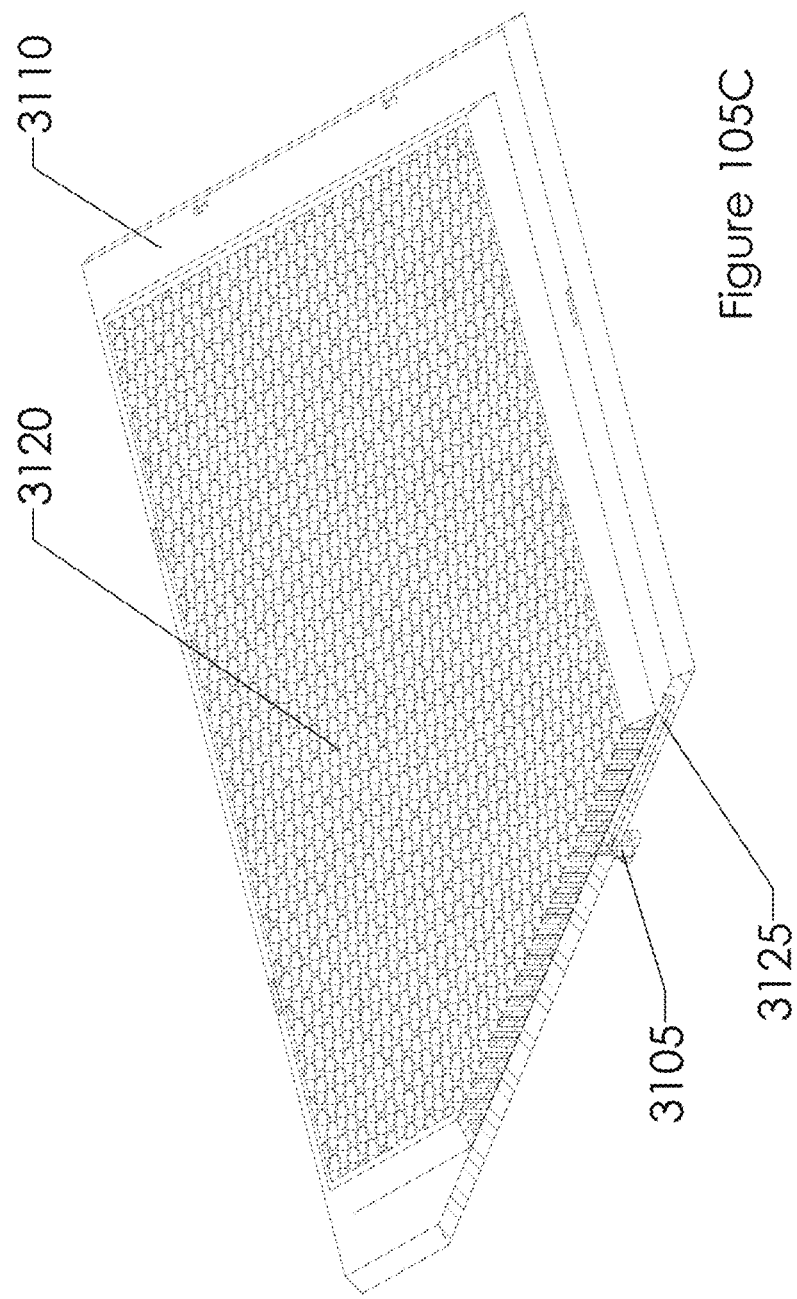

FIG. 105A shows the insulated cover 3110 separated from a honeycomb anode 3120 with the anode conductive posts 3130 and capacitor cover holes 3140 highlighted. FIG. 105B shows the reverse side of the insulated cover 3110 joined with the honeycomb anode 3120. These two components 3110, 3120 are secured together, as detailed in FIG. 105D-105F. FIG. 105C is a section view of FIG. 105B, revealing the LED 3105 and the cathode LED channel 3125.

Figure 105D:
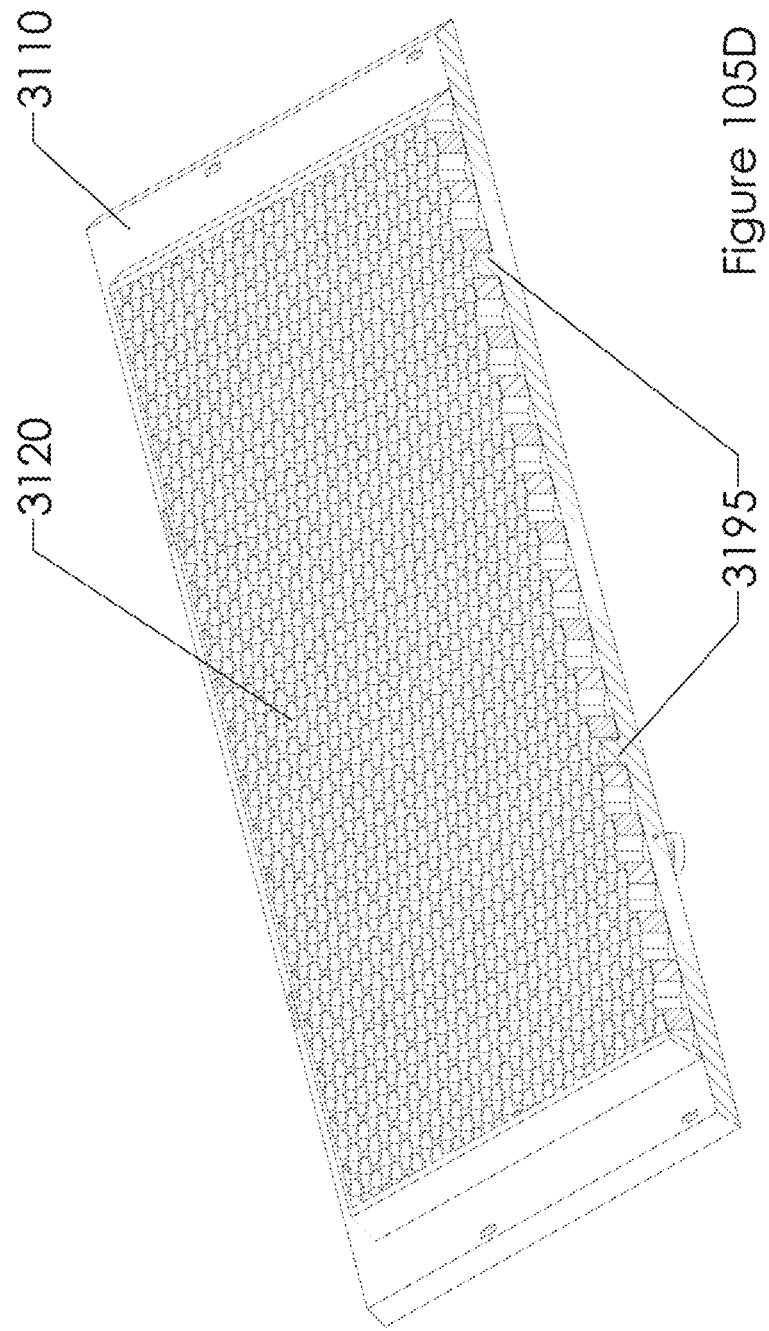
Figure 105E:
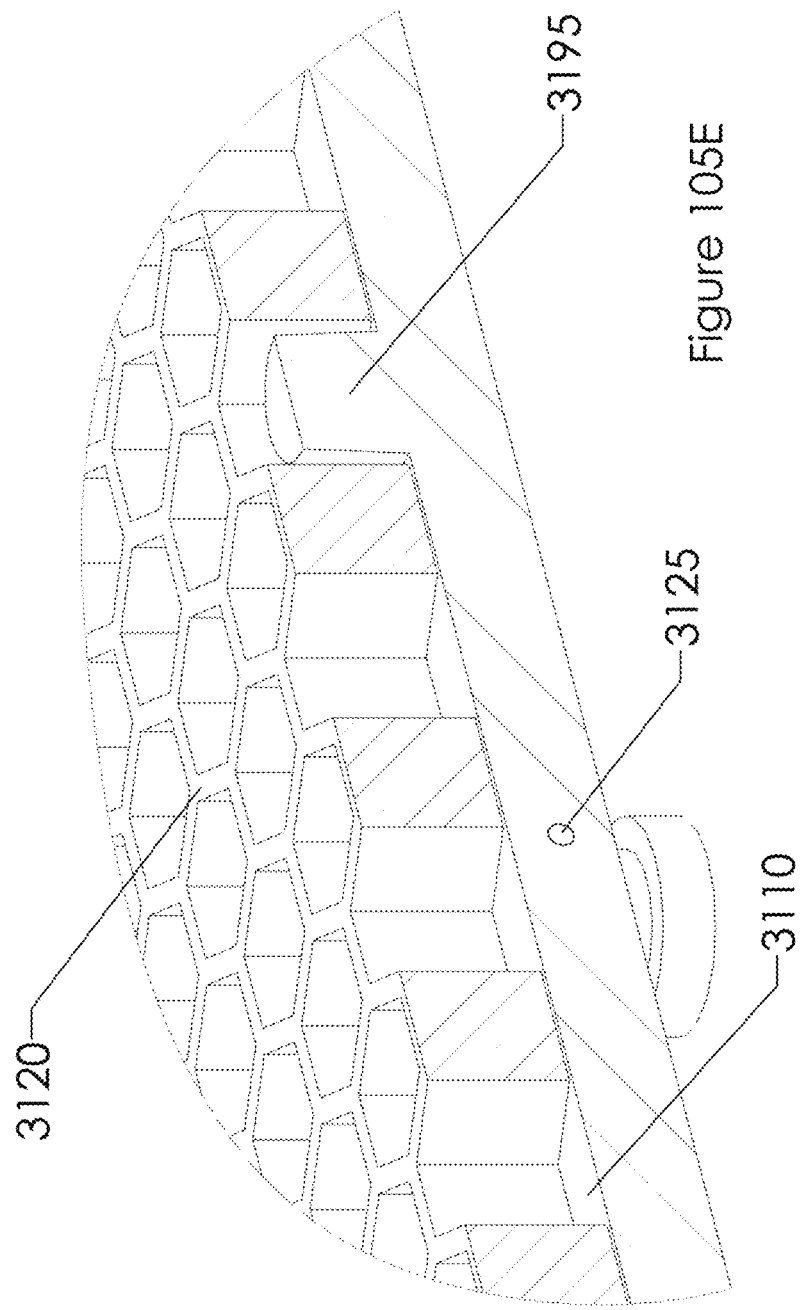

FIG. 105D is a section view of FIG. 105B, revealing tapered cover bosses 3195 on the insulated cover 3110. These bosses 3195 secure the anode 3120 and prevent the anode 3120 from touching a cathode 3150 by press fitting inside of the honeycomb spaces. FIG. 105E is a cropped detail view of FIG. 105D that shows one covered boss 3195 and a section view of the cathode LED channel 3125, normal to its axis.

Figure 106:
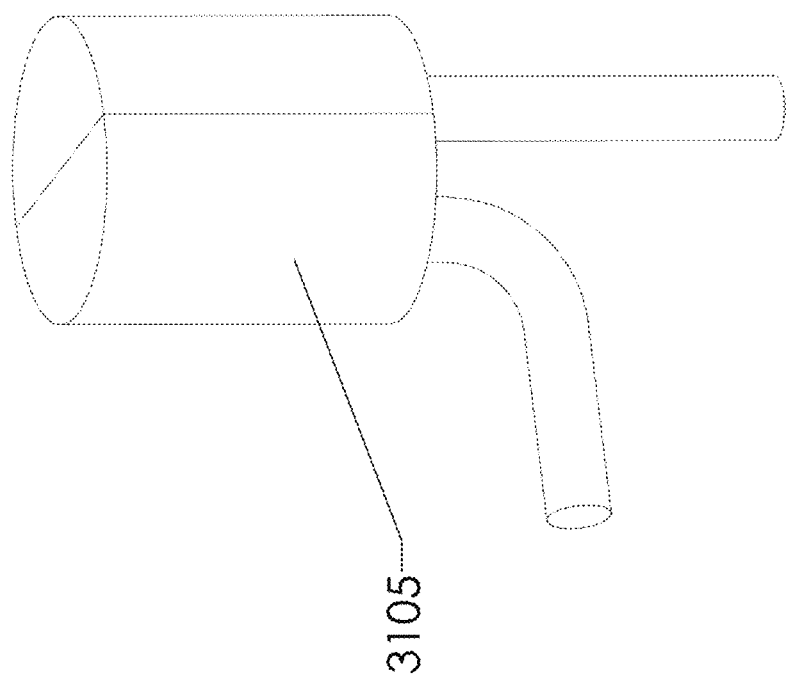

FIG. 105F shows the honeycomb anode 3120 separated from the tapered cover bosses 3195 on the insulated cover 3110. Also shown are the tab slots 3175 in the cover 3110 that are used to hold the tabs 3185 (shown in FIG. 107A) on a capacitor cell casing 3160 when they are bonded together. FIG. 105G is similar to FIG. 105F and shows the addition of an LED 3105 in the exploded view. FIG. 106 shows a close-up view of the indicator LED 3105.

Figure 107A:
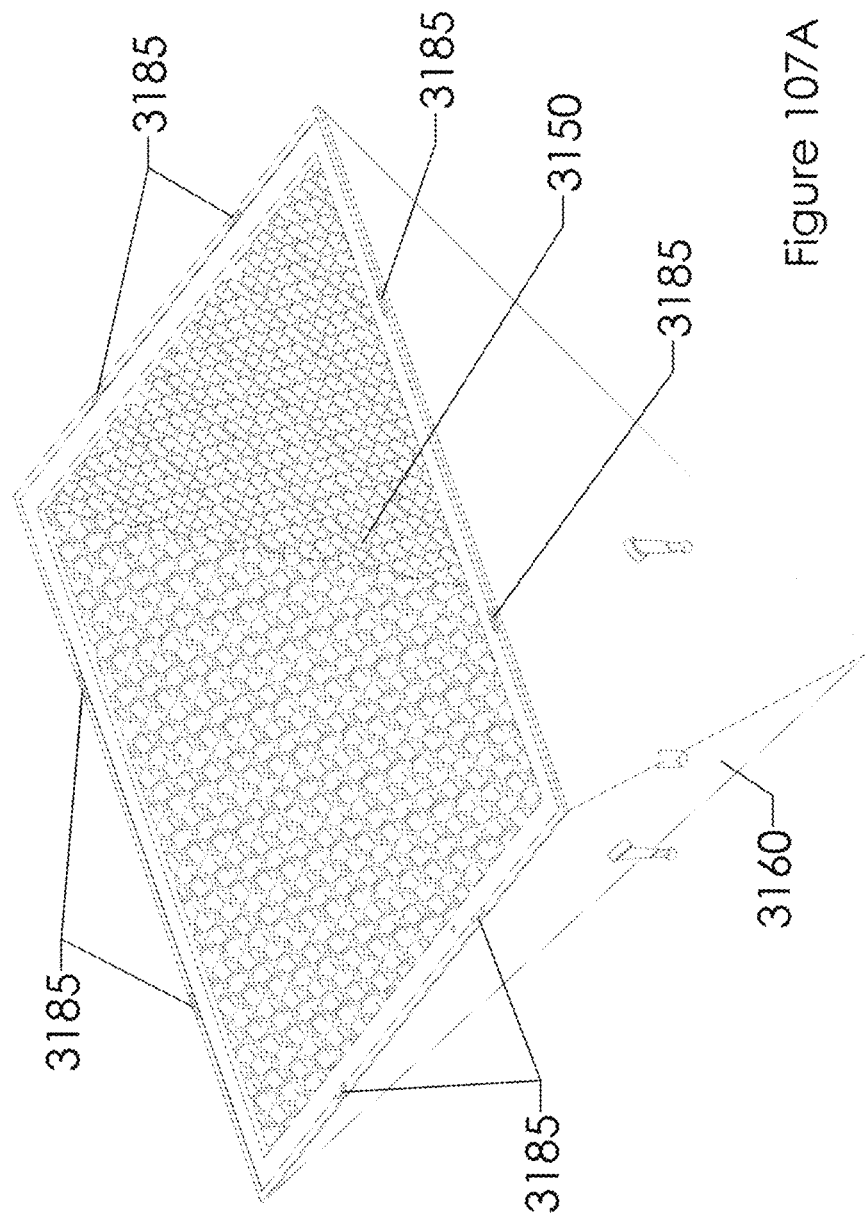

FIG. 107A shows the capacitor cell casing 3160 and the honeycomb cathode 3150 together, as well as casing tabs 3185 to be inserted in tab slots 3175 on the insulated cover 3110. The pyramid shape of the casing 3160 has the same 3D "footprint" as a solar panel module 2000 allowing a consistent modular design between these two types of wall sections.

Figure 107C:
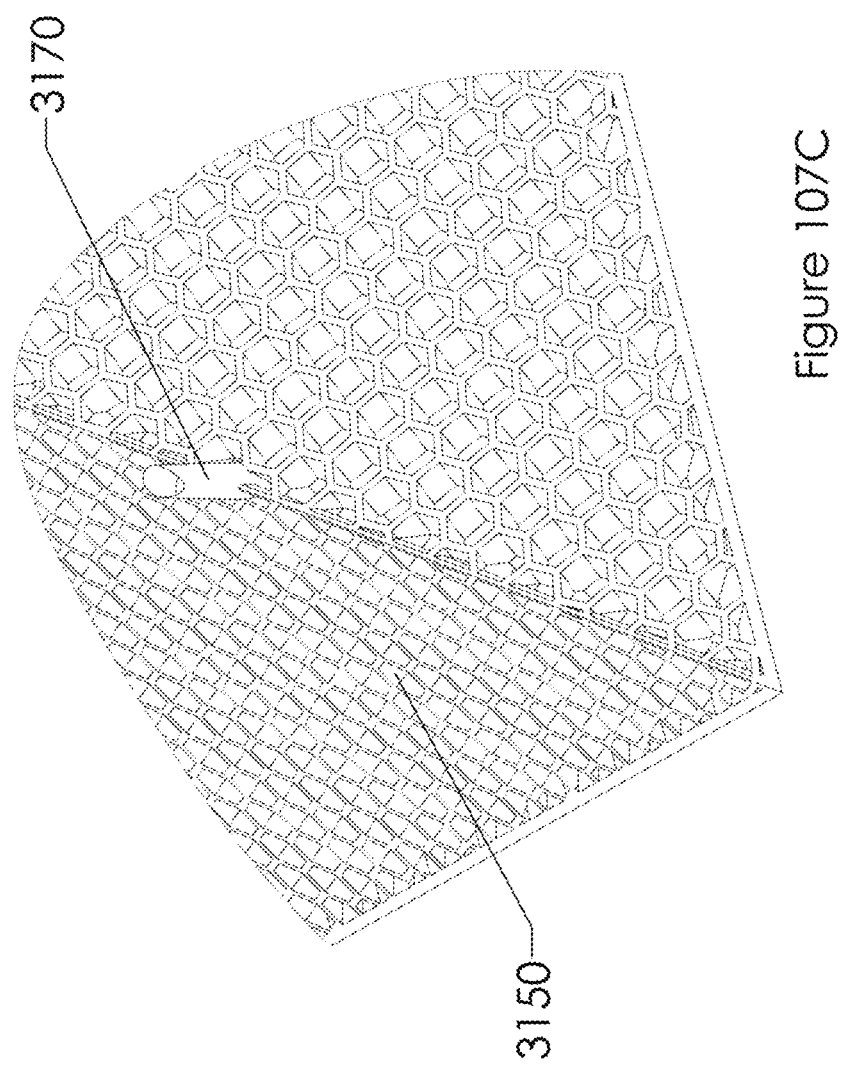

FIG. 107B shows the capacitor cell casing 3160 and the honeycomb cathode 3150 separated, with one (of two) cathode conductive posts 3170 visible, as well as both casing holes 3135 for those posts 3170 and two bulbous bosses 3165. These bosses 3165 have the same shape as the conductive tip 1810 on the solar panels 1800; the bosses 3165 provide a locking feature to secure the capacitor rack 3200 and carry no current. FIG. 107C shows a cropped detail of a cathode conductive post 3170.

Figure 107D:
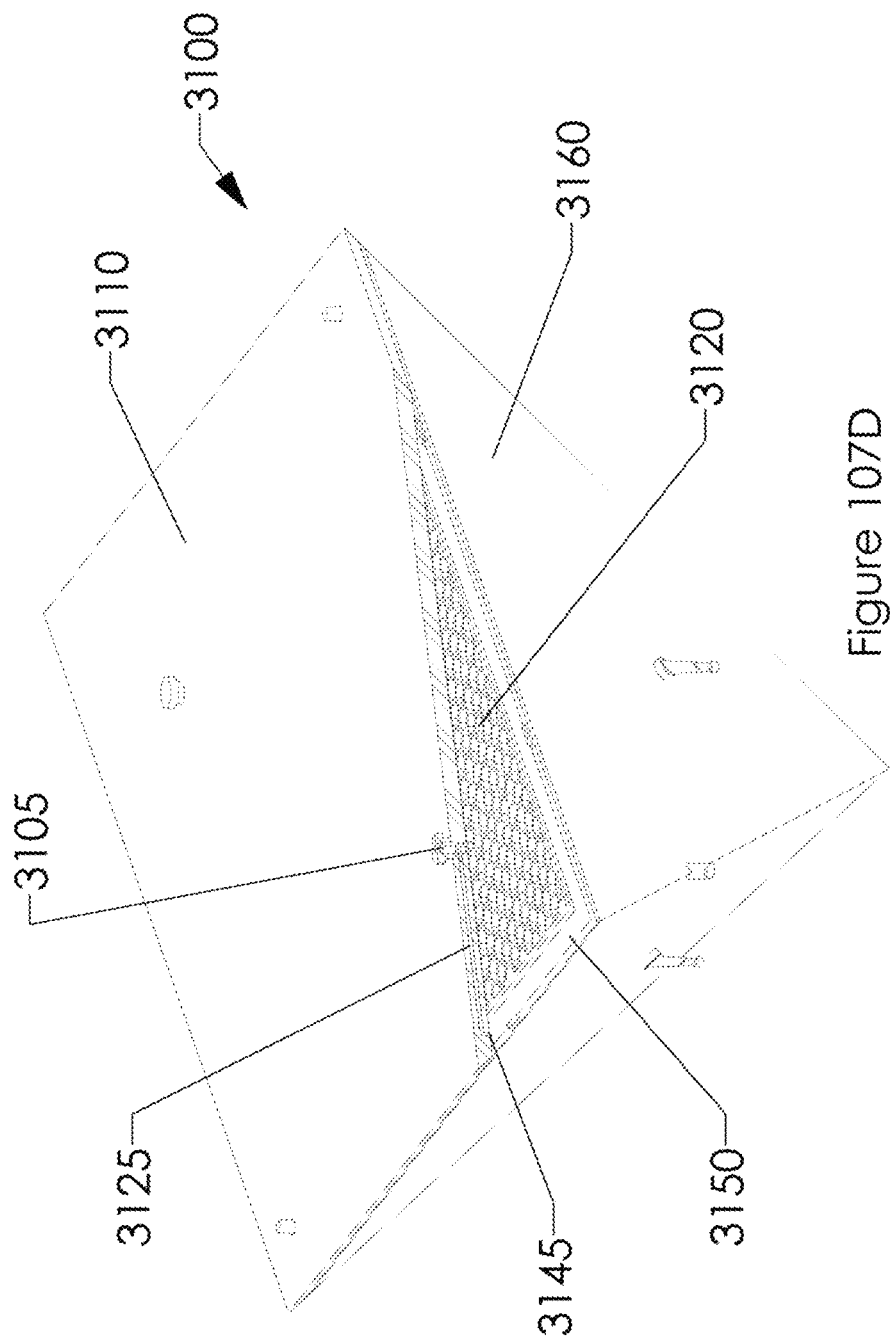

FIG. 107D shows an assembled capacitor cell 3100 with a sectioned insulated cover 3110. Highlighted are an anode 3120, the outside edge of a cathode 3150, a cell casing 3160 a cathode LED channel 3125, an LED 3105 and a cathode channel boss 3145 to connect to the end of the channel 3125.

FIG. 107E shows a cropped detail of FIG. 107D highlighting the cathode LED channel 3125 and a cathode channel boss 3145. FIG. 107F is similar to FIG. 107E with the insulated cover 3110 raised slightly to show a cathode channel boss 3145.

FIG. 108A shows a cropped detail of the top of the capacitor cell 3100 with the insulated cover 3110 sectioned across a tab slot 3175 and raised slightly above a casing tab 3185 to show its orientation before it is bonded in place. FIG. 108B shows a view similar to FIG. 108A with the insulated cover 3110 bonded in place with the tab slot 3175 and casing tab 3185 in relative position.

FIG. 109 shows an exploded view of the components in the capacitor cell 3100 including: the capacitor cell casing 3160, honeycomb cathode 3150, honeycomb anode 3120, indicator LED 3105 and capacitor insulated cover 3110.

FIG. 110 shows a capacitor rack 3200 removed from a complete (male) capacitor wall section 2900.

FIG. 111 shows the capacitor rack 3200 in isolation. The capacitor rack 3200 has a similar construction to the connection rack 2100 except that there are four (4) bosses, instead of eight (8), which serve to provide a detent snap fit against bulbous bosses 3250 in the capacitor cell casing 3160. FIG. 112 shows a capacitor rack circuit 3205 with input lead 3210 and output lead 3220 to the frame. The capacitor rack circuit 3205 is embodied within the capacitor rack 3200. FIG. 113 shows a circuit contact 3230 to the cathode.

FIG. 114 shows a hatch on the tip of a cathode connection post 3170 as a circuit contact 3230 is in position. FIG. 115 shows a detail of cathode connection post 3170 and a cutaway of the capacitor rack 3200 showing the bulbous boss 3165 in the capacitor cell casing 3160. When the capacitor rack 3200 is in place, the cathode connection post 3170 aligns and makes contact with the circuit contact 3230.

Electrical conduits within the U-shaped, three (3) sided base 3410 or its top cover 4400 can connect a solar panel wall 3300 with a capacitor wall 3500. These conduits can have bypass and blocking diodes to prevent a back-flow of electrical current from the capacitors 3100 to the solar panels 1800. In one non-limiting embodiment, detent/snap fit connection methods (similar to those seen in FIGS. 61-63) provide electrical connection between wall sections through the base 3410 and/or cover 4400. They can be connected in parallel to allow continuous electricity in case a section of wall is damaged. In a further non-limiting embodiment, plug outlets can be provided in order to draw power from sub-sections of the panels. In another non-limiting embodiment, a single outlet is used per wall.

FIG. 116 shows an example of a solar panel wall 3300 in a pyramid wall frame 3400. In addition to V shaped bosses 520 and grooves 530 that hold the sections together laterally, dowel pins can be put through these V joints normal to the connection rack side to prevent collapse when a force is applied normal to the face of the wall 3300. In the configuration shown here, there is one full modular array 2500, four male solar panel sections 2300, one half female sections (right side) 3700, one half female section 3800 (left side), one half female section (top) 3900 and one half female section (bottom) 4000.

FIG. 117 shows the backside of a pyramid wall frame 3400. Here, a capacitor wall 3500 compliments the solar panel side with capacitor shields 4300 covering the face of every panel and half section.

FIG. 118 shows the U-shaped, three (3) sided base 3410 of the pyramid wall frame 3400. FIG. 119 shows pyramid frame corners 3420 added to the frame as a cosmetic shield to missing quarter panels.

FIG. 120 shows two top half female sections 3900 inserted at the bottom of the frame 3400. FIG. 121 shows one male side—A—wall section 2900 added in the center and two female side—B—wall sections 2400 on either side of it. FIG. 122 shows one half female sections (right side) 3700 and one half female section 3800 (left side) added to either side. FIG. 123 shows the remainder of sections added: two female side—B—wall sections 2400, three male side—A—wall sections 2900 and two half female sections (bottom) 4000.

FIG. 124 shows the capacitor wall 4100 in place. FIG. 125 shows the frame cover 4200 ready to be put in place.

FIG. 126A shows a capacitor shield 4300 ready to position in place. FIG. 126B shows maintenance handles 4310 with a transparent window 4320 to see power outage signals on the indicator LEDs 3105. FIG. 127 shows the capacitor shields 4300 in place with one removed for clarity.

FIG. 128 shows the opposite side of the pyramid wall frame 3400, exposing the connector side of the capacitor wall 4100. FIG. 129 shows a frame cover 4200 added to the bottom.

FIG. 130 shows the solar panel wall 3300 to be added to the assembly 4100. FIG. 131 shows pyramid frame corners 3420 to be added to the frame. FIG. 132 shows the top cover 4400 to be added in order to complete the top and seal the pyramid wall frame 3400.

As described above, various embodiments provide a method and apparatus to create wall sections. These wall sections may then be used to quickly set up pyramidal structures.

Various operations described are purely exemplary and imply no particular order. Further, the operations can be used in any sequence when appropriate and can be partially used. Various operations described as individual steps may be combined into a single operation. Additionally, some operations described as individual steps may be divided so as to be performed as multiples steps. As used herein, the terms fig., Figure, image and step may be used interchangeably.

In some embodiments, the vacuum forming shown in FIG. 3 may be done in a full vacuum chamber and the steps may vary. In other embodiments, the sheet may be clamped and cut at various steps before the final vacuum forming step and curing occurs. In still other embodiment, various Figures could be reordered so as to take place as another sequence of steps.

In one non-limiting embodiment of the sheet being formed into the shape of the pyramids, after the last fold and cutting step, an infusion mesh may be placed on top of the material to wick resin. The mesh may be taped along the outside, with two plastic connectors loosely placed for a vacuum hose on opposite sides. A slightly oversized vacuum bag (for example, a single sided sheet of clear bagging material) can then be placed over the material and taped down with vacuum bagging tape.

An incision may be made above each connector. One allows a hose to draw resin from a reservoir. The other connects a hose which is attached to a vacuum pump. Initially, the reservoir may be clamped off and a full vacuum may be pulled through the bag. Then, the hose at the pump end may be clamped off as well. After it is determined that there are no leaks, the clamp at the reservoir end may be opened and the resin may be drawn through the infusion mesh. Then both hoses may be clamped off again. The vacuum forming sheet may be allowed to cure over the next 24 hours to make the finished housing.

Any of the operations described that form part of the presently disclosed embodiments may be useful machine operations. Various embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines employing one or more processors coupled to one or more computer readable medium can be used with computer programs written in accordance with the teachings herein, or it may be more convenient to construct a more specialized apparatus to perform the required operations.

The foregoing description has been directed to particular embodiments. However, other variations and modifications may be made to the described embodiments, with the attainment of some or all of their advantages. Modifications to the above-described systems and methods may be made without departing from the concepts disclosed herein. Accordingly, the invention should not be viewed as limited by the disclosed embodiments. Furthermore, various features of the described embodiments may be used without the corresponding use of other features. Thus, this description should be read as merely illustrative of various principles, and not in limitation of the invention.

What is claimed is:

1. A method of producing a wall section, the method comprising:
    vacuum forming a carbon fiber sheet to a pyramidal mold core to create a first layer of the carbon fiber sheet, the first layer having a plurality of pyramidal shapes;
    disposing a conductive frame on the carbon fiber sheet, the conductive frame having a bird bone core, a plurality of frame connectors electrically connected to the conductive frame and a plurality of locking post slot areas;
    trimming the first layer to form first solar panel post slots;
    cutting vents in the carbon fiber sheet to expose the plurality of frame connectors;
    clamping at least a portion of the carbon fiber sheet to the conductive frame;
    wrapping the carbon fiber sheet around the conductive frame and over the first layer to create a second layer of the carbon fiber sheet;
    trimming the second layer to form second solar panel post slots, wherein the first solar panel post slots and the second solar panel post slots overlap;
    trimming the second layer to expose the plurality of locking post slot areas; and
    affixing locking posts to the peaks of the plurality of pyramidal shapes.

2. The method of claim 1 further comprising:
    inserting a plurality of solar panels having solar panel posts such that the solar panel posts are disposed in the first and second solar panel post slots; and
    inserting a connector rack securing the solar panel posts and electrically connecting the plurality of solar panels to the conductive frame.

3. A method of building a wall for a pyramidal structure, the method comprising:
    providing a plurality of wall sections as described in claim 1;
    connecting a first subset of wall sections into an outer wall, wherein the wall sections in the first subset include solar panels;
    connecting a second subset of wall sections into an inner wall;
    overlapping the outer wall to the inner wall by placing the solar panel posts of one wall in the solar panel post slots in the opposite wall;
    in each solar panel post slot, inserting a securing post to secure the solar panel post in the solar panel post slot.

4. The method of claim 3, wherein the wall sections in the second subset of wall sections include capacitor racks.

5. The method of claim 4, wherein each capacitor rack includes a honeycomb anode having electrodes formed into layers of a honeycomb lattice.

6. The method of claim 4, wherein each capacitor rack includes a honeycomb cathode.

7. The method of claim 1, wherein the conductive frame is a carbon wrapped conductive frame comprising:
    an outer shell;
    a first insulative layer;
    a first conductive layer of graphene embedded thermoplastic configured to conduct a negative charge, wherein the first insulative layer is disposed between the outer shell and the first conductive layer;
    a second insulative layer;
    a second conductive layer of graphene embedded thermoplastic configured to conduct a positive charge, wherein the second insulative layer is disposed between the first conductive layer and the second insulative layer; and
    the bird bone core, wherein the bird bone core comprises graphene embedded thermoplastic.

8. The method of claim 1, wherein the bird bone core is configured to enable a flow of low pressure inert gas within the conductive frame so as to conduct an ionic current.

9. The method of claim 1, wherein the bird bone core is configured to enable a flow of low pressure inert gas within the conductive frame.

* * * * *